United States Patent
Kitazawa et al.

(10) Patent No.: US 8,501,901 B2
(45) Date of Patent: Aug. 6, 2013

(54) MATERIAL FOR PHOTOVOLTAIC DEVICE, AND PHOTOVOLTAIC DEVICE

(75) Inventors: Daisuke Kitazawa, Otsu (JP); Shuhei Yamamoto, Otsu (JP); Nobuhiro Watanabe, Otsu (JP); Jun Tsukamoto, Otsu (JP)

(73) Assignee: Toray Industries, Inc. (JP)

( * ) Notice: Subject to any disclaimer, the term of this patent is extended or adjusted under 35 U.S.C. 154(b) by 123 days.

(21) Appl. No.: 13/144,532

(22) PCT Filed: Jan. 20, 2010

(86) PCT No.: PCT/JP2010/050586
§ 371 (c)(1),
(2), (4) Date: Jul. 14, 2011

(87) PCT Pub. No.: WO2010/084865
PCT Pub. Date: Jul. 29, 2010

(65) Prior Publication Data
US 2011/0272030 A1   Nov. 10, 2011

(30) Foreign Application Priority Data

Jan. 20, 2009 (JP) .................. 2009-009648
Jun. 26, 2009 (JP) .................. 2009-151912

(51) Int. Cl.
*C08G 75/00* (2006.01)
(52) U.S. Cl.
USPC .......... 528/377; 136/263; 526/256; 252/511; 977/734
(58) Field of Classification Search
USPC .............. 528/377; 136/263; 252/511
See application file for complete search history.

(56) References Cited

U.S. PATENT DOCUMENTS

2008/0089113 A1* 4/2008 Yang et al. ............... 365/153
2008/0099758 A1   5/2008 Lee et al.

FOREIGN PATENT DOCUMENTS

JP  2004-500464 A   1/2004
JP  2004-534863 A   11/2004

OTHER PUBLICATIONS

J.J.M. Halls et al., "Efficient photodiodes from interpenetrating polymer networks," Nature, vol. 376, Aug. 10, 1995, pp. 498-500.
G. Yu et al., "Polymer Photovoltaic Cells: Enhanced Efficiencies via a Network of Internal Donor-Acceptor Heterojunctions," Science, vol. 270, Dec. 15, 1995, pp. 1789-1791.
Raja Shahid Ashraf et al., "Synthesis and Properties of Fluorene-Based Polyheteroarylenes for Photovoltaic Devices," Journal of Polymer Science: Part A: Polymer Chemistry, vol. 44, 2006, pp. 6952-6961.

(Continued)

Primary Examiner — Shane Fang
(74) Attorney, Agent, or Firm — DLA Piper LLP (US)

(57) ABSTRACT

A photovoltaic device has a high photoelectric conversion efficiency with a material for a photovoltaic device including an electron donating organic material having a structure represented by Formula (1):

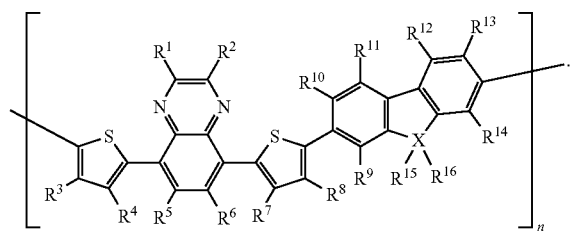

8 Claims, 22 Drawing Sheets

OTHER PUBLICATIONS

Eva Bimdgaard et al., "Low band gap polymers for organic photovoltaics," Solar Energy Materials & Solar Cells, vol. 91, 2007, pp. 954-985.

Abay Gadisa et al., "A New Donor-Acceptor-Donor Polyfluorene Copolymer with Balanced Electron and Hole Mobility," Advanced Functional Materials, vol. 17, 2007, pp. 3836-3842.

Wen-Ya Lee et al., "Effects of Acceptors on the Electronic and Optoelectronic Properties of Fluorene-Based Donor-Acceptor-Donor Copolymers," Macromolecular Chemistry and Physics, vol. 208, 2007, pp. 1919-1927.

Wendimagegn Mammo et al., "New low band gap alternating polyfluorene copolymer-based photovoltaic cells," Solar Energy Materials & Solar Cells, vol. 91, 2007, pp. 1010-1018.

Mingliang Sun et al., "Fluorene-Based Single-Chain Copolymers for Color-Stable White Light-Emitting Diodes," Macromolecular Chemistry and Physics, vol. 208, 2007, pp. 988-993.

Argiri Tsami et al., "Alternating quionoxaline/oligothiophene copolymers—synthesis and unexpected absorption properties," Journal of Materials Chemistry, vol. 17, 2007, pp. 1353-1355.

L. Mattias Andersson et al., "Intrinsic and extrinsic influences on the temperature dependence of mobility in conjugated polyers," Organic Electronics, vol. 9, 2008, pp. 569-574.

Nicolas Blouin et al., "Toward a Rational Design of Poly(2,7-Carbazole) Derivatives for Solar Cells," Journal of American Chemical Society, vol. 130, 2008, pp. 732-742.

Cheng-Liang Liu et al., "New Didecyloxyphenylene—Acceptor Alternating Conjugated Copolymers: Synthesis, Properties, and Optoelectronic Device Applications," Macromolecules, vol. 41, 2008, pp. 6952-6959.

Argiri Tsami et al., "Alternating Fluorene-di(thiophene)quinoxaline Copolymers via Microwave-Supported Suzuki Cross-Coupling Reactions," Journal of Polymer Science: Part A: Polymer Chemistry, vol. 46, 2008, pp. 7794-7808.

Mei-Hsiu Lai et al., "Synthesis and Properties of New Dialkoxyphenylene Quinoxaline-Based Donor-Acceptor Conjugated Polymers and Their Applications on Thin Film Transistors and Solar Cells," Journal of Polymer Science: Part A: Polymer Chemistry, vol. 47, 2009, pp. 973-985.

Lars J. Lindgren et al., "Synthesis, Characterization, and Devices of a Series of Alternating Copolymers for Solar Cells," Chemistry of Materials, vol. 21, 2009, pp. 3491-3502.

* cited by examiner

MATERIAL FOR PHOTOVOLTAIC DEVICE, AND PHOTOVOLTAIC DEVICE

RELATED APPLICATIONS

This is a §371 of International Application No. PCT/JP2010/050586, with an international filing date of Jan. 20, 2010 (WO 2010/084865 A1, published Jul. 29, 2010), which is based on Japanese Patent Application Nos. 2009-009648, filed Jan. 20, 2009, and 2009-151912, filed Jun. 26, 2009, the subject matter of which is incorporated by reference.

TECHNICAL FIELD

This disclosure relates to a material for use in a photovoltaic device and such a photovoltaic device.

BACKGROUND

Solar cells that provide an environment-friendly electric energy source have been drawn public attentions as an effective energy source that can solve energy problems that have currently become more and more serious. At present, as a semiconductor material for use in photovoltaic devices for solar cells, inorganic substances, such as single crystal silicon, polycrystal silicon, amorphous silicon, and a compound semiconductor, have been used. However, since the solar cell to be produced by using inorganic semiconductors requires high costs in comparison with other power generation systems, such as thermal power generation and nucleic power generation, it has not been widely used for general household purposes. The main reason for the high costs lies in that a process for manufacturing a semiconductor thin-film under vacuum at high temperatures is required. For this reason, organic solar cells have been examined in which, as a semiconductor material that can desirably simplify the manufacturing process, an organic semiconductor and an organic colorant, such as a conjugated copolymer and an organic crystal, are utilized.

However, the largest problem with the organic solar cells using the conjugated polymer or the like is that its photoelectric conversion efficiency is low in comparison with conventional solar cells using inorganic semiconductors, and these solar cells have not been put into practical use. The reasons that the photoelectric conversion efficiency of the organic solar cells using the conjugated polymer is low mainly lie in that the absorbing efficiency of solar light is low, in that a bound state referred to as a bound exciton state in which electrons and holes generated by solar light are hardly separated is formed, and in that since a trap that captures carriers (electrons and holes) is easily formed, generated carriers are easily captured by the trap, with the result that the mobility of carriers is slow.

At present, the conventional photoelectric conversion device with the organic semiconductors can be generally classified into the following device structures: that is, a schottky-type structure in which an electron donating organic material (p-type organic semiconductor) and metal having a small work function are joined to each other, and a hetero junction type structure in which an electron accepting organic material (n-type organic semiconductor) and an electron donating organic material (p-type organic semiconductor) are joined to each other. These devices have a low photoelectric conversion efficiency because only the organic layer (layer of about several molecules) of the joined portion is allowed to devote to photoelectric current generation, and the improvement thereof has been required.

As a method for improving the photoelectric conversion efficiency, a bulk hetero-junction type structure (for example, see J. J. M. Halls et al., "Nature," No. 376, 1995, page 498) has been proposed in which an electron accepting organic material (n-type organic semiconductor) and an electron donating organic material (p-type organic semiconductor) are mixed with each other to increase the junction surface that devotes to the photoelectric conversion. In particular, a photoelectric conversion material has been reported (for example, see G. Yu et al., "Science," Vol. 270, 1995, page 1789) in which a conjugated polymer is used as the electron donating organic material (p-type organic semiconductor) while a $C_{60}$ derivative, such as PCBM, is used as the electron accepting organic material in addition to a conductive polymer having an n-type semiconductor characteristic.

Moreover, to effectively absorb radiating energy that covers a wide range of solar light spectra, another photoelectric conversion material using an organic semiconductor has been reported (for example, see E. Bundgaard et al., "Solar Energy Materials & Solar Cells," Vol. 91, 2007, page 954) in which an electron donating group and an electron withdrawing group are introduced to a main chain so that a band gap is narrowed. Thiophene skeletons have been examined as this electron donating group, and benzothiazole skeletons and quinoxaline skeletons have been vigorously examined as this electron withdrawing group (for example, see E. Bundgaard et al.; A. Gadisa et al., "Advanced Functional Materials," Vol. 17, 2007, pp 3836-3842; W. Mammo et al., "Solar Energy Materials & Solar Cells," Vol. 91, 2007, pp 1010-1018; R. S. Ashraf et al., "Journal of Polymer Science Part A: Polymer Chemistry," Vol. 44, 2006, pp 6952-6961; C-L. Liu et al., "Macromolecules," Vol. 41, 2008, pp 6952-6959; N. Blouin et al., "Journal of American Chemical Society," Vol. 130, 2008, pp 732-742; M. Sun et al., "Macromolecular Chemistry and Physics," Vol. 208, 2007, pp 988-993; W-Y. Lee et al., "Macromolecular Chemistry and Physics," Vol. 208, 2007, pp 1919-1927; A. Tsami et al., "Journal of Materials Chemistry," Vol. 17, 2007, pp 1353-1355; and M. Lai et al., "Journal of Polymer Science Part A: Polymer Chemistry," Vol. 47, 2009, pp 973-985, and Japanese Patent Application National Publication (Laid-Open) Nos. 2004-534863 and 2004-500464). However, these methods have failed to provide sufficient photoelectric conversion efficiency.

As described above, the conventional organic solar cells have a problem of a low photoelectric conversion efficiency. It could therefore be helpful to provide a photovoltaic device having a high photoelectric conversion efficiency.

SUMMARY

We thus provide a material for a photovoltaic device containing an electron donating organic material having a specific structure, and a photovoltaic device. For example, we provide a material for a photovoltaic device including an electron donating organic material having a structure represented by Formula (1):

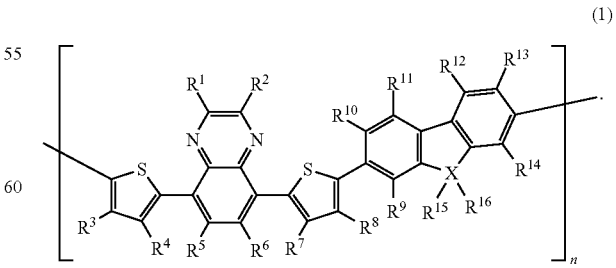

wherein each of $R^1$ and $R^2$ that may be the same or different represents an optionally substituted alkyl group having 1 to 5 carbon atoms, an optionally substituted alkoxy group having 1 to 5 carbon atoms, an optionally substituted aryl group, or an optionally substituted heteroaryl group; provided that when a substituent is present, the substituent is an alkyl group having 1 to 5 carbon atoms, an alkoxy group having 1 to 5 carbon atoms, an aryl group, a heteroaryl group, or halogen; each of $R^3$ through $R^{14}$ that may be the same or different represents hydrogen, an alkyl group, an alkoxy group, an aryl group, an heteroaryl group, or halogen; each of $R^{15}$ and $R^{16}$ that may be the same or different represents an alkyl group having 6 or more carbon atoms; X represents carbon, nitrogen or silicon; in the case where X is nitrogen, no $R^{16}$ exists; and n represents a range from 10 or more to 1000 or less.

In accordance with the material for a photovoltaic device, it is possible to provide a photovoltaic device having a high photoelectric conversion efficiency.

DETAILED DESCRIPTION

Figure 1:
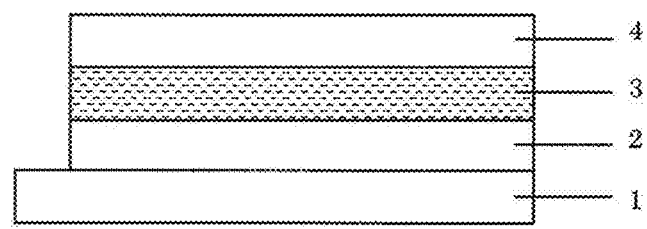
FIG. 1 is a schematic drawing that shows one aspect of a photovoltaic device.

The material for a photovoltaic device contains an electron donating organic material having a structure represented by Formula (1):

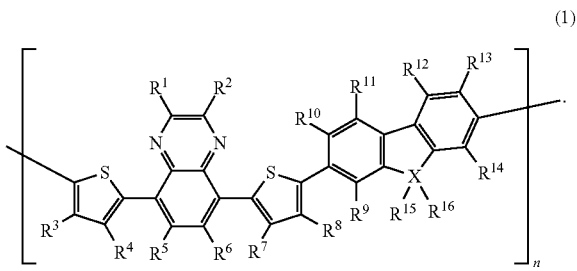

(1)

Each of $R^1$ and $R^2$ that may be the same or different represents an optionally substituted alkyl group having 1 to 5 carbon atoms, an optionally substituted alkoxy group having 1 to 5 carbon atoms, an optionally substituted aryl group, or an optionally substituted heteroaryl group, provided that when a substituent is present, the substituent is an alkyl group having 1 to 5 carbon atoms, an alkoxy group having 1 to 5 carbon atoms, an aryl group, a heteroaryl group, or halogen.

Each of $R^3$ through $R^{14}$ that may be the same or different represents hydrogen, an alkyl group, an alkoxy group, an aryl group, a heteroaryl group, or halogen.

Each of $R^{15}$ and $R^{16}$ that may be the same or different represents an alkyl group having 6 or more carbon atoms. The number of carbon atoms of the alkyl group is preferably set in a range from 8 or more to 30 or less, from the viewpoint of processability. Moreover, from the viewpoints of properly maintaining the orientation of the main chain and of effectively carrying out light absorption and carrier mobility, the number thereof is preferably set to 20 or less, more preferably, to 10 or less.

X represents carbon, nitrogen or silicon. In the case where X is nitrogen, no $R^{16}$ exists. n represents a range from 10 or more to 1000 or less.

Examples of the alkyl group herein include saturated aliphatic hydrocarbon groups, such as a methyl group, an ethyl group, a propyl group, a butyl group, a pentyl group, a hexyl group, a heptyl group, an octyl group, a nonyl group, a decyl group, an undecyl group, and a dodecyl group, and these may be straight, branched, or cyclic, and may be unsubstituted or substituted. The number of carbon atoms of the alkyl group is preferably set in a range from 1 or more to 20 or less, from the viewpoint of processability. When a substituent is present, examples thereof include the following alkoxy group, aryl group, heteroaryl group, and halogen. In the case where $R^1$ and $R^2$ are substituted, examples of the substituent include the following alkoxy group having 1 to 5 carbon atoms, aryl group, heteroaryl group, and halogen.

Moreover, the alkoxy group, for example, represents an aliphatic hydrocarbon group with an ether bond, such as a methoxy group, an ethoxy group, a propoxy group, and a butoxy group, and the aliphatic hydrocarbon group may be unsubstituted or substituted. The number of carbon atoms of the alkoxy group is preferably set in a range from 1 or more to 20 or less, from the viewpoint of processability. When a substituent is present, examples thereof include the following aryl group, heteroaryl group, and halogen. In the case where $R^1$ and $R^2$ are substituted, examples of the substituent include the following aryl group, heteroaryl group, and halogen.

Examples of the aryl group include aromatic hydrocarbon groups, such as a phenyl group, a naphthyl group, a biphenyl group, a phenanthryl group, an anthryl group, a terphenyl group, a pyrenyl group, a fluorenyl group, and a perylenyl group, and these may be unsubstituted or substituted. The number of carbon atoms of the aryl group is preferably set in a range from 6 or more to 30 or less, from the viewpoint of processability. When a substituent is present, examples thereof include the above-mentioned alkyl group, the following heteroaryl group, and halogen. In the case where $R^1$ and $R^2$ are substituted, examples of the substituent include the above-mentioned alkyl group having 1 to 5 carbon atoms, and alkoxy group having 1 to 5 carbon atoms, and the following heteroaryl group, or halogen.

The heteroaryl group represents, for example, a heteroaromatic group having atoms other than carbon atoms, such as a thienyl group, a furyl group, a pyrrolyl group, an imidazolyl group, a pyrazolyl group, an oxazolyl group, a pyridyl group, a pyrazyl group, a pyrimidyl group, a quinolinyl group, an isoquinolinyl group, a quinoxalinyl group, an acridinyl group, an indolyl group, a carbazolyl group, a benzofuran group, a dibenzofuran group, a benzothiophene group, a dibenzothiophene group, a silole group, a benzosilole group, and a dibenzosilole group, and these groups may be unsubstituted or substituted. The number of carbon atoms of the heteroaryl group is preferably set in a range from 3 or more to 30 or less, from the viewpoint of processability. When a substituent is present, examples thereof include the above-mentioned alkyl group, aryl group, and the following halogen. In the case where $R^1$ and $R^2$ are substituted, examples of the substituent include the above-mentioned alkyl group having 1 to 5 carbon atoms, alkoxy group having 1 to 5 carbon atoms, aryl group, or halogen. Moreover, the halogen is at least any one selected from fluorine, chlorine, bromine, and iodine.

In Formula (1), n represents a degree of polymerization, which is set in a range from 10 or more to 1000 or less. The degree of polymerization can be determined from the weight-average molecular weight. The weight-average molecular weight is measured by using a GPC (gel permeation chromatography), and can be converted based upon polystyrene standard sample.

In most cases, the photoelectric conversion efficiency of a photovoltaic device shows a correlation with the molecular weight of an electron donating organic material. A conjugated polymer having a number-average molecular weight of 5000 or more, more preferably, 10000 or more, is desirably used as the electron donating organic material to obtain a high photoelectric conversion efficiency. However, since the conjugated polymer generally has a rigid main chain, its solubility is low, and to obtain such a polymer having a high molecular weight and high solubility, it is generally considered that an alkyl group having 6 or more carbon atoms, or an alkoxy group having 6 or more carbon atoms needs to be introduced as a solubilizing group. As a specific example of such a polymer, Poly(3-hexylthiophene), and APFO-15, which is described in "Advanced Functional Materials," pages 3836-3842, Volume 17, 2007, have been proposed. On the other hand, as a method for improving the photoelectric conversion efficiency from the viewpoint of its device structure, a bulk hetero-junction-type photovoltaic device, which increases the junction surface that devotes to photoelectric conversion by mixing an electron accepting organic material and an electron donating with each other, has been known. In the bulk hetero-junction-type photovoltaic device, the electron donating organic material and the electron accepting organic material are preferably phase-separated from each other in a nano-level, without being completely compatible with each other, to form a passing route (carrier path) for electrons and holes. However, the solubilizing group, which has been introduced to increase the solubility of the electron donating organic material as described above, tends to increase the compatibility with the electron accepting organic material to impair the formation of a phase-separated structure, or, in contrast, lower the compatibility with the electron donating organic material to cause a phase separation in a micrometer scale, with the result that the bulk hetero-junction-type photovoltaic device is not allowed to exert the photoelectric conversion effect sufficiently.

In this manner, it has been difficult to satisfy both of functions for providing a high molecular weight, while maintaining sufficient solubility, and for providing a capability of forming a phase-separated structure that is suitable for the bulk hetero-junction-type photovoltaic device. However, the electron donating organic material having a structure represented by Formula (1) makes it possible to achieve both of the functions.

The electron donating organic material having a structure represented by Formula (1) forms a main-chain structure constituted by a quinoxaline skeleton having the substituents $R^1$ and $R^2$, two thiophene skeletons disposed on the two sides of this quinoxaline skeleton, and a divalent linking group (fluorine, silafluorene, or carbazole) that links triads of the thiophene-quinoxaline-thiophene to one after another.

The quinoxaline skeleton forming a first constituent element tends to cause an aggregation due to π-π stacking since its planarity is high, and is considered to easily form a phase-separation structure that is suitable for the above-mentioned bulk hetero-junction. However, in the case where none of the substituents $R^1$ and $R^2$ are placed, since the chemical stability of the electron donating organic material is low and the aggregating force is too high, an excessive crystallization is caused to result in a reduction in the photoelectric conversion efficiency of the photovoltaic device. In contrast, in the case where a solubilizing group, such as an alkyl group having 6 or more carbon atoms and an alkoxy group having 6 or more carbon atoms, is located at each of the positions of $R^1$ and $R^2$, since, as described above, the compatibility with the electron accepting organic material is increased to impair the formation of the phase separation structure, or, in contrast, the compatibility with the electron accepting organic material is lowered to cause a phase separation in a micrometer scale, it becomes difficult to form a phase separation structure that is desirable for a bulk hetero-junction-type photovoltaic device, thereby failing to sufficiently exert the photoelectric conversion efficiency. To ensure such chemical stability and suitable phase-separation structure forming capability, it has been found that it is very effective that the substituent at each of the positions of $R^1$ and $R^2$ is an optionally substituted alkyl group having 1 to 5 carbon atoms, an optionally substituted alkoxy group having 1 to 5 carbon atoms, an optionally substituted aryl group, or an optionally substituted hetero-aryl group, and that when a substituent is present, it is an alkyl group having 1 to 5 carbon atoms, an alkoxy group having 1 to 5 carbon atoms, an aryl group, a hetero-aryl group, or halogen.

In the case where the thiophene skeleton serving as the second constituent element is allowed to form the triads of the thiophene-quinoxaline-thiophene in combination with the quinoxaline skeleton, the band gap of the main chain skeleton is lowered to devote to an increase of a short-circuit current (Jsc) of the photovoltaic device. The number of the thiophene rings needs to be set so that one ring is placed on each of the two sides of the quinoxaline skeleton. When two of these are placed on each of the sides, the solubility is lowered to cause an extreme reduction of synthesis yield, or the thiophene rings are mutually twisted to sometimes impair the carrier mobility.

The divalent linking group (fluorine, silafluorene, or carbazole) forming a third constituent element is a very effective skeleton for providing a high molecular weight and for forming a suitable phase separation structure in a nano-level. These linking groups are characterized in that these easily allow a solubilizing group required for providing a high molecular weight to be synthetically introduced. What is more important than this is that, in contrast to the fact that, when introduced into the quinoxaline skeleton, a solubilizing group having 6 or more carbon atoms intervenes with the formation of a phase separation structure, a solubilizing group (alkyl group), introduced into these divalent linking group (fluorine, silafluorene, or carbazole), exerts such effects that it becomes possible to accelerate to provide a high molecular weight, and also to devote to the formation of a suitable phase separation structure. It is unexpectedly found that these peculiar effects can be exerted for the first time when combined with the triad of the aforementioned thiophene-quinoxaline-thiophene. Among these, fluorene is superior in these effects, and this lies in that in the same manner as in the fact that polyfluorene has a β-phase forming capability, when fluorene is used as its linking group, the electron donating organic material having a structure represented by Formula (1) is allowed to easily form a peculiar aggregated structure.

From the viewpoints of satisfying preparations of both of a high molecular weight and a phase-separation-structure forming capability, as well as easiness of synthesis and high yield, among the above-mentioned substituents, $R^1$ and $R^2$ are preferably optionally substituted aryl groups, and $R^3$ to $R^{14}$ are more preferably hydrogen or aryl groups. In the case where $R^1$ and $R^2$ are substituted aryl groups, the substituent is preferably an alkyl group having 1 to 5 carbon atoms or an alkoxy group having 1 to 5 carbon atoms, and more preferably an alkyl group having 1 to 3 carbon atoms or an alkoxy group having 1 to 3 carbon atoms.

As the electron donating organic material having a structure represented by Formula (1), the following structures are proposed. In the following structures, n is set in a range from 10 or more to 1000 or less.

Formula 2

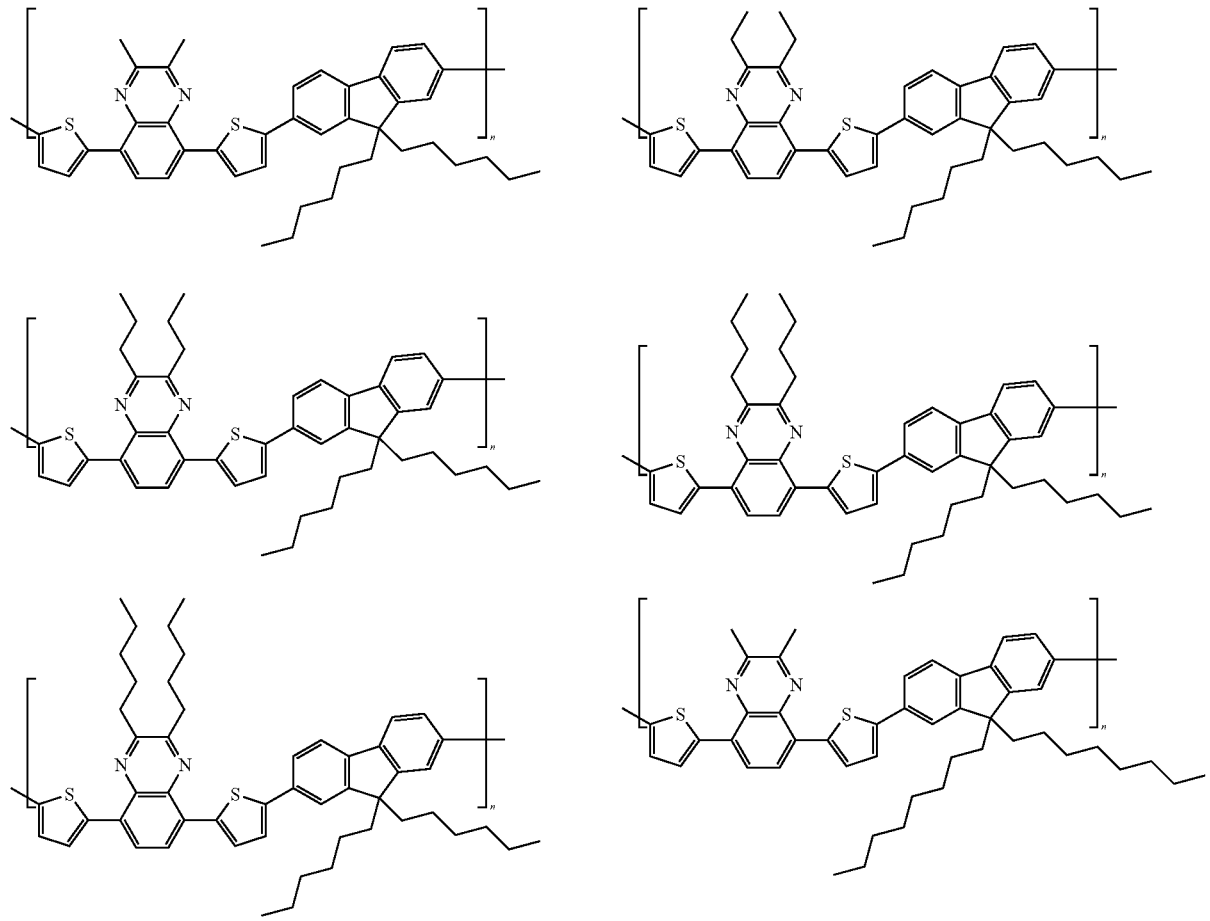

-continued
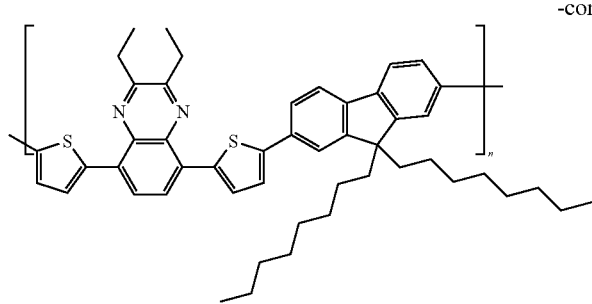
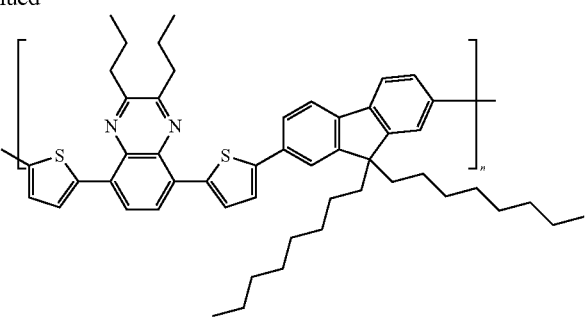
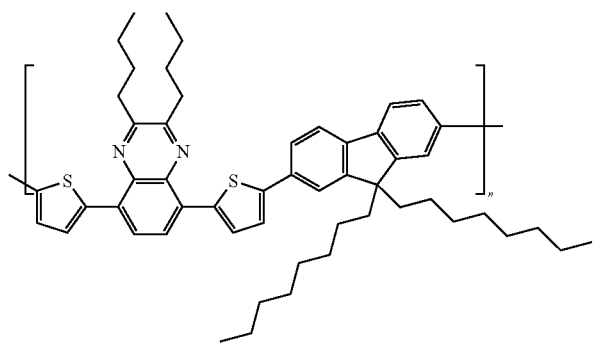
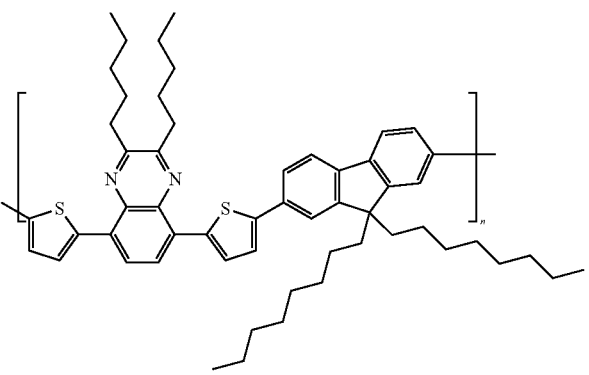
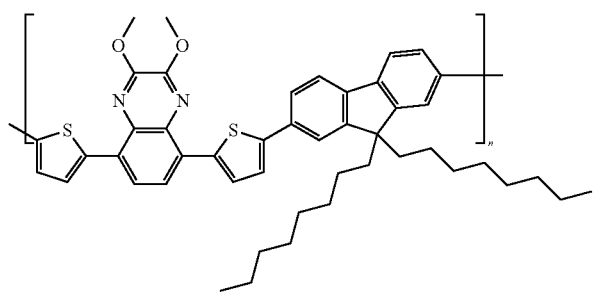
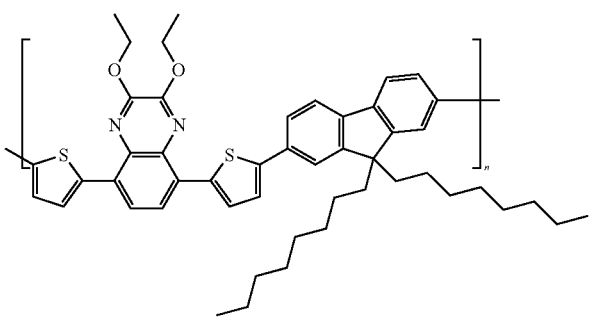
Formula 3
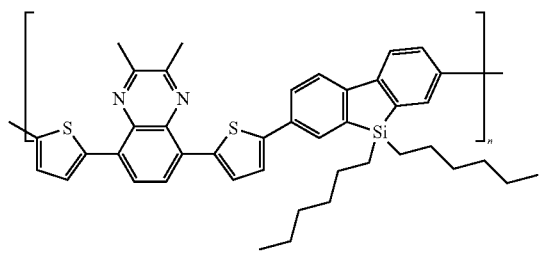
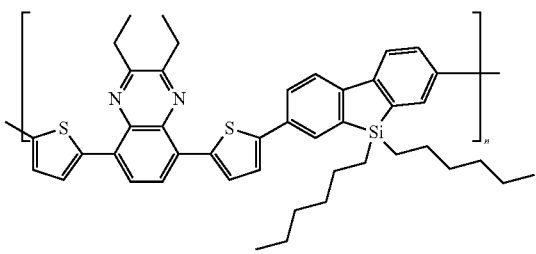
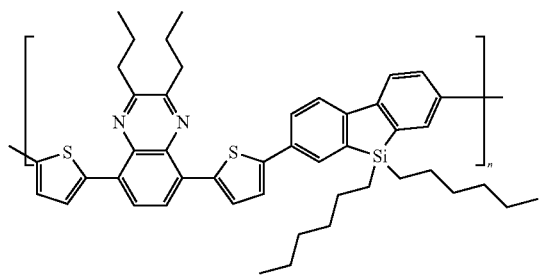
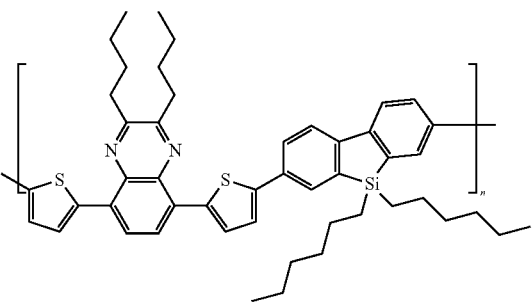

-continued
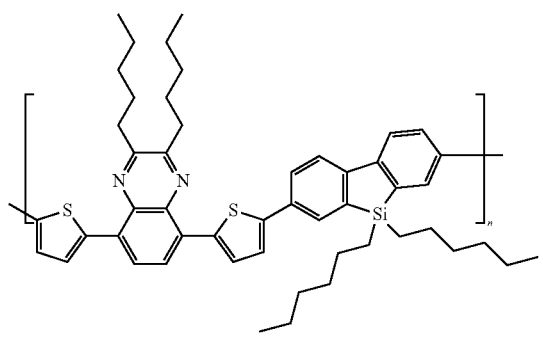
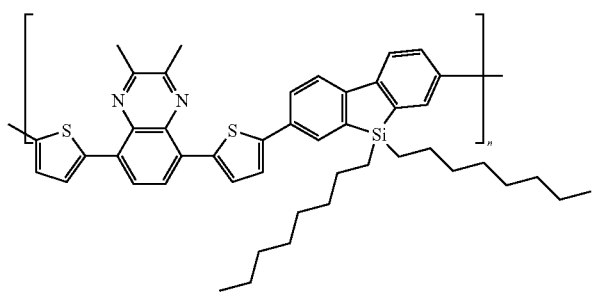
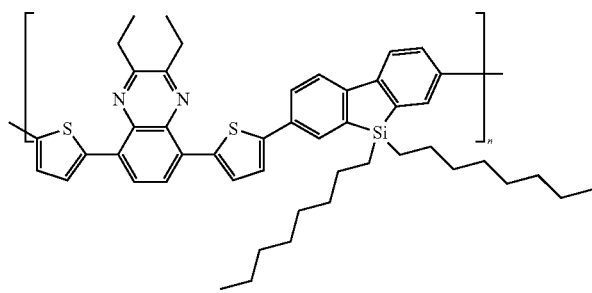
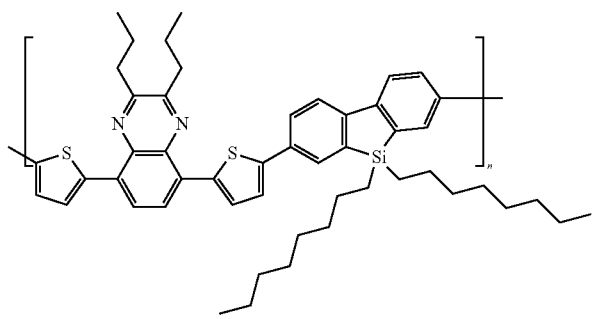
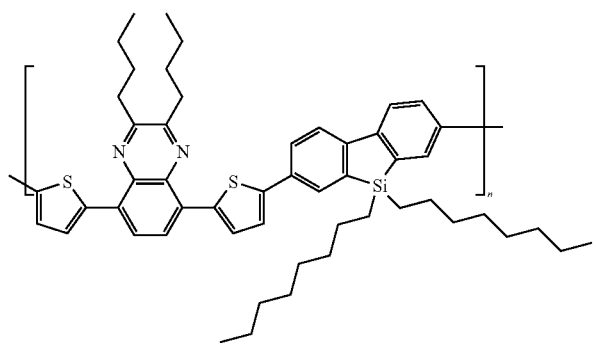
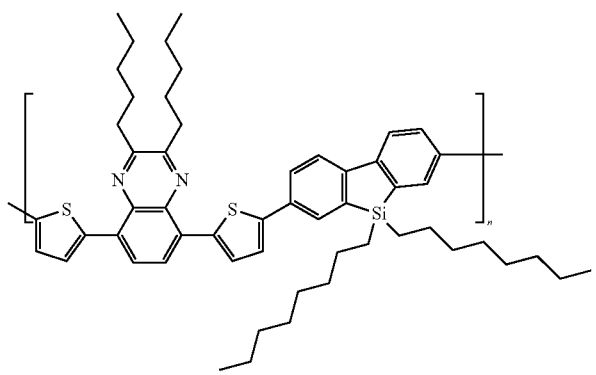
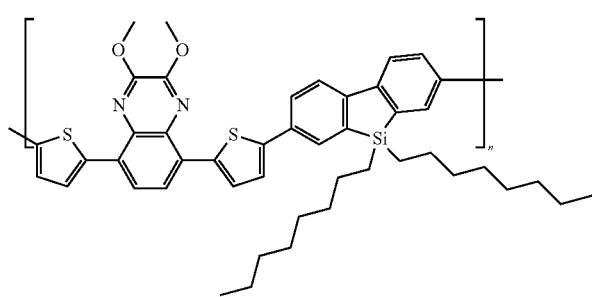
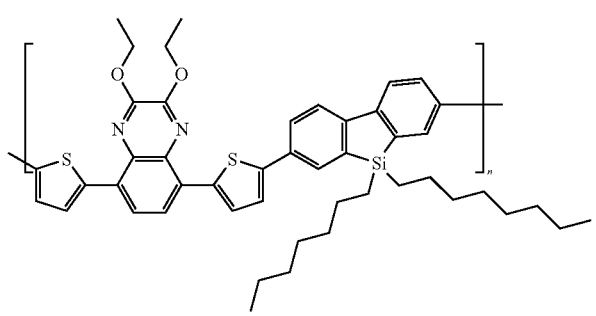
Formula 4
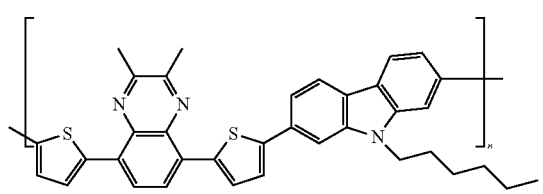
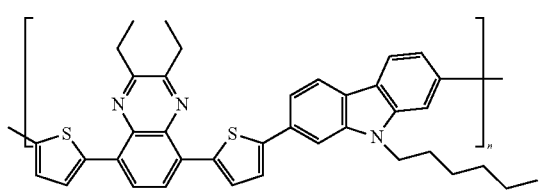

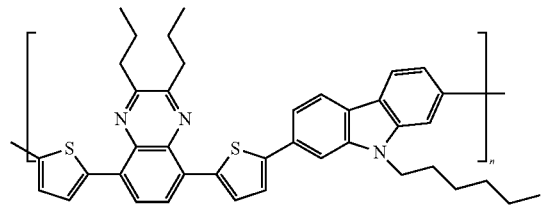
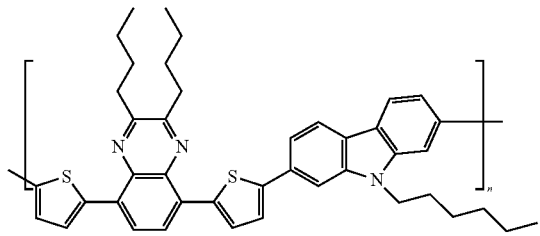
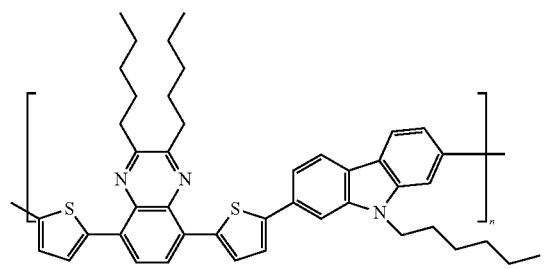
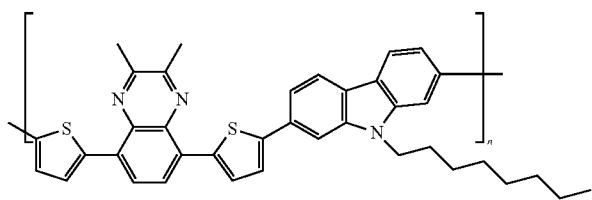
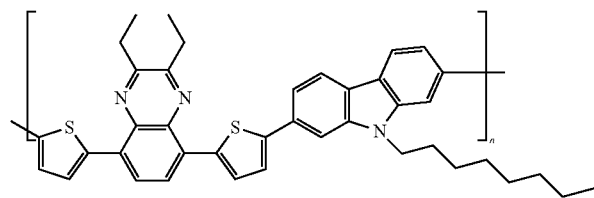
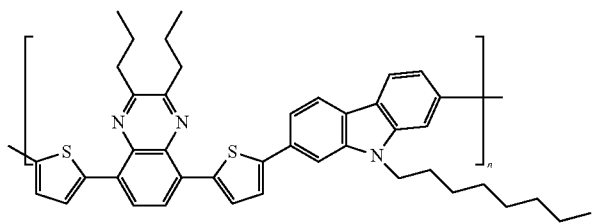
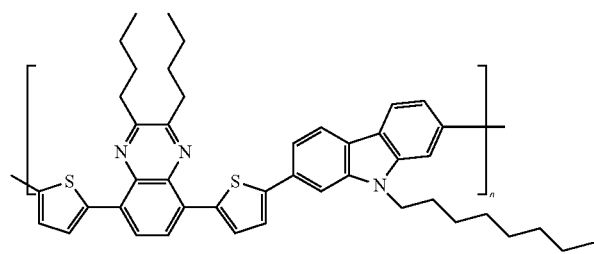
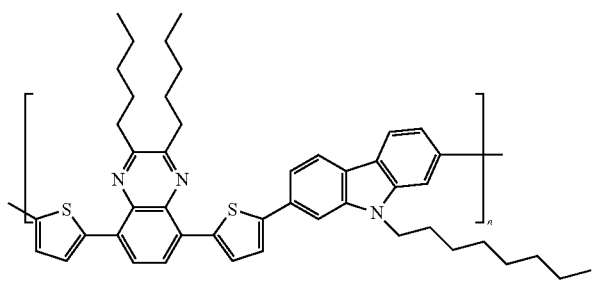
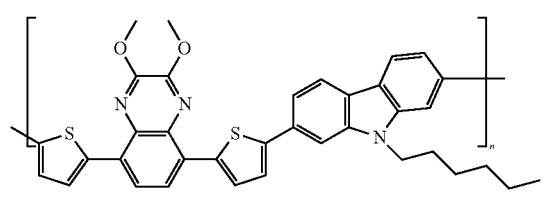
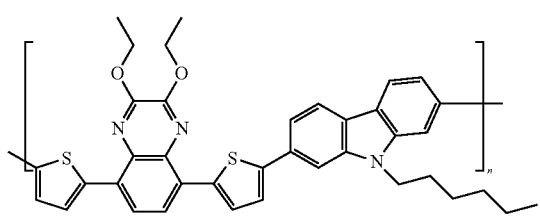
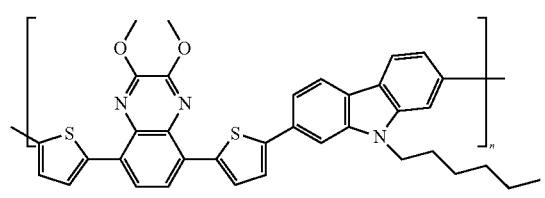
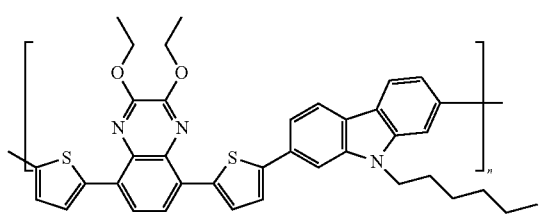

Formula 5
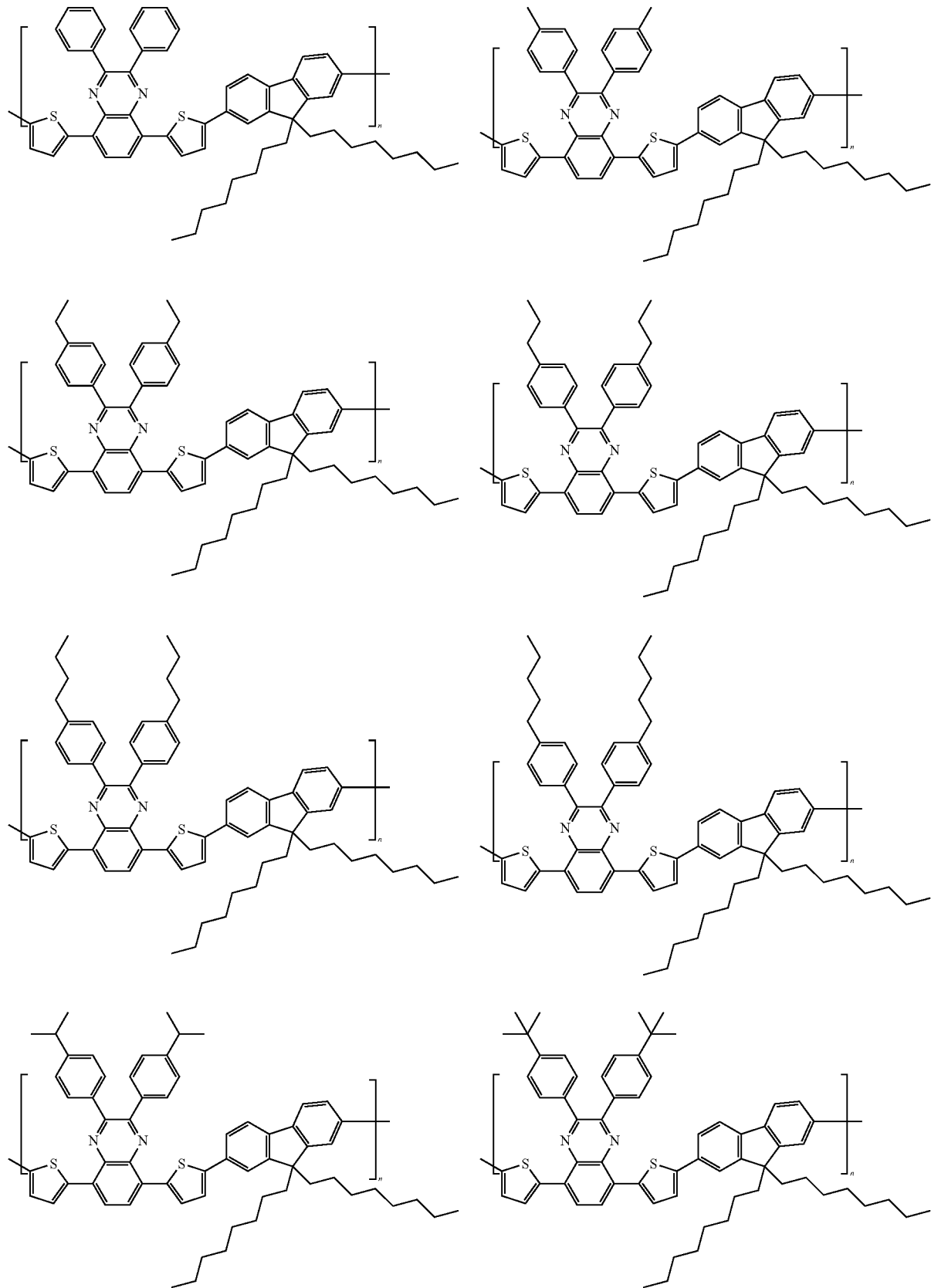

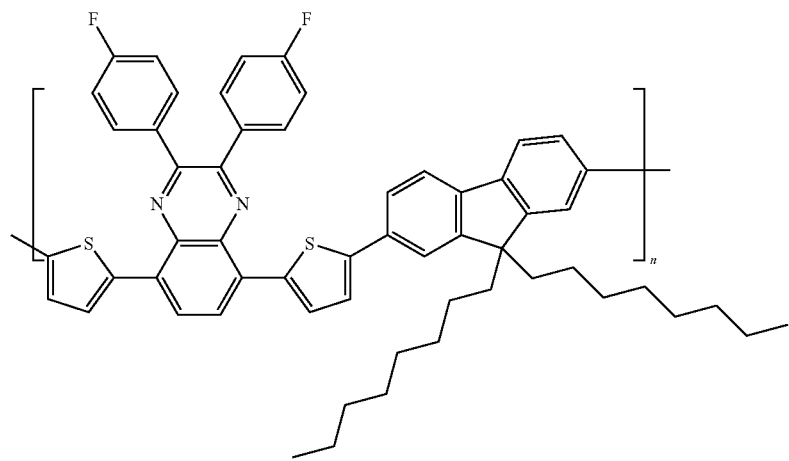
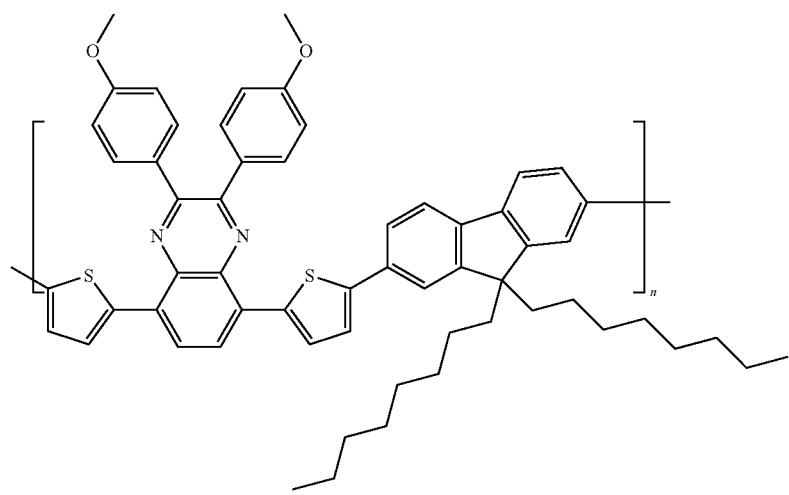
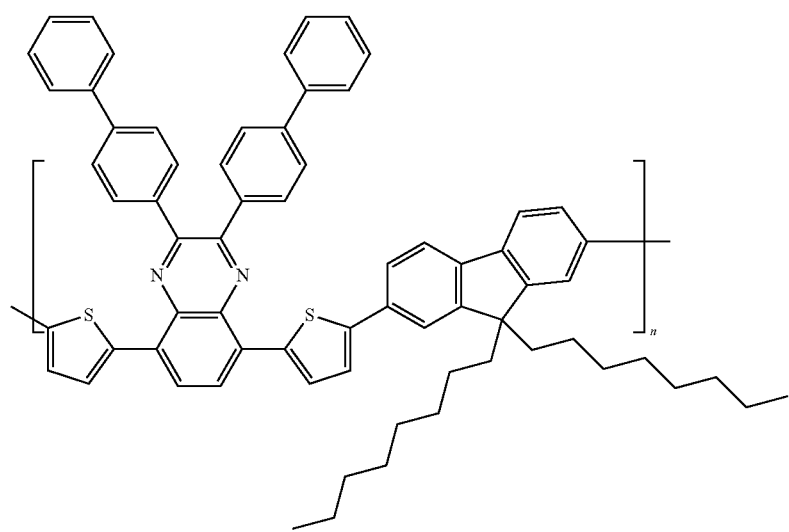

-continued
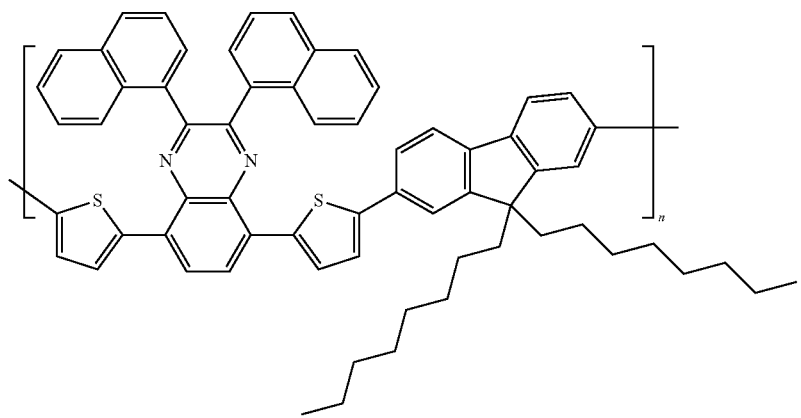
Formula 6
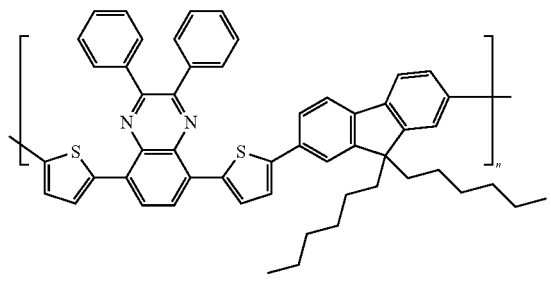
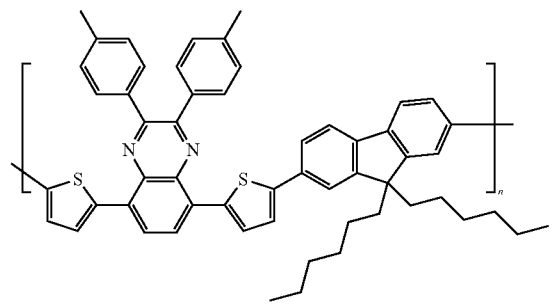
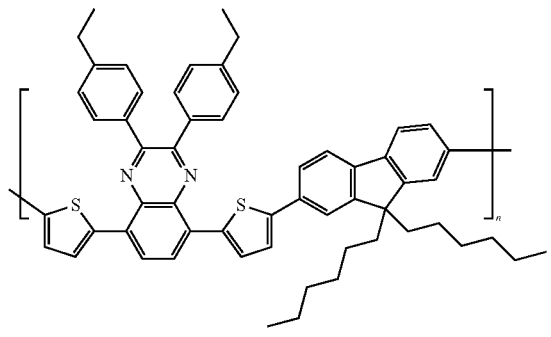
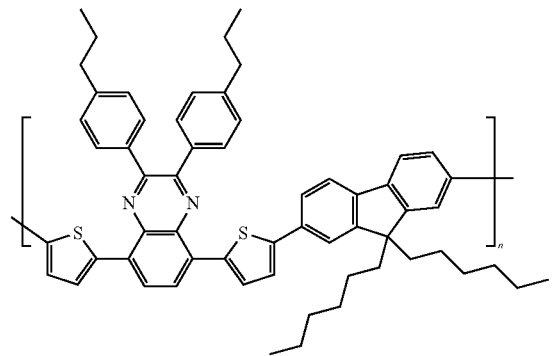
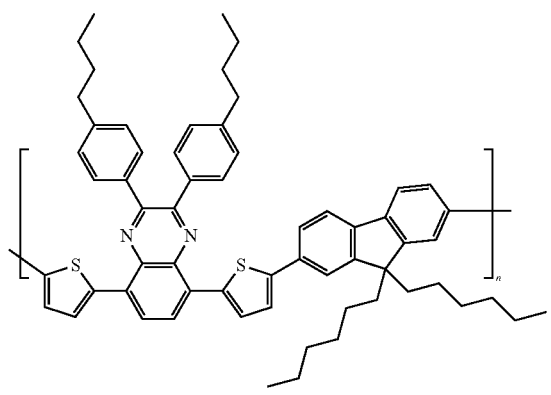
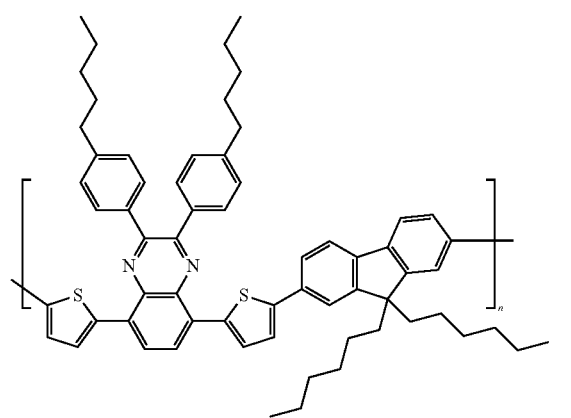

-continued
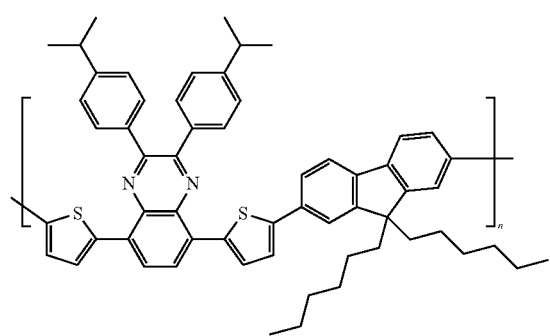
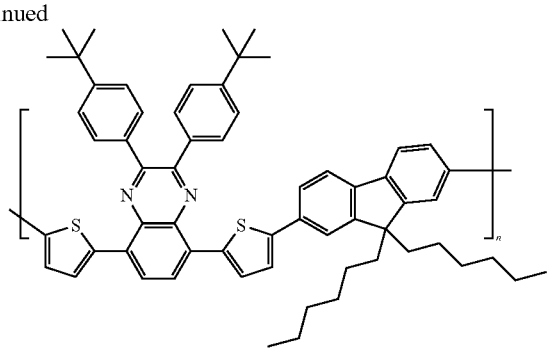
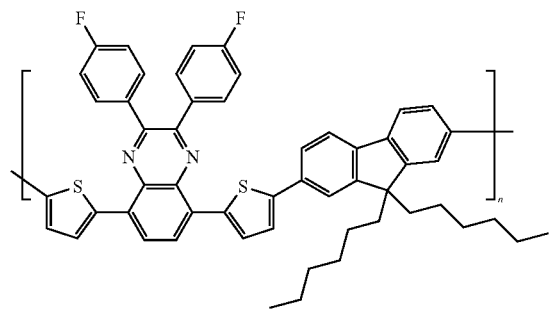
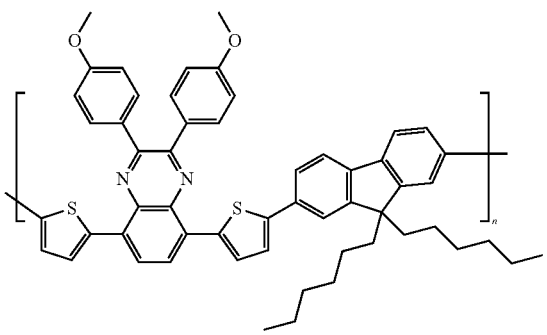
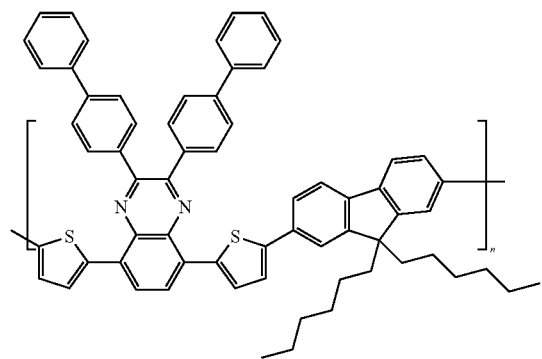
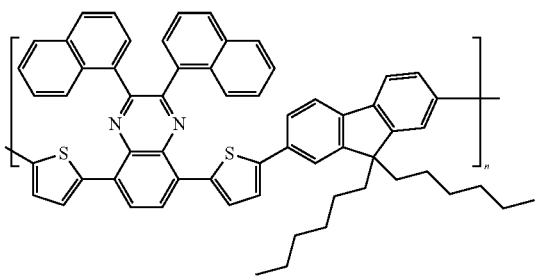
Formula 7
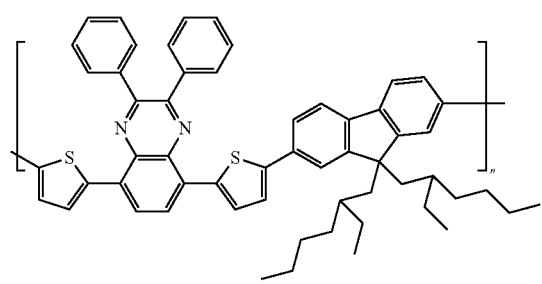
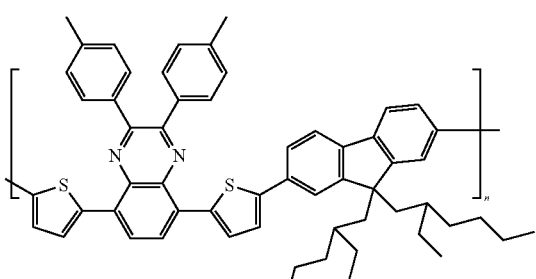
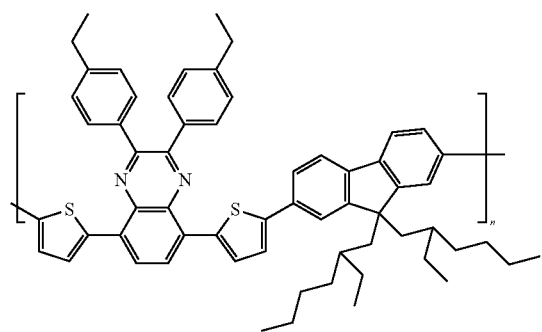
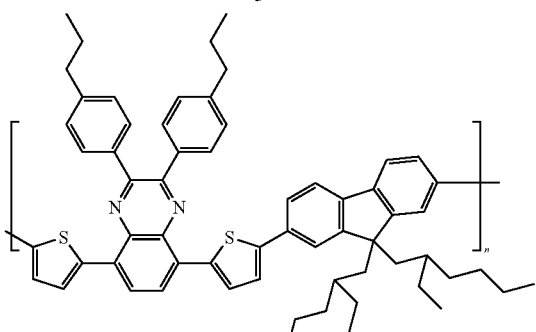

-continued
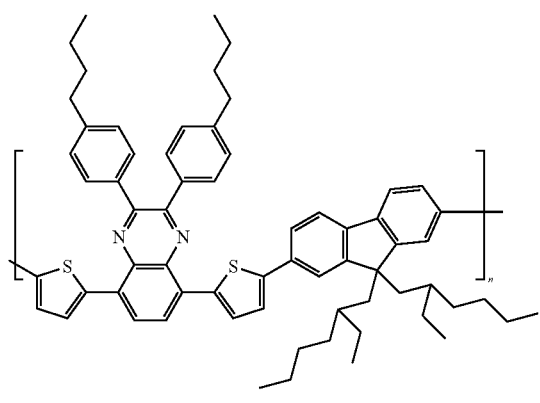
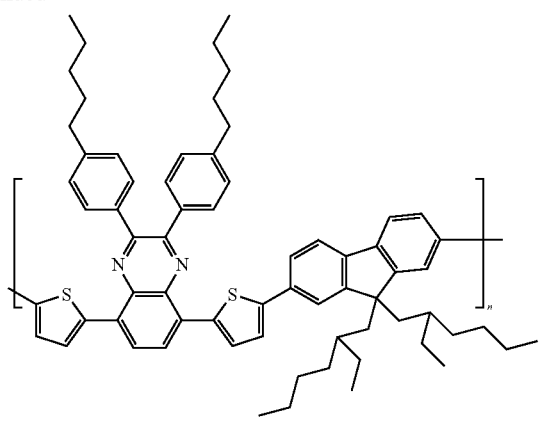
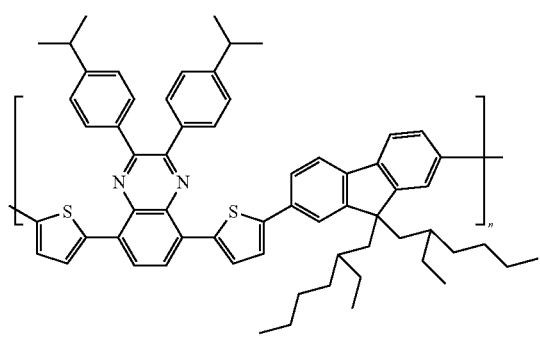
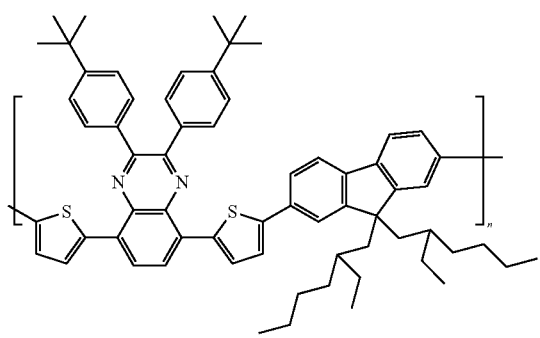
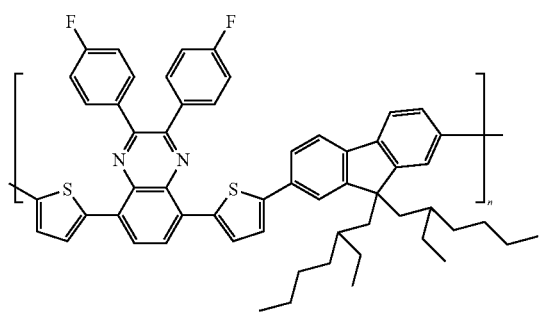
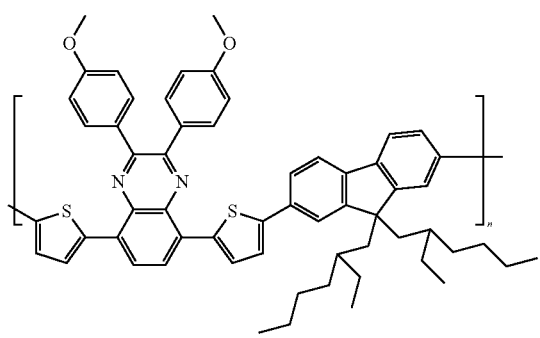
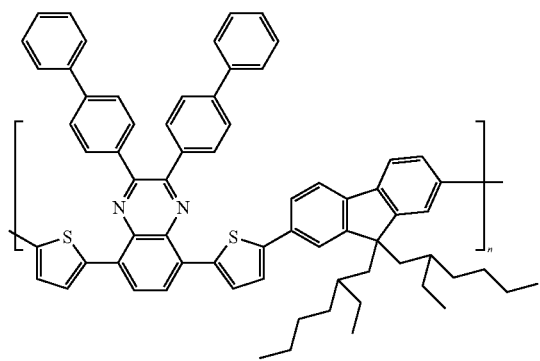
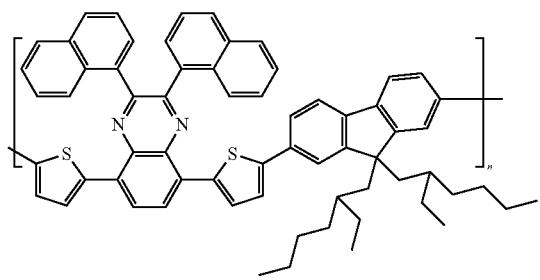

Formula 8
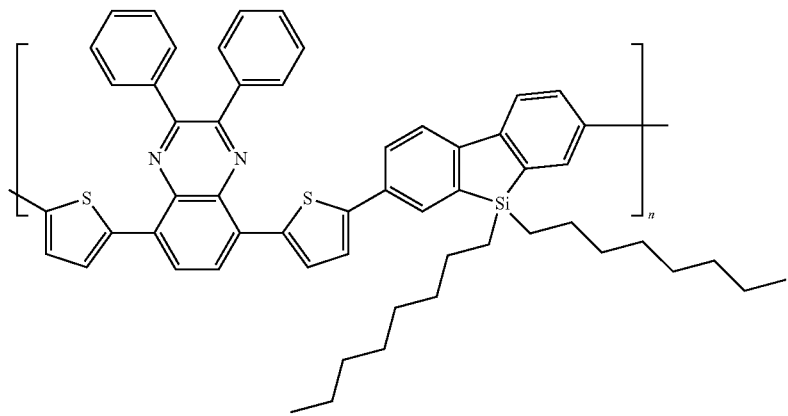
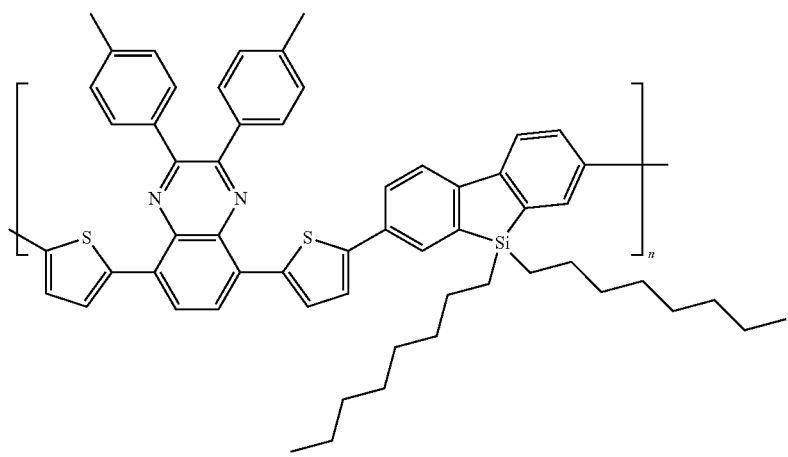
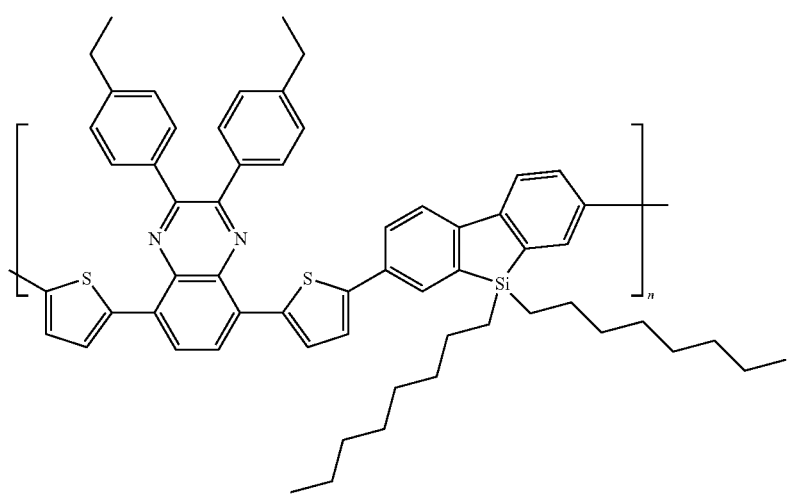

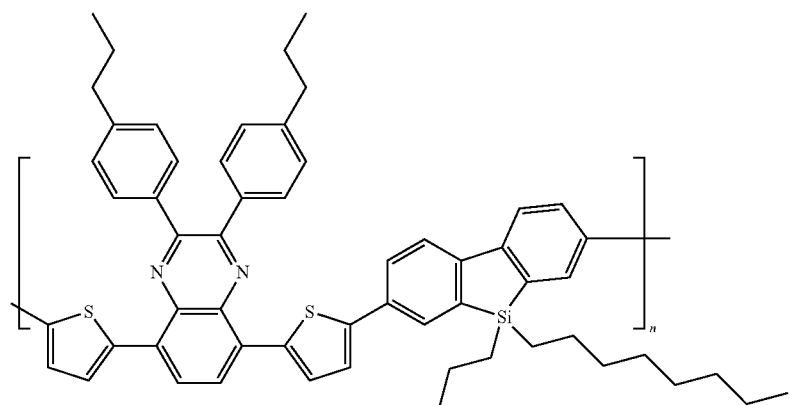
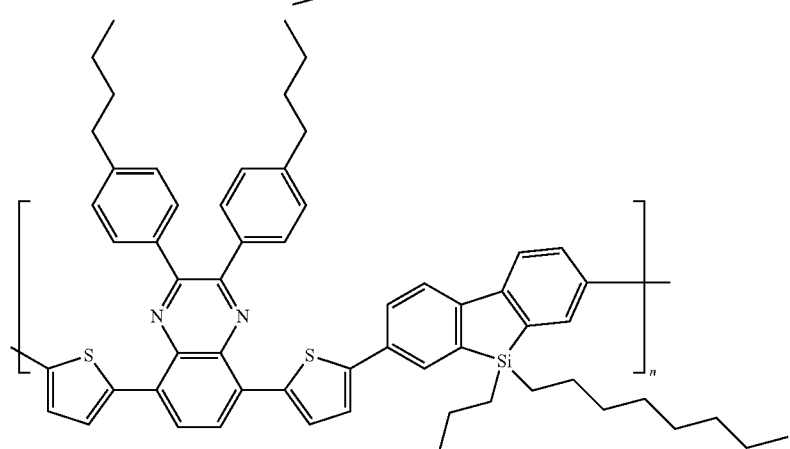
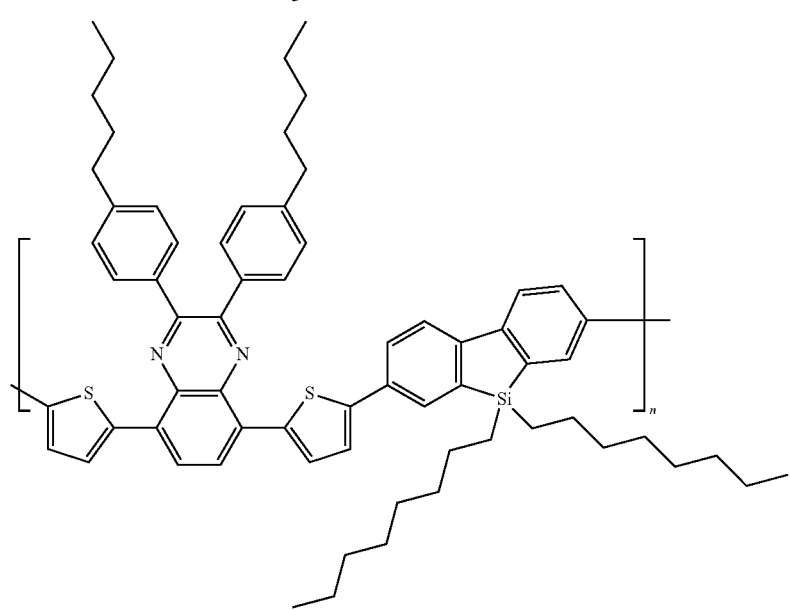

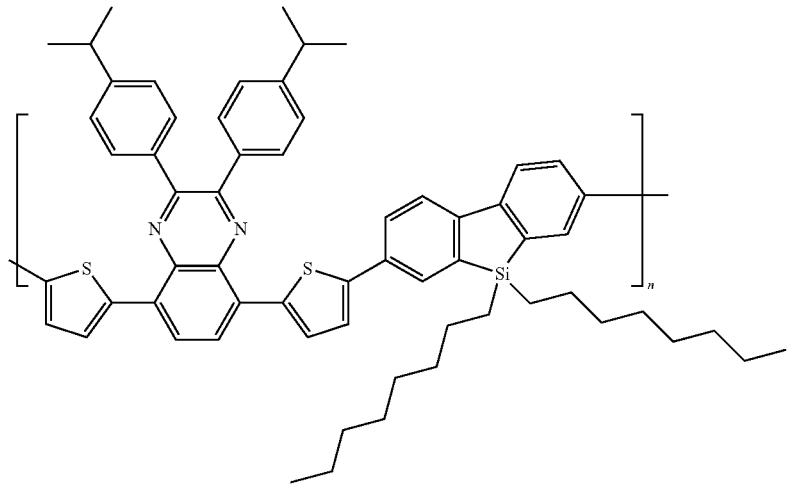
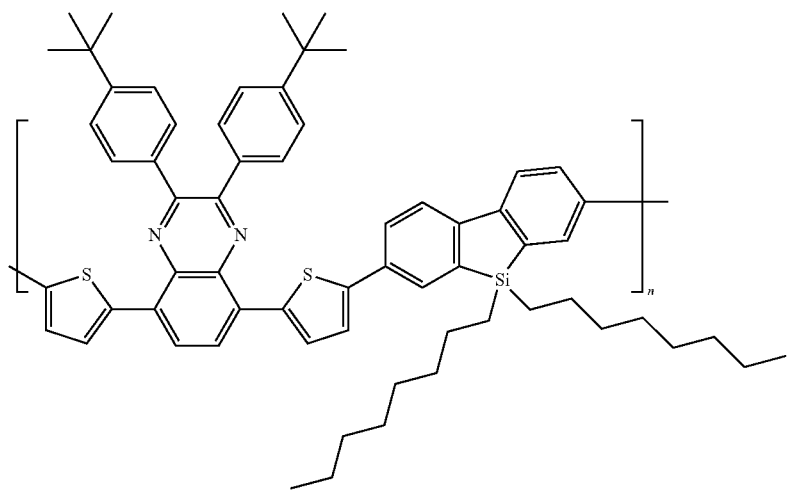
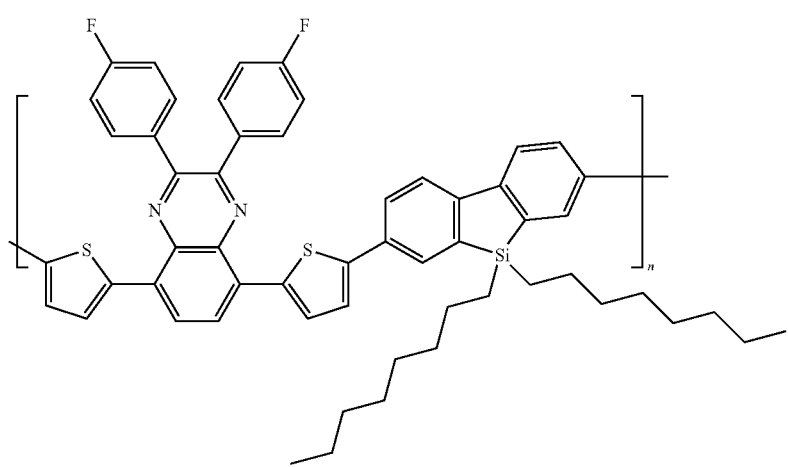

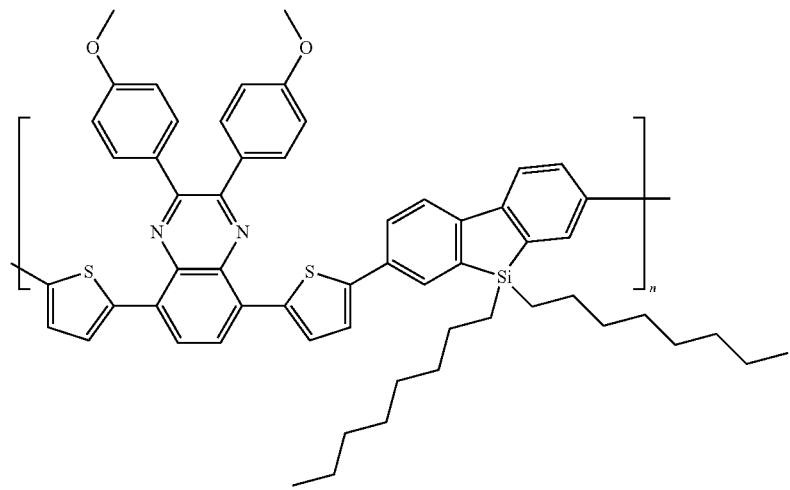
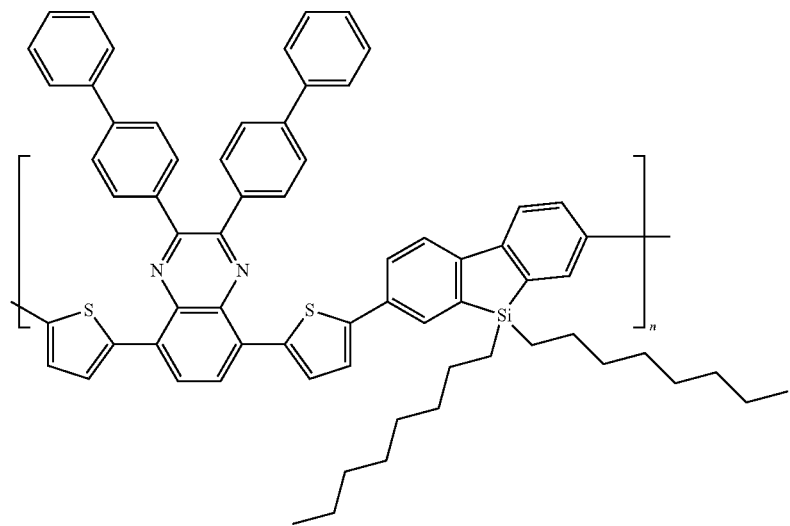
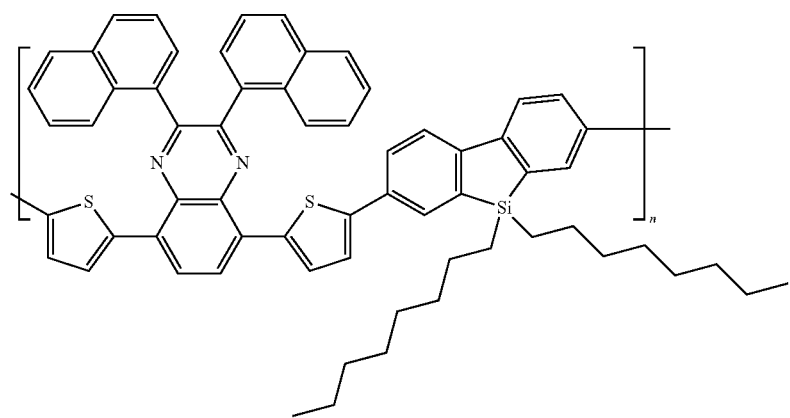

Formula 9
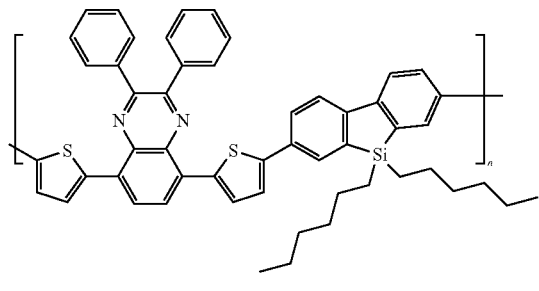
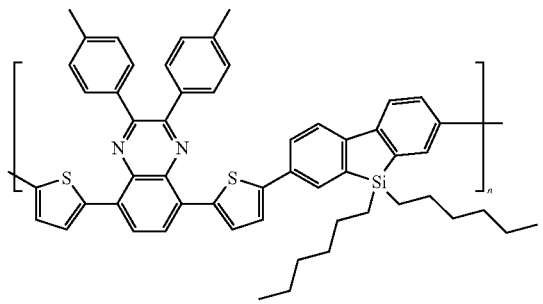
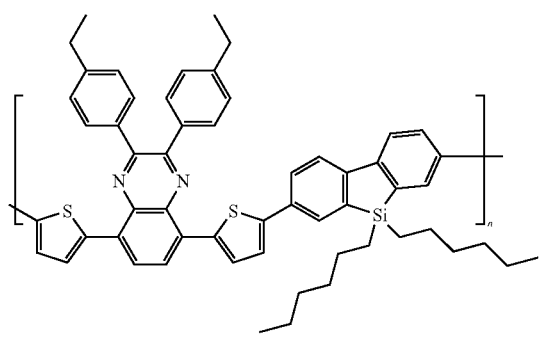
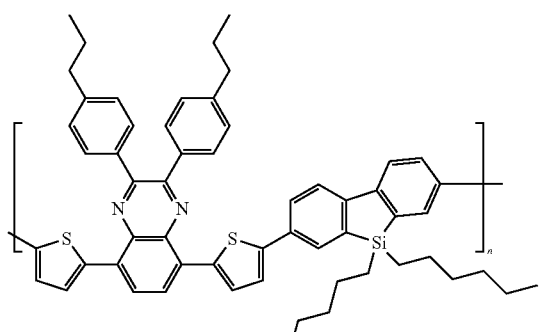
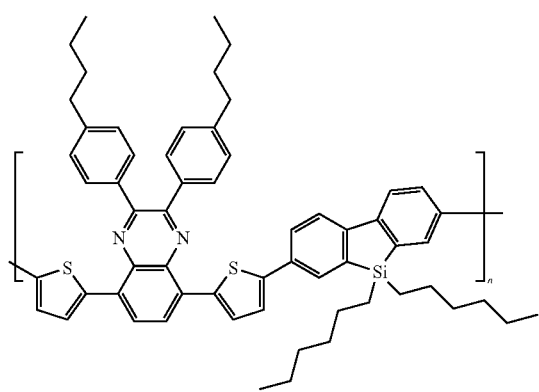
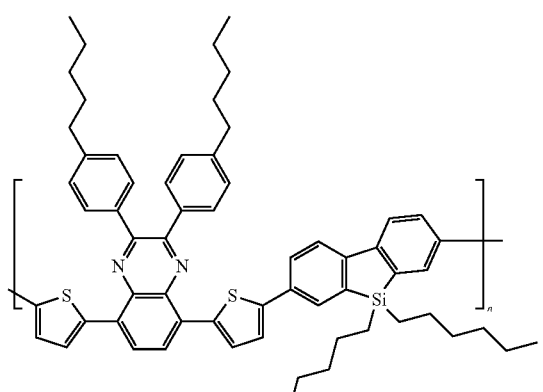
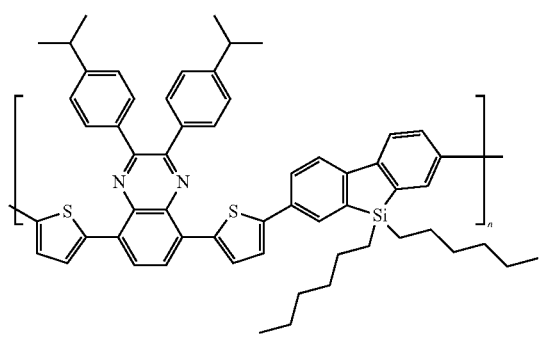
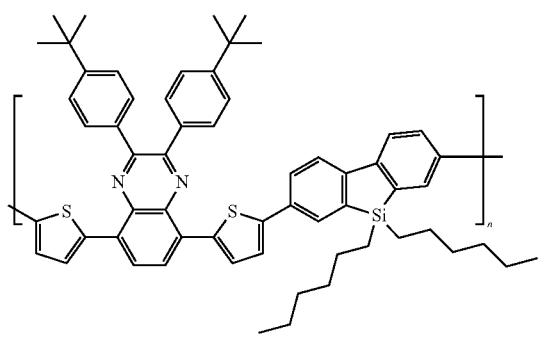

-continued
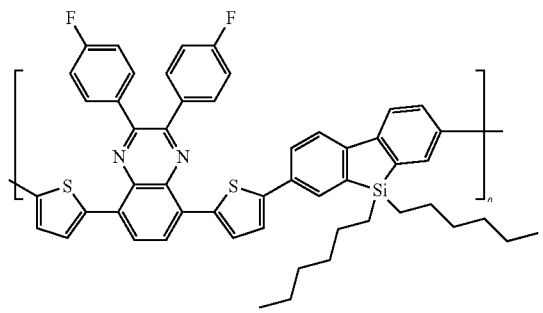
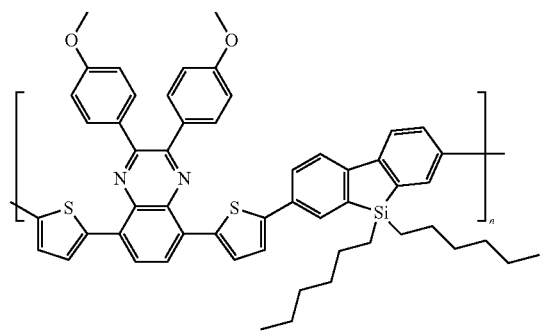
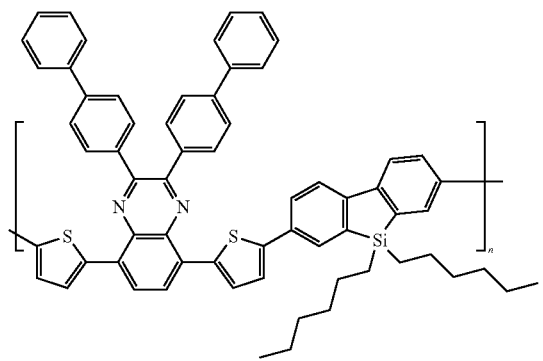
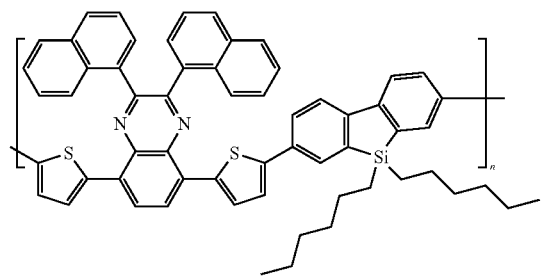
Formula 10
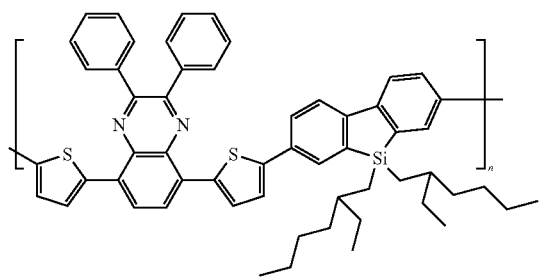
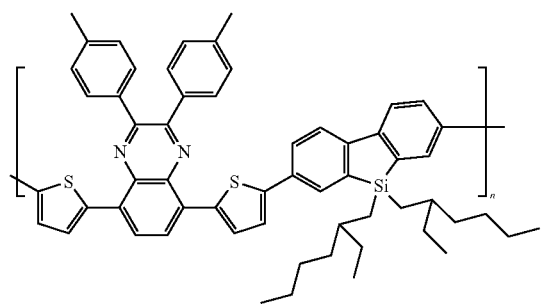
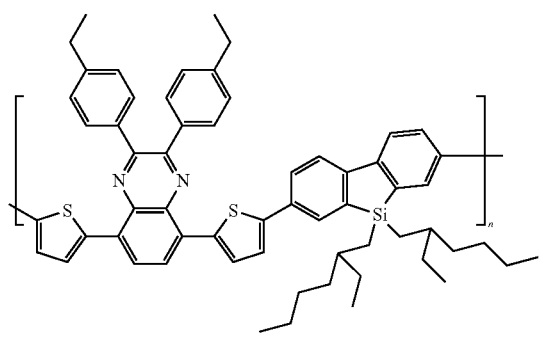
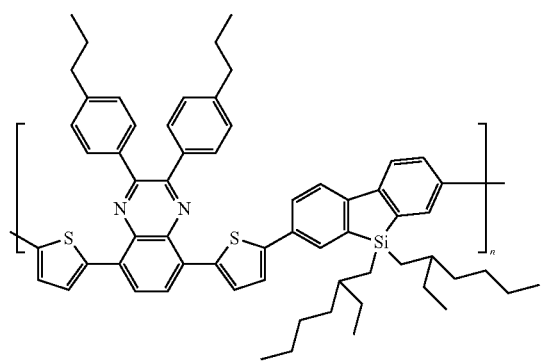

-continued
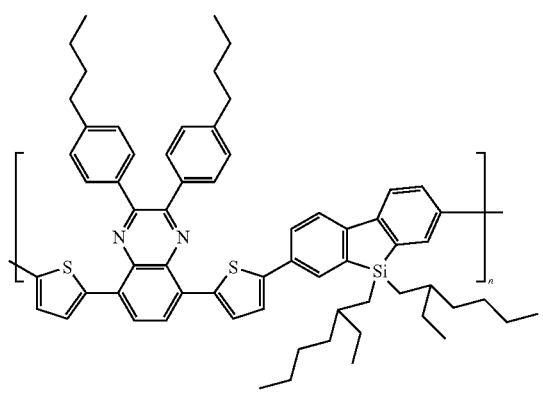
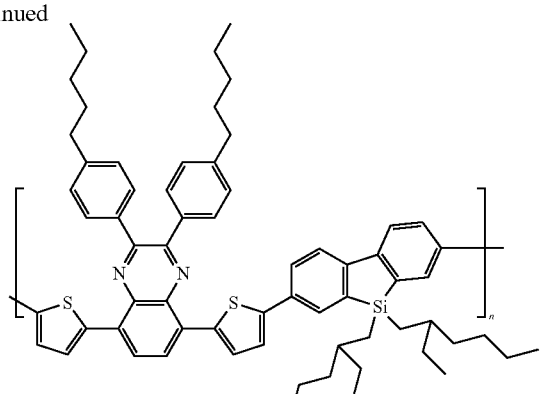
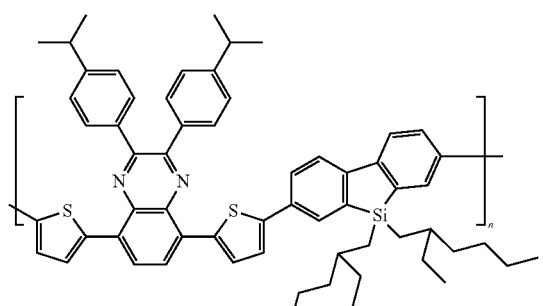
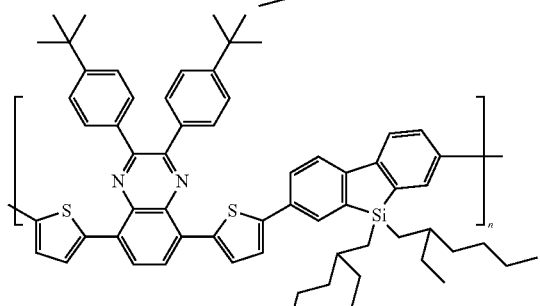
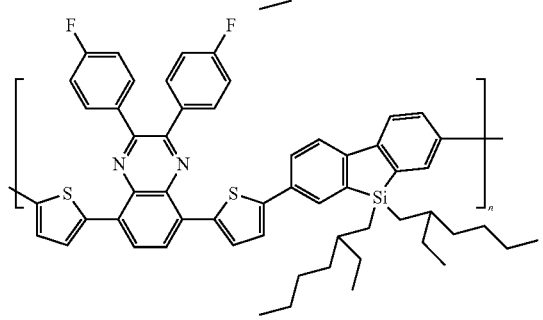
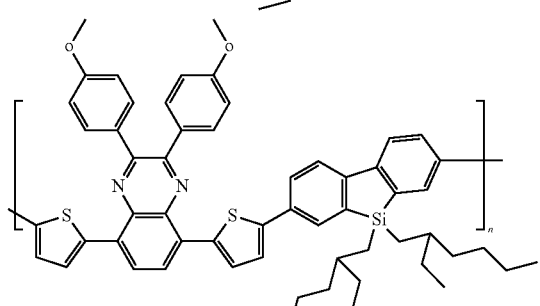
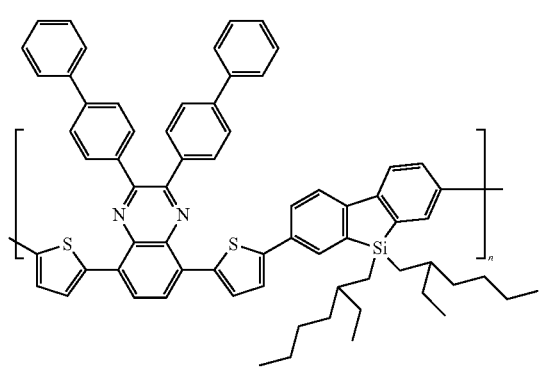
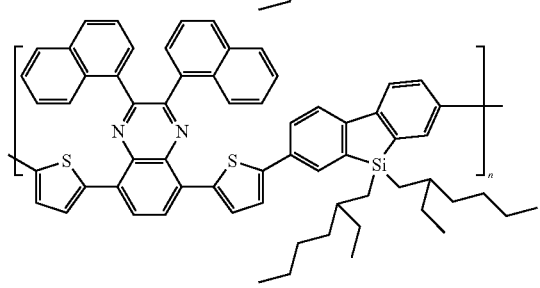
Formula 11
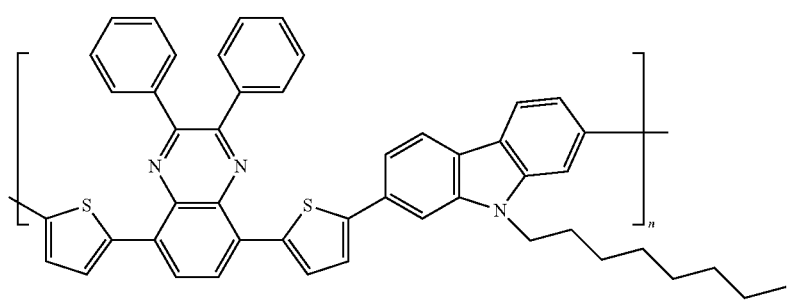

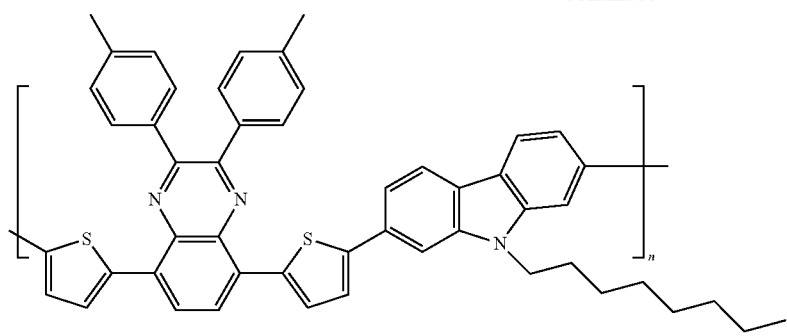
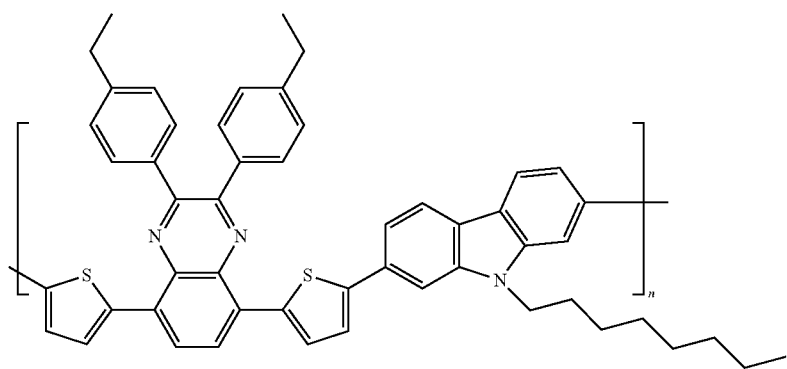
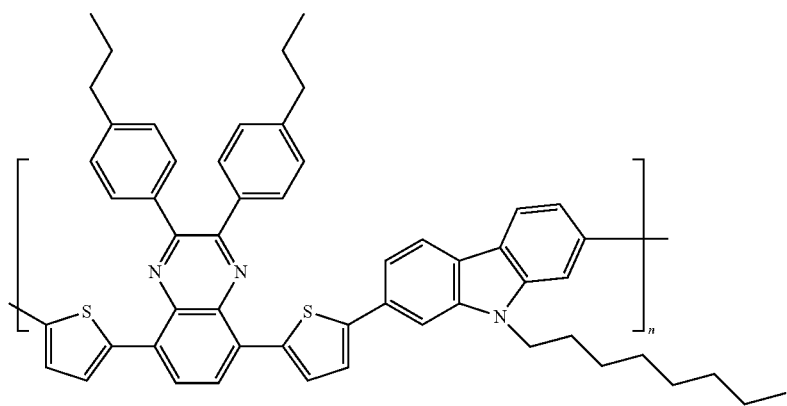
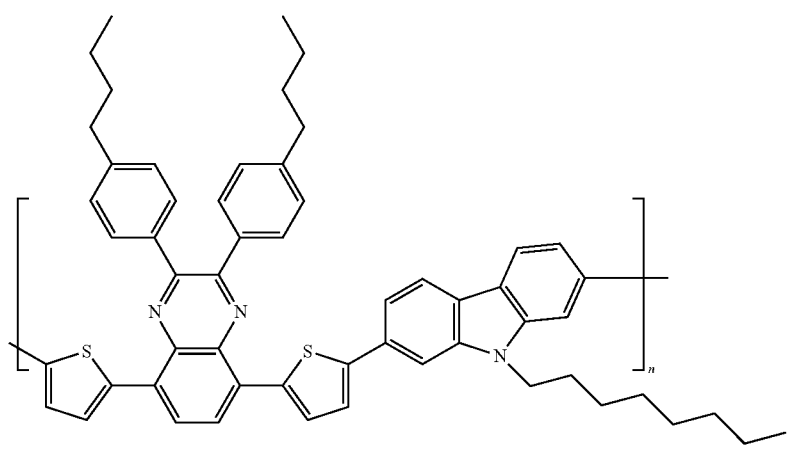

-continued
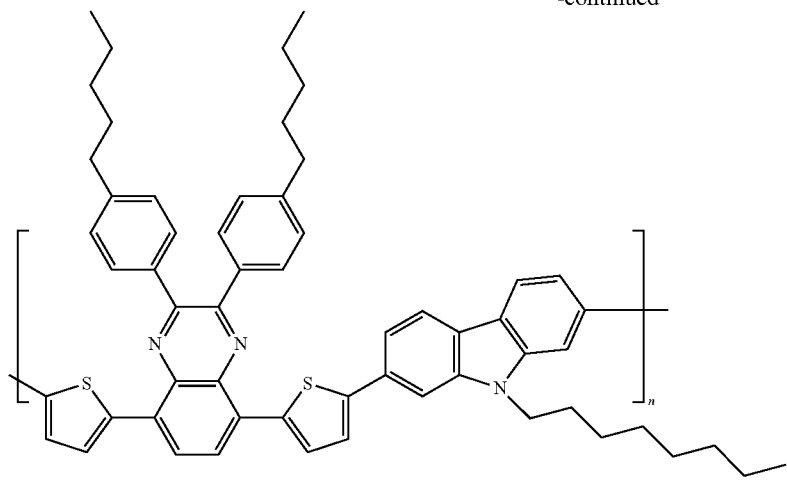
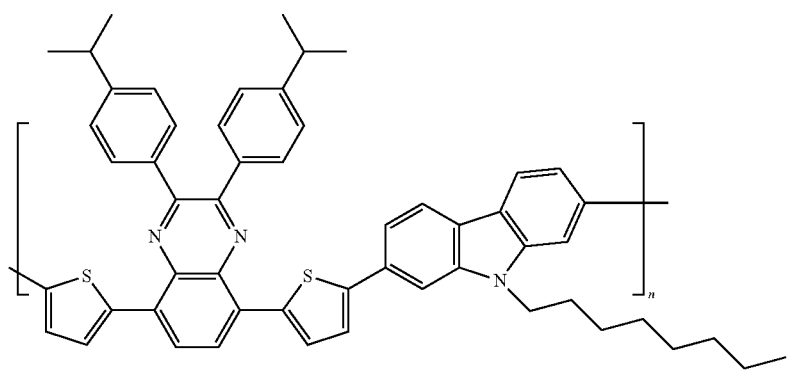
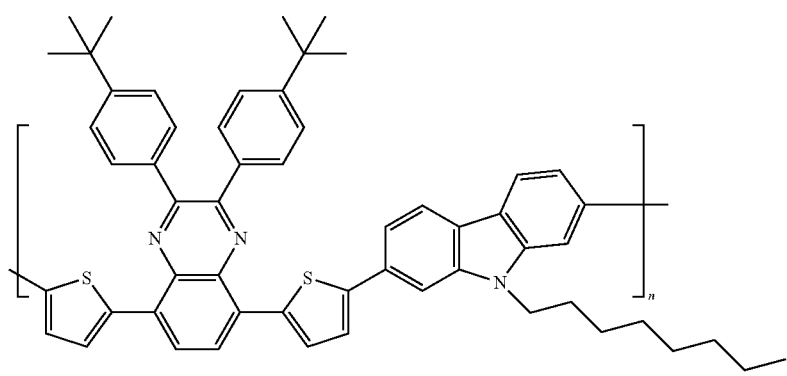
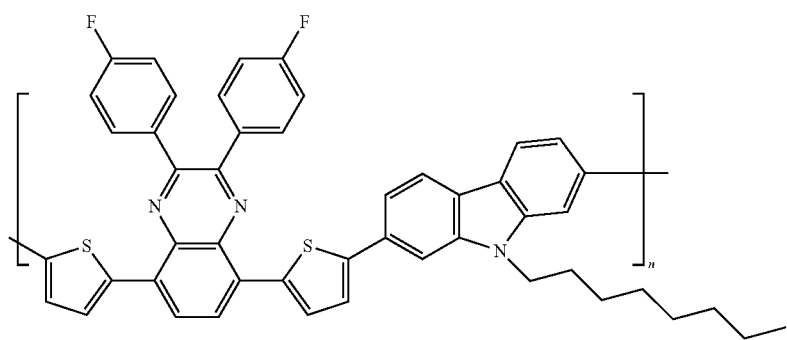

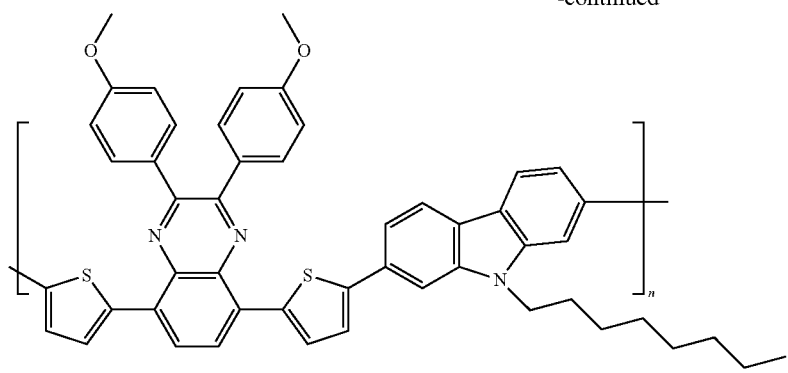
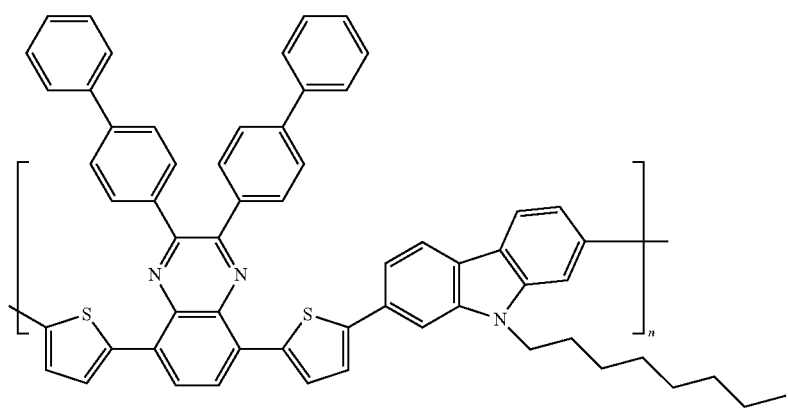
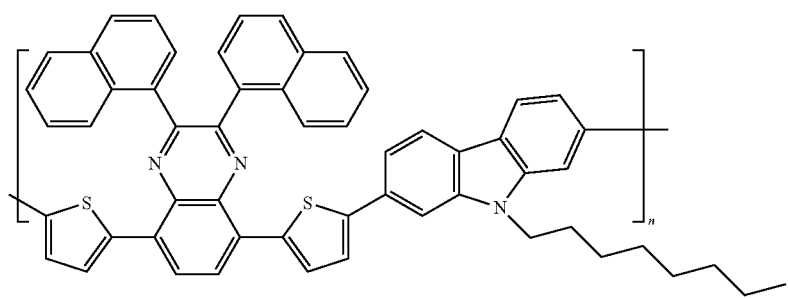
Formula 12
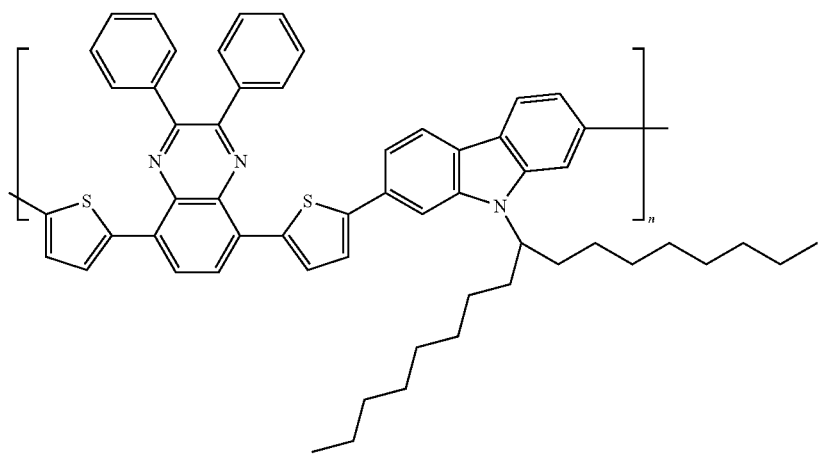

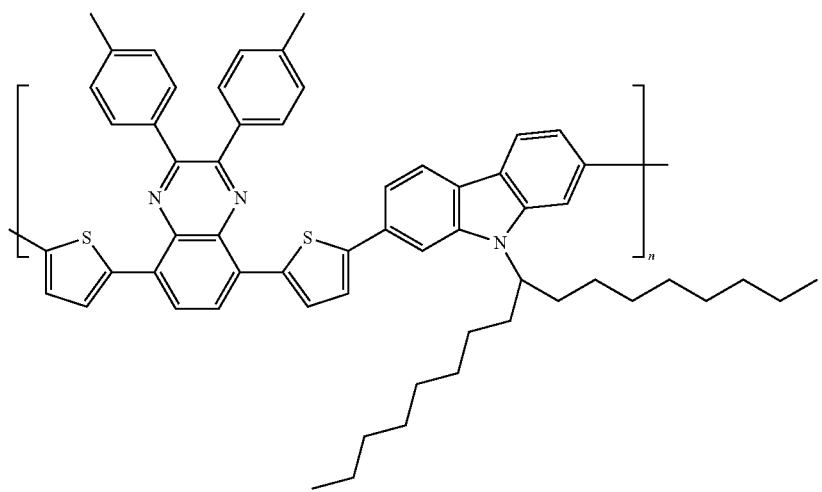
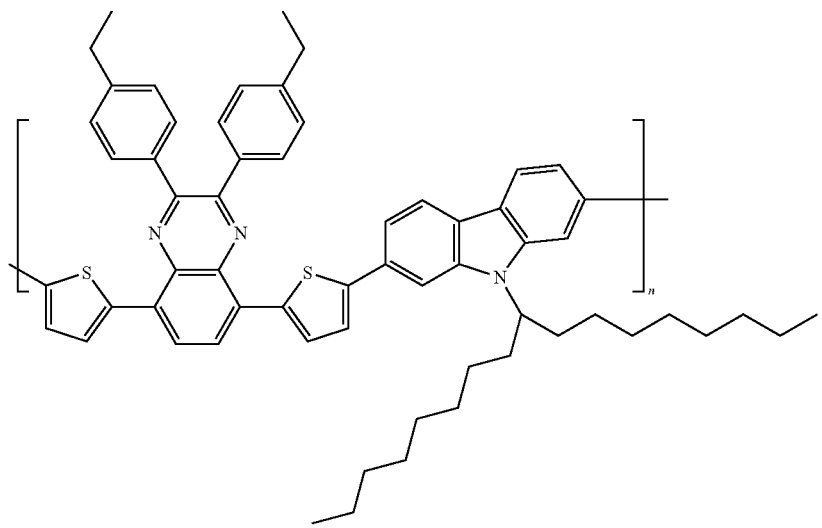
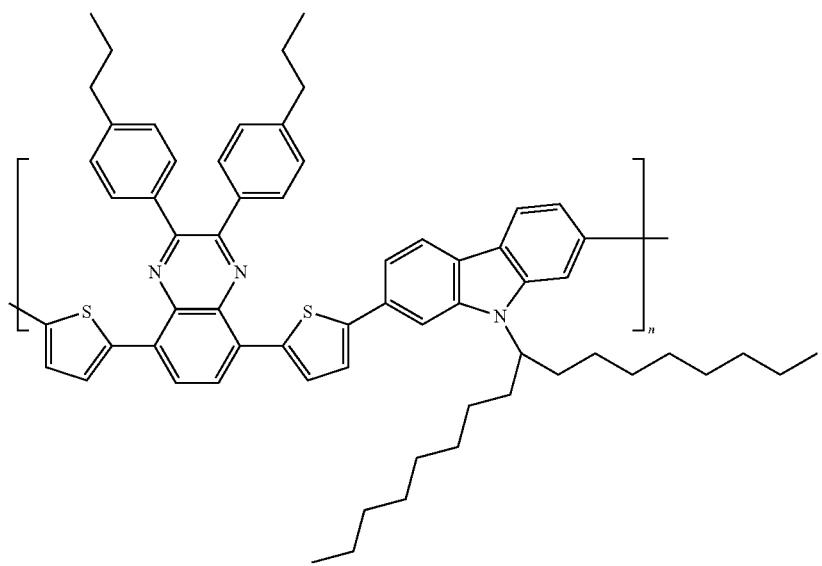

-continued
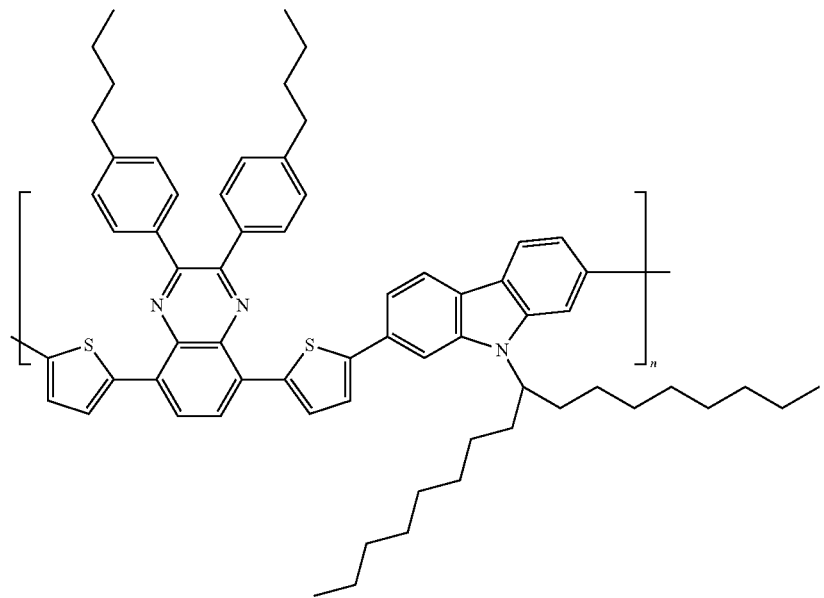
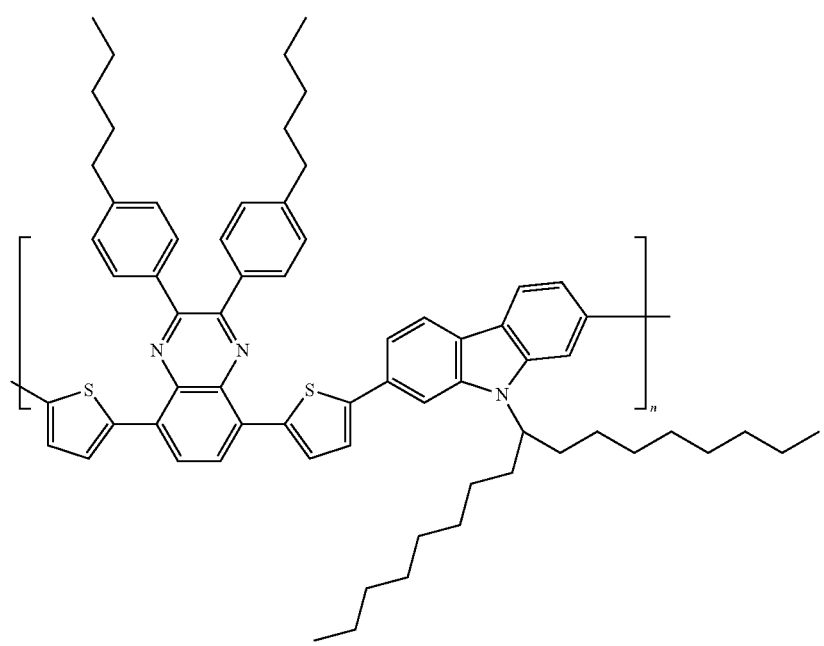

-continued
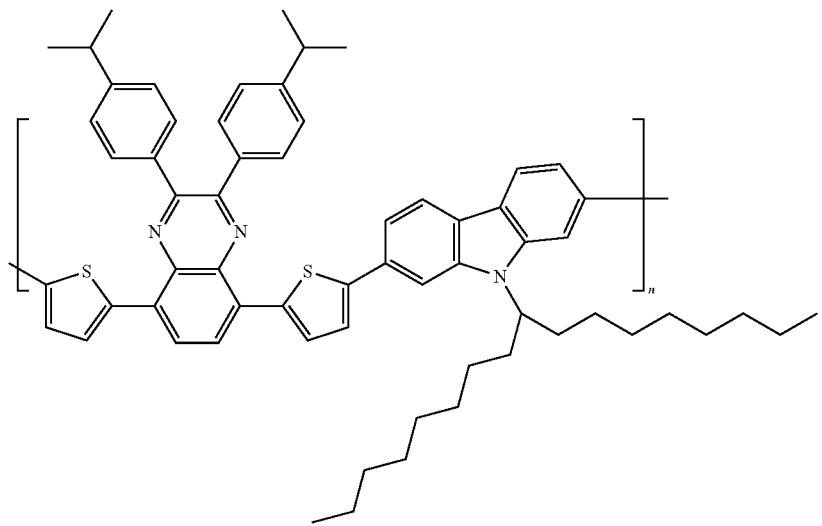
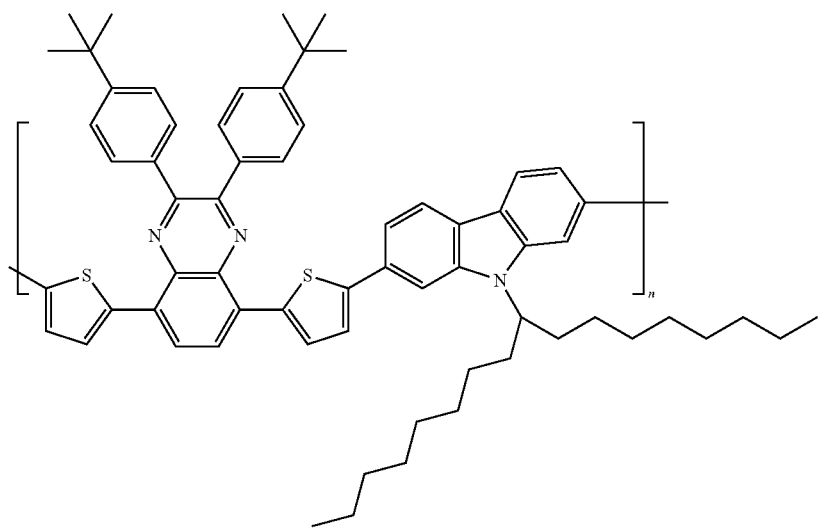
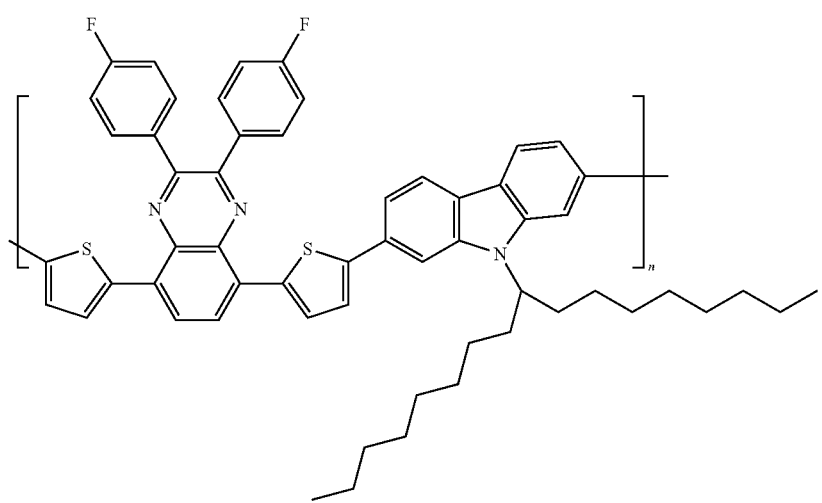

-continued
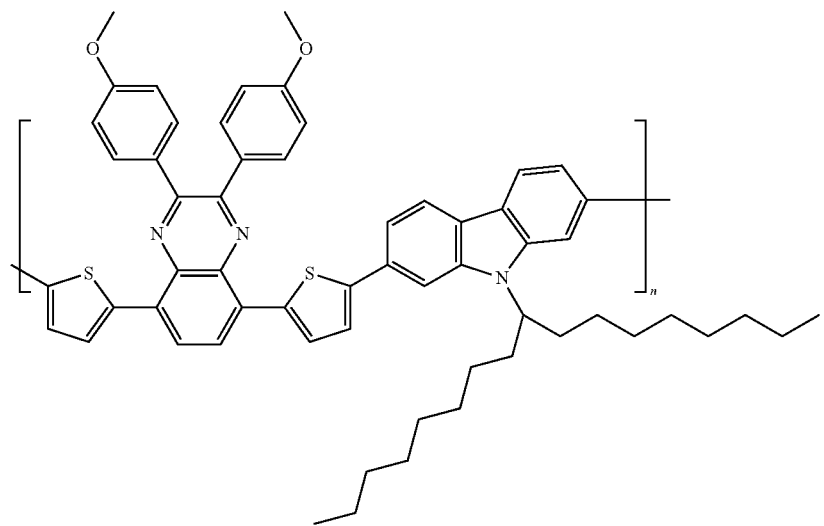
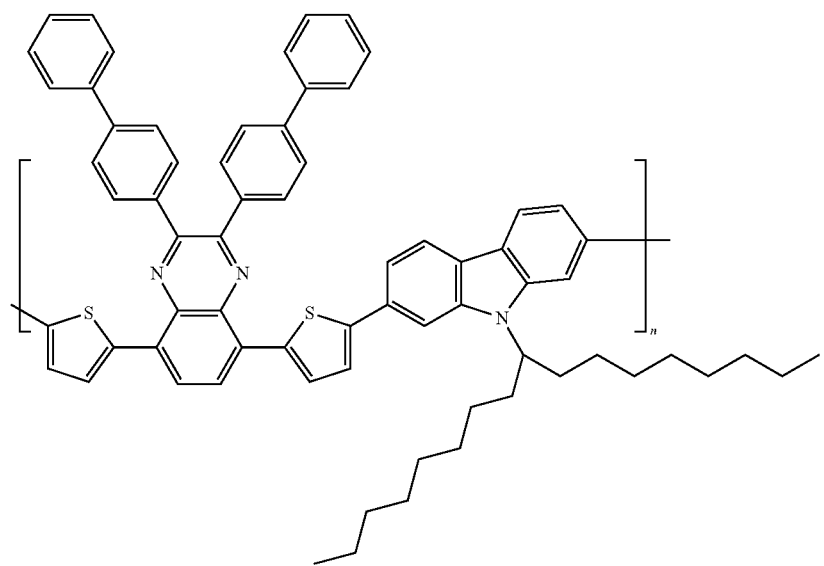
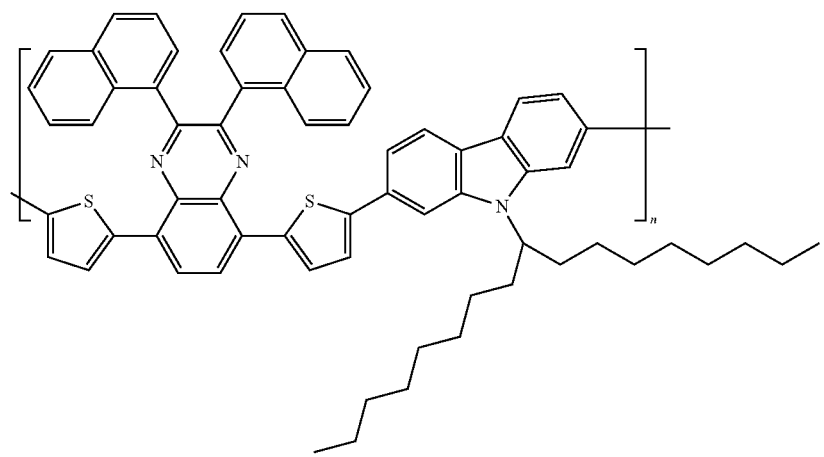

-continued
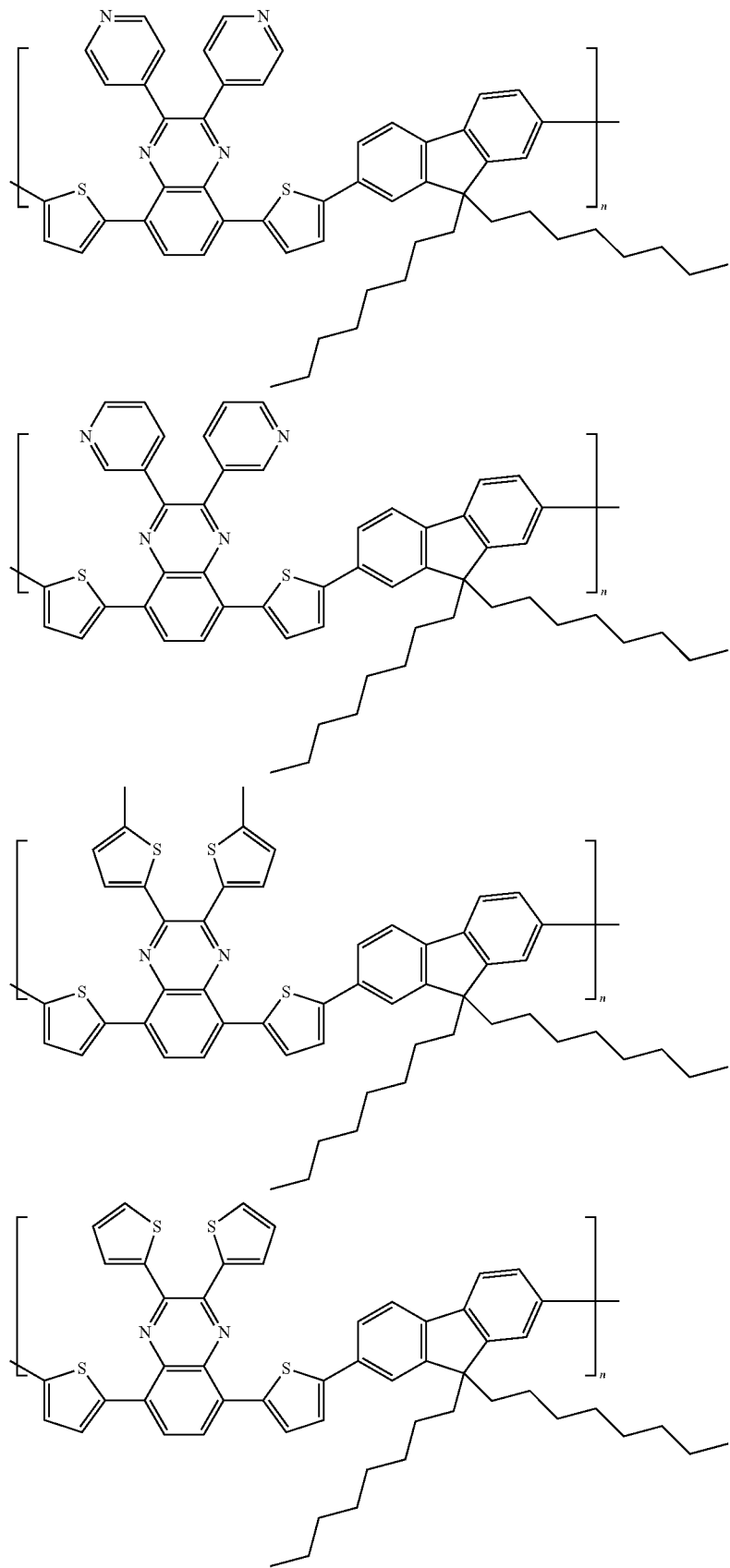
Formula 13

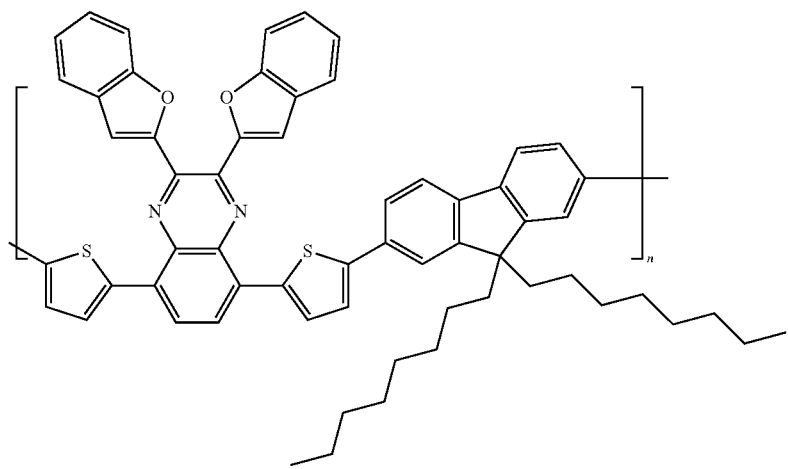
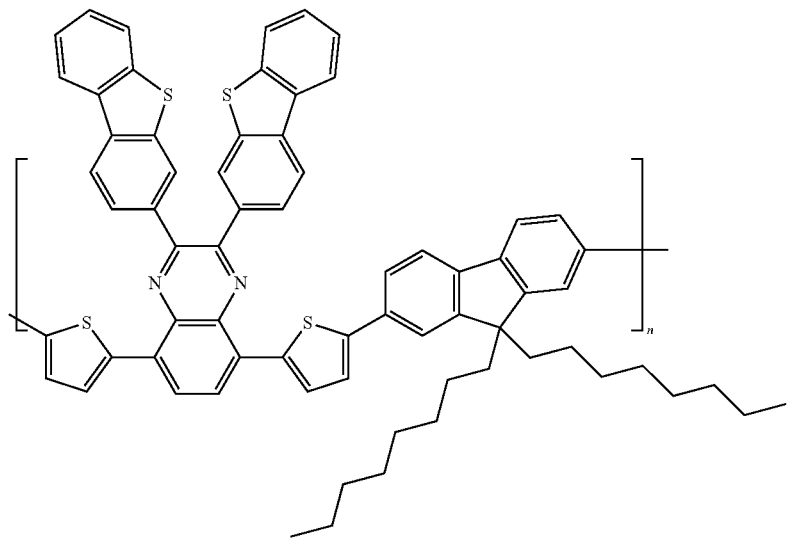
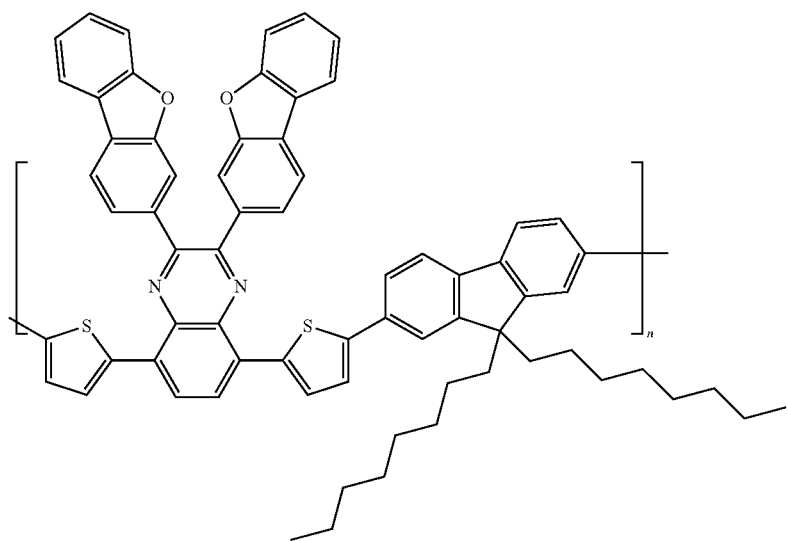

-continued
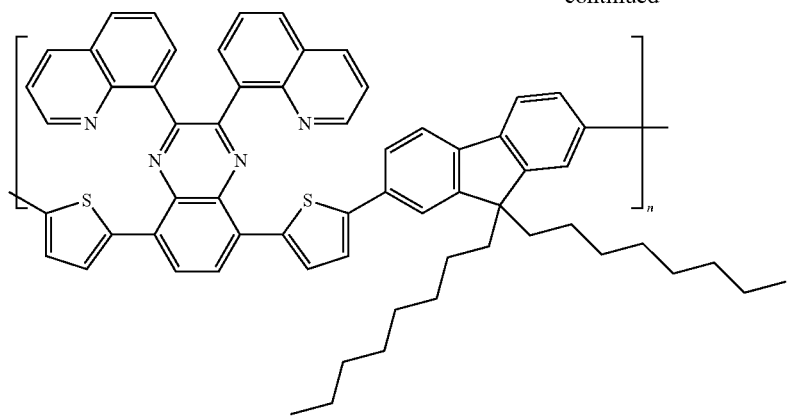
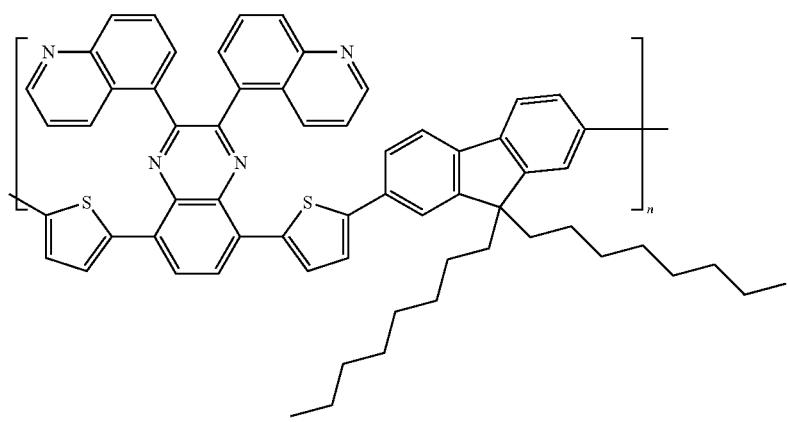
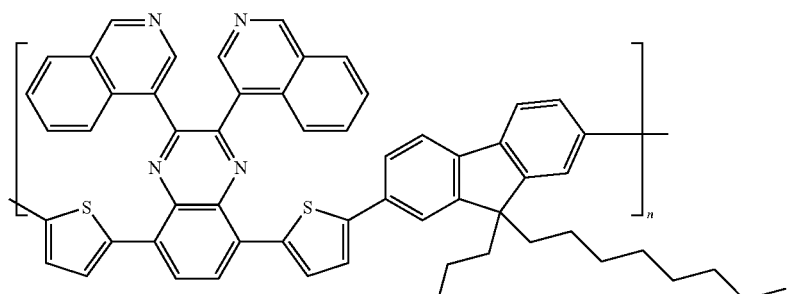
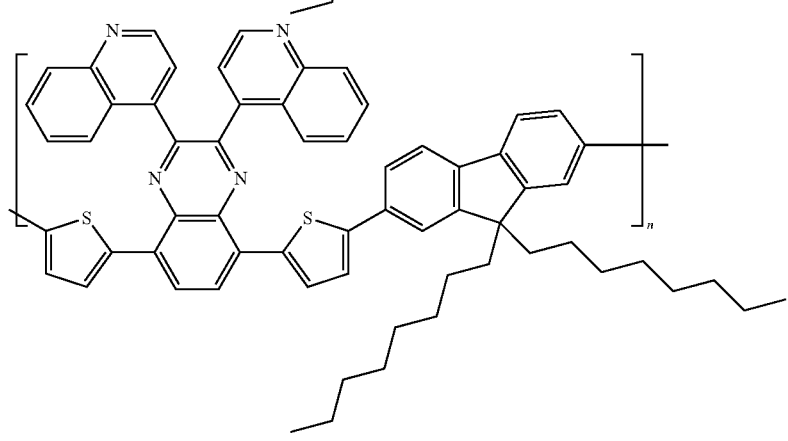

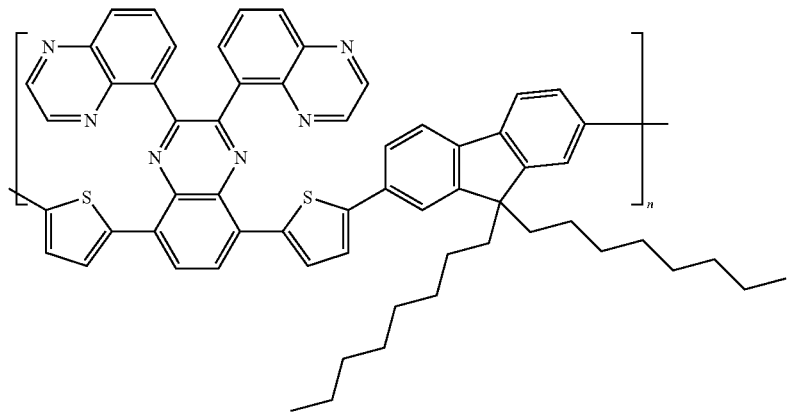
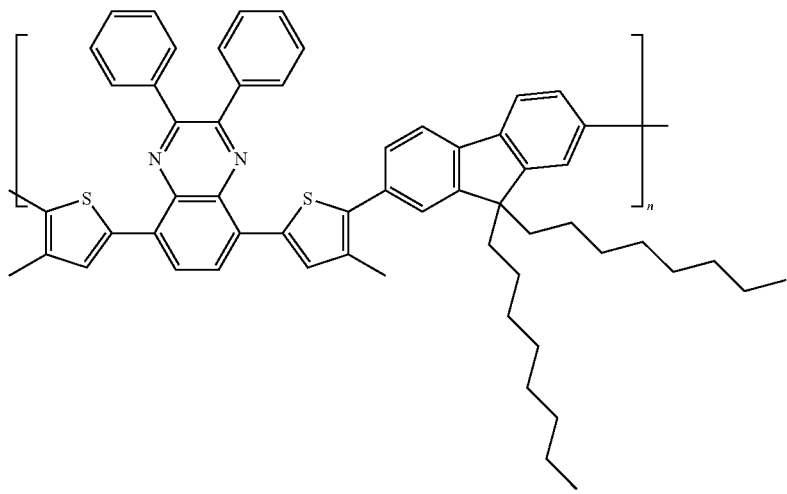
Formula 14
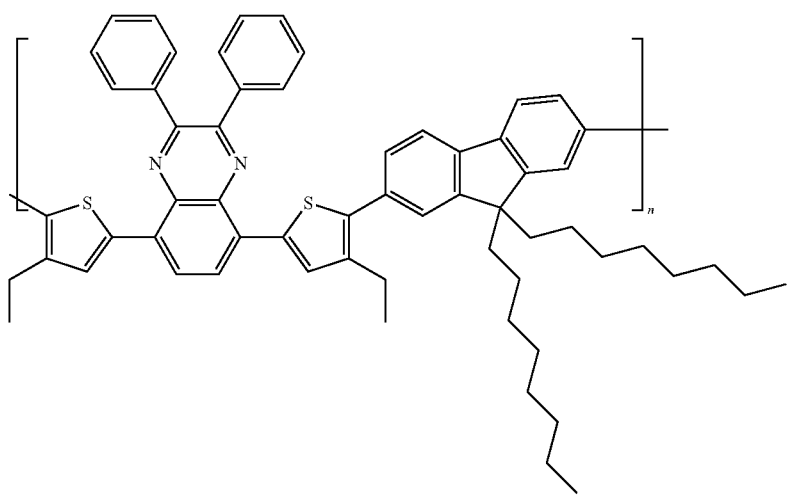

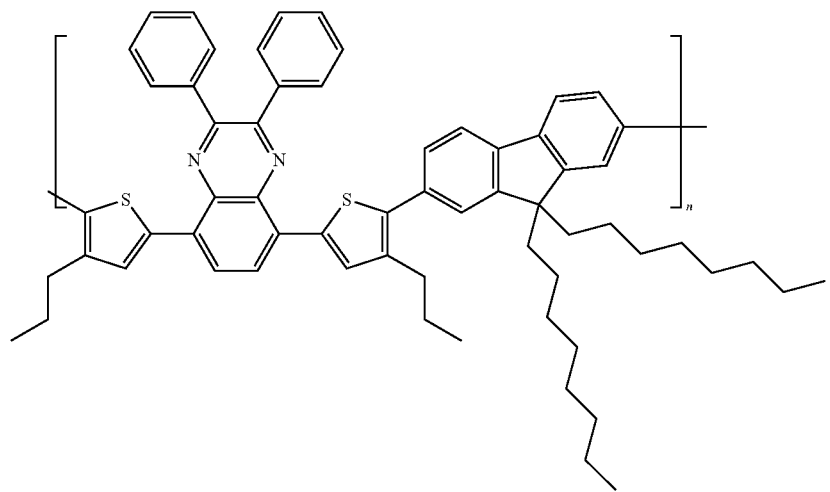
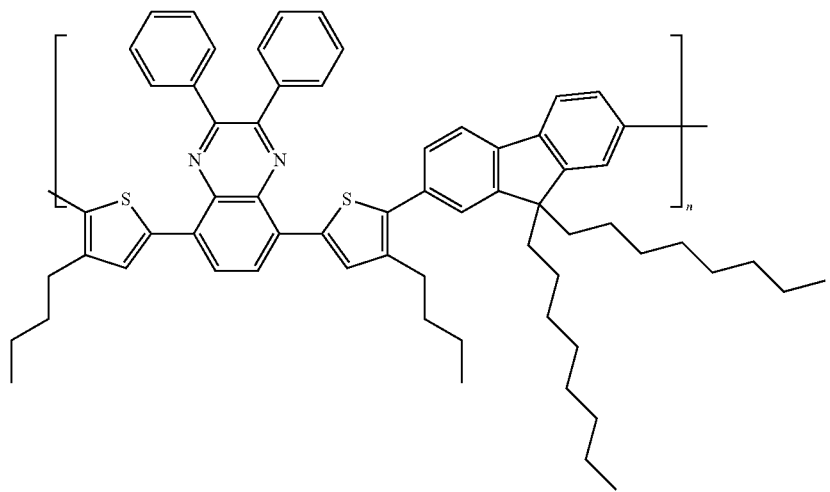
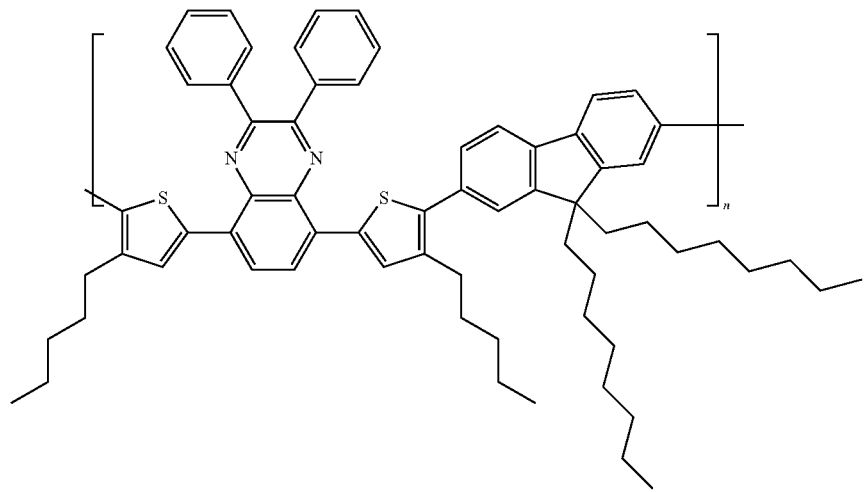

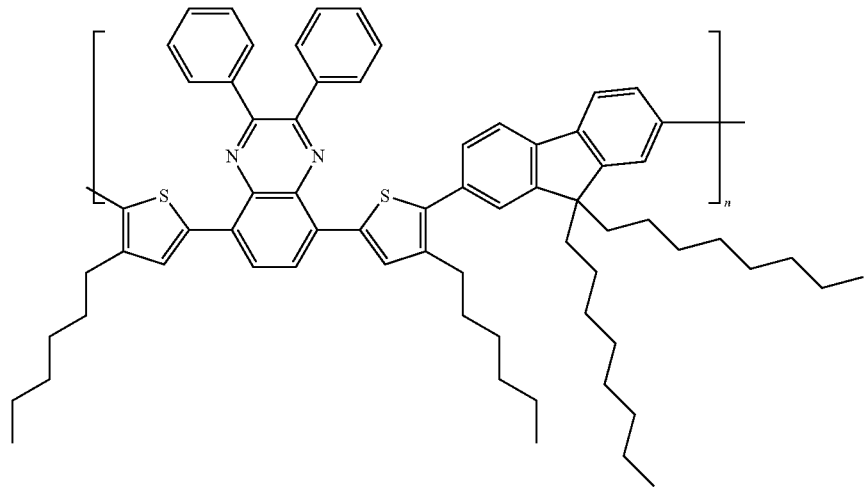
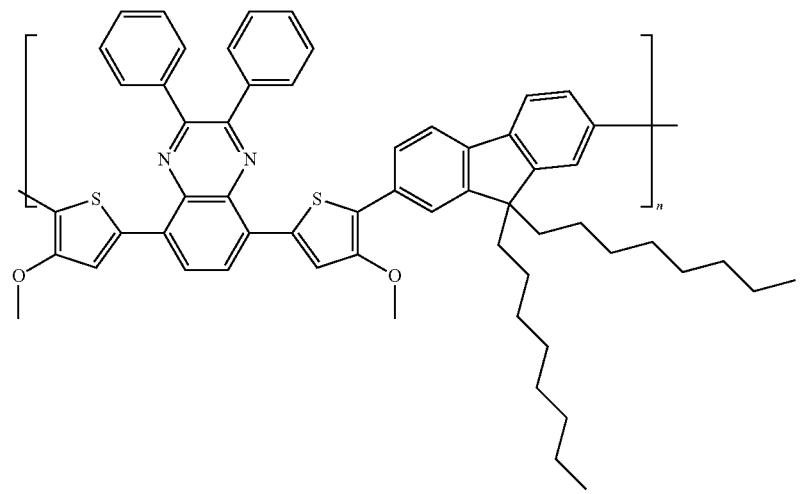
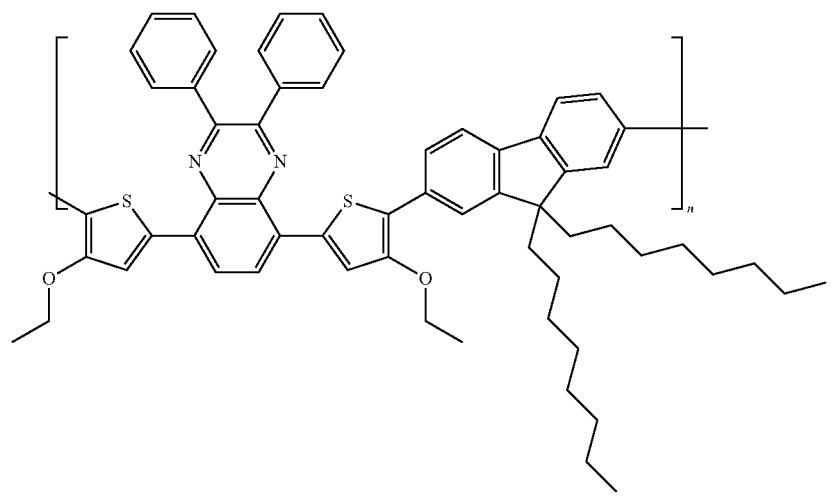

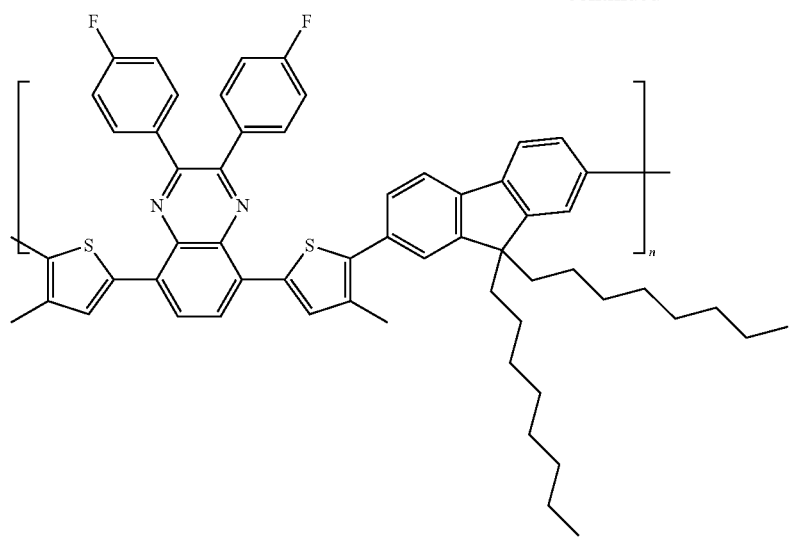
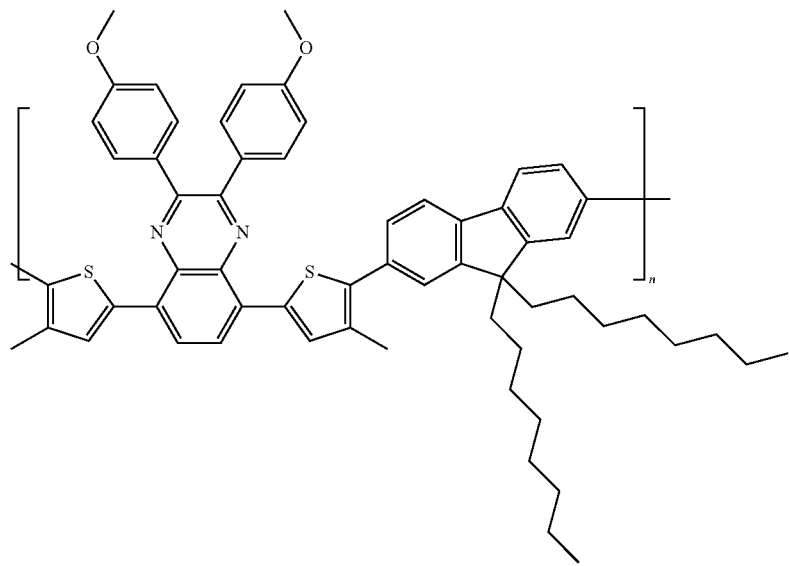
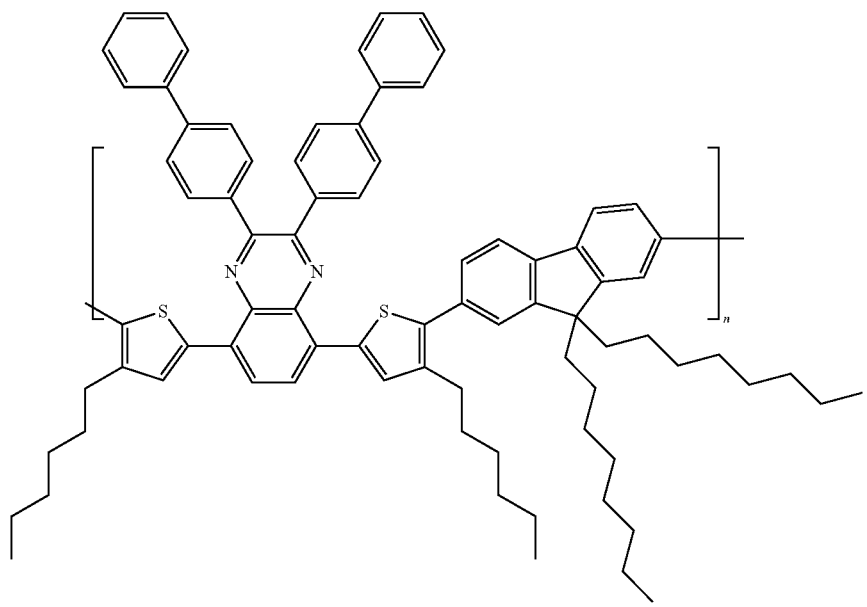

-continued
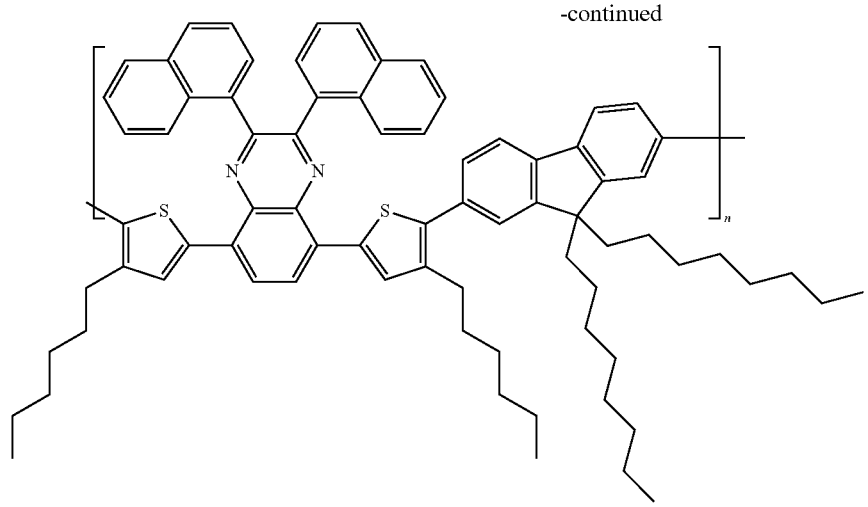
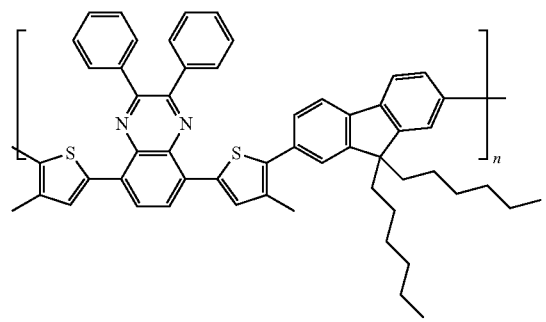
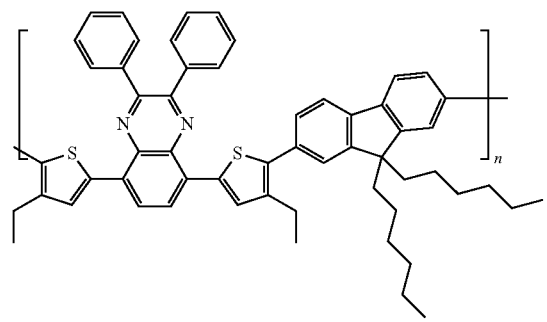
Formula 15
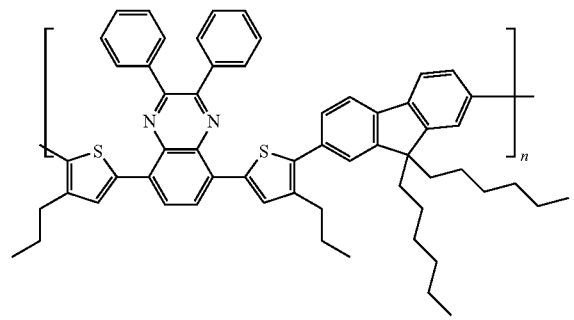
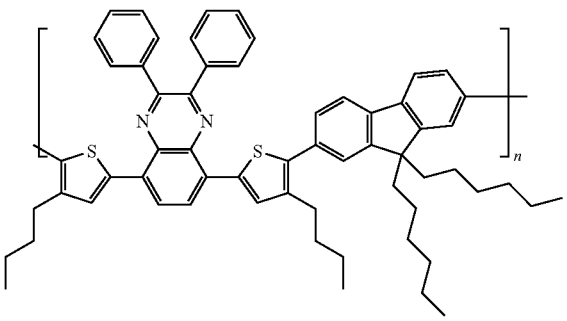
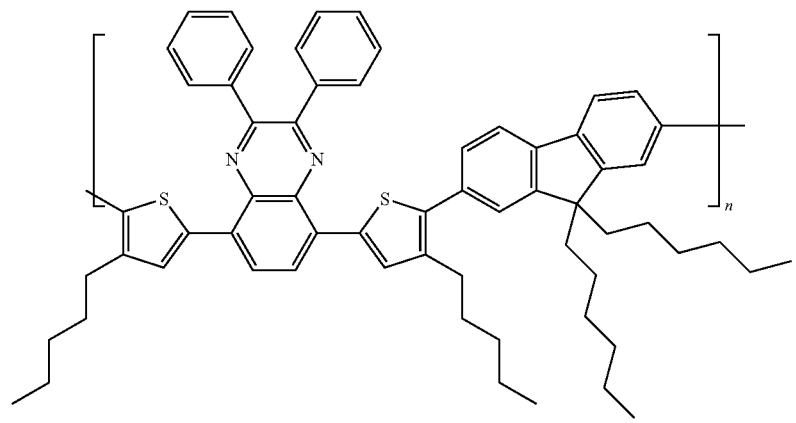

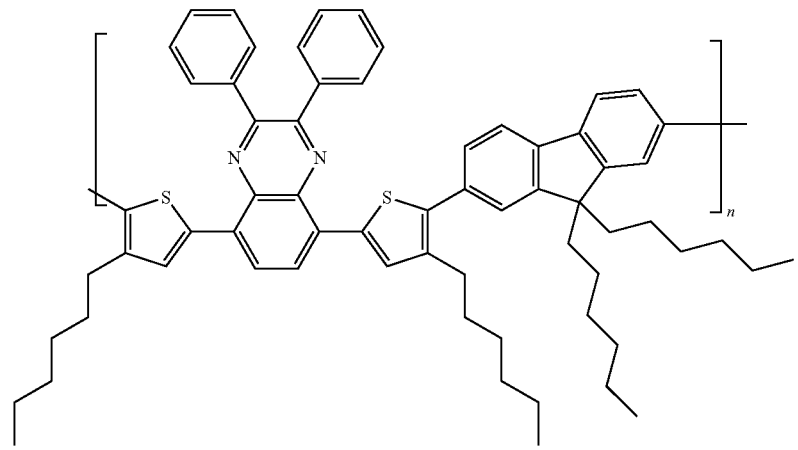
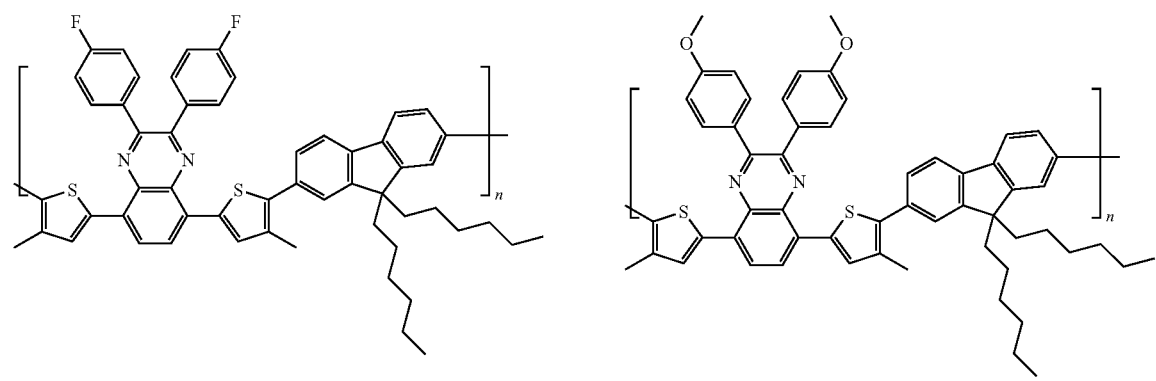
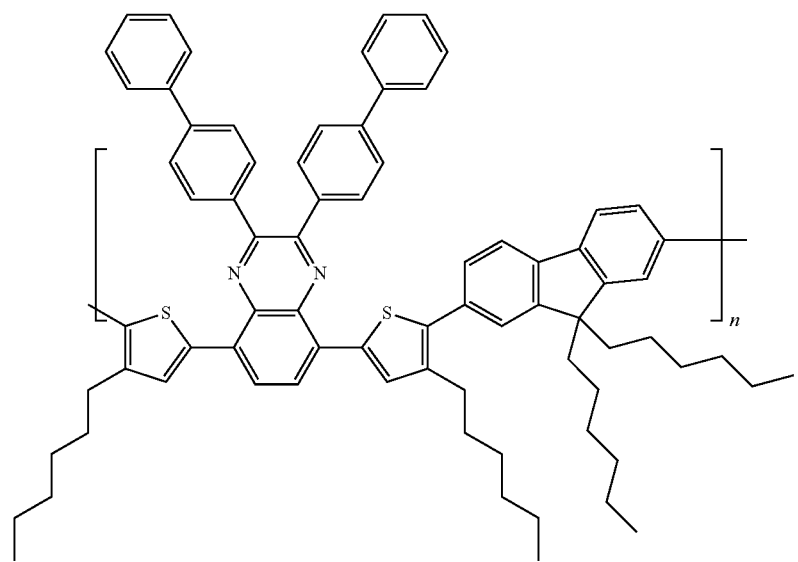

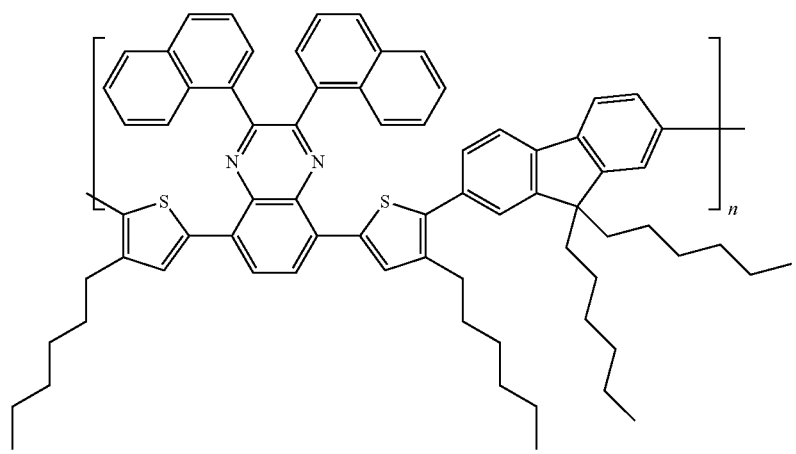
Formula 16
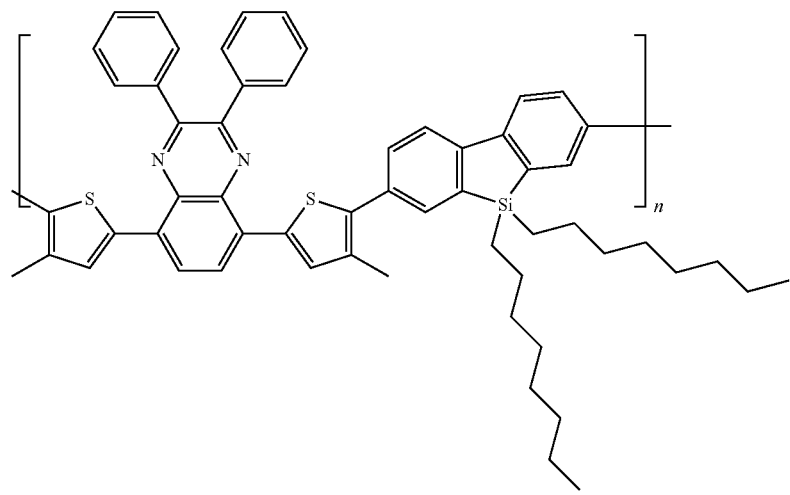
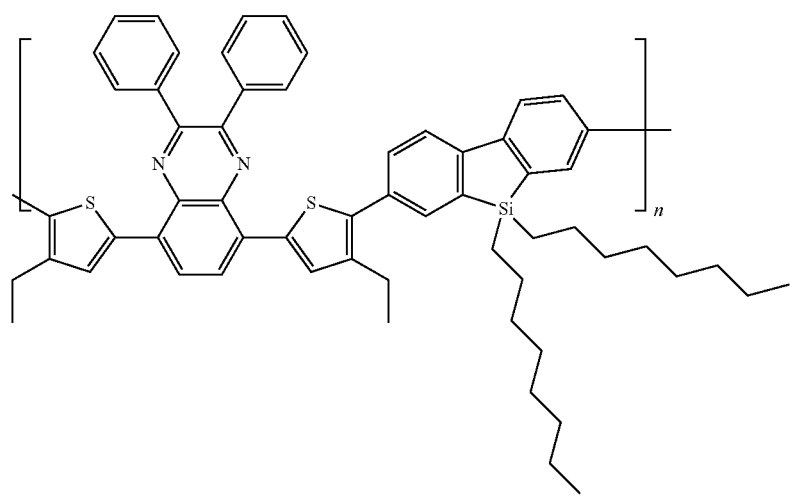

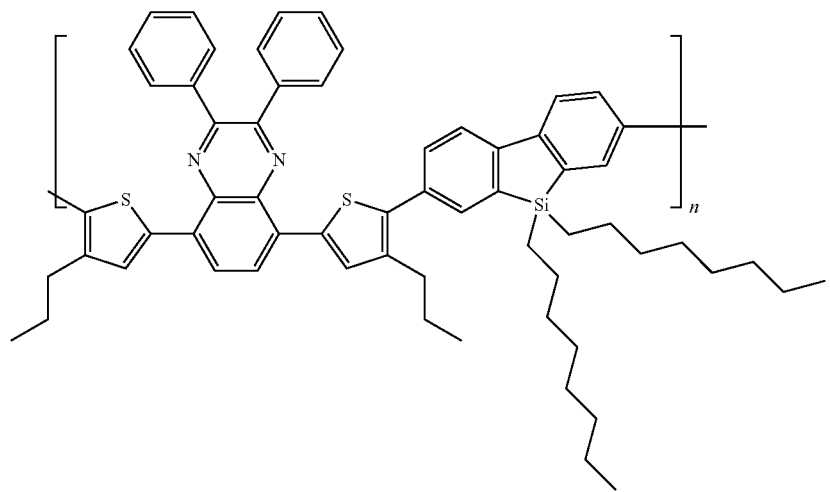
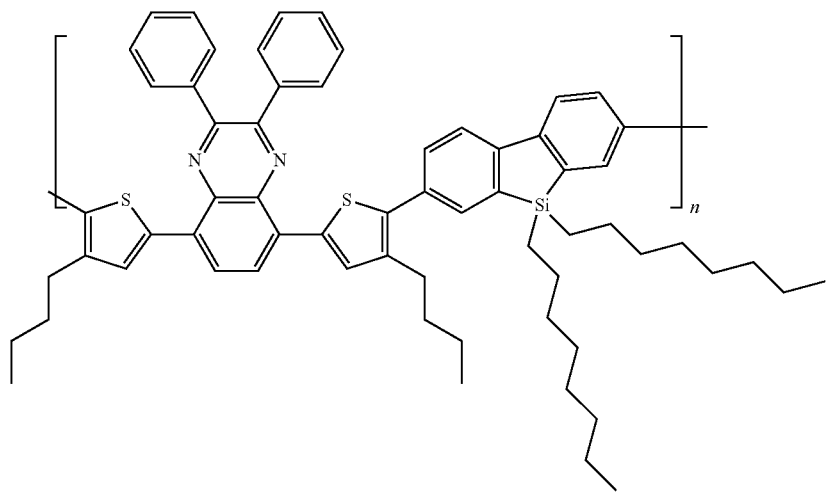
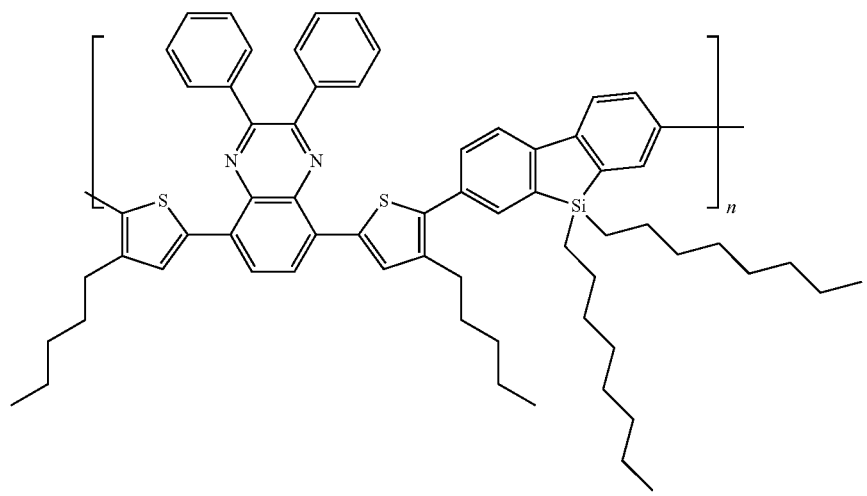

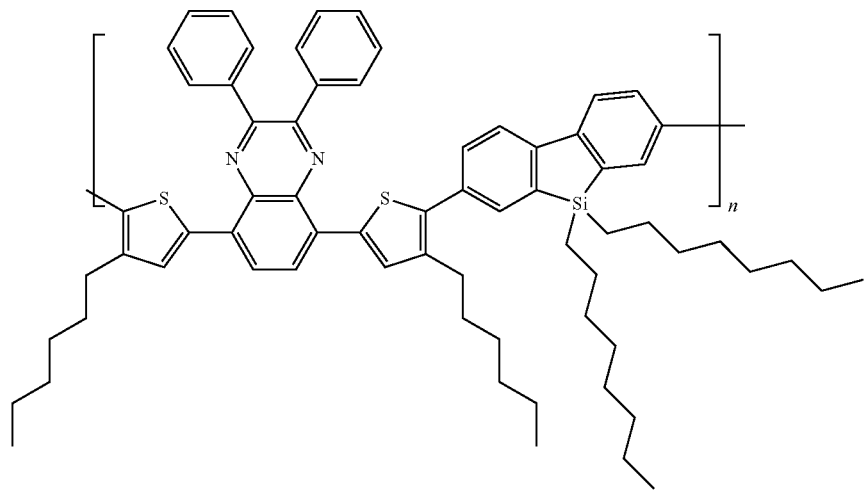
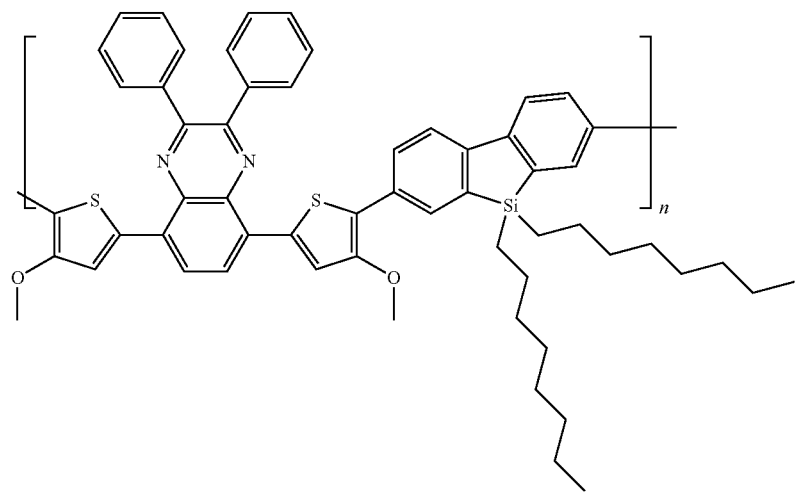
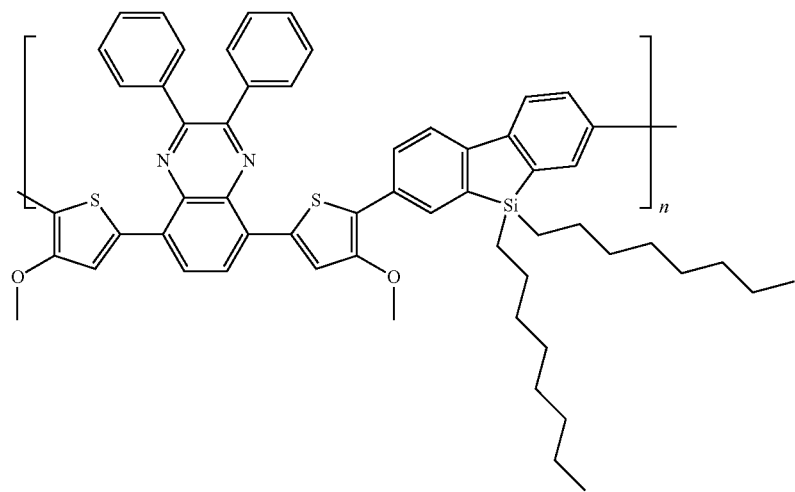

-continued
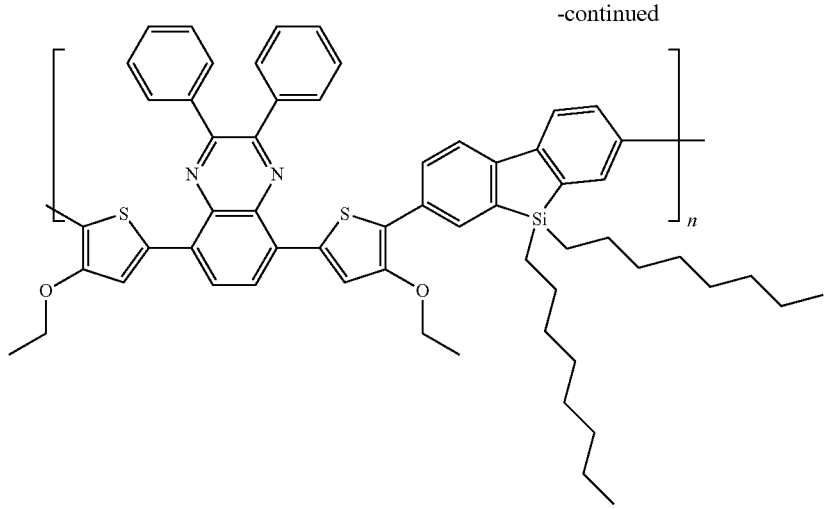
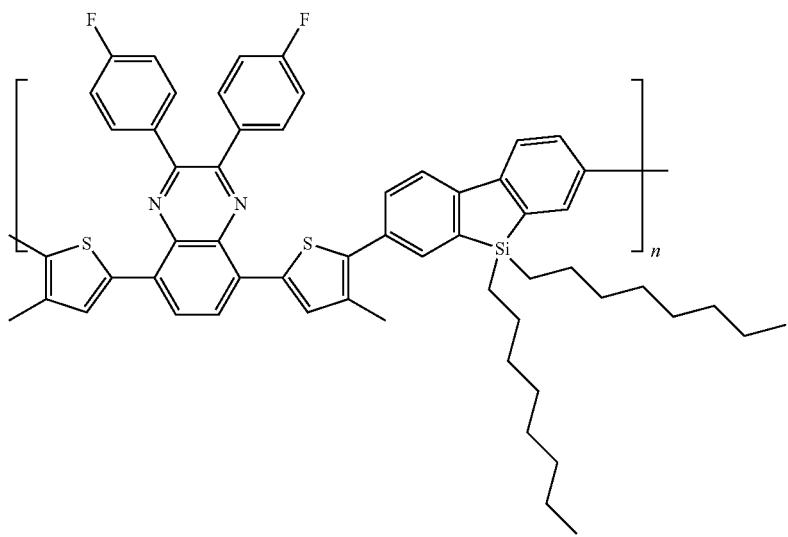
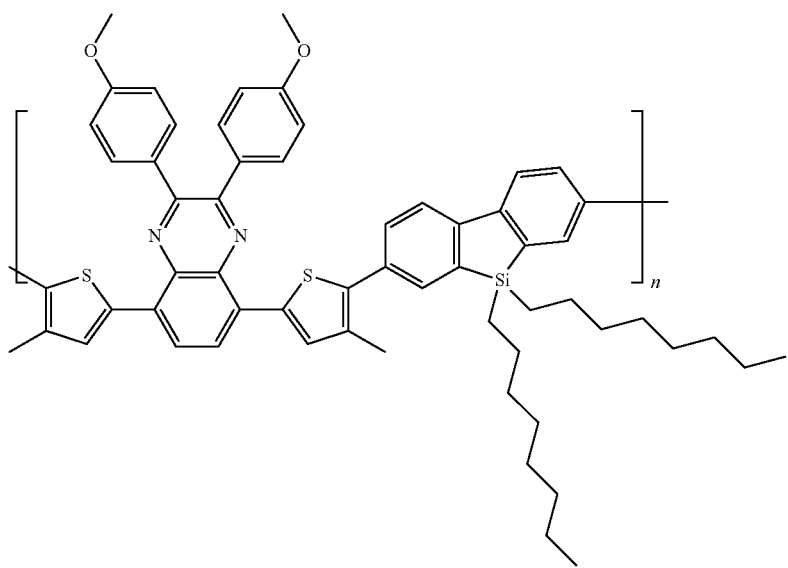

-continued
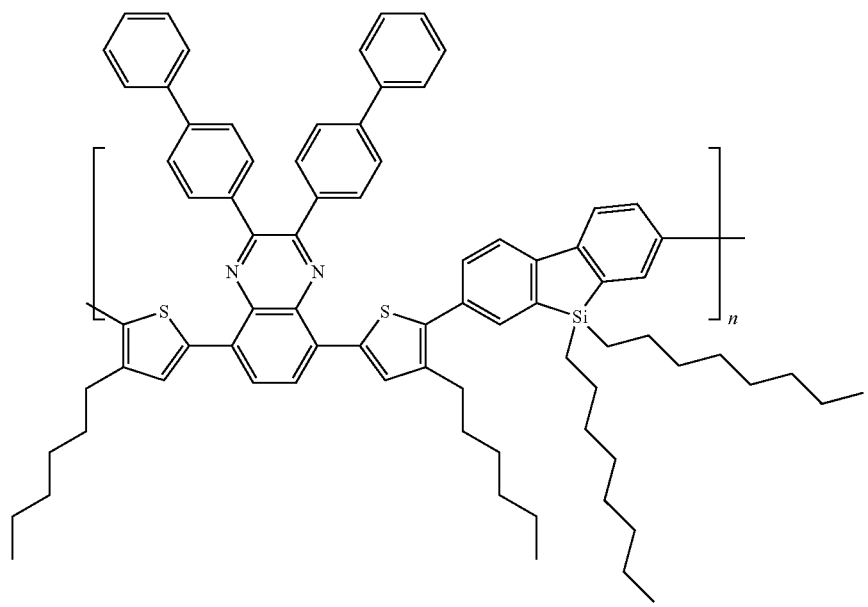
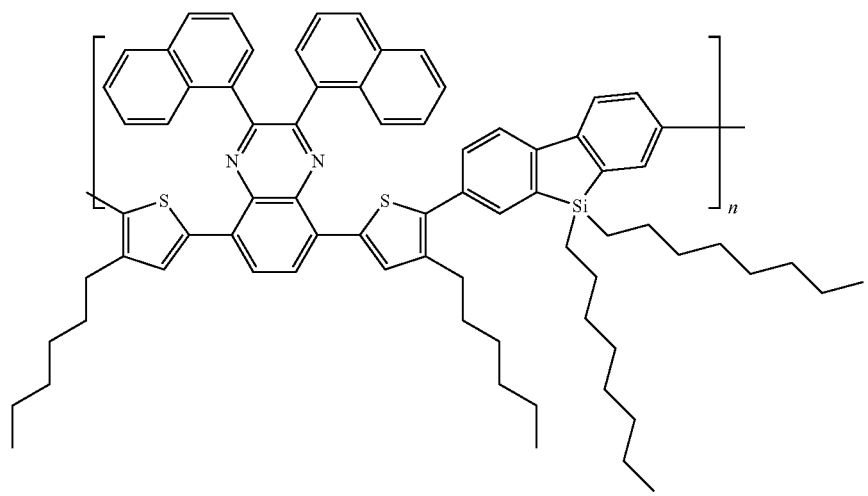
Formula 17
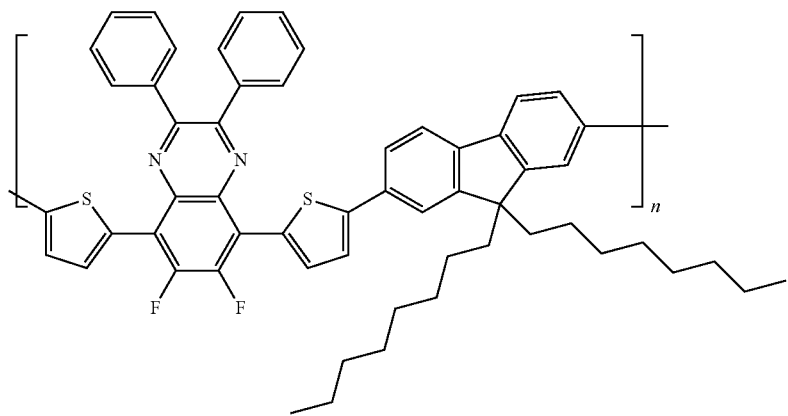

-continued
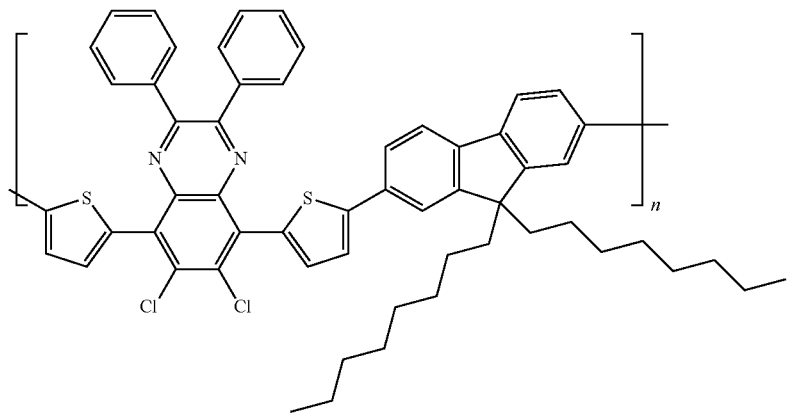
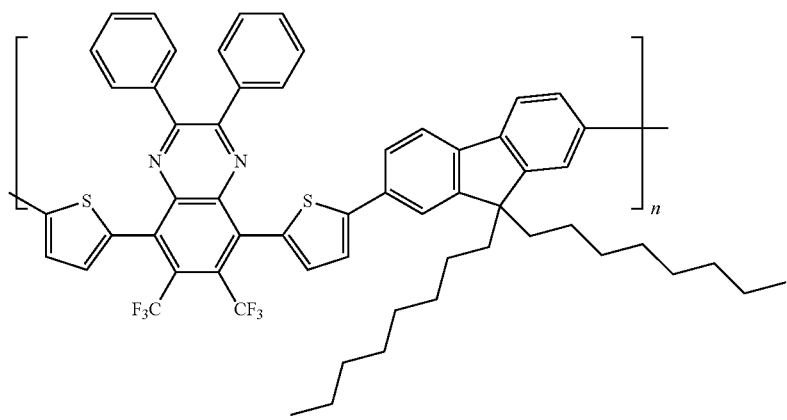
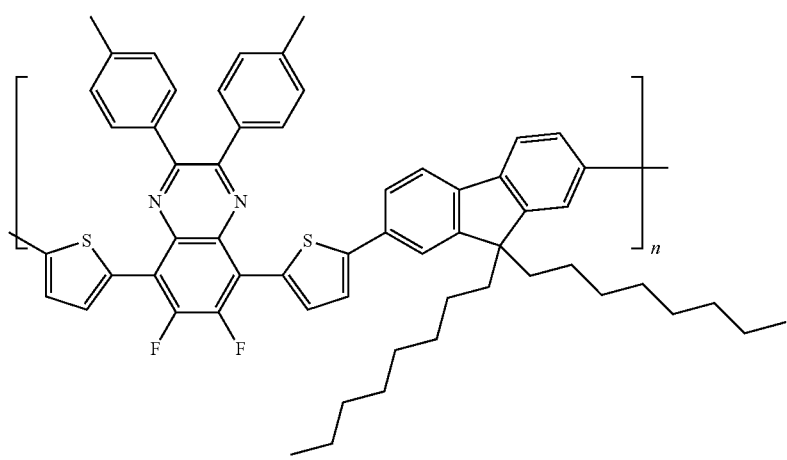

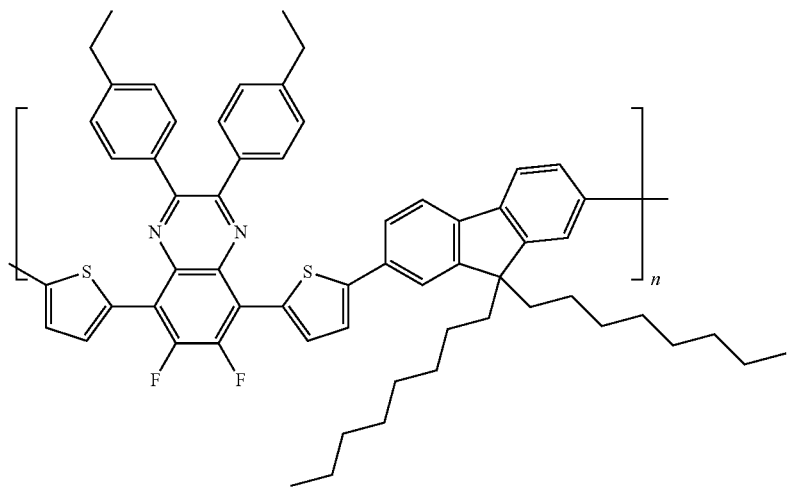
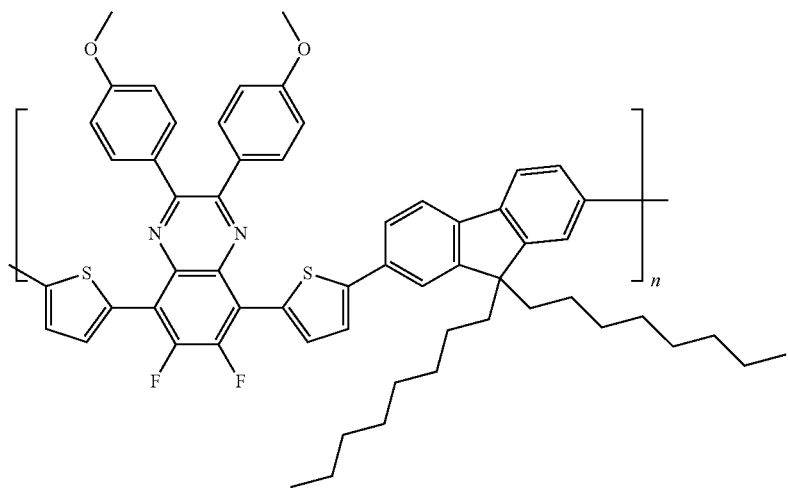
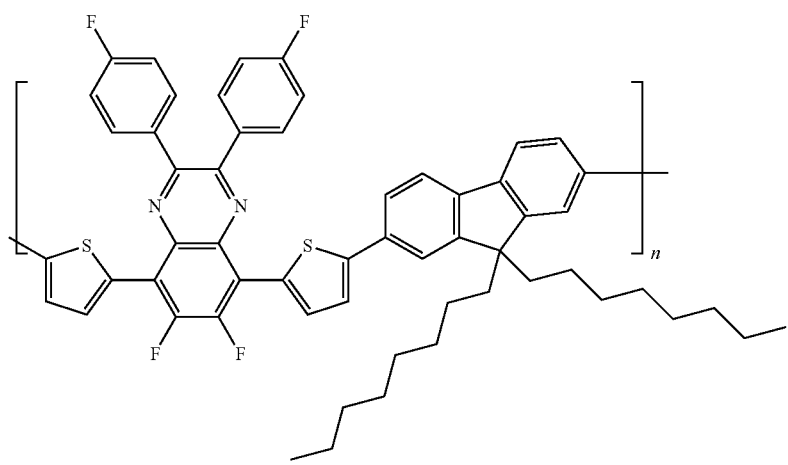

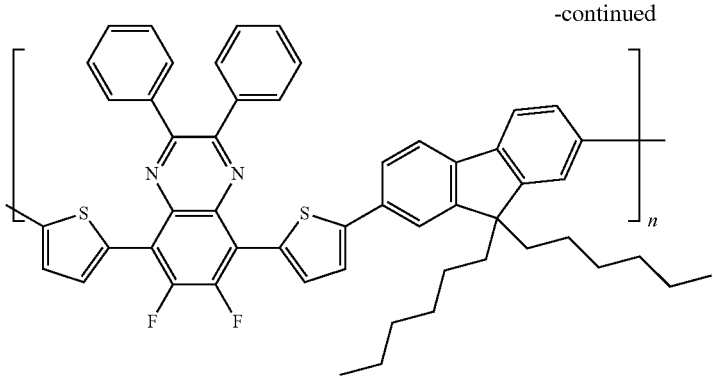
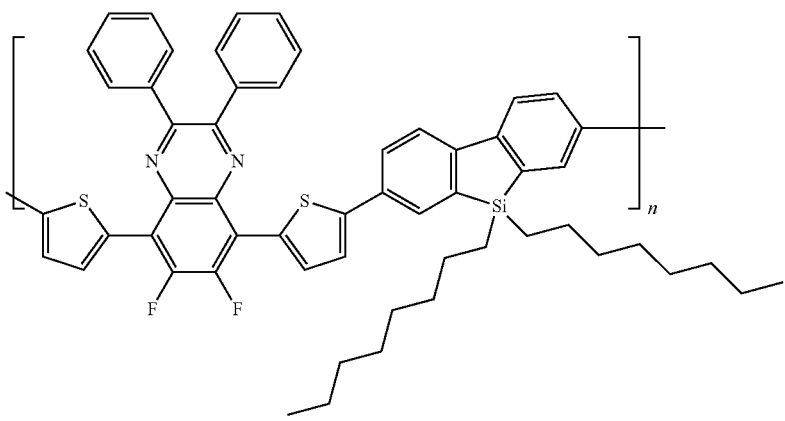
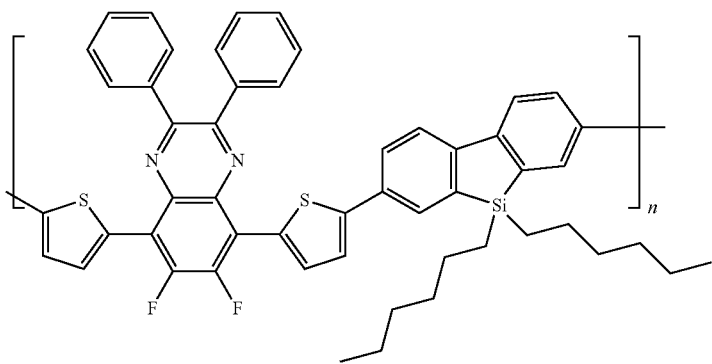
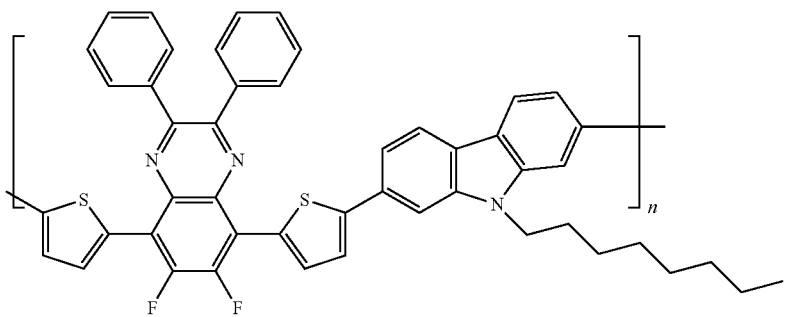

-continued
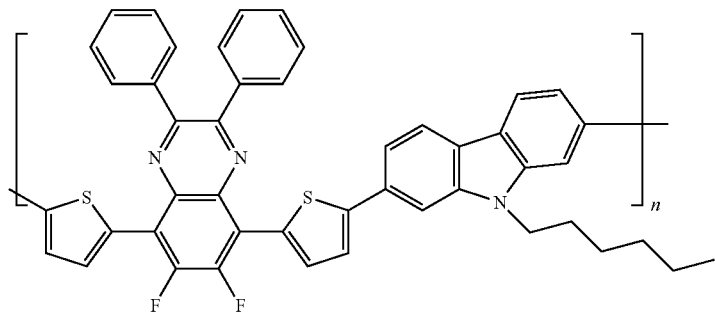
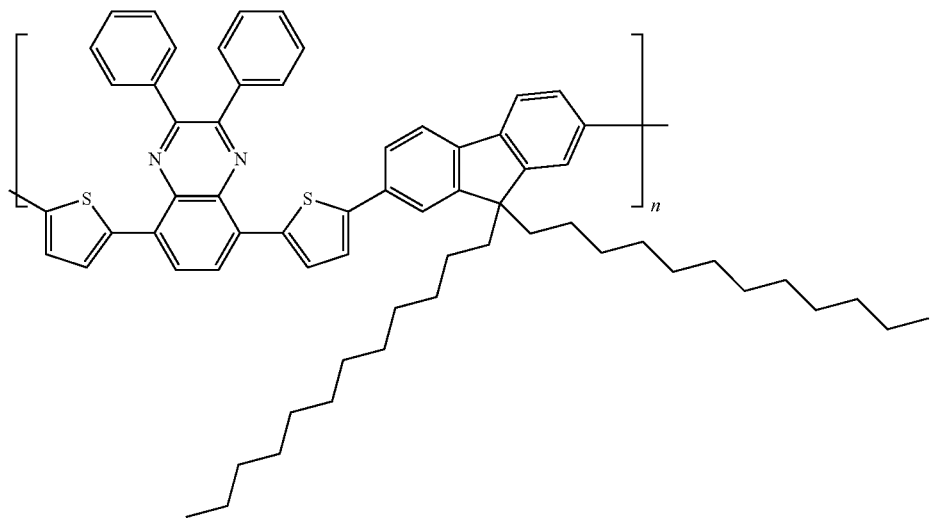
Formula 18
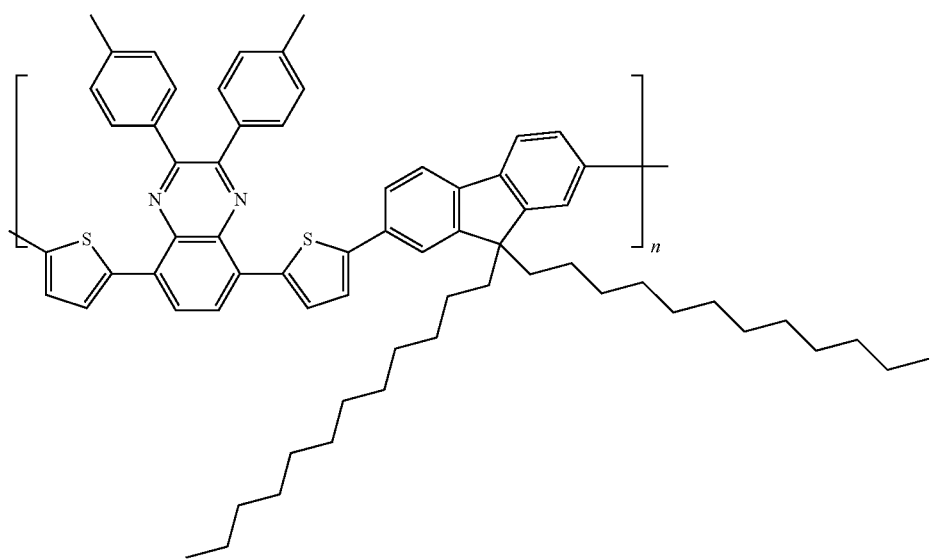

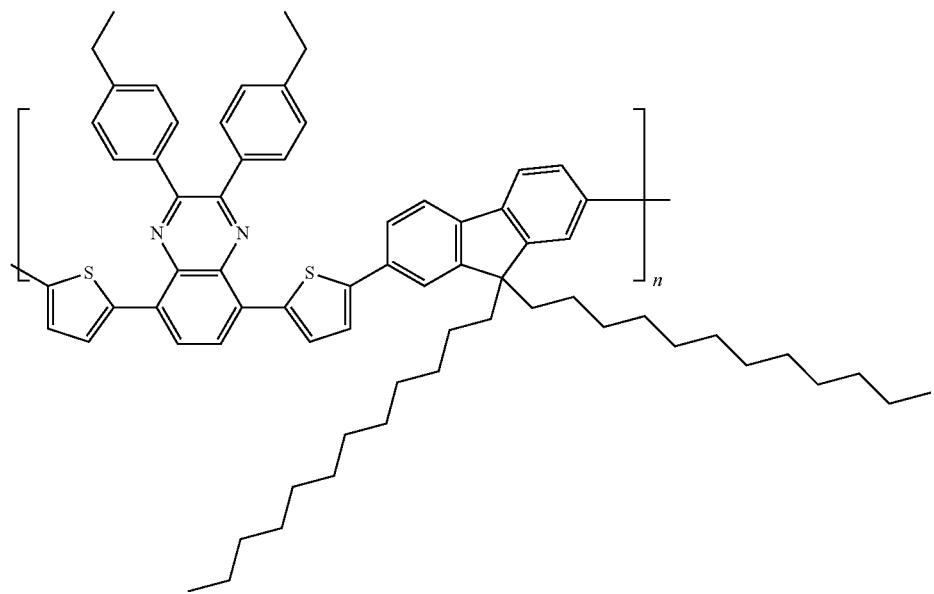
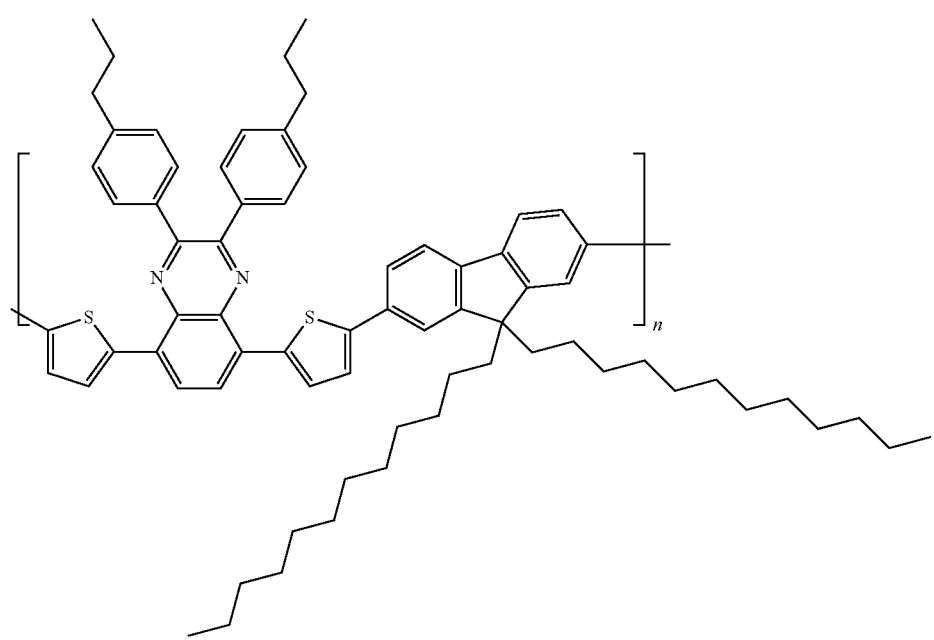

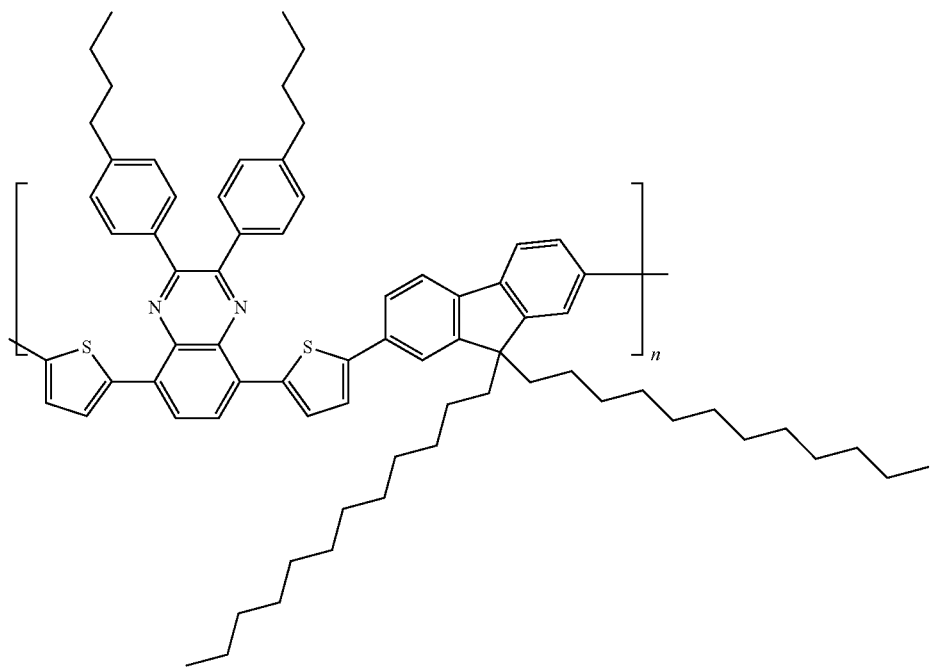
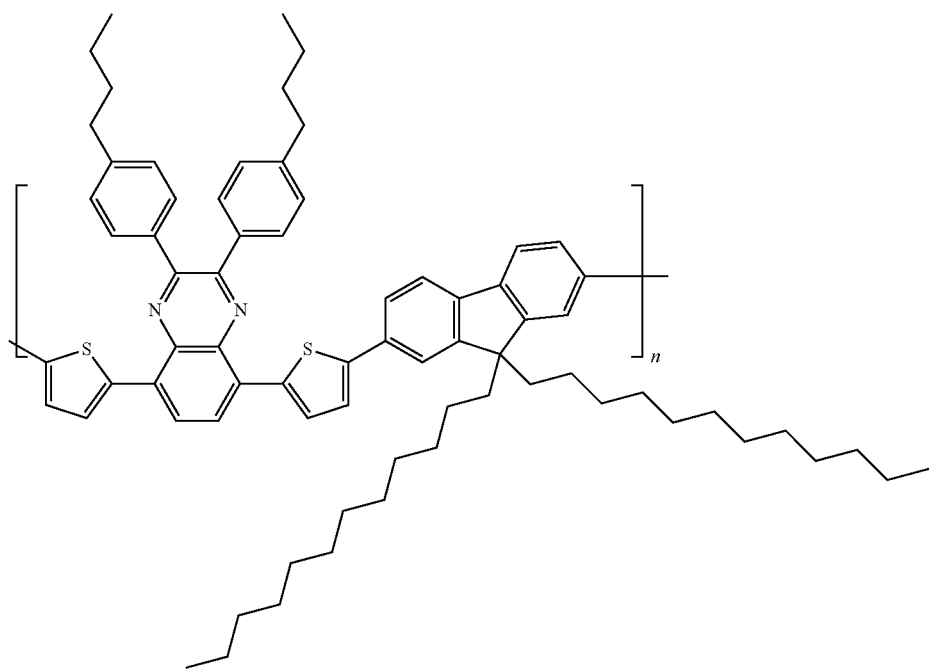

-continued
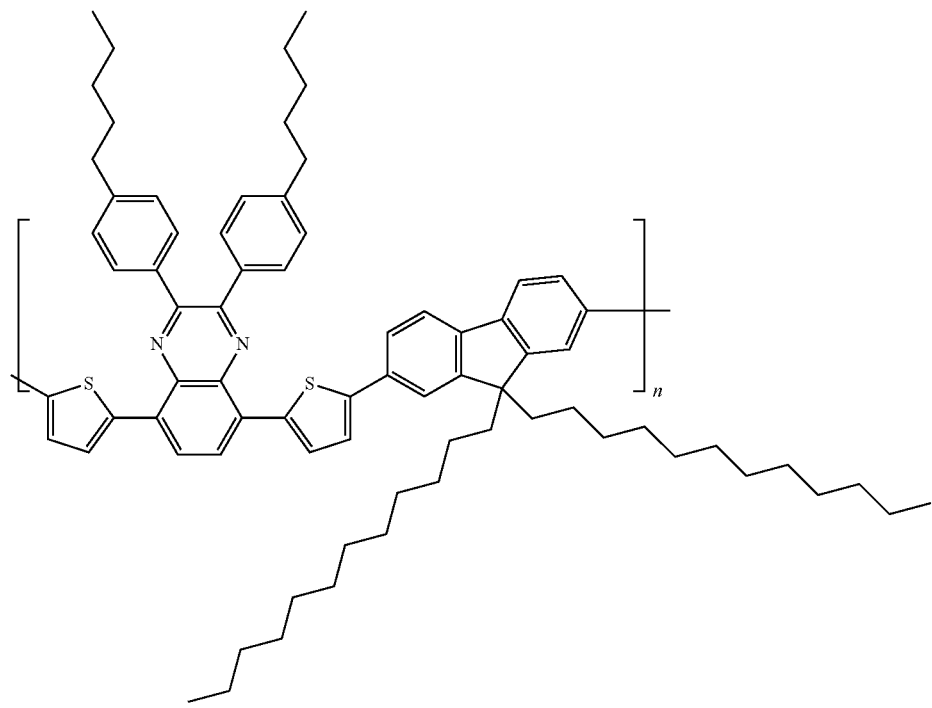
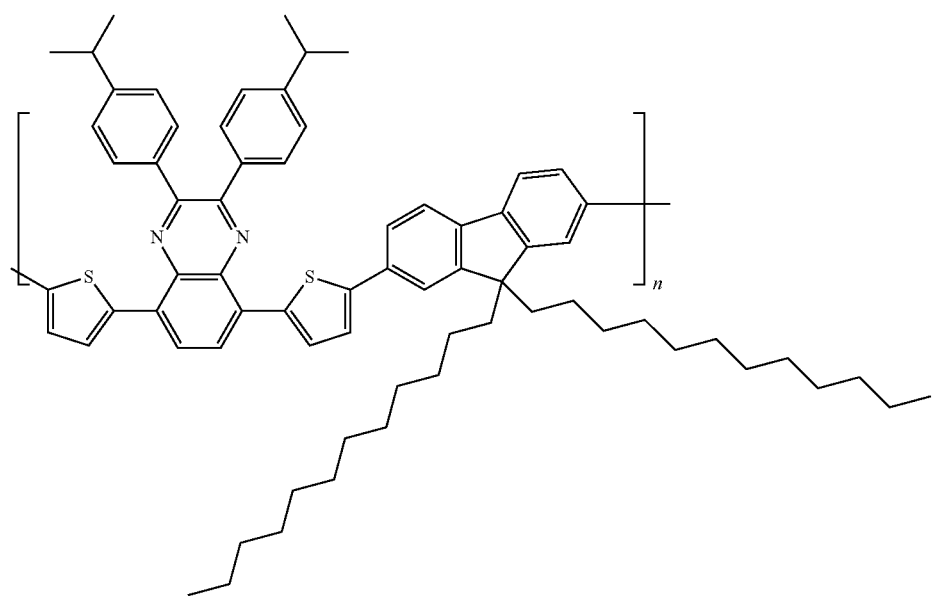

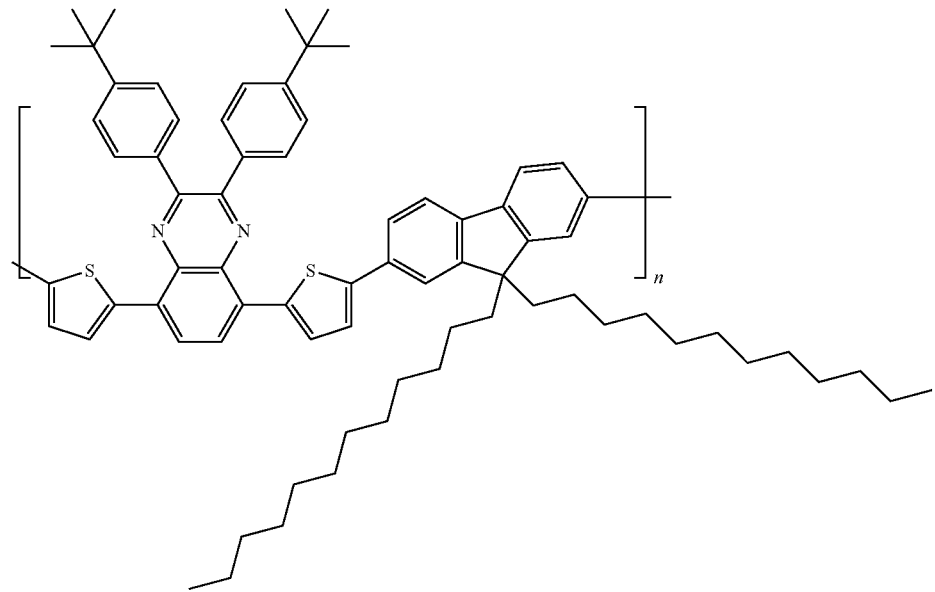
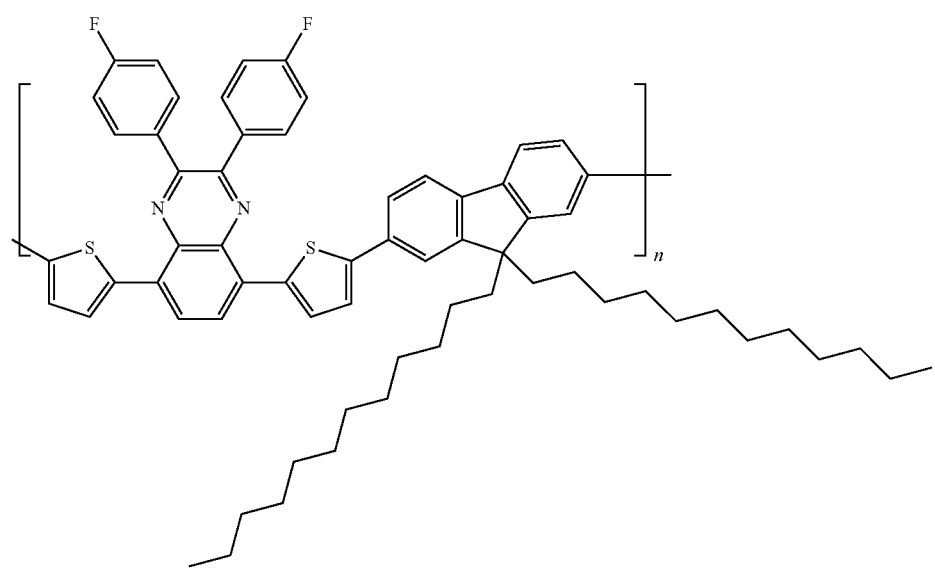

-continued
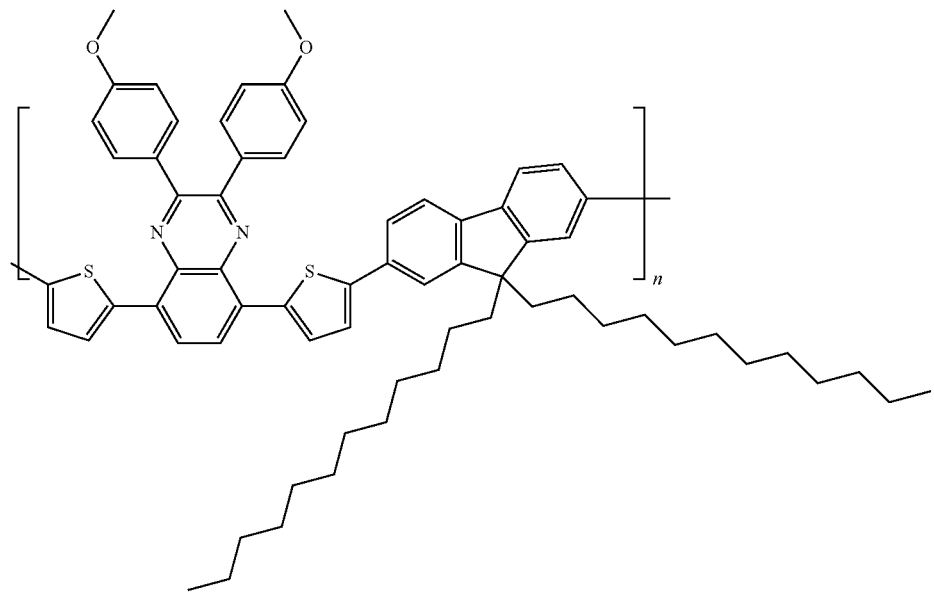
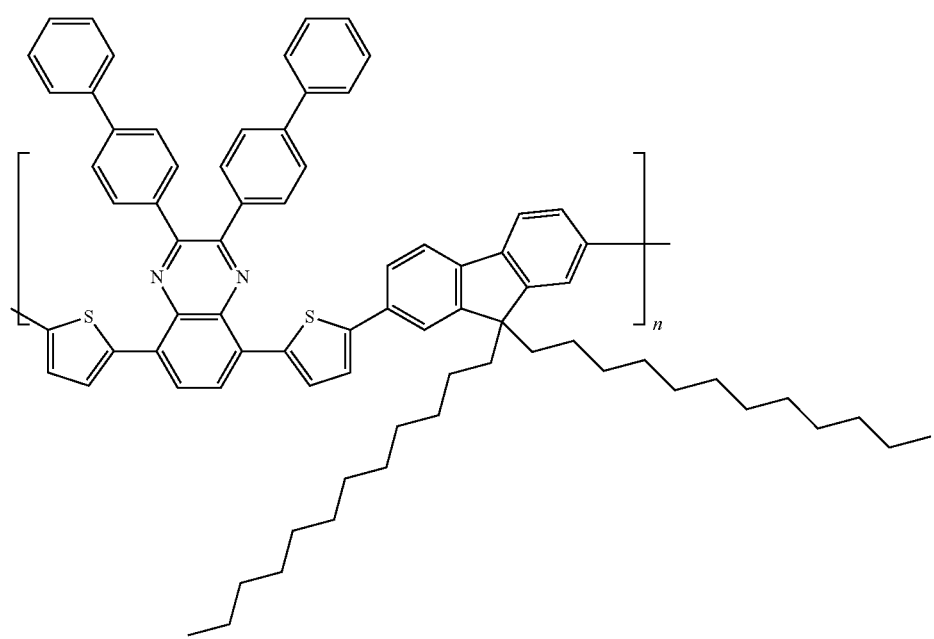

-continued

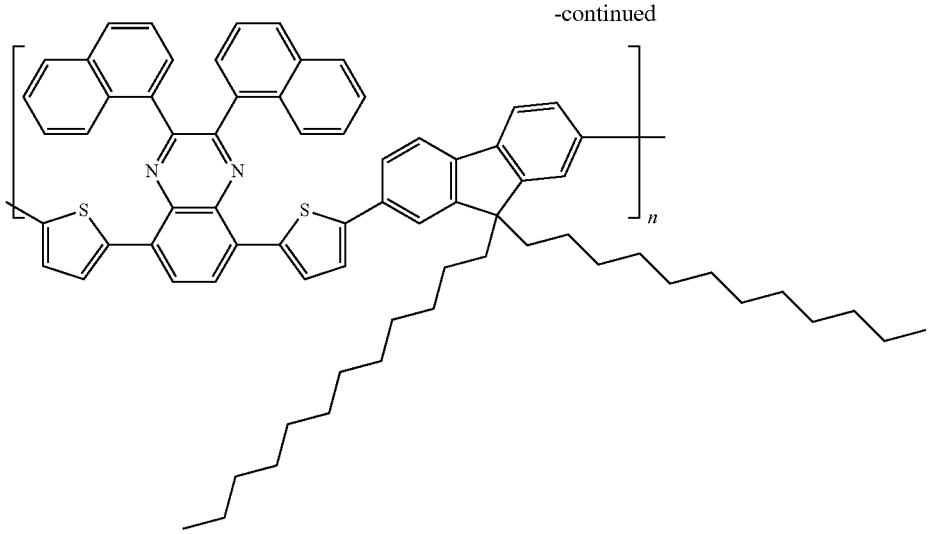

The electron donating organic material having a structure represented by Formula (1) can be synthesized by, for example, a technique similar to the method described in "Advanced Functional Materials," pages 3836-3842, Volume 17.

The material for a photovoltaic device may be made from only the electron donating organic material having a structure represented by Formula (1), or may contain another electron donating organic material. As the other electron donating organic material, examples thereof include conjugated polymers, such as a polythiophene polymer, a poly-p-phenylenevinylene copolymer, a poly-p-phenylene polymer, a polyfluorene polymer, a polypyrrole polymer, a polyaniline polymer, a polyacetylene polymer, and a polythienylene vinylene polymer, and low-molecular weight organic compounds including phthalocyanine derivatives, such as $H_2$ phthalocyanine ($H_2$Pc), cupper phthalocyanine (CuPc), and zinc phthalocyanine (ZnPc), porphyrin derivatives, triaryl amine derivatives, such as N,N'-diphenyl-N,N'-di(3-methylphenyl)-4,4'-diphenyl-1,1'-diamine (TPD) and N,N'-dinaphtyl-N,N'-diphenyl-4,4'-diphenyl-1,1'-diamine (NPD), carbazole derivatives, such as 4,4'-di(carbazole-9-yl) biphenyl (CBP), and oligothiophene derivatives (terthiophene, quaterthiophene, sexithiophene, octithiophene and the like).

Since the electron donating organic material having a structure represented by Formula (1) exerts a p-type semiconductor characteristic, it is preferable to combine it with an electron accepting organic material (n-type organic semiconductor) to obtain a higher photoelectric conversion efficiency when used for a photovoltaic device.

The electron accepting organic material corresponds to an organic material that exerts an n-type semiconductor characteristic, and examples thereof include: oxazole derivatives, such as 1,4,5,8-naphthalene tetracarboxylic dianhydride (NTCDA), 3,4,9,10-perylenetetracarboxylic dianhydride (PTCDA), 3,4,9,10-perylenetetracarboxylic bisbenzimidazole (PTCBI), N,N'-dioctyl-3,4,9,10-naphthyltetracarboxy diimide (PTCDI-C8H), 2-(4-biphenyl)-5-(4-t-butylphenyl)-1,3,4-oxadiazole (PBD), 2,5-di(1-naphthyl)-1,3,4-oxadiazole (BND); triazole derivatives, such as 3-(4-bephenyl)-4-phenyl-5-(4-t-butylphenyl)-1,2,4-triazole (TAZ); phenanthroline derivatives, phosphine oxide derivatives, fullerene compounds, carbon nanotubes (CNT), and a derivative (CN-PPV) prepared by introducing a cyano group to a poly-p-phenylenevinylene polymer. Among these, the fullerene compound is desirably used because it has high charge separating rate and electron mobility. Examples of the fullerene compounds include: unsubstituted compounds including $C_{60}$, $C_{70}$, $C_{76}$, $C_{78}$, $C_{82}$, $C_{84}$, $C_{90}$ and $C_{94}$, [6,6]-phenyl C61 butyric acid methyl ester ([6,6]-PCBM), [5,6]-phenyl C61 butyric acid methyl ester ([5,6]-PCBM), [6,6]-phenyl C61 butyric acid hexyl ester ([6,6]-PCBH), [6,6]-phenyl C61 butyric acid dodecyl ester ([6,6]-PCBD), phenyl C71 butyric acid methyl ester ($PC_{70}BM$), and phenyl C85 butyric acid methyl ester ($PC_{84}BM$). Among the fullerene compounds, the $C_{70}$ derivative (the above-mentioned $PC_{70}BM$ or the like) is preferably used because it is superior in light absorbing characteristic, and provides a higher photoelectric conversion efficiency.

In the material for a photovoltaic device, although not particularly limited, the content ratio (weight percentage) of the electron donating organic material and the electron accepting organic material is preferably set in a range from 1 to 99:99 to 1, more preferably, from 10 to 90:90 to 10, and most preferably, from 20 to 60:80 to 40, in the weight percentage of the electron donating organic material:the electron accepting organic material. The electron donating organic material and the electron accepting organic material are desirably used in a mixed state. As the mixing method, although not particularly limited, a method is proposed in which the electron donating organic material and the electron accepting organic material are added to a solvent at a desired ratio to be dissolved. Additionally, in the case where the material for a photovoltaic device forms a single organic semiconductor layer, as will be described later, the above-mentioned content ratio refers to a content ratio of the electron donating organic material and the electron accepting organic material contained in the single layer. Moreover, in the case of a stacked structure having two or more organic semiconductor layers, the above-mentioned content ratio refers to a content ratio of the electron donating organic material and the electron accepting organic material in the entire organic semiconductor layers.

It is preferable to eliminate impurities that might cause a trap of carriers to be kept to a minimum to further improve the photoelectric conversion efficiency. As the method for eliminating impurities from the electron donating organic material having a structure represented by Formula (1) and the electron accepting organic material, although not particularly limited, the following methods may be used: a column chromatography method, a re-crystallizing method, a sublimation method, a re-precipitation method, a Soxhlet extraction method, a molecular cutoff method by using GPC (Gel Permeation Chromatography), a filtration method, an ion exchange method, a chelate method, and the like. In general, upon refining a low-molecular-weight organic material, the column chromatography method, re-crystallizing method, or sublimation method is preferably used. In contrast, upon refining a high-molecular-weight organic material, the re-precipitation method, Soxhlet extraction method, molecular cutoff method by using GPC (Gel Permeation Chromatography), or filtration method is preferably used when a low-molecular-weight component is eliminated, and the re-precipitation method, chelate method, ion exchange method, or column chromatography method is preferably used, when a metal component is eliminated. Among these methods, a plurality of methods may be combined.

The following description will discuss the photovoltaic device. The photovoltaic device is provided with at least a positive electrode and a negative electrode, and a layer containing the material for the photovoltaic device is placed between the positive electrode and the negative electrode. FIG. 1 is a schematic drawing that shows one example of the photovoltaic device. In FIG. 1, reference numeral 1 represents a substrate, reference numeral 2 represents the positive electrode, reference numeral 3 represents an organic semiconductor layer containing the material for the photovoltaic device, and reference numeral 4 represents the negative electrode.

The organic semiconductor layer 3 contains the material for the photovoltaic device, that is, an electron donating organic material having a structure represented by Formula (1). In the case where the material for the photovoltaic device contains an electron donating organic material and an electron accepting organic material, these materials may be mixed with each other, or formed as stacked layers. However, the mixed state is more preferable. The aforementioned "bulk hetero junction type" refers to this mixed type. In the case of the mixed type, the electron donating organic material having a structure represented by Formula (1) and the electron accepting organic material are compatibly dissolved with each other in a molecular level, or preferably phase-separated from each other in a nano-level. In the case of the phase separation, although not particularly limited, the domain size of the phase separation structure is preferably set in a size from 1 nm or more to 50 nm or less.

Figure 2:
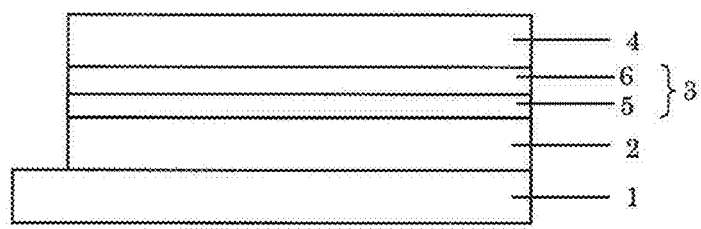
FIG. 2 is a schematic drawing that shows another aspect of the photovoltaic device.

In the case where the electron donating organic material and the electron accepting organic material are stacked with each other, the layer containing the electron donating organic material that exhibits a p-type semiconductor characteristic is preferably placed on the positive electrode side, while the layer containing the electron accepting organic material that exhibits an n-type semiconductor characteristic is preferably placed on the negative electrode side. FIG. 2 illustrates one example of the photovoltaic device having the stacked structure. Reference numeral 5 represents a layer having the electron donating organic material having a structure represented by Formula (1), and reference numeral 6 represents a layer having the electron accepting organic material.

The organic semiconductor layer is preferably designed to have a thickness in a range from 5 nm to 500 nm, more preferably, from 30 nm to 300 nm. In the case of the stacked structure of the organic semiconductor layers, the layer containing the electron donating organic material having a structure represented by Formula (1) is preferably designed to have a thickness from 1 nm to 400 nm, more preferably, from 15 nm to 150 nm, within the thickness of the entire organic semiconductor layers. Moreover, the layer containing the electron accepting organic material is preferably designed to have a thickness from 1 nm to 499 nm, more preferably, from 15 nm to 150 nm, within the thickness of the entire organic semiconductor layers.

Moreover, the organic semiconductor layer 3 may further include an electron donating organic material (p-type organic semiconductor) other than the electron donating organic material having a structure represented by Formula (1). As the electron donating organic material (p-type organic semiconductor) to be used in this case, those materials exemplified before may be used.

In the photovoltaic device, either the positive electrode 2 or the negative 4 is preferably allowed to have a light-transmitting property. The light-transmitting property of the electrode is not particularly limited as long as it allows incident light to reach the organic semiconductor layer 3 so that an electromotive force is generated. In this case, the light-transmitting property is indicated by a value determined from [Transmitted Light Intensity (W/m$^2$)/Incident Light Intensity (W/m$^2$)]× 100(%). The thickness of the electrode having a light-transmitting property is only necessary to be set in such a range that provides a proper light-transmitting property and conductivity, and although different depending on the electrode materials, it is preferably set to 20 nm to 300 nm. Additionally, the other electrode is not necessarily required to have a light-transmitting property as long as it has conductivity, and the thickness thereof is also not particularly limited.

As the electrode material, it is preferable to use a conductive material having a high work function for one of the electrodes and a conductive material having a low work function for the other electrode. The electrode using the conductive material having a high work function forms the positive electrode. As the conductive material having a high work function, in addition to metals, such as gold, platinum, chromium and nickel, oxides of metals such as indium, tin, or molybdenum having transparency, or composite metal oxides, such as indium tin oxide (ITO) and indium zinc oxide (IZO), are preferably used. In this case, the conductive material to be used for the positive electrode 2 is preferably designed to be ohmic contact to the organic semiconductor layer 3. Moreover, as will be described later, in the case where a hole transporting layer is formed between the positive electrode 2 and the organic semiconductor layer 3, the conductive material to be used for the positive electrode 2 is preferably designed to be ohmic contact to the hole transporting layer.

The electrode using the conductive material having a low work function forms the negative electrode. As the conductive material having a low work function, alkali metals and alkali earth metals, more specifically, lithium, magnesium, calcium and the like, are used. Further, tin, silver and aluminium are also preferably used. Moreover, electrodes made from the above-mentioned metals and alloys and made from a stacked member of the above-mentioned metals may be preferably used. In this case, the conductive material to be used for the negative electrode 4 is preferably designed to be ohmic contact to the organic semiconductor layer 3. Moreover, as will be described later, in the case where an electron transporting layer is formed between the negative electrode 4 and the organic semiconductor layer 3, the conductive material to be used for the positive electrode 4 is preferably designed to be ohmic contact to the electron transporting layer. Moreover, by introducing a metal fluoride, such as lithium fluoride and cesium fluoride onto the interface of the negative electrode 4 and the electron transporting layer, it becomes possible to improve the output electric current.

Depending on the kinds and usages of the photoelectric conversion material, the substrate 1 may be formed as a substrate on which an electrode material and an organic semiconductor layer can be stacked, for example, as a film or a plate manufactured by using any method from an inorganic material, such as non-alkali glass and quartz glass, or an organic material, such as polyester, polycarbonate, polyolefin, polyamide, polyimide, polyphenylene sulfide, polyparaxylene, an epoxy resin, and a fluorine-based resin. Moreover, in the case where light is made incident on the substrate side, each of the above-mentioned substrates is preferably allowed to have a light-transmitting property of about 80%.

A hole transporting layer may be provided between the positive electrode 2 and the organic semiconductor layer 3. As a material used for forming the hole transporting layer, a conductive polymer, such as a polythiophene-based polymer, poly-p-phenylenevinylene-based polymer, and a polyfluorene-based polymer, and a low-molecular-weight organic compound that exerts a p-type semiconductor characteristic, such as a phthalocyanine derivative ($H_2Pc$, CuPc, ZnPc, and the like) and a porphyrin derivative, are preferably used. In particular, those materials, prepared by adding polystyrene sulfonate (PSS) to polyethylene dioxythiophene (PEDOT) and PEDOT serving as a polythiophene-based polymer, are preferably used. The hole transporting layer preferably has a thickness in a range from 5 nm to 600 nm, and more preferably, from 30 nm to 200 nm. Moreover, the hole transporting layer is preferably treated by a fluorous compound (an organic compound having one or more fluorine atoms in its molecule) so that it becomes possible to further improve the photoelectric conversion efficiency. Examples of the fluorous compound include: benzotrifluoride, hexafluorobenzene, 1,1,1,3,3,3-hexafluoro-2-propanol, perfluorotoluene, perfluorodecalin, perfluorohexane, and 1H,1H,2H,2H-heptadecafluoro-1-decanol (F-decanol). More preferably, benzotrifluoride, perfluorohexane, and F-decanol can be used. As the treating method, a method in which, after the fluorous compound has been preliminarily mixed with a material used for forming a hole transporting layer, the hole transporting layer is formed, and a method in which, after a hole transporting layer is formed, the fluorous compound is made in contact therewith (such as spin coating, dip coating, blade coating, vapor deposition, and vapor treating methods) can be exemplified.

Moreover, in the photovoltaic device, an electron transporting layer may be provided between the organic semiconductor layer 3 and the negative electrode 4. As the material used for forming the electron transporting layer, although not particularly limited, a compound that exerts an n-type semiconductor characteristic, such as the aforementioned electron accepting organic materials (NTCDA, PTCDA, PTCDI-C8H, an oxazole derivative, a triazole derivative, a phenanthroline derivative, a phosphine oxide derivative, a fullerene derivative, CNT, CN-PPV and the like) and titanium oxide, are preferably used. The thickness of the electron transporting layer is preferably set in a range from 5 nm to 600 nm, and more preferably, from 30 nm to 200 nm.

Moreover, as the photovoltaic device, two or more organic semiconductor layers may be stacked (into a tandem structure), with one or more intermediate layers interposed therebetween, so that series junctions may be formed. For example, the stacked layer structure includes: substrate/positive electrode/first organic semiconductor layer/intermediate electrode/second organic semiconductor layer/negative electrode. By using this stacked layer structure, it becomes possible to improve an open circuit voltage. Additionally, the aforementioned hole transporting layer may be provided between the positive electrode and the first organic semiconductor layer, as well as between the intermediate electrode and the second organic semiconductor layer, or the hole transporting layer may be provided between the first organic semiconductor layer and the intermediate electrode, as well as between the second organic semiconductor layer and the negative electrode.

In the case of such a stacked-layer structure, at least one of the organic semiconductor layers is preferably designed to contain the material for the photovoltaic device, while the other layers are preferably designed to contain an electron donating organic material having a bandgap different from that of the electron donating organic material to not lower the short-circuit current. Examples of the electron donating organic material include: conjugated polymers, such as a polythiophene polymer, a poly-p-phenylene vinylene copolymer, a poly-p-phenylene polymer, a polyfluorene polymer, a polypyrrole polymer, a polyaniline polymer, a polyacetylene polymer, a polythienylene vinylene polymer, and a benzothiadiazole polymer (for example, PCPDTBT (poly[2,6-(4,4-bis-(2-ethylhexyl)-4H-cyclopenta[2,1-b;3,4-b'] dithiophene)-alt-4,7-(2,1,3-benzothiadiazole)]), and PSBTBT (poly[(4,4-bis-(2-ethylhexyl)dithieno[3,2-b:2',3'-d]silole)-2,6,-diylalt-(2,1,3-benzothiadiazole)-4,7-diyl]); and the aforementioned low-molecular-weight organic compounds including phthalocyanine derivatives such as $H_2$ phthalocyanine ($H_2Pc$), cupper phthalocyanine (CuPc), and zinc phthalocyanine (ZnPc), porphyrin derivatives, triaryl amine derivatives such as N,N'-diphenyl-N,N'-di(3-methylphenyl)-4,4'-diphenyl-1,1'-diamine (TPD) and N,N'-dinaphtyl-N,N'-diphenyl-4,4'-diphenyl-1,1'-diamine (NPD), carbazole derivatives such as 4,4'-di(carbazole-9-yl) biphenyl (CBP), and oligothiophene derivatives such as terthiophene, quaterthiophene, sexithiophene, and octithiophene. Moreover, as the material for the intermediate electrode to be used in this case, those having high conductivity are preferably used, and examples thereof include the aforementioned metals, such as gold, platinum, chromium, nickel, lithium, magnesium, calcium, tin, silver and aluminum; oxides of metals such as indium, tin, molybdenum and titanium having transparency; or composite metal oxides, such as indium tin oxide (ITO) and indium zinc oxide (IZO); alloys made from the above-mentioned metals and laminates of the above-mentioned metals; and polyethylene dioxythiophene (PEDOT) and PEDOT to which polystyrene sulfonate (PSS) is added. The intermediate electrode is preferably allowed to have a light-transmitting property, and even in the case of a material such as metal having a low light-transmitting property, by making the film thickness thinner, a sufficient light-transmitting property can be ensured in many cases.

Moreover, the photovoltaic device may contain a pigment between the positive electrode and the negative electrode. The pigment may be either luminescent or non-luminescent. In the case of the luminous pigment, it may be either fluorescent or phosphorescent. In this case, fluorescence refers to a light emission caused by a transition between states having the same spin multiplicity, and phosphorescence refers to a light emission cause by a transition between states that are different in spin multiplicity. For example, luminescence caused by a transition from a singlet excited state to the ground state (in general, the ground state of an organic compound is singlet) is fluorescence, and luminescence caused by a transition from a triplet excited state to the ground state is phosphorescence. By allowing the element to contain such a pigment, its light absorption can be increased, or light having such short wavelengths that the electron donating organic material and the electron accepting organic material hardly absorb can be wavelength-converted to light having long wavelengths that are easily absorbed so that it becomes possible to improve a short-circuit current. From the viewpoint of processability, the pigment is desirably an organic pigment that is soluble to an organic solvent. Examples of these organic pigments include: porphyrin derivatives, phthalocyanine derivatives, naphthalocyanine derivatives, coumarin derivatives, pyrromethene derivatives, pyrrolopyrrole derivatives, anthracene derivatives, distyryl benzene derivatives, tetraphenyl butadiene derivatives, stilbene derivatives, phthalimide derivatives, naphthalimide derivatives, perinone derivatives, cyclopentadiene derivatives, acridone derivatives, quinacridone derivatives, rare-earth complexes, such as an Eu complex having a ligand, such as acetylacetone, benzoylacetone, phenanthroline, or the like, 4-(dicyanomethylene)-2-methyl-6-(p-dimethylaminostyryl)-4H-pyrane derivative, rhodamine compounds, deazaflavin derivatives, phenoxazine derivatives, oxazine derivatives, quinazoline derivatives, squarylium derivatives, violanthrone derivatives, phenazine derivatives, phenoxazone derivatives, and thiadiazolopyrene derivatives. The pigment may be stacked between the positive electrode and the negative electrode, or may be mixed in a layer selected from the organic semiconductor layer, the hole transporting layer, and the electron transporting layer. The pigment is desirably mixed into the organic semiconductor layer to exert the light absorbing increasing effect and the wavelength converting effect.

The following description will discuss a method for manufacturing the photovoltaic device based upon examples. A transparent electrode (corresponding to a positive electrode in this case) made of ITO is formed on a substrate by using a sputtering method or the like. Next, a solution, prepared by dissolving an electron donating organic material having a structure represented by Formula (1) and a material for a photovoltaic device containing an electron accepting organic material, if necessary, in a solvent, is applied to the transparent electrode so that an organic semiconductor layer is formed. The solvent to be used at this time is preferably an organic solvent. Examples thereof include: methanol, ethanol, butanol, toluene, xylene, ochlorophenol, acetone, ethylacetate, ethylene glycol, tetrahydrofuran, dichloromethane, chloroform, dichloroethane, chlorobenzene, dichlorobenzene, trichlorobenzene, chloronaphthalene, dimethylformamide, dimethylsulfoxide, N-methylpyrrolidone and γ-butyrolactone. Two or more kinds of these may be used. Moreover, by allowing the solvent to contain the aforementioned fluorous compound, the photoelectric conversion efficiency can be further improved. Fluorous compounds (fluorous solvents) in a liquid state under normal temperature and normal pressure are preferably used and, more preferably, benzotrifluoride, perfluorohexane, or F-decanol is used. The content of the fluorous compound is preferably set to 0.01 to 20% by volume and, more preferably, to 0.1 to 2% by volume, relative to the total amount of the solvent. The content of the fluorous solvent is preferably set to 0.01 to 30% by weight and, more preferably, to 0.1 to 4% by weight, relative to the total amount of the solvent.

In the case of mixing the electron donating organic material having a structure represented by Formula (1) and the electron accepting organic material to form an organic semiconductor layer, the electron donating organic material having a structure represented by Formula (1) and the electron accepting organic material are added to a solvent at the desired ratio, and by dissolving these by using a method such as, heating, stirring, or irradiating with ultrasonic wave, the resulting solution is applied onto the transparent electrode.

In this case, by using two or more kinds of the solvents in a mixed manner, the photoelectric conversion efficiency of the photovoltaic device can be improved. This effect is presumably obtained by the fact that the electron donating organic material and the electron accepting organic material are phase-separated in a nano-level so that a carrier path that forms a passing route of electrons and holes is formed. The solvent to be combined therewith can be selected as an optimal combination depending on the kinds of the electron donating organic materials and the electron accepting organic materials. In the case where the electron donating organic material having a structure represented by Formula (1) is used, a combination between chloroform and chlorobenzene is exemplified as a desired solvent. In this case, the mixed volume ratio of the respective solvents is preferably set in a range from 5:95 to 95:5=chloroform:chlorobenzene, more preferably, from 10:90 to 90:10=chloroform:chlorobenzene.

Moreover, in the case where the electron donating organic material having a structure represented by Formula (1) and the electron accepting organic material are stacked to form an organic semiconductor layer, for example, after the solution of the electron donating organic material is applied to form a layer having the electron donating organic material thereon, a solution of the electron accepting organic material is applied thereto so that a layer is formed. In the case where each of the electron donating organic material and the electron accepting organic material is a low-molecular-weight substance whose molecular weight is about 1000 or less, the layer may be formed by using a vapor deposition method.

The organic semiconductor layer may be formed by using any of the following application methods: a spin coating method, a blade coating method, a slit die coating method, a screen printing method, a bar coating method, a mold coating method, a print transfer method, a dip coating method, an ink jet method, a spraying method, a vacuum vapor deposition method, and the like. The formation method may be properly selected depending on the characteristics of an organic semiconductor layer to be obtained, such as film-thickness controlling and orientation controlling. For example, in the case of carrying out the spin coating method, the total amount of the electron donating organic material having a structure represented by Formula (1) and the electron accepting organic material is preferably set to 1 to 20 g/l relative to the entire solution. By using this concentration, a uniform organic semiconductor layer with a thickness in a range from 5 to 200 nm can be easily obtained. To remove the solvent, the organic semiconductor layer thus formed may be subjected to an annealing treatment under reduced pressure or in an inert gas atmosphere (in a nitrogen or argon atmosphere). The temperature of the annealing treatment is preferably set in a range from 40° C. to 300° C., more preferably, from 50° C. to 200° C. By carrying out the annealing treatment, the stacked layers are mutually allowed to permeate each other through the interface, and the effective contact areas consequently increase so that a short-circuit current can be increased. This annealing treatment may be carried out after the formation of the negative electrode.

Next, a metal electrode (corresponding to a negative electrode, in this case) made of Al is formed on the organic semiconductor layer by a vacuum vapor deposition method, a sputtering method, or the like. In the case where an electron transporting layer is formed by the vacuum vapor deposition by using a low-molecular-weight organic material as an electron transporting layer, the metal electrode is preferably formed, with the vacuum state being successively maintained.

In the case where a hole transporting layer is provided between the positive electrode and the organic semiconductor layer, after a desired p-type organic semiconductor material (PEDOT or the like) is applied on the positive electrode by a spin coating method, a bar coating method, or a casting method by the use of a blade, the solvent is removed by using a vacuum thermostat, a hot plate, or the like so that the hole transporting layer is formed. In the case where a low-molecular-weight organic material, such as a phthalocyanine derivative and a porphyrin derivative, is used, a vacuum vapor deposition method by the use of a vacuum vapor deposition machine may be adopted.

In the case where an electron transporting layer is provided between the organic semiconductor layer and the negative electrode, after a desired n-type organic semiconductor material (a fullerene derivative or the like) or n-type inorganic semiconductor material (titanium oxide gel or the like) is applied onto the organic semiconductor layer by a spin coating method, a bar coating method, a casting method by the use of a blade, a spraying method, or the like, the solvent is removed by using a vacuum thermostat, a hot plate, or the like so that the electron transporting layer is formed. In the case where a low-molecular-weight organic material, such as a phenanthroline derivative and $C_{60}$, is used, a vacuum vapor deposition method by the use of a vacuum vapor deposition machine may be adopted.

The photovoltaic device may be applicable to various photoelectric conversion devices in which its photoelectric conversion function, photo-rectifying function, or the like is utilized. For example, it is useful for photoelectric cells (solar cells, or the like), electron devices (a photosensor, photoswitch, phototransistor, photoconductor, or the like), and photorecording materials (photomemory or the like).

EXAMPLES

The following description will further discuss the photovoltaic device based upon examples more specifically. Incidentally, this disclosure is not intended to be limited by the following examples. Also, among compounds that are used in the examples, those indicated by abbreviations are shown below:

ITO: Indium tin oxide
PEDOT: Polyethylene dioxythiophene
PSS: Polystyrene sulfonate
$PC_{70}BM$: Phenyl $C_{71}$ butyric acid methyl ester
Eg: Bandgap
HOMO: Highest occupied molecular orbital Isc: Short-circuit current density
Voc: Open-circuit voltage
FF: Fill factor
η: Photoelectric conversion efficiency.

Additionally, for $^1H$-NMR measurements, an FT-NMR analyzer (JNM-EX270, made by JEOL Ltd.) was used. The average molecular weight (number-average molecular weight, weight-average molecular weight) was measured by GPC analyzer (high-speed GPC device HLC-8220GPC with transported chloroform, made by Tosoh Corporation), and calculated by an absolute calibration curve method. The polymerization degree n was calculated based upon the following expression:

Polymerization degree $n$=[(Weight-average molecular weight)/(Molecular weight of repetitive units).

Moreover, with respect to an optical absorption edge wavelength, measurements were carried out on a thin film formed on glass with a thickness of about 60 nm by using a U-3010-type spectrophotometer manufactured by Hitachi, Ltd., and based upon the ultraviolet and visible absorption spectrum of the thin film (measured wavelength range: 300 to 900 nm), the corresponding value was obtained. The band gap (Eg) was calculated from the optical absorption edge wavelength based upon the following expression. In this case, the thin film was formed by a spin coating method by the use of chloroform as a solvent.

$Eg$ (eV)=1240/Light absorption edge wavelength (nm)

Furthermore, the highest occupied molecular orbital (HOMO) level was measured on a thin film formed on an ITO glass with a thickness of about 60 nm, by using a surface analyzing apparatus (Model AC-2 atmospheric ultraviolet photoelectron spectrometer, manufactured by Rikenkiki Co., Ltd.). In this case, the thin film was formed by a spin coating method by the use of chloroform as a solvent.

Synthesis Example 1

Compound A-1 was synthesized by using a method indicated by Scheme 1.

Scheme 1

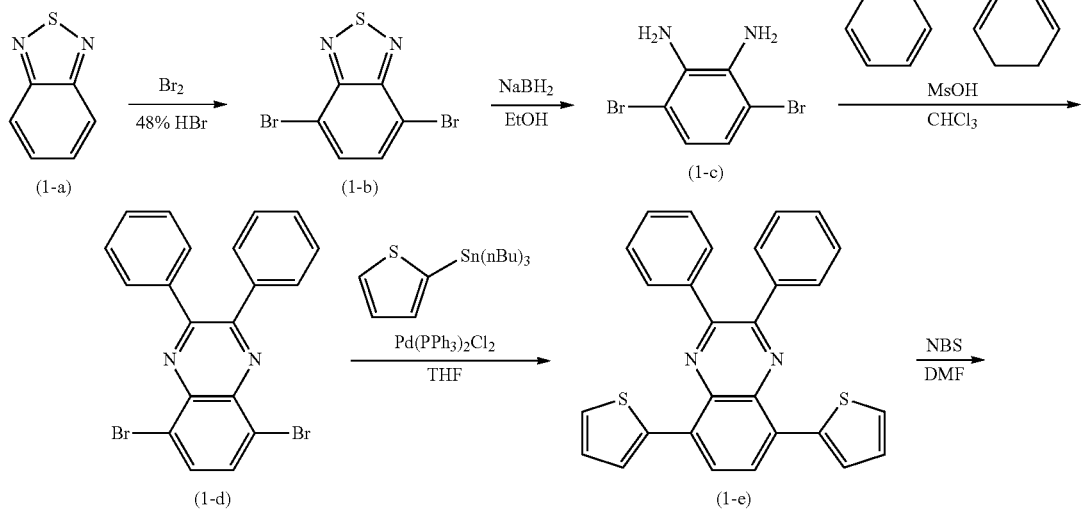
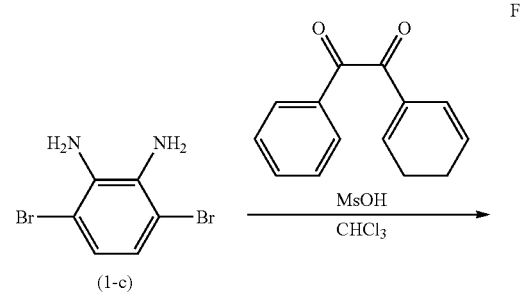
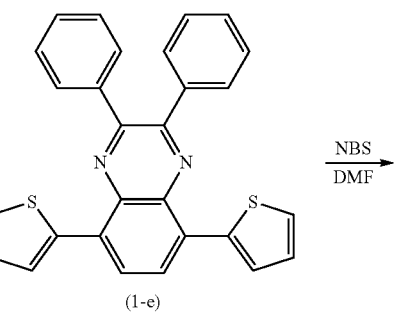

Formula 19

-continued

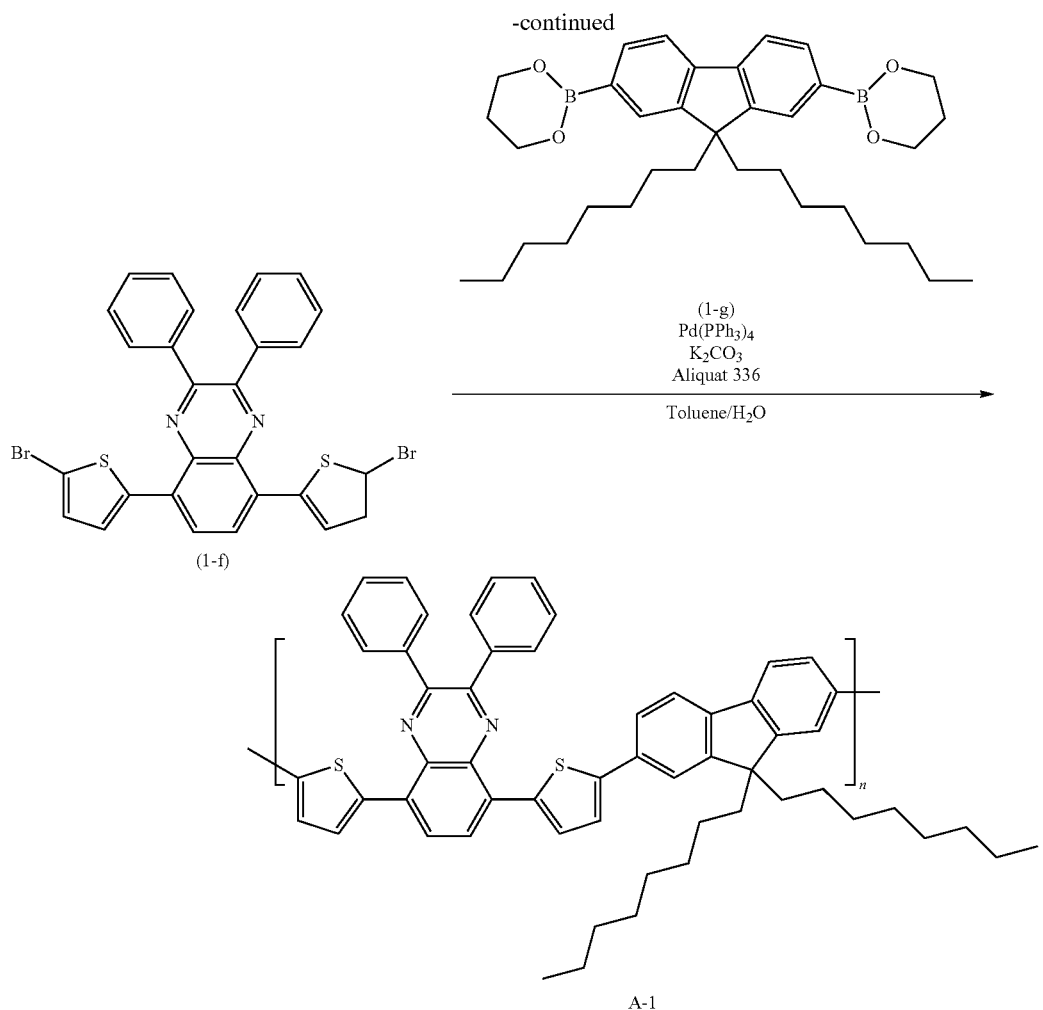

Compound (1-a) (4.3 g) (produced by Tokyo Chemical Industry Co., Ltd.) and bromide (10 g) (produced by Wako Pure Chemical Industries, Ltd.) were added to 48% hydrobromic acid (150 mL) (produced by Wako Pure Chemical Industries, Ltd.), and this was stirred at 120° C. for 3 hours. After being cooled to room temperature, the resulting solid was filtered by a glass filter, and washed with water (1000 mL) and acetone (100 mL). The resulting solid was vacuum-dried at 60° C. so that compound (1-b) (6.72 g) was obtained.

The above-mentioned compound (1-b) (5.56 g) was added to 180 mL of ethanol (produced by Wako Pure Chemical Industries, Ltd.), and to this was added 13.2 g of $NaBH_4$ (produced by Wako Pure Chemical Industries, Ltd.) at 5° C. in a nitrogen atmosphere, and then stirred at room temperature for 2 days. After the solvent was distilled off, to this was added water (500 mL) so that a solid was filtered and taken out, and washed with 1000 mL of water. The resulting solid was dissolved in 200 mL of diethyl ether, and after being washed with water (300 mL), this was dried over magnesium sulfate. The solvent was distilled off so that compound (1-c) (2.37 g) was obtained.

The above-mentioned compound (1-c) (2.37 g) and benzil (1.87 g) (produced by Wako Pure Chemical Industries, Ltd.) were added to 80 mL of chloroform, and after 3 drops of methane sulfonic acid (produced by Wako Pure Chemical Industries, Ltd.) was added thereto in a nitrogen atmosphere, this was heated and refluxed for 11 hours. After the resulting solution was washed with an aqueous sodium hydrogencarbonate solution, this was dried over magnesium sulfate. The resulting solution was purified by column chromatography (filler: silica gel, eluent: chloroform), and washed with methanol so that compound (1-d) (3.72 g) was obtained.

The above-mentioned compound (1-d) (1.0 g) and tributyl (2-thienyl)tin (1.87 g) (produced by Tokyo Chemical Industry Co., Ltd.) were added to 20 mL of tetrahydrofuran (produced by Wako Pure Chemical Industries, Ltd.), and to this was added bis(triphenyl phosphine) palladium dichloride (32 mg) (produced by Tokyo Chemical Industry Co., Ltd.) in a nitrogen atmosphere, and heated and refluxed for 5 hours. After being cooled to room temperature, to this was added methanol (50 mL) and the resulting precipitate was filtered and taken out, and then successively washed with methanol, water and methanol in this order. The resulting solid was purified by column chromatography (filler: silica gel, eluent: dichloromethane), and washed with methanol so that compound (1-e) (693 mg) was obtained.

The above-mentioned compound (1-e) (693 mg) was dissolved in dimethylformamide (80 mL) (produced by Wako Pure Chemical Industries, Ltd.), and to this was added 550 mg of N-bromosuccinimide (produced by Wako Pure Chemical Industries, Ltd.), and stirred at room temperature for 4 hours. Water (250 mL) was added to the resulting solution, and the resulting precipitate was filtered and taken out, and then successively washed with methanol and water in this order. The resulting solid was purified by column chromatography (filler: silica gel, eluent: dichloromethane), and washed with methanol so that compound (1-f) (900 mg) was obtained. The result of $^1$H-NMR measurement on compound (1-f) is shown below:

$^1$H-NMR (CDCl$_3$, ppm): 8.10 (s, 2H), 7.72-7.69 (m, 4H), 7.59 (d, 2H), 7.43-7.41 (m, 6H), 7.13 (d, 2H).

The above-mentioned compound (1-f) (330 mg) and compound (1-g) described in Formula 1 (304 mg) (produced by Aldrich Corporation) were dissolved in 70 mL of toluene. To this were added water (20 mL), potassium carbonate (1.51 g), tetrakis(triphenyl phosphine) palladium (0) (63 mg) (produced by Tokyo Chemical Industry Co., Ltd.), and 2 drops of Aliquat 336 (produced by Aldrich Corporation), and this was stirred at 100° C. for 4.5 hours in a nitrogen atmosphere. Next, to this was added 200 mg of bromobenzene (produced by Tokyo Chemical Industry Co., Ltd.), and stirred at 100° C. for one hour. Next, to this was added 200 mg of phenylboronic acid (produced by Tokyo Chemical Industry Co., Ltd.), and stirred at 100° C. for 2 hours. To the resulting solution was added 200 mL of methanol, and the generated solid was filtered and taken out, and then washed with methanol, acetone, water and acetone in this order. The resulting solid was added to 300 mL of acetone, and heated and refluxed for 30 minutes. The solid, obtained through filtration while being heated, was dissolved in 300 mL of chloroform, and after being filtered through a silica gel short column (eluent: chloroform), the resulting solution was condensed, and re-precipitated with methanol so that compound A-1 (354 g) was obtained (yield: 78%). This compound had the weight-average molecular weight of 39500, the number-average molecular weight of 16600, and the degree of polymerization n of 47.4. Moreover, the light absorption edge wavelength thereof was 636 nm, the bandgap (Eg) was 1.95 eV, and the highest occupied molecular orbital (HOMO) level was −5.37 eV.

Synthesis Example 2

Compound A-2 was synthesized by using a method indicated by Scheme 2.

Scheme 2

Formula 20

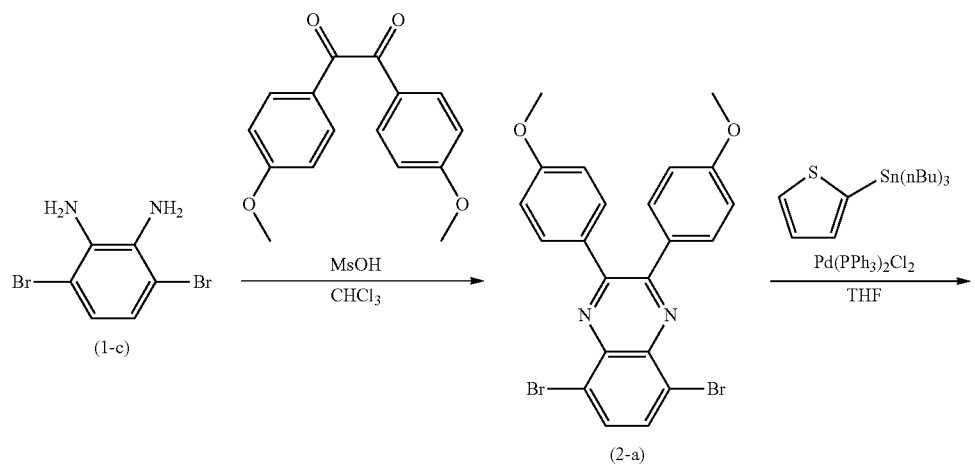

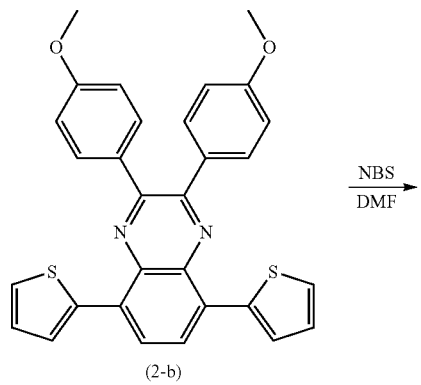

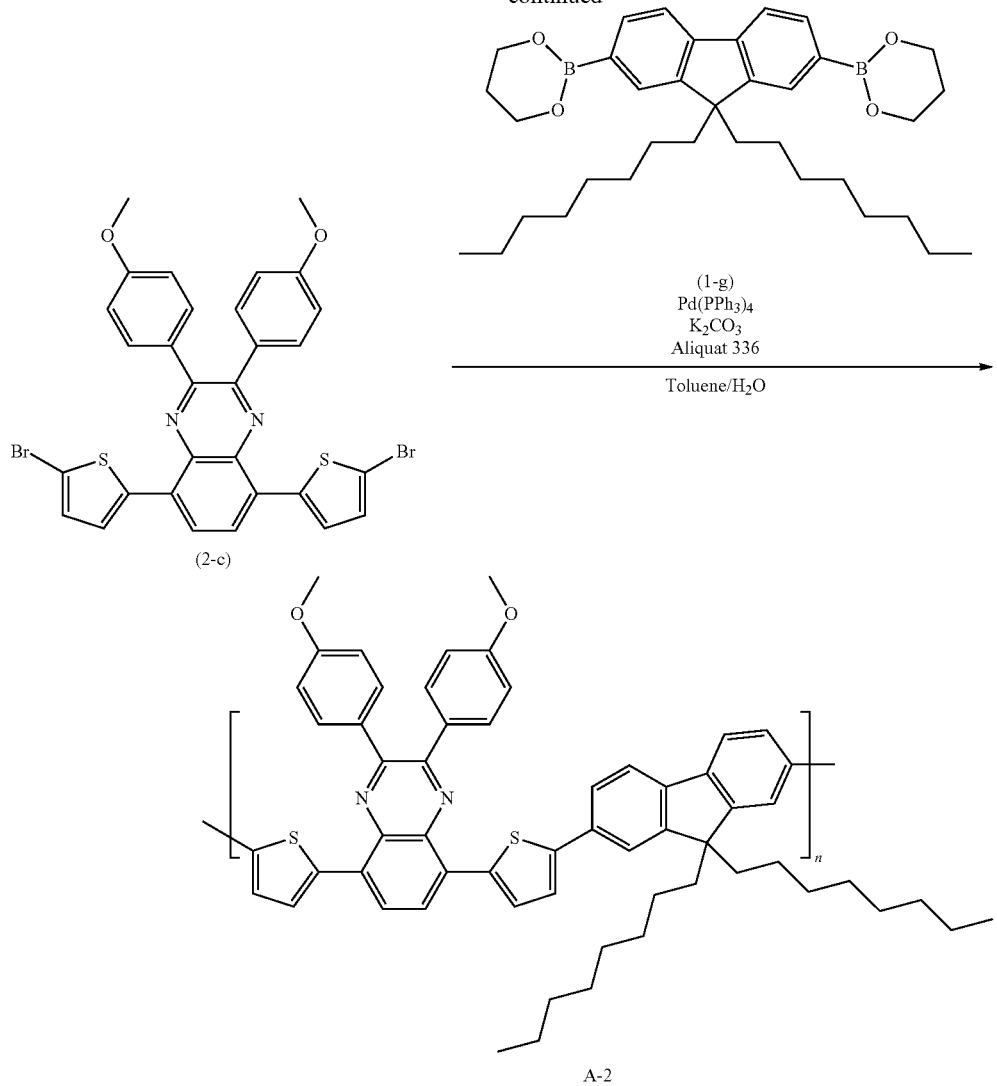

(2-c)

A-2

Compound (1-c) (1.22 g) of Synthesis Example 1 and 4,4'-dimethoxybenzyl (1.24 g) (produced by Wako Pure Chemical Industries, Ltd.) were added to chloroform (45 mL), and after 4 drops of methane sulfonic acid (produced by Wako Pure Chemical Industries, Ltd.) was added thereto in a nitrogen atmosphere, this was heated and refluxed for 5 hours. After the resulting solution was washed with an aqueous sodium hydrogencarbonate solution, this was dried over magnesium sulfate. After the solvent was distilled off from the resulting solution under reduced pressure, the resulting solid was washed with methanol so that compound (2-a) (1.5 g) was obtained.

The above-mentioned compound (2-a) (1.5 g) and tributyl (2-thienyl)tin (2.24 g) (produced by Tokyo Chemical Industry Co., Ltd.) were added to 40 mL of tetrahydrofuran (produced by Wako Pure Chemical Industries, Ltd.), and to this was added 42 mg of bis(triphenyl phosphine) palladium dichloride (produced by Tokyo Chemical Industry Co., Ltd.) in a nitrogen atmosphere, and heated and refluxed for 6 hours. To the resulting solution was added 150 mL of chloroform and, after being washed with water, this was dried over magnesium sulfate. The resulting solution was purified by column chromatography (filler: silica gel, eluent: dichloromethane), and washed with methanol so that compound (2-b) (463 mg) was obtained.

The above-mentioned compound (2-b) (461 mg) was dissolved in 20 mL of dimethylformamide (produced by Wako Pure Chemical Industries, Ltd.), and to this was added 324 mg of N-bromosuccinimide (produced by Wako Pure Chemical Industries, Ltd.), and stirred at room temperature for 6.5 hours. Water (200 mL) was added to the resulting solution, and the resulting precipitate was filtered and taken out, and then washed with water. The resulting solid was purified by column chromatography (filler: silica gel, eluent: dichloromethane), and washed with methanol so that compound (2-c) (453 mg) was obtained. The result of $^1$H-NMR measurement on compound (2-c) is shown below:

$^1$H-NMR (CDCl$_3$, ppm): 7.99 (s, 2H), 7.67 (d, 4H), 7.52 (d, 2H), 7.10 (d, 2H), 6.93 (d, 4H), 3.88 (s, 6H).

The above-mentioned compound (2-c) (453 mg) and compound (1-g) of Synthesis Example 1 (380 mg) (produced by Aldrich Corporation) were dissolved in 80 mL of toluene. To this were added water (20 mL), potassium carbonate (1.88 g), tetrakis(triphenyl phosphine) palladium (0) (79 mg) (produced by Tokyo Chemical Industry Co., Ltd.), and 2 drops of Aliquat 336 (produced by Aldrich Corporation), and this was stirred at 100° C. for 2 hours in a nitrogen atmosphere. Next, to this was added 200 mg of bromobenzene (produced by Tokyo Chemical Industry Co., Ltd.), and stirred at 100° C. for one hour. Next, to this was added 200 mg of phenylboronic acid (produced by Tokyo Chemical Industry Co., Ltd.), and stirred at 100° C. for 4.5 hours. To the resulting solution was added 200 mL of methanol, and the generated solid was filtered and taken out, and then washed with methanol, acetone, water and acetone in this order. The resulting solid was dissolved in 300 mL of chloroform and, after being filtered through a silica gel short column (eluent: chloroform), the resulting solution was condensed, and re-precipitated with methanol so that compound A-2 (404 mg) was obtained (yield: 67%). This compound had the weight-average molecular weight of 35800, the number-average molecular weight of 14200, and the degree of polymerization n of 40.1. Moreover, the light absorption edge wavelength thereof was 628 nm, the bandgap (Eg) was 1.97 eV, and the highest occupied molecular orbital (HOMO) level was −5.32 eV.

Synthesis Example 3

Compound A-3 was synthesized by using a method indicated by Scheme 3.

Scheme 3

[Formula 21]

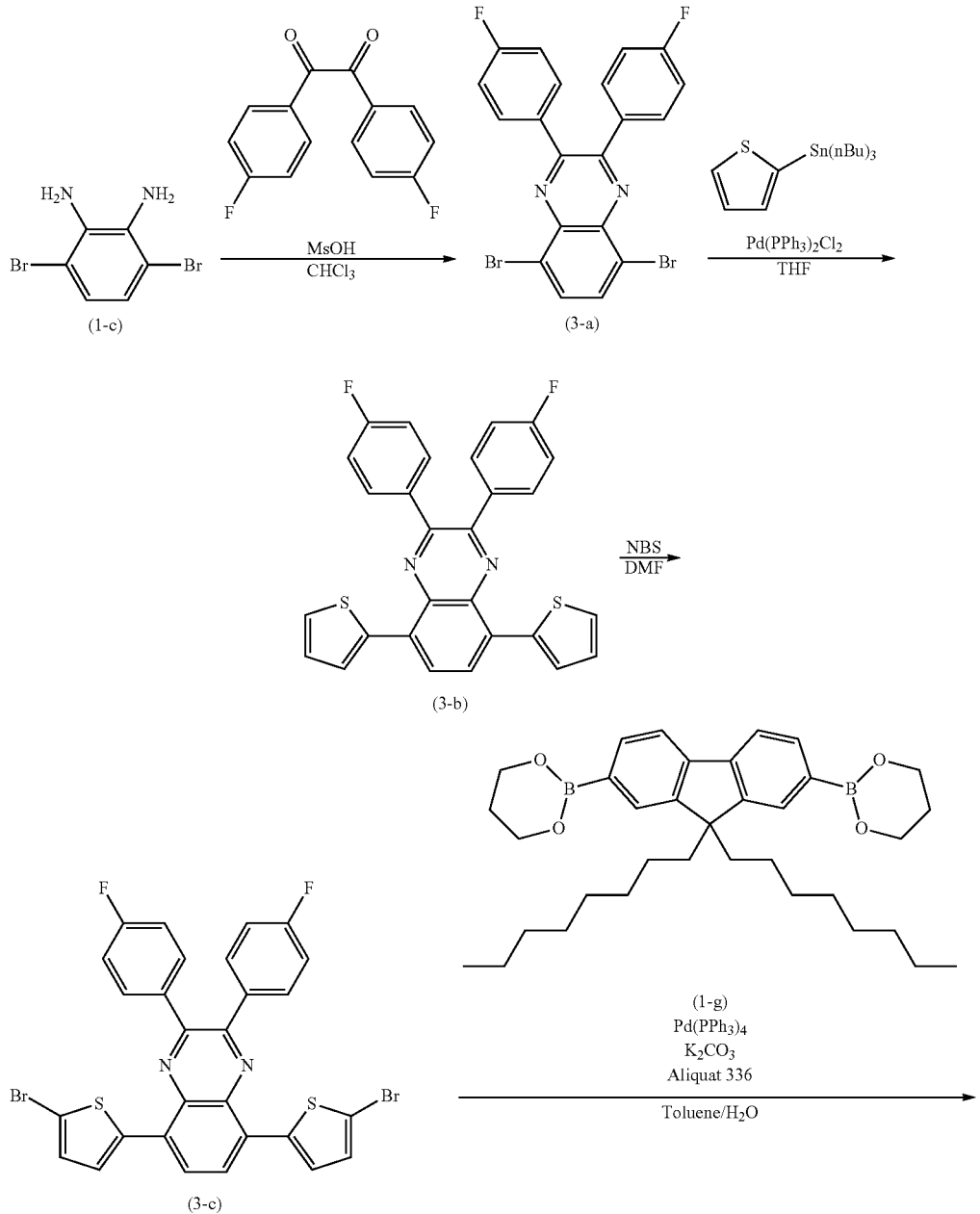

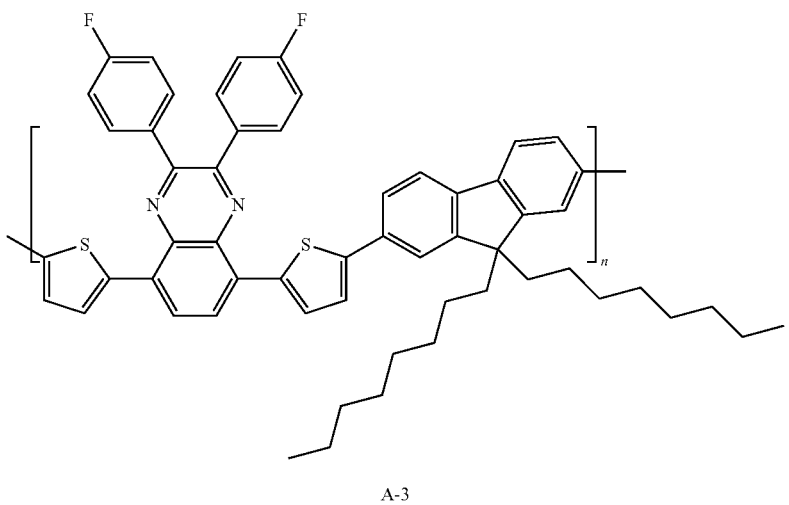

A-3

Compound (1-c) (1.0 g) of Synthesis Example 1 and 4,4'-difluorobenzyl (930 mg) (produced by Tokyo Chemical Industry Co., Ltd.) were added to 37 mL of chloroform and, after 3 drops of methane sulfonic acid (produced by Wako Pure Chemical Industries, Ltd.) was added thereto in a nitrogen atmosphere, this was heated and refluxed for 7 hours. After the resulting solution was washed with an aqueous sodium hydrogencarbonate solution, this was dried over magnesium sulfate. The resulting solution was purified by column chromatography (filler: silica gel, eluent: dichloromethane), and washed with methanol so that compound (3-a) (780 mg) was obtained.

The above-mentioned compound (3-a) (780 mg) and tributyl(2-thienyl)tin (1.52 g) (produced by Tokyo Chemical Industry Co., Ltd.) were added to 20 mL of tetrahydrofuran (produced by Wako Pure Chemical Industries, Ltd.), and to this was added 23 mg of bis(triphenyl phosphine) palladium dichloride (produced by Tokyo Chemical Industry Co., Ltd.) in a nitrogen atmosphere, and heated and refluxed for 7 hours. To the resulting solution was added 150 mL of chloroform and, after being washed with water, this was dried over magnesium sulfate. The resulting solution was purified by column chromatography (filler: silica gel, eluent: dichloromethane), and washed with methanol so that compound (3-b) (600 mg) was obtained.

The above-mentioned compound (3-b) (600 mg) was dissolved in 40 mL of dimethylformamide (produced by Wako Pure Chemical Industries, Ltd.), and to this was added 440 mg of N-bromosuccinimide (produced by Wako Pure Chemical Industries, Ltd.), and stirred at room temperature for 6 hours. Chloroform (200 mL) was added to the resulting solution, and after being washed with water, the resulting solution was dried over magnesium sulfate. The resulting solid was purified by column chromatography (filler: silica gel, eluent: chloroform), and washed with methanol so that compound (3-c) (740 mg) was obtained. The result of $^1$H-NMR measurement on compound (3-c) is shown below:

$^1$H-NMR (CDCl$_3$, ppm): 8.10 (s, 2H), 7.71-7.65 (m, 4H), 7.57 (d, 2H), 7.16-7.10 (m, 6H).

The above-mentioned compound (3-c) (320 mg) and compound (1-g) of Synthesis Example 1 (279 mg) (produced by Aldrich Corporation) were dissolved in 60 mL of toluene. To this were added water (15 mL), potassium carbonate (1.38 g), tetrakis(triphenyl phosphine) palladium (0) (58 mg) (produced by Tokyo Chemical Industry Co., Ltd.) and 2 drops of Aliquat 336 (produced by Aldrich Corporation), and this was stirred at 100° C. for 3 hours in a nitrogen atmosphere. Next, to this was added 200 mg of bromobenzene (produced by Tokyo Chemical Industry Co., Ltd.), and stirred at 100° C. for one hour. Next, to this was added 200 mg of phenylboronic acid (produced by Tokyo Chemical Industry Co., Ltd.), and stirred at 100° C. for 2 hours. To the resulting solution was added 300 mL of methanol, and the generated solid was filtered and taken out, and then washed with methanol, acetone, water and acetone in this order. The resulting solid was dissolved in 300 mL of acetone, and heated and refluxed for 30 minutes. The solid, obtained through filtration while being heated, was dissolved in 300 mL chloroform and, after being filtered through a silica gel short column (eluent: chloroform), the resulting solution was condensed, and re-precipitated with methanol so that compound A-3 (172 g) was obtained (yield: 40%). This compound had the weight-average molecular weight of 38700, the number-average molecular weight of 8860, and the degree of polymerization n of 44.5. Moreover, the light absorption edge wavelength thereof was 649 nm, the bandgap (Eg) was 1.91 eV, and the highest occupied molecular orbital (HOMO) level was −5.51 eV.

Synthesis Example 4

Compound A-4 was synthesized by using a method indicated by Scheme 4.

Scheme 4

[Formula 22]

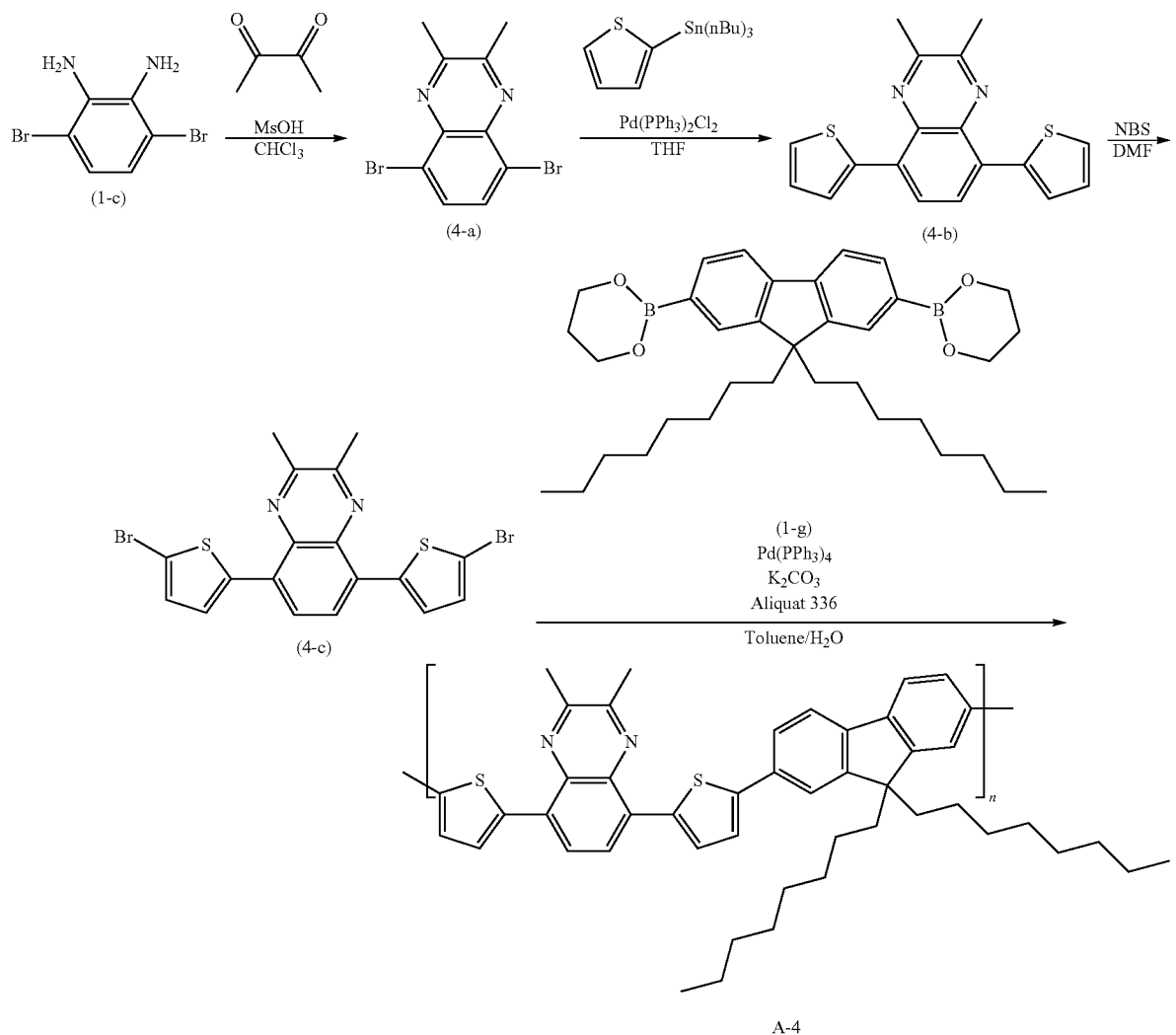

A-4

Compound (1-c) (1.09 g) of Synthesis Example 1 and diacetyl (350 mg) (produced by Tokyo Chemical Industry Co., Ltd.) were added to 41 mL of chloroform and, after 4 drops of methane sulfonic acid (produced by Wako Pure Chemical Industries, Ltd.) was added thereto in a nitrogen atmosphere, this was heated and refluxed for 5 hours. After being washed with an aqueous sodium hydrogencarbonate solution, the resulting solution was dried over magnesium sulfate. The resulting solution was purified by column chromatography (filler: silica gel, eluent: dichloromethane), and washed with hexane so that compound (4-a) (785 mg) was obtained.

The above-mentioned compound (4-a) (784 mg) and tributyl(2-thienyl)tin (2.31 g) (produced by Tokyo Chemical Industry Co., Ltd.) were added to 30 mL of tetrahydrofuran (produced by Wako Pure Chemical Industries, Ltd.), and to this was added 35 mL of bis(triphenyl phosphine) palladium dichloride (produced by Tokyo Chemical Industry Co., Ltd.) in a nitrogen atmosphere, and heated and refluxed for 7 hours. To the resulting solution was added 150 mL of chloroform and, after being washed with water, this was dried over magnesium sulfate. The resulting solution was purified by column chromatography (filler: silica gel, eluent: dichloromethane), and washed with hexane so that compound (4-b) (565 mg) was obtained.

The above-mentioned compound (4-b) (565 mg) was dissolved in 80 mL of dimethylformamide (produced by Wako Pure Chemical Industries, Ltd.), and to this was added 624 mg of N-bromosuccinimide (produced by Wako Pure Chemical Industries, Ltd.), and stirred at room temperature for 7 hours. Water (200 mL) was added to the resulting solution, and the resulting precipitate was filtered and taken out, and then washed with water and methanol in this order. The resulting solid was purified by column chromatography (filler: silica gel, eluent: dichloromethane), and washed with methanol so that compound (4-c) (782 mg) was obtained. The result of $^1$H-NMR measurement on compound (4-c) is shown below:

$^1$H-NMR (CDCl$_3$, ppm): 7.99 (s, 2H), 7.53 (d, 2H), 7.11 (d, 2H), 2.83 (s, 6H).

The above-mentioned compound (4-c) (316 mg) and compound (1-g) of Synthesis Example 1 (367 mg) (produced by Aldrich Corporation) were dissolved in 80 mL of toluene. To this were added water (20 mL), potassium carbonate (1.82 g), tetrakis(triphenyl phosphine) palladium (0) (76 mg) (produced by Tokyo Chemical Industry Co., Ltd.) and 2 drops of Aliquat 336 (produced by Aldrich Corporation), and this was stirred at 100° C. for 1.5 hours in a nitrogen atmosphere. Next, to this was added 200 mg of bromobenzene (produced by Tokyo Chemical Industry Co., Ltd.), and stirred at 100° C. for one hour. Next, to this was added 200 mg of phenylboronic acid (produced by Tokyo Chemical Industry Co., Ltd.), and stirred at 100° C. for 3 hours. To the resulting solution was added 200 mL of methanol, and the generated solid was filtered and taken out, and then washed with methanol, acetone, water and acetone in this order. The resulting solid was dissolved in 300 mL of acetone, and heated and refluxed for 30 minutes. The solid, obtained through filtration while being heated, was dissolved in 300 mL of chloroform and, after being filtered through a silica gel short column (eluent: chloroform), the resulting solution was condensed, and re-precipitated with methanol so that compound A-4 (97 mg) was obtained (yield: 21%). This compound had the weight-average molecular weight of 8500, the number-average molecular weight of 5300, and the degree of polymerization n of 12.0. Moreover, the light absorption edge wavelength thereof was 591 nm, the bandgap (Eg) was 2.10 eV, and the highest occupied molecular orbital (HOMO) level was −5.30 eV.

Synthesis Example 5

Compound A-5 was synthesized by using a method indicated by Scheme 5.

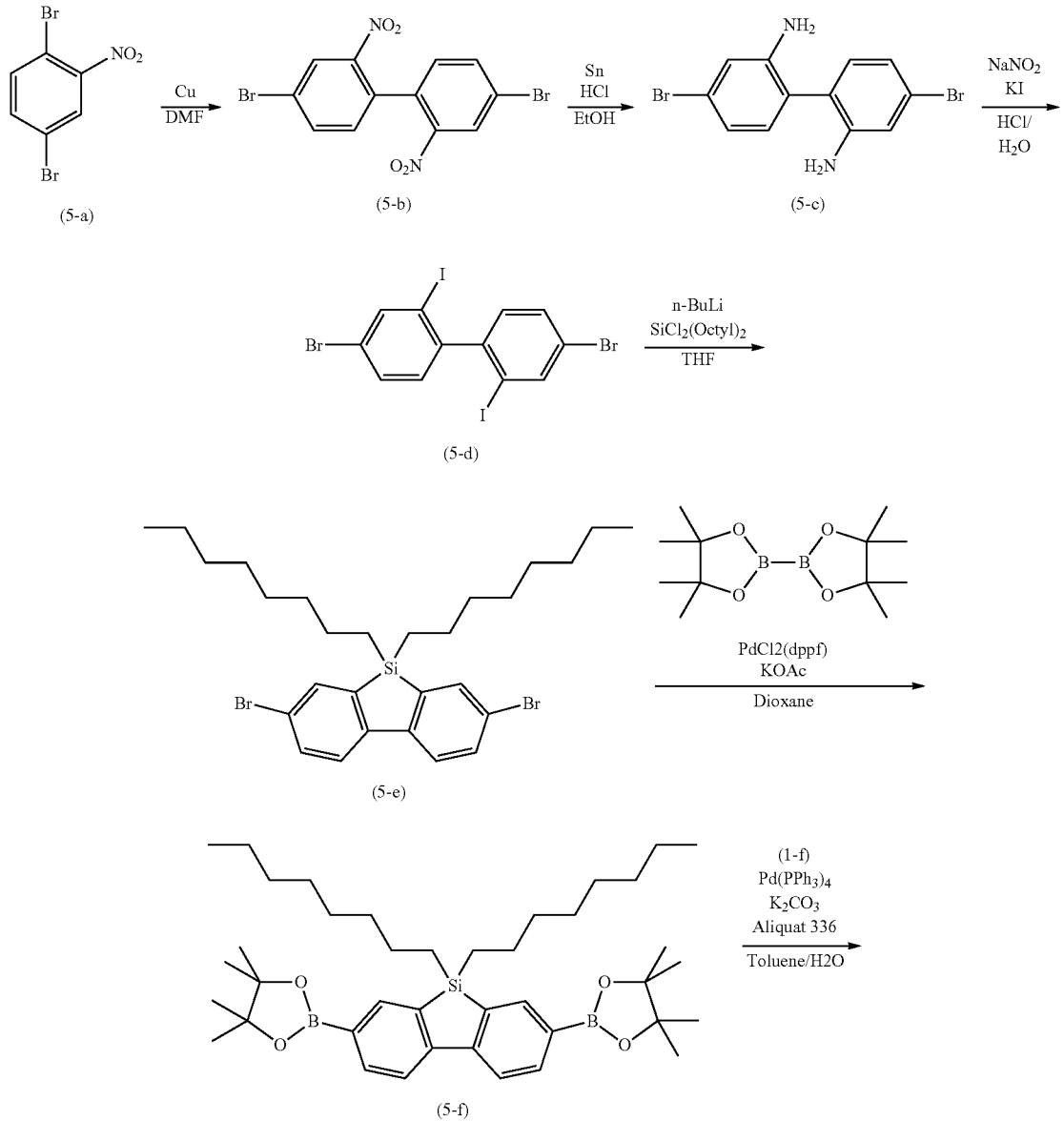

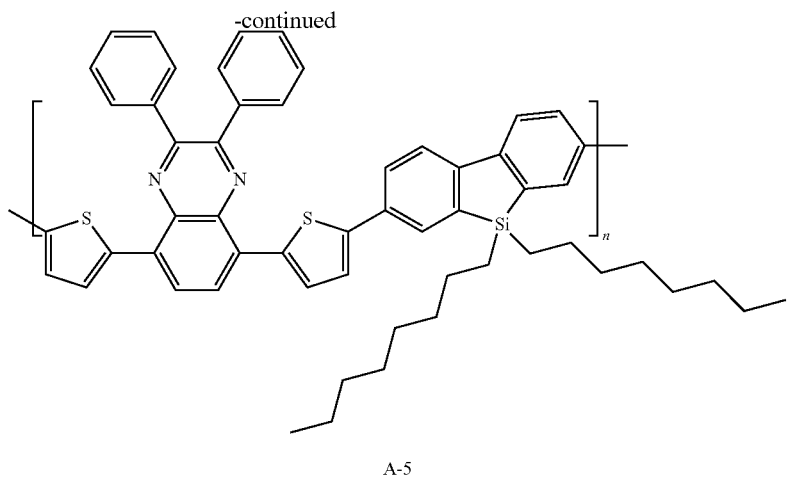

A-5

Compound (5-a) (50.25 g) described in Formula 5 (produced by Wako Pure Chemical Industries, Ltd.) and a copper powder (25 g) (produced by Wako Pure Chemical Industries, Ltd.) were added to 230 mL of dimethylformamide, and stirred at 130° C. for 7 hours in a nitrogen atmosphere. After the solvent was distilled off under reduced pressure, to this was added 500 mL of toluene, and filtered through celite, and after being washed with water (400 mL) and an aqueous sodium hydrogencarbonate solution (200 mL) in this order, the resulting solution was dried over magnesium sulfate. After the solvent was distilled off from the resulting solution, the residues were washed with 300 mL of isopropanol so that compound (5-b) (26 g) was obtained.

After the above-mentioned compound (5-b) (26 g) was added to 320 mL of ethanol, to this were further added a 36% hydrochloric acid solution (180 mL) and a tin powder (31 g) (produced by Wako Pure Chemical Industries, Ltd.), and this was stirred at 100° C. for 4 hours in a nitrogen atmosphere. The resulting solution was put into 800 mL of water, and to this was added an aqueous sodium hydrochloric acid solution so that the pH thereof was set to about 10. The generated precipitate was filtered and taken out, and then dissolved in 1000 mL of chloroform and, after being washed with 1000 mL of water, the resulting solution was dried over magnesium sulfate. The solvent was distilled off from the resulting solution so that compound (5-c) (21.37 g) was obtained.

The above-mentioned compound (5-c) (21.3 g) was added to a 36% hydrochloric acid solution (75 mL) and water (85 mL), and to this was dripped an aqueous $NaNO_2$ solution ($NaNO_2$ 10.7 g/water 55 mL) at 5° C. After being stirred at 5° C. for 30 minutes, to this was dripped an aqueous KI solution (KI 104 g/water 200 mL), and then stirred at 5° C. for one hour, at room temperature for one hour, and at 60° C. for 3 hours. The resulting solid was filtered and taken out, and then purified by column chromatography (filler: silica gel, eluent: hexane) so that compound (5-d) (4.27 g) was obtained.

The above-mentioned compound (5-d) (4.27 g) was dissolved in 85 mL of tetrahydrofuran (produced by Wako Pure Chemical Industries, Ltd.), and cooled to −80° C. To this was added 19 mL of a n-butyl lithium 1.6M hexane solution (produced by Wako Pure Chemical Industries, Ltd.) in one hour, and was then stirred at −80° C. for 30 minutes in a hydrogen atmosphere. To this was further added 5.2 mL of dichlorodioctyl silane (produced by Wako Pure Chemical Industries, Ltd.), and heated to room temperature, and then stirred for one day in a nitrogen atmosphere. Water (50 mL) was added to the resulting solution, and the solvent was distilled off. After adding 150 mL of diethylether thereto, an organic layer was separated and taken out, and this was washed with water (400 mL), and then dried over magnesium sulfate. The resulting solution was purified by column chromatography (filler: silica gel, eluent: hexane) so that compound (5-e) (2.49 g) was obtained.

The above-mentioned compound (5-e) (2.49 g) and bis (pinacolato) diboron (2.58 g) (produced by BASF Corp.) were added to 21 mL of 1,4-dioxane, and to this were further added 2.6 g of potassium acetate (produced by Wako Pure Chemical Industries, Ltd.) and 648 mg of [bis(diphenylphosphino)ferrocene]dichloropalladium (produced by Aldrich Corporation), and stirred at 80° C. for 5.5 hours. Water (200 mL) and diethylether (200 mL) were added to the resulting solution, and an organic layer was separated and taken out, and this was washed with 300 mL of water, and then dried over magnesium sulfate. The resulting solution was purified by column chromatography (filler: florisil, eluent: hexane/ethylacetate) so that compound (5-f) (2.6 g) was obtained. The result of $^1$H-NMR measurement on compound (5-f) is shown below:

$^1$H-NMR ($CDCl_3$, ppm): 8.04 (s, 2H), 7.90-7.83 (m, 4H), 1.37 (s, 24H), 1.35-1.17 (m, 24H), 0.93 (t, 4H), 0.84 (t, 6H).

The above-mentioned compound (5-f) (310 mg) and compound (1-f) of Synthesis Example 1 (300 mg) were dissolved in 50 mL of toluene. To this were added water (15 mL), potassium carbonate (1.37 g), tetrakis(triphenyl phosphine) palladium (0) (58 mg) (produced by Tokyo Chemical Industry Co., Ltd.) and one drop of Aliquat 336 (produced by Aldrich Corporation), and this was stirred at 100° C. for 6 hours in a nitrogen atmosphere. Next, to this was added 200 mg of bromobenzene (produced by Tokyo Chemical Industry Co., Ltd.), and stirred at 100° C. for one hour. Next, to this was added phenylboronic acid (200 mg) (produced by Tokyo Chemical Industry Co., Ltd.), and stirred at 100° C. for 6 hours. To the resulting solution was added 200 mL of methanol, and the generated solid was filtered and taken out, and then washed with methanol, water and acetone in this order. The resulting solid was dissolved in 200 mL of acetone, and heated and refluxed for 5 minutes. The solid, obtained through filtration while being heated, was dissolved in 200 mL of chloroform, and after being filtered through a silica gel short column (eluent: chloroform), the resulting solution was condensed, and re-precipitated with methanol so that compound A-5 (342 mg) was obtained (yield: 86%). This compound had the weight-average molecular weight of 54700, the number-average molecular weight of 11100, and the degree of polymerization n of 64.5. Moreover, the light absorption edge wavelength thereof was 640 nm, the bandgap (Eg) was 1.94 eV, and the highest occupied molecular orbital (HOMO) level was −5.29 eV.

Synthesis Example 6

Compound A-6 was synthesized by using a method indicated by Scheme 6.

Scheme 6

[Formula 24]

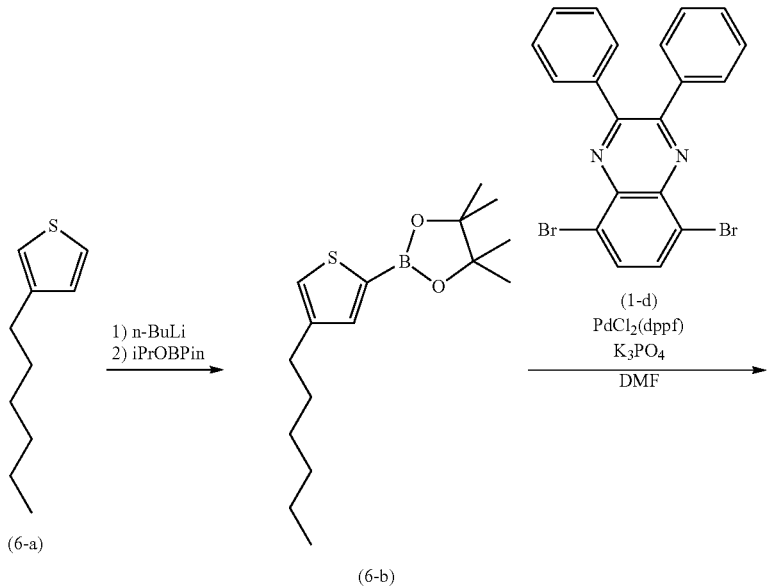

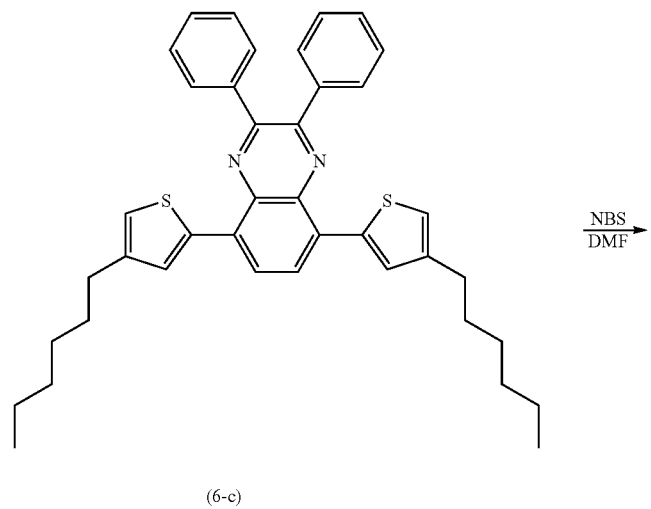

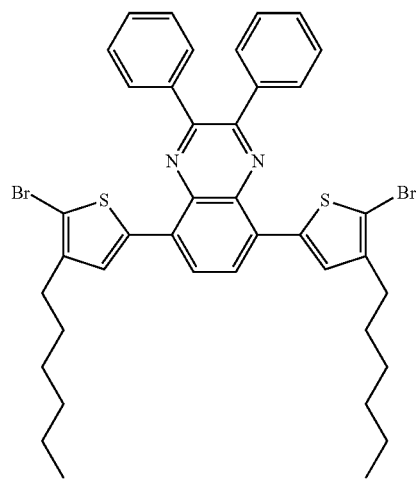

(6-d)

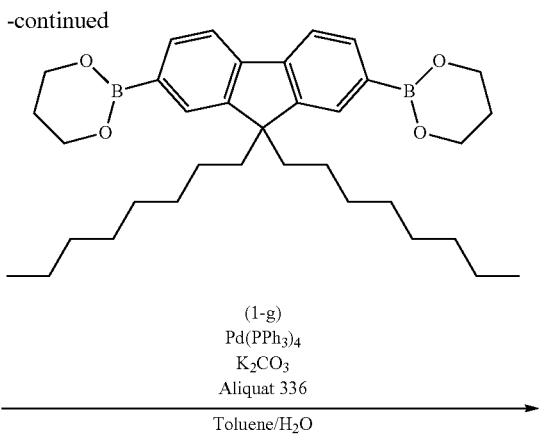

(1-g)
Pd(PPh₃)₄
K₂CO₃
Aliquat 336
Toluene/H₂O

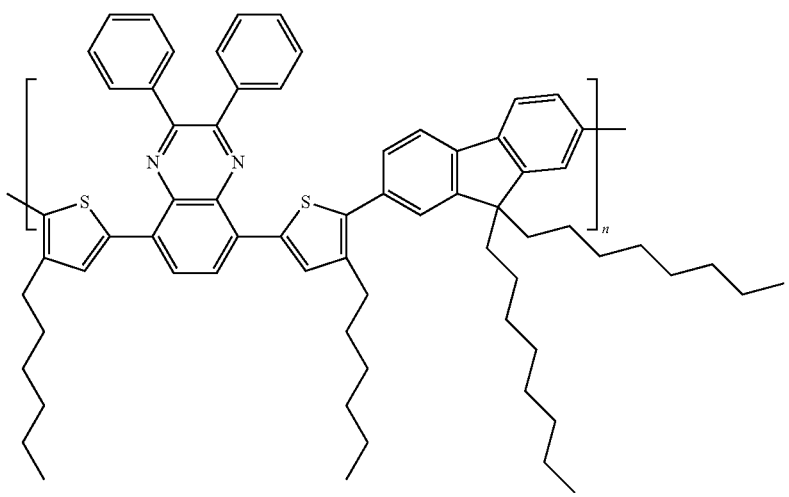

A-6

Compound (6-a) (3 g) described in Formula 6 (produced by Tokyo Chemical Industry Co., Ltd.) was dissolved in 40 mL of tetrahydrofuran (produced by Wako Pure Chemical Industries, Ltd.), and cooled to −80° C. To this was added an n-butyl lithium 1.6M hexane solution (12 mL) (produced by Wako Pure Chemical Industries, Ltd.), and stirred for 2 hours, and its temperature was raised to −60° C., and to this was further added 5.5 g of 2-isopropoxy-4,4,5,5-tetramethyl-1,3,2-dioxaborolane (produced by Wako Pure Chemical Industries, Ltd.). This was heated to room temperature, and stirred for 4 hours in a nitrogen atmosphere. To the resulting solution were added dichloromethane (100 mL) and a saturated saline (100 mL) so that an organic layer was separated and taken out. The organic layer was washed with 100 mL of water three times, and then dried over magnesium sulfate. The solvent was distilled off from the resulting solution under reduced pressure by using a rotary evaporator so that compound (6-b) (4.6 g) was obtained.

The above-mentioned compound (6-b) (600 mg) and the aforementioned compound (1-d) (446 mg) were added to 10 mL of dimethylformamide, and to this were further added 2.57 g of potassium phosphate (produced by Wako Pure Chemical Industries, Ltd.) and 41 mg of [bis(diphenylphosphino)ferrocene]dichloropalladium (produced by Aldrich Corporation) in a nitrogen atmosphere, and stirred at 100° C. for 6 hours. Water (100 mL) and chloroform (100 mL) were added to the resulting solution, and an organic layer was separated and taken out, and this was washed with 100 mL of water, and then dried over magnesium sulfate. The resulting solution was purified by column chromatography (filler: silica gel, eluent: dichloromethane/hexane) so that compound (6-c) (480 mg) was obtained.

The above-mentioned compound (6-c) (480 mg) was dissolved in 40 mL of dimethylformamide, and to this was added 280 mg of N-bromosuccinimide (produced by Wako Pure Chemical Industries, Ltd.), and stirred at room temperature for 3.5 hours. Water (200 mL) was added to the resulting solution, and the generated solid was filtered and taken out, and then washed with water. The resulting solid was purified by column chromatography (filler: silica gel, eluent: dichloromethane) so that compound (6-d) (600 mg) was obtained. The result of $^1$H-NMR measurement on compound (6-d) is shown below:

$^1$H-NMR (CDCl$_3$, ppm): 8.06 (s, 2H), 7.74-7.69 (m, 4H), 7.55 (s, 2H), 7.42-7.39 (m, 6H), 2.63 (t, 4H), 1.73-1.62 (m, 4H), 1.36 (m, 8H), 0.91 (t, 6H).

The above-mentioned compound (6-d) (321 mg) and the aforementioned compound (1-g) (231 mg) (produced by Aldrich Corporation) were dissolved in 50 mL of toluene. To this were added water (15 mL), potassium carbonate (1.15 g), tetrakis(triphenyl phosphine) palladium (0) (46 mg) (produced by Tokyo Chemical Industry Co., Ltd.) and 2 drops of Aliquat 336 (produced by Aldrich Corporation), and this was stirred at 100° C. for 5.5 hours in a nitrogen atmosphere. Next, to this was added bromobenzene (200 mg) (produced by Tokyo Chemical Industry Co., Ltd.), and stirred at 100° C. for one hour. Next, to this was added 200 mg of phenylboronic acid (produced by Tokyo Chemical Industry Co., Ltd.), and stirred at 100° C. for 4 hours. To the resulting solution was added 200 mL of methanol, and the generated solid was filtered and taken out, and then washed with methanol, acetone, water and acetone in this order. The resulting solid was dissolved in 200 mL of dichloromethane, and after being passed through a silica gel short column (eluent: dichloromethane), this was condensed, and re-precipitated with methanol so that compound A-6 (365 g) was obtained (yield: 89%). This compound had the weight-average molecular weight of 18200, the number-average molecular weight of 9900, and the degree of polymerization n of 18.2. Moreover, the light absorption edge wavelength thereof was 606 nm, the bandgap (Eg) was 2.05 eV, and the highest occupied molecular orbital (HOMO) level was −5.42 eV.

Synthesis Example 7

Compound A-7 was synthesized by using a method indicated by Scheme 7.

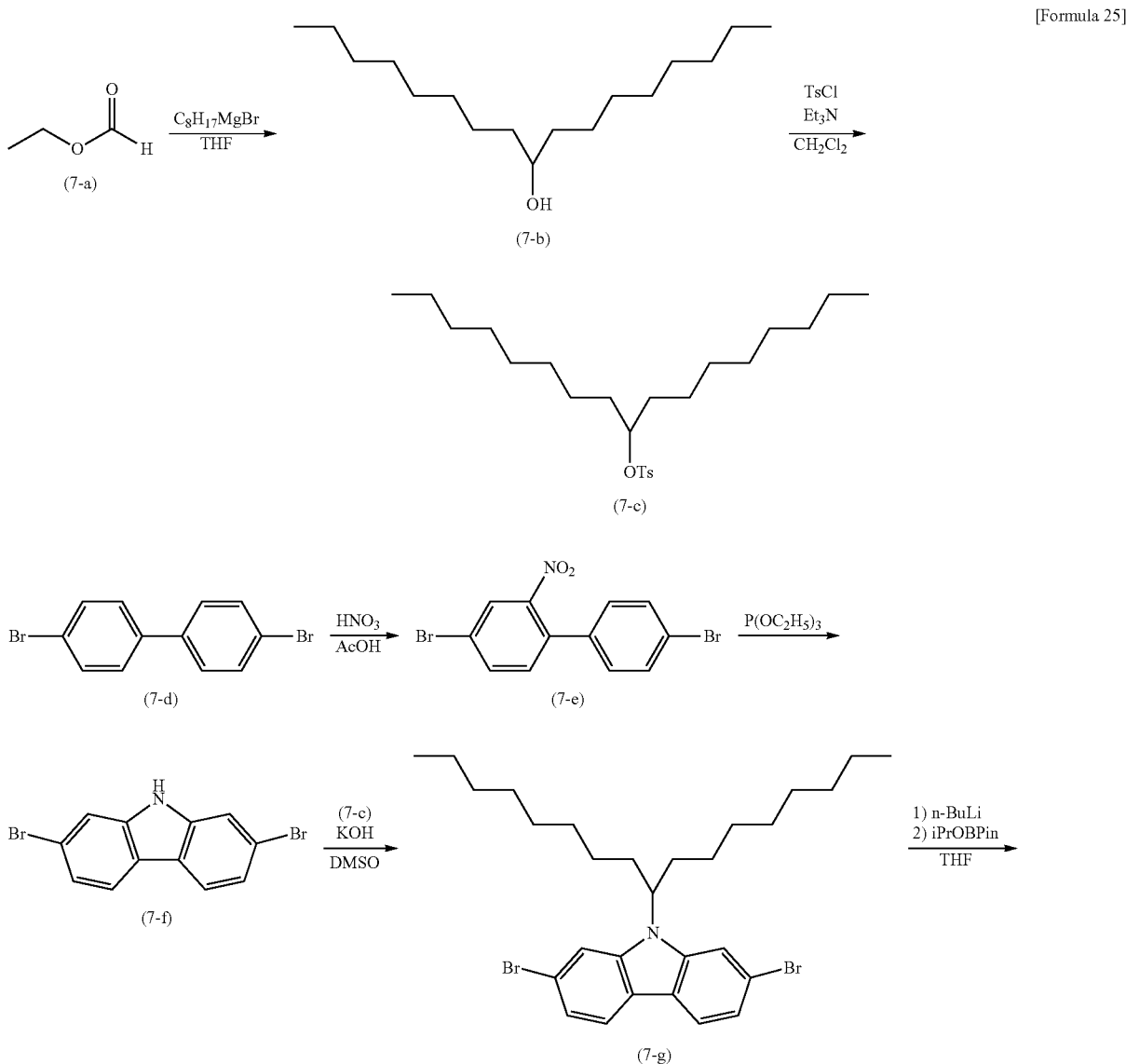

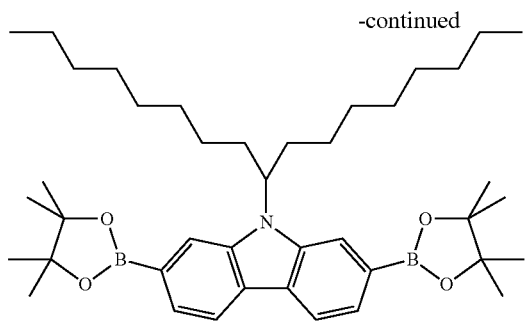

(7-h)

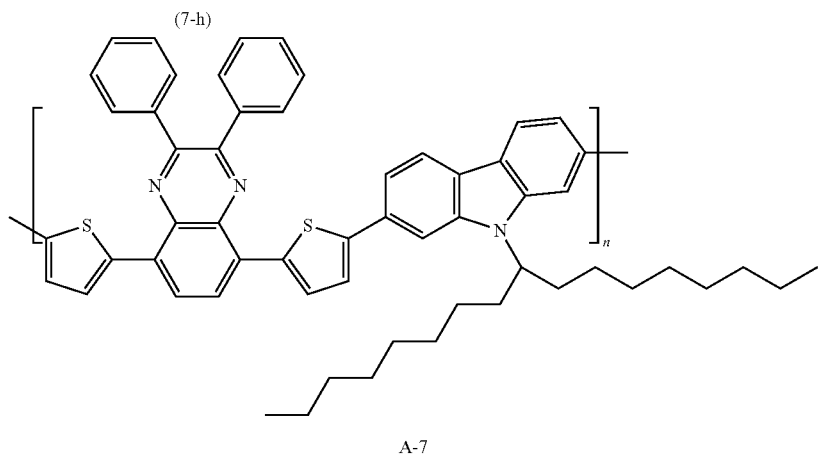

A-7

To ethyl formate (7-a) (6.15 g) (produced by Tokyo Chemical Industry Co., Ltd.) was added 125 mL of tetrahydrofuran, and cooled to −78° C., and to this was dripped 250 mL of a tetrahydrofuran solution of octylmagnesium bromide having a concentration of 1.0 M (produced by Tokyo Chemical Industry Co., Ltd.) in one hour, with the reaction solution being kept at −78° C. After the dripping process, the reaction solution was stirred at room temperature for 5 hours. After excessive octylmagnesium bromide was eliminated by adding 50 mL of methanol, tetrahydrofuran was distilled off under reduced pressure. Diethylether (120 mL) was added thereto, and the resulting organic layer was washed with 100 mL of an aqueous saturated ammonium chloride solution, and then washed with 100 mL of a saturated saline. After the organic layer was dried over anhydrous magnesium sulfate, the solvent was distilled off under reduced pressure. The residues were purified by column chromatography (filler: silica gel, eluent: hexane/ethyl acetate=10/1) so that compound (7-b) (16.0 g) was obtained as a white solid.

To 80 mL of dichloromethane were added the above-mentioned compound (7-b) (10.0 g), triethylamine (5.1 g) (produced by Wako Pure Chemical Industries, Ltd.) and pyridine (5 mL) (produced by Wako Pure Chemical Industries, Ltd.), and while being stirred at 0° C., to this was added 8.92 g of paratoluene sulfonyl chloride. After being stirred at 0° C. for one hour, the reaction solution was further stirred at room temperature for 12 hours. To this was added water (50 mL), and further stirred at room temperature for 30 minutes, and the product was extracted twice with 80 mL of dichloromethane. After the organic layer was dried over anhydrous magnesium sulfate, the solvent was distilled off under reduced pressure. The residues were purified by column chromatography (filler: silica gel, eluent: hexane/ethyl acetate=10/1) so that compound (7-c) (9.2 g) was obtained as a wax state solid.

To 4-4-4'-dibromobephenyl (7-d) (25.0 g) (produced by Tokyo Chemical Industry Co., Ltd.) was added 375 mL of acetic acid (produced by Wako Pure Chemical Industries, Ltd.), and while being stirred at 100° C., to this was added 120 mL of fuming nitric acid (produced by Wako Pure Chemical Industries, Ltd.) slowly, and water (10 mL) was successively added to the reaction solution. After the reaction solution was stirred at 100° C. for one hour, it was cooled to room temperature, and left at room temperature for 5 hours. After the resulting solid was filtered and taken out, it was washed with water and then with ethanol. By allowing the crude product to be re-crystallized from ethanol, compound (7-e) (17.0 g) was obtained as a pale yellow solid.

To the above-mentioned compound (7-e) (11 g) was added 40 mL of triethyl phosphite (produced by Wako Pure Chemical Industries, Ltd.), and stirred at 150° C. for 10 hours. After triethyl phosphite was distilled off under reduced pressure, the residues were purified by column chromatography (filler: silica gel, eluent: hexane/ethyl acetate=5/1) so that compound (7-f) (2.5 g) was obtained as a white solid.

To the above-mentioned compound (7-f) (1.2 g) were added dimethylsolfoxide (10 mL) (produced by Tokyo Chemical Industry Co., Ltd.) and a powder of potassium hydroxide (1.08 g) (produced by Wako Pure Chemical Industries, Ltd.), and while being stirred at room temperature, to this was dripped 6 mL of a dimethylsulfoxide solution containing 2.4 g of the above-mentioned compound (7-c) at room temperature over one hour. After the dripping process, the resulting solution was stirred at room temperature for 5 hours. After water (50 mL) was added to the reaction mixture, the solution was extracted three times by using hexane (40 mL), and the organic layer was dried over anhydrous magnesium sulfate, and the solvent was then distilled off under reduced pressure. The residues were purified by column chromatography (filler: silica gel, eluent: hexane) so that compound (7-g) (540 mg) was obtained as a white solid.

The above-mentioned compound (7-g) (530 mg) was dissolved in 10 mL of tetrahydrofuran, and cooled to −78° C., and to this was dripped 0.65 mL of a n-butyl lithium hexane solution having a concentration of 1.6 M (produced by Wako Pure Chemical Industries, Ltd.), and stirred at −78° C. for one hour. After being stirred at 0° C. for 30 minutes, the resulting reaction solution was again cooled to −78° C., and to this was added 440 mg of 2-isopropoxy-4,4,5,5-tetramethyl-1,3,2-dioxaborane (produced by Tokyo Chemical Industry Co., Ltd.). After the reaction solution was further stirred at room temperature for 4 hours, water (10 mL) and then diethylether (50 mL) were added to the resulting solution. After the resulting organic layer was washed with water (30 mL) three times, and then with a saturated saline (30 mL) one time, it was dried over anhydrous magnesium sulfate, and the solvent was distilled off under reduced pressure. By carrying out a re-crystallizing process from the methanol/acetone mixed solvent, compound (7-h) (390 mg) was obtained as a white solid. The result of $^1$H-NMR measurement on compound (7-h) is shown below:

$^1$H-NMR (CDCl$_3$, ppm): 8.12 (s, 2H), 8.02 (s, 1H), 7.89 (s, 1H), 7.66 (d, J=7.6 Hz, 2H), 4.69 (m, 2H), 2.31 (m, 2H), 1.95 (m, 2H), 1.39 (s, 24H), 1.21-1.12 (m, 24H), 0.82 (t, J=7.0 Hz, 6H).

The above-mentioned compound (7-h) (99 mg) and compound (1-f) of Synthesis Example 1 (91 mg) were dissolved in 15 mL of toluene. To this were added water (4 mL), potassium carbonate (550 mg), tetrakis(triphenyl phosphine) palladium (0) (17 mg) (produced by Tokyo Chemical Industry Co., Ltd.), and one drop of Aliquat 336 (produced by Aldrich Corporation), and this was stirred at 90° C. for 7 hours in a nitrogen atmosphere. Next, to this was added 20 mg of bromobenzene (produced by Tokyo Chemical Industry Co., Ltd.), and stirred at 90° C. for one hour. Next, to this was added 40 mg of phenylboronic acid (produced by Tokyo Chemical Industry Co., Ltd.), and stirred at 90° C. for one hour. After the stirring process, the resulting solution was cooled to room temperature, and to this was added 200 mL of methanol, and the resulting solid was filtered and taken out, and then washed with methanol, water and acetone in this order. The resulting solid was dissolved in 100 mL of chloroform, and after being passed through silica gel short column (eluent: chloroform), the resulting solution was condensed, and re-precipitated with methanol so that compound A-7 (35 mg) was obtained (yield: 28%). This compound had the weight-average molecular weight of 12000, the number-average molecular weight of 7500, and the degree of polymerization n of 14.0. Moreover, the light absorption edge wavelength thereof was 648 nm, the bandgap (Eg) was 1.91 eV, and the highest occupied molecular orbital (HOMO) level was −5.16 eV.

Synthesis Example 8

Compound B-1 was synthesized by using a method indicated by Scheme 8.

Scheme 8

[Formula 26]

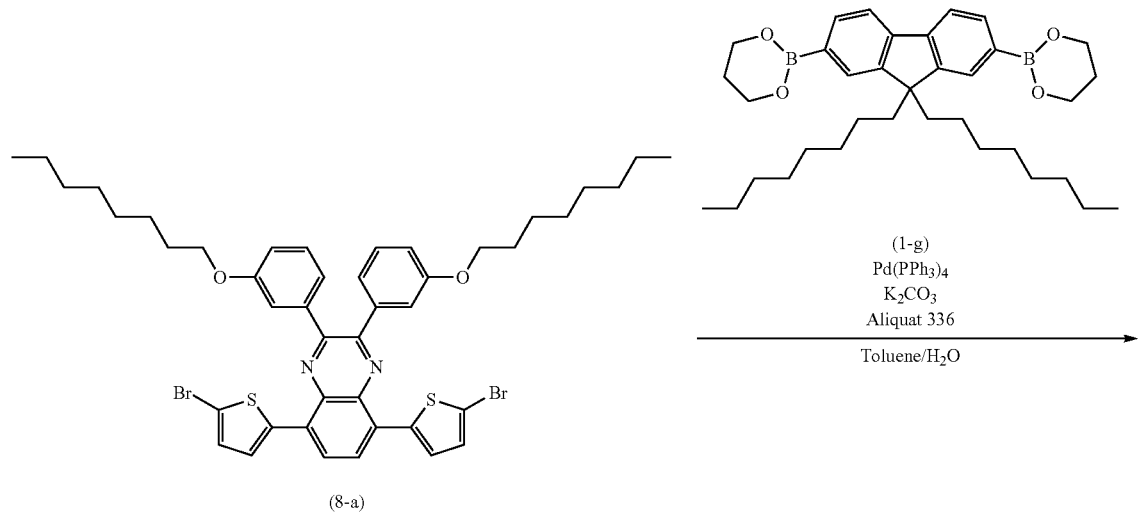

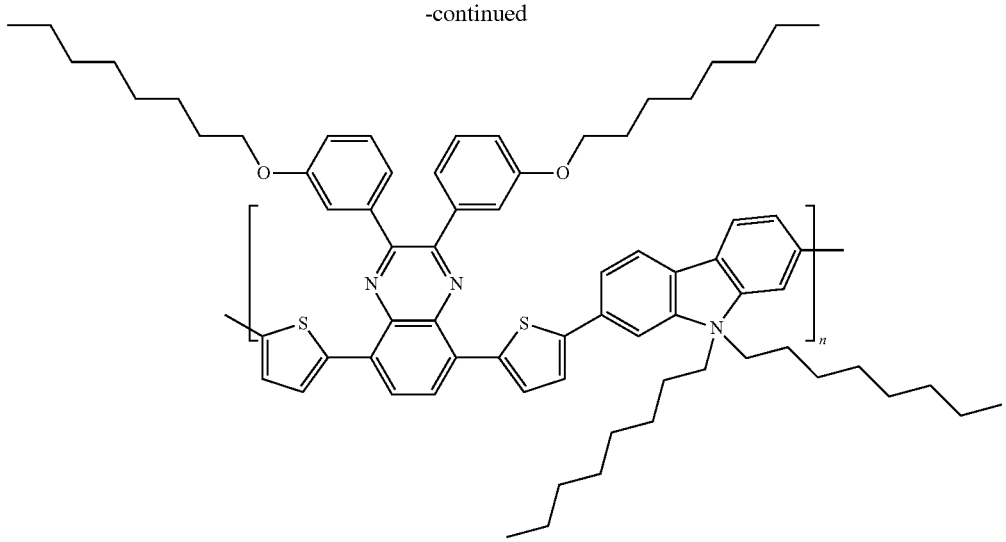

B-1

Compound (8-a) was synthesized by using a method described in "Advanced Functional Materials", pp. 3836-3842, Volume 17, 2007. The result of $^1$H-NMR measurement on compound (8-a) is shown below:

$^1$H-NMR (CDCl$_3$, ppm): 8.09 (s, 2H), 7.57-7.54 (m, 4H), 7.22 (t, 2H), 7.13-7.10 (m, 4H), 6.98 (d•d, 2H), 4.04 (t, 4H), 1.81 (m, 4H), 1.50-1.30 (m, 20H), 0.89 (t, 6H).

The above-mentioned compound (8-a) (382 mg) and the aforementioned compound (1-g) of Synthesis Example 1 (248 mg) (produced by Aldrich Corporation) were dissolved in 50 mL of toluene. To this were added water (15 mL), potassium carbonate (1.23 g), tetrakis(triphenyl phosphine) palladium (0) (51 mg) (produced by Tokyo Chemical Industry Co., Ltd.) and 2 drops of Aliquat 336 (produced by Aldrich Corporation), and this was stirred at 100° C. for 2.5 hours in a nitrogen atmosphere. Next, to this was added 200 mg of bromobenzene (produced by Tokyo Chemical Industry Co., Ltd.), and stirred at 100° C. for one hour. Next, to this was added 200 mg of phenylboronic acid (produced by Tokyo Chemical Industry Co., Ltd.), and stirred at 100° C. for 1 hour. To the resulting solution was added 300 mL of methanol, and the generated solid was filtered and taken out, and then washed with methanol, acetone, water and acetone in this order. The resulting solid was added to 300 mL of acetone, and heated and refluxed for 30 minutes. The solid, obtained through filtration while being heated, was dissolved in 300 mL of chloroform, and after being filtered through a silica gel short column (eluent: chloroform), the resulting solution was condensed, and re-precipitated with methanol so that compound B-1 (439 mg) was obtained (yield: 91%). This compound had the weight-average molecular weight of 33000, the number-average molecular weight of 15300, and the degree of polymerization n of 30.3. Moreover, the light absorption edge wavelength thereof was 632 nm, the bandgap (Eg) was 1.96 eV, and the highest occupied molecular orbital (HOMO) level was −5.36 eV.

Synthesis Example 9

Compound B-2 was synthesized by using a method indicated by Scheme 9.

Scheme 9

[Formula 27]

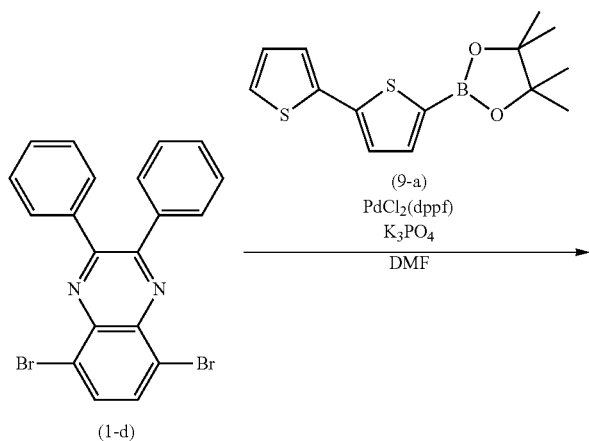

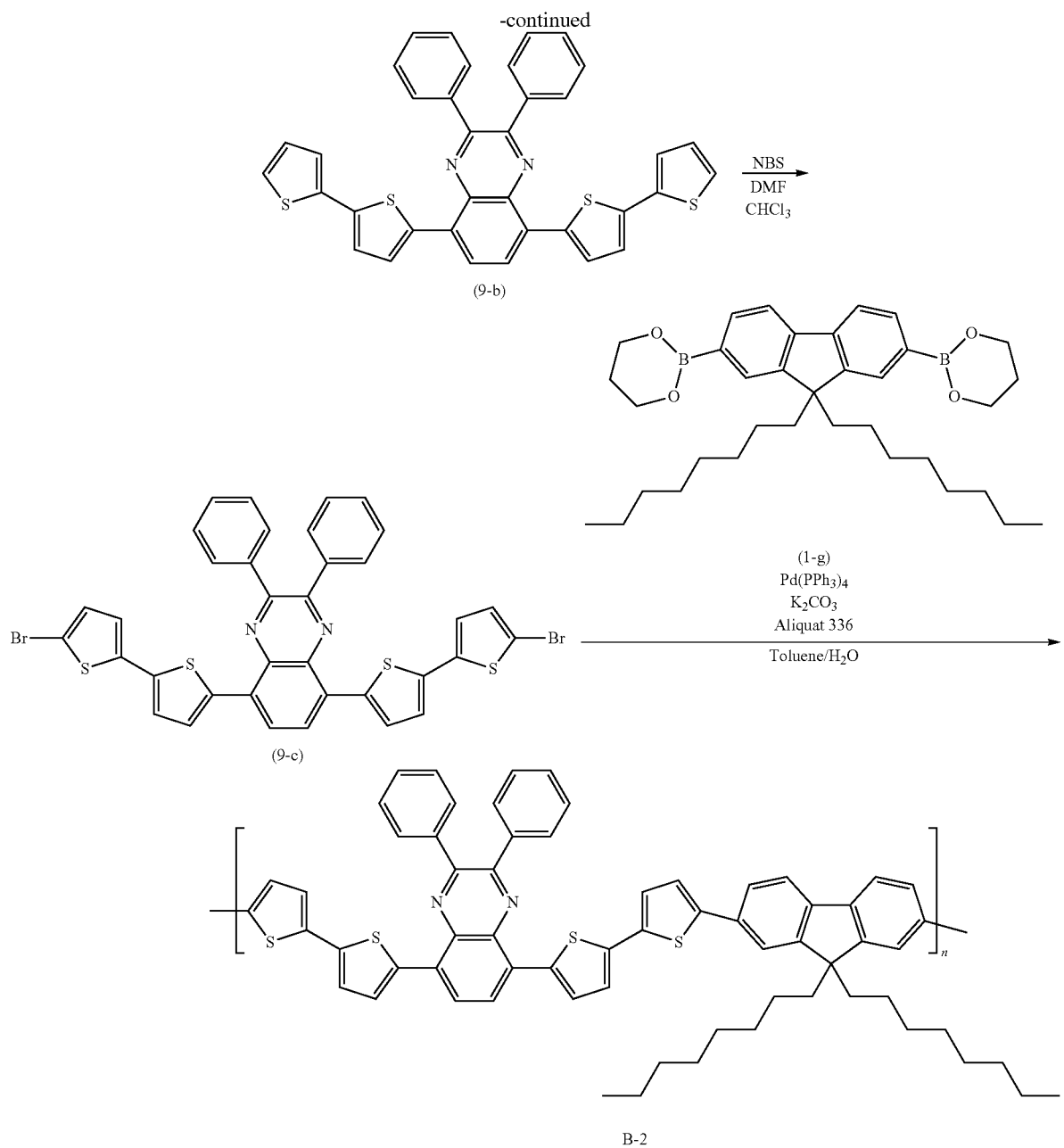

B-2

Compound (1-d) of Synthesis Example 1 (200 mg) and compound (9-a) (290 mg) (produced by Aldrich Corporation) were added to 10 mL of dimethylformamide, and to this were further added potassium phosphate (1.15 g) (produced by Wako Pure Chemical Industries, Ltd.) and [bis(diphenylphosphino)ferrocene]dichloropalladium (37 mg) (produced by Aldrich Corporation) in a nitrogen atmosphere, and stirred at 100° C. for 6.5 hours. Water (100 mL) was added to the resulting solution, and the resulting precipitate was filtered and taken out, and this was washed with water and methanol in this order. The resulting solid was purified by column chromatography (filler: silica gel, eluent: dichloromethane) and washed with methanol so that compound (9-b) (235 mg) was obtained.

The above-mentioned compound (9-b) (235 mg) was dissolved in 40 mL of chloroform, and to this was added to a dimethyl formamide solution (2 mL) containing 137 mg of N-bromosuccinimide (produced by Wako Pure Chemical Industries, Ltd.), and stirred at room temperature for 6 hours. Methanol (100 mL) was added to the resulting solution, and the resulting precipitate was filtered and taken out, and then washed with methanol, water and methanol in this order so that compound (9-c) (288 mg) was obtained. Additionally, since the above-mentioned compound (9-b) and compound (9-c) were low in solubility, it was not possible to carry out $^1$H-NMR measurement.

The above-mentioned compound (9-c) (288 mg) and compound (1-g) of Synthesis Example 1 (209 mg) were dissolved in 70 mL of toluene. To this were added water (15 mL), potassium carbonate (1.04 g), tetrakis(triphenyl phosphine) palladium (0) (43 mg) (produced by Tokyo Chemical Industry Co., Ltd.) and 2 drops of Aliquat 336 (produced by Aldrich Corporation), and this was stirred at 100° C. for 3 hours in a nitrogen atmosphere. Next, to this was added 200 mg of bromobenzene (produced by Tokyo Chemical Industry Co., Ltd.), and stirred at 100° C. for 30 minutes. Next, to this was added 200 mg of phenylboronic acid (produced by Tokyo Chemical Industry Co., Ltd.), and stirred at 100° C. for 30 minutes. To the resulting solution was added 200 mL of methanol, and the generated solid was filtered and taken out, and then washed with methanol, water and acetone in this order. The resulting solid was suspended in 200 mL of chloroform, and after being allowed a chloroform-soluble fraction to pass through a silica gel short column (eluent: chloroform), this was condensed, and re-precipitated with methanol so that compound B-2 (11 mg) was obtained (yield: 29%). Moreover, a gel (360 mg) insoluble to the organic solvent was obtained as a chloroform-insoluble fraction. This compound had the weight-average molecular weight of 5040, the number-average molecular weight of 320, with the degree of polymerization n of 5.1. The light absorption edge wavelength thereof was 680 nm, the bandgap (Eg) was 1.82 eV, and the highest occupied molecular orbital (HOMO) level was −5.20 eV.

Synthesis Example 10

Compound B-3 was synthesized by using a method indicated by Scheme 10.

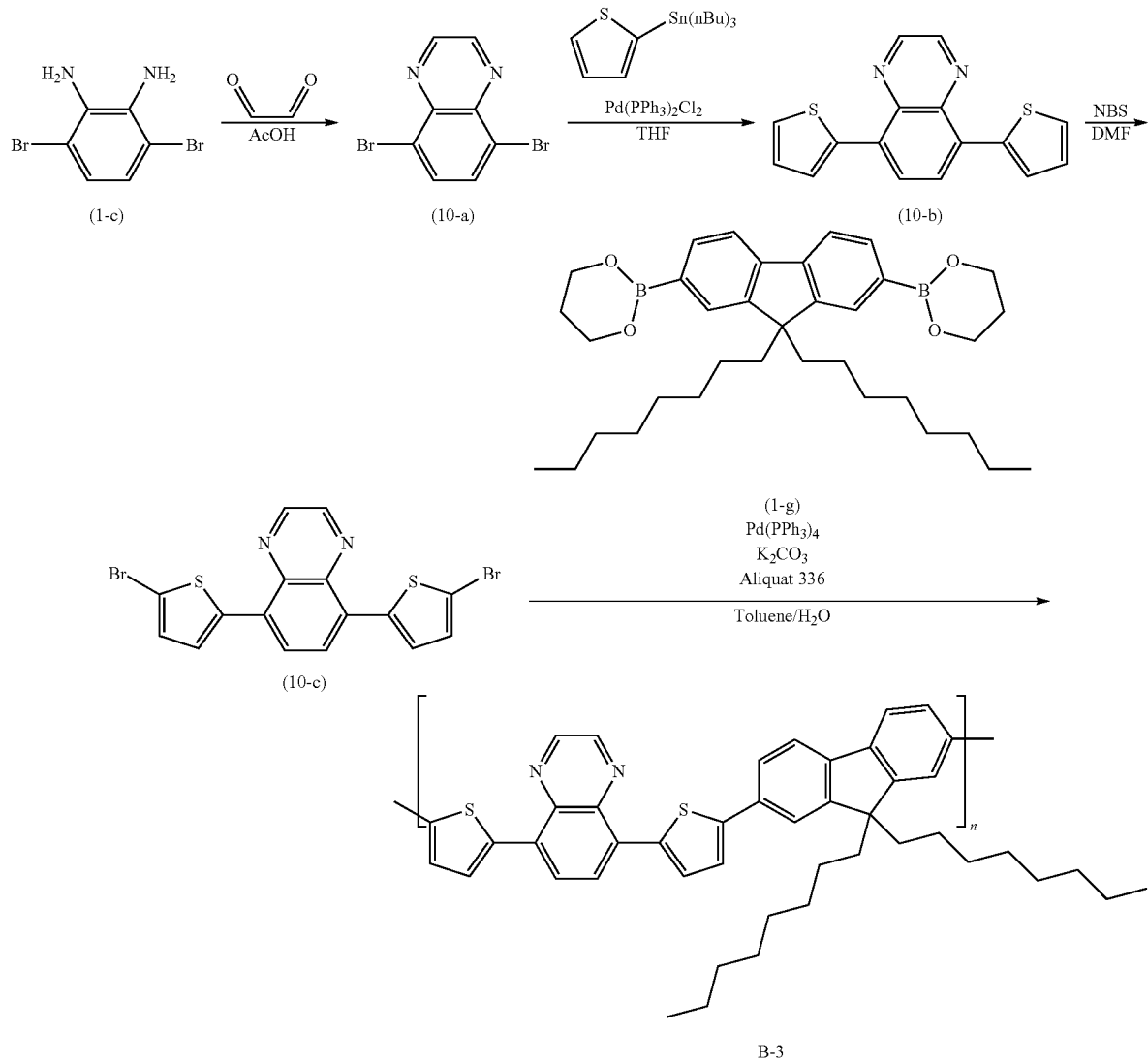

Scheme 10

[Formula 28]

Compound (1-c) of Synthesis Example 1 (267 mg) and glyoxal (39% aqueous solution, produced by Tokyo Chemical Industry Co., Ltd.) (0.13 mL) were added to 5 mL of acetic acid, and this was stirred at 50° C. for 20 minutes in a nitrogen atmosphere, and next stirred at room temperature for 2 hours. Water (50 mL) was added to the resulting solution, and the generated precipitate was filtered and taken out, and washed with water. The resulting solid was purified by column chromatography (filler: silica gel, eluent: dichloromethane) so that compound (10-a) (96 mg) was obtained.

The above-mentioned compound (10-a) (96 mg) and tributyl (2-thienyl)tin (310 mg) (produced by Tokyo Chemical Industry Co., Ltd.) were added to 5 mL of tetrahydrofuran (produced by Wako Pure Chemical Industries, Ltd.), and to this was added 12 mg of bis(triphenyl phosphine) palladium dichloride (produced by Tokyo Chemical Industry Co., Ltd.) in a nitrogen atmosphere, and heated and refluxed for 5 hours. Chloroform (150 mL) was added to the resulting solution, and after being washed with water, this was dried over magnesium sulfate. The resulting solution was purified by column chromatography (filler: silica gel, eluent: chloroform), and washed with methanol so that compound (10-b) (81 mg) was obtained.

The above-mentioned compound (10-b) (81 mg) was dissolved in 15 mL of dimethylformamide (produced by Wako Pure Chemical Industries, Ltd.), and to this was added 98 mg of N-bromosuccinimide (produced by Wako Pure Chemical Industries, Ltd.), and stirred at room temperature for 23 hours. Water (100 mL) was added to the resulting solution, and the resulting precipitate was filtered and taken out, and then successively washed with methanol and water in this order. The resulting solid was purified by column chromatography (filler: silica gel, eluent: chloroform), and washed with methanol so that compound (10-c) (80 mg) was obtained. The result of $^1$H-NMR measurement on compound (10-c) is shown below:

$^1$H-NMR (CDCl$_3$, ppm): 8.98 (s, 2H), 8.12 (s, 2H), 7.56 (d, 2H), 7.14 (d, 2H).

The above-mentioned compound (10-c) (80 mg) and compound (1-g) of Synthesis Example 1 (99 mg) (produced by Aldrich Corporation) were dissolved in 30 mL of toluene. To this were added water (2 mL), potassium carbonate (50 mg), tetrakis(triphenyl phosphine) palladium (0) (21 mg) (produced by Tokyo Chemical Industry Co., Ltd.) and one drop of Aliquat 336 (produced by Aldrich Corporation), and this was stirred at 100° C. for 3 hours in a nitrogen atmosphere. Next, to this was added 100 mg of bromobenzene (produced by Tokyo Chemical Industry Co., Ltd.), and stirred at 100° C. for 30 minutes. Next, to this was added 100 mg of phenylboronic acid (produced by Tokyo Chemical Industry Co., Ltd.), and stirred at 100° C. for 30 minutes. To the resulting solution was added 100 mL of methanol, and the generated solid was filtered and taken out, and then washed with methanol, acetone, water and acetone in this order. The resulting solid was dissolved in 100 mL of chloroform, and after being filtered through a silica gel short column (eluent: chloroform), the resulting solution was condensed, and re-precipitated with methanol so that compound B-3 (69 mg) was obtained (yield: 56%). This compound had the weight-average molecular weight of 40200, the number-average molecular weight of 5500, and the degree of polymerization n of 59.0. Moreover, the light absorption edge wavelength thereof was 618 nm, the bandgap (Eg) was 2.01 eV, and the highest occupied molecular orbital (HOMO) level was −5.40 eV.

Synthesis Example 11

Compound A-8 was synthesized by using a method indicated by Scheme 11.

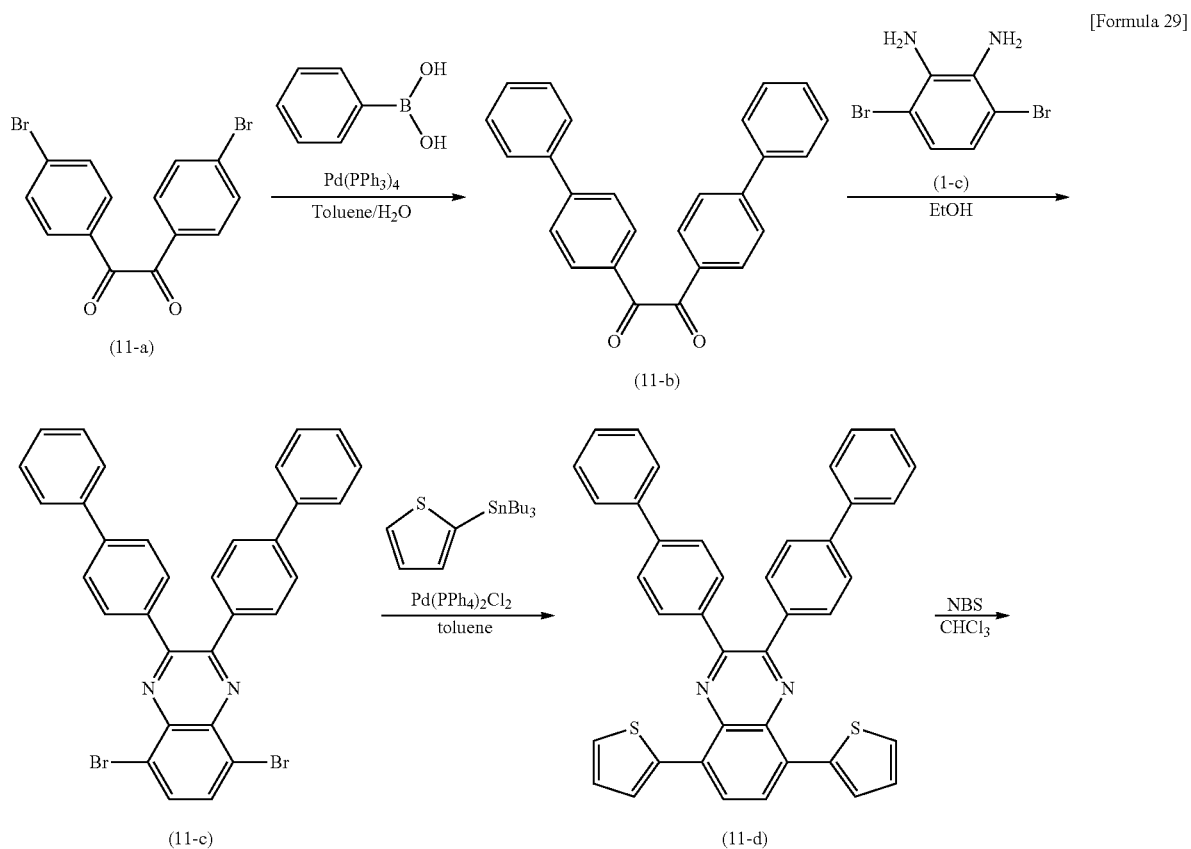

Scheme 11

[Formula 29]

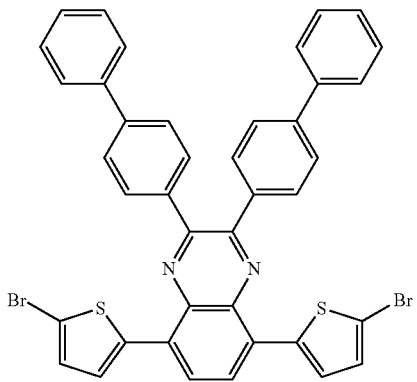

(11-e)

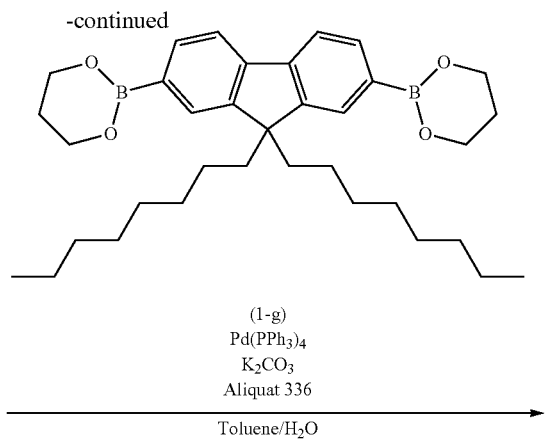

(1-g)
Pd(PPh₃)₄
K₂CO₃
Aliquat 336
─────────→
Toluene/H₂O

-continued

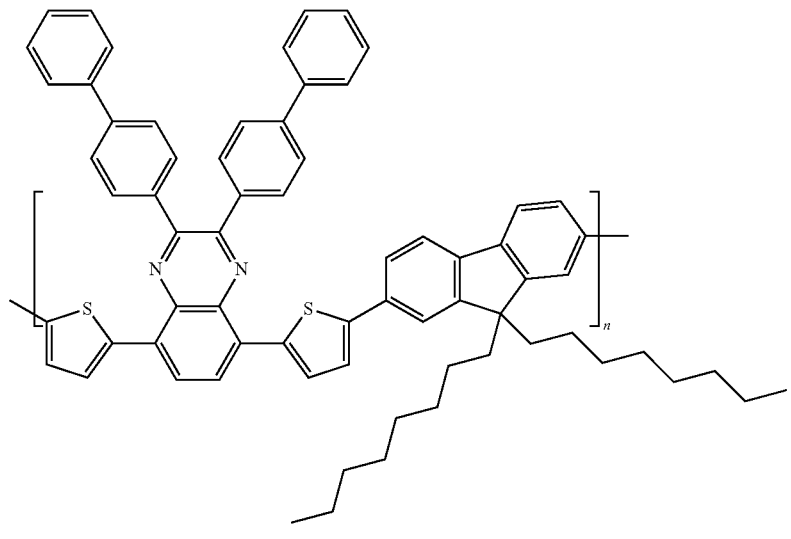

A-8

Into toluene (50 mL) were dissolved 3.68 g of 4-4-4'-dibromobenzyl (11-a) (10 mmol) (produced by Tokyo Chemical Industry Co., Ltd.) and 3.66 g of phenyl boronic acid (30 mmol), and to this further added 10 mL of a 1M aqueous sodium carbonate solution, 3 drops of Aliquat 336 (produced by Aldrich Corporation) and 580 mg of a tetrakis (triphenyl phosphine) palladium catalyst (produced by Tokyo Chemical Industry Co., Ltd.), and this was stirred at 100° C. for 8 hours in a nitrogen atmosphere. After the reaction mixture was cooled to room temperature, the resulting organic layer was washed with 50 mL of water twice, and then washed with 50 mL of a saturated saline once. The solvent was dried over anhydrous magnesium sulfate, and then distilled off under reduced pressure. The resulting crude product was purified by silica gel column chromatography (eluent: chloroform) so that compound (11-b) was obtained as a pale yellow solid (3.21 g, yield 89%). The result of $^1$H-NMR measurement on compound (11-b) is shown below:

$^1$H-NMR (CDCl₃, ppm): 8.08 (d, J=8.1 Hz, 4H), 7.73 (d, J=8.1 Hz, 4H), 7.62 (m, 4H), 7.52-7.39 (m, 6H).

To an ethanol solution (80 mL) containing 1.45 g of the above-mentioned compound (11-b) (4.0 mmol) and 1.06 g of compound (1-c) of Synthesis Example 1 (4.0 mmol) was added 1 mL of acetic acid, and the reaction solution was heated and refluxed for 3 hours. After the reaction solution was cooled to room temperature, the resulting solid was filtered and taken out. The resulting crude product was re-crystallized with chloroform-ethanol so that compound (11-c) was obtained as a yellow solid (1.9 g, yield: 80%). The result of $^1$H-NMR measurement on compound (11-c) is shown below:

$^1$H-NMR (CDCl₃, ppm): 7.91 (s, 2H), 7.80 (d, J=8.4 Hz, 4H), 7.64-7.61 (m, 8H), 7.48-7.33 (m, 6H).

To a toluene solution (80 mL) containing 1.78 g of the above-mentioned compound (11-c) (3.0 mmol) and 3.36 g of tributyl (2-thienyl)tin (9.0 mmol) (produced by Aldrich Corporation) was added 180 mg of a dichlorobis(triphenyl phosphine) palladium catalyst (produced by Tokyo Chemical Industry Co., Ltd.), and this was heated and refluxed for 8 hours in a nitrogen atmosphere. After completion of the reaction, the solvent was distilled off under reduced pressure. To the residues was added 200 mL of ethanol, and stirred at room temperature for 30 minutes. After the precipitate was filtered and taken out, the solid was washed with ethanol and then washed with acetone. The resulting crude product was purified by silica gel column chromatography (eluent: toluene) so that compound (11-d) was obtained as a yellow solid (1.05 g, yield: 58%). The result of $^1$H-NMR measurement on compound (11-d) is shown below:

$^1$H-NMR (CDCl$_3$, ppm): 8.15 (s, 2H), 7.89 (m, 6H), 7.65 (m, 8H), 7.54 (d, J=4.9 Hz, 2H), 7.48-7.34 (m, 6H), 7.20 (dd, J=4.9 and 4.1 Hz, 2H).

To a chloroform solution (80 mL) containing 960 mg of the above-mentioned compound (11-d) (1.6 mmol) was added 630 mg of N-bromosuccinimide (3.52 mmol) (produced by Tokyo Chemical Industry Co., Ltd.) and stirred at room temperature for one hour. After completion of the reaction, to this was added 10 mL of a 5% aqueous sodium-thiosulfate solution, and stirred for 10 minutes. The resulting organic layer was washed with 100 mL of water three times, and then washed with a saturated saline once and, after being dried over anhydrous magnesium sulfate, the solvent was distilled off under reduced pressure. The resulting crude product was re-crystallized with chloroform-acetone so that compound (11-e) was obtained as an orange-colored solid (1.06 g, yield 87%). The result of $^1$H-NMR measurement on compound (11-e) is shown below:

$^1$H-NMR (CDCl$_3$, ppm): 8.05 (s, 2H), 7.83 (d, J=8.4 Hz, 4H), 7.68-7.65 (m, 8H), 7.56 (d, J=3.8 Hz, 2H), 7.49-7.45 (m, 6H), 7.12 (d, J=3.8 Hz, 2H).

The above-mentioned compound (11-e) (151 mg) (0.20 mmol) and compound (1-g) of Synthesis Example 1 (117 mg) (0.20 mmol) (produced by Aldrich Corporation) were dissolved in 5 mL of toluene, and to this were added a 1M aqueous potassium carbonate solution (1 mL), one drop of Aliquat 336 (produced by Aldrich Corporation) and a tetrakis (triphenyl phosphine) palladium catalyst (23 mg) (produced by Tokyo Chemical Industry Co., Ltd.) at room temperature, and this was stirred at 100° C. for 8 hours in a nitrogen atmosphere. Next, to this was added 60 mg of bromobenzene (produced by Tokyo Chemical Industry Co., Ltd.), and stirred at 100° C. for one hour. Next, to this was added 100 mg of phenylboronic acid (produced by Tokyo Chemical Industry Co., Ltd.), and further stirred at 100° C. for one hour. After the stirring process, the reaction mixture was cooled to room temperature, and poured into 100 mL of methanol. The resulting solid was filtered and taken out, and then washed with methanol, water, and acetone in this order. The resulting solid was added to 100 mL of acetone, and this was heated and refluxed for one hour so as to be filtered. Thus, acetone-soluble fractions were removed. The crude product was dissolved in 80 mL of chloroform, and to this was added 30 mg of a catalyst removing polymer QuadraSil MP (produced by Aldrich Corporation), and refluxed for one hour. After the chloroform solution was filtered through celite (produced by Nacalai Tesque Inc.), the solvent was distilled off under reduced pressure. The resulting solid was again dissolved in chloroform and, after being allowed to pass through a silica gel column (eluent: chloroform), the resulting solution was condensed, and re-precipitated with methanol so that compound A-8 (80 mg) was obtained (yield: 41%). This compound had the weight-average molecular weight of 19000, the number-average molecular weight of 12000, and the degree of polymerization n of 19.3. Moreover, the light absorption edge wavelength thereof was 637 nm, the bandgap (Eg) was 1.95 eV, and the highest occupied molecular orbital (HOMO) level was −5.37 eV.

Synthesis Example 12

Compound A-9 was synthesized by using a method indicated by Scheme 12.

Scheme 12

[Formula 30]

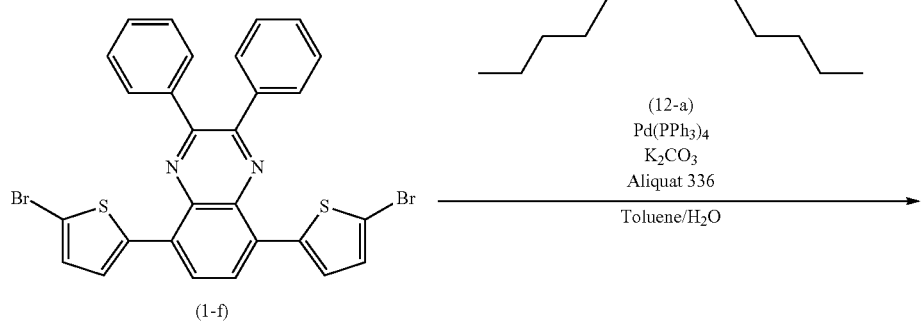

-continued

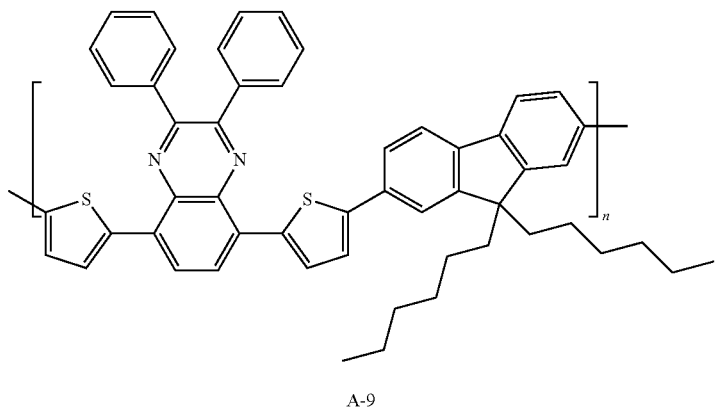

A-9

Compound (1-f) (47 mg) (78 μmol) and compound (12-a) described in Formula 12 (39 mg) (78 μmol) (produced by Aldrich Corporation) were dissolved in 5 mL of toluene, and to this were added a 1M aqueous potassium carbonate solution (1 mL), one drop of Aliquat 336 (produced by Aldrich Corporation) and a tetrakis(triphenyl phosphine) palladium catalyst (10 mg) (produced by Tokyo Chemical Industry Co., Ltd.) at room temperature, and this was stirred at 100° C. for 8 hours in a nitrogen atmosphere. Next, to this was added 60 mg of bromobenzene (produced by Tokyo Chemical Industry Co., Ltd.), and stirred at 100° C. for one hour. Next, to this was added 100 mg of phenylboronic acid (produced by Tokyo Chemical Industry Co., Ltd.), and further stirred at 100° C. for one hour. After the stirring process, the reaction mixture was cooled to room temperature, and poured into 100 mL of methanol. The resulting solid was filtered and taken out, and then washed with methanol, water and acetone in this order. The resulting solid was added to acetone (100 mL), and this was heated and refluxed for one hour so as to be filtered. Thus, acetone-soluble fractions were removed. The crude product was dissolved in 80 mL of chloroform, and to this was added 30 mg of a catalyst removing polymer QuadraSil MP (produced by Aldrich Corporation), and refluxed for one hour. After the chloroform solution was filtered through celite (produced by Nacalai Tesque Inc.), the solvent was distilled off under reduced pressure. The resulting solid was again dissolved in chloroform, and after being allowed to pass through a silica gel column (eluent: chloroform), the resulting solution was condensed, and re-precipitated with methanol so that compound A-9 (20 mg) was obtained (yield: 33%). This compound had the weight-average molecular weight of 10500, the number-average molecular weight of 7300, and the degree of polymerization n of 13.5. Moreover, the light absorption edge wavelength thereof was 637 nm, the bandgap (Eg) was 1.95 eV, and the highest occupied molecular orbital (HOMO) level was −5.37 eV.

Synthesis Example 13

Compound A-10 was synthesized by using a method indicated by Scheme 13.

Scheme 13

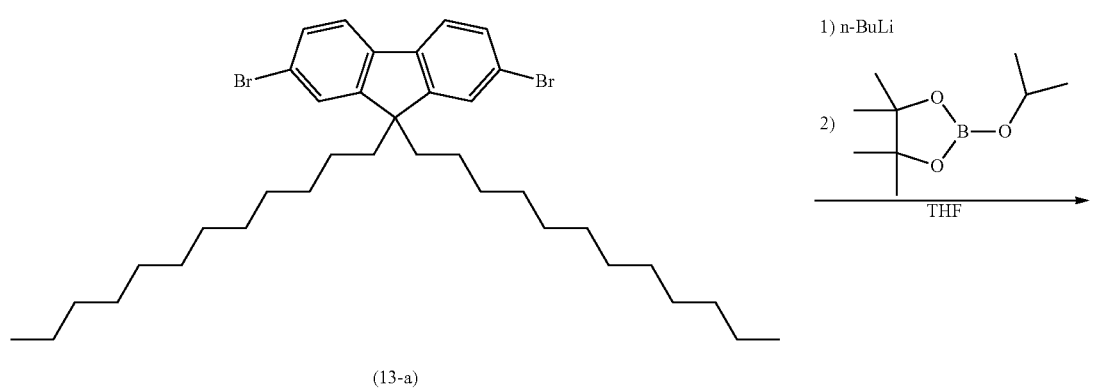

(13-a)

[Formula 31]

1) n-BuLi

2) [pinacol isopropoxy borate]

THF

-continued

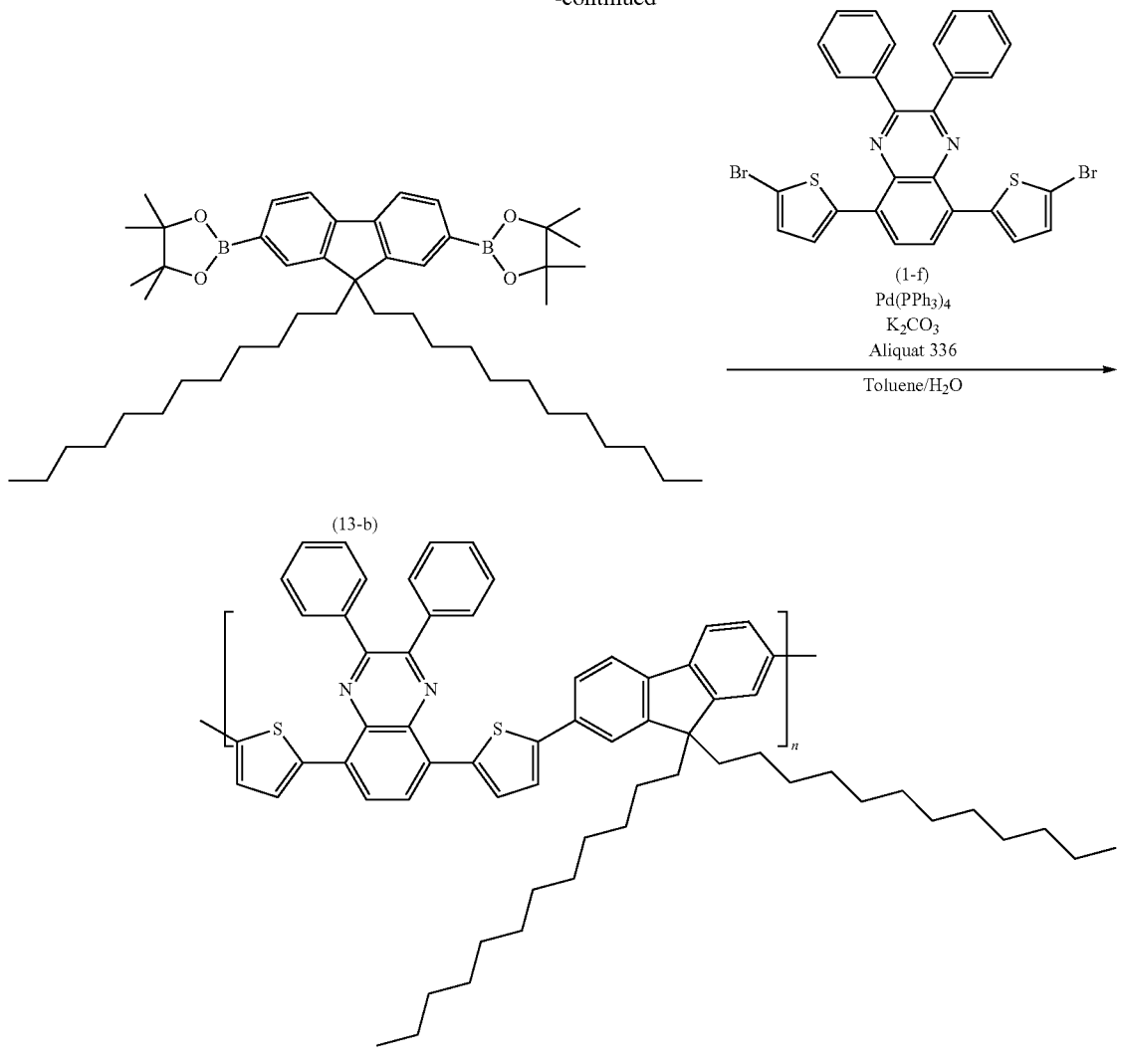

To a tetrahydrofuran solution (100 mL) containing 6.61 g of 9,9-didodecyl-2,7-diboromo fluorene (13-a) (10.0 mmol) (produced by Aldrich Corporation) was dripped 15.6 mL of n-butyllithium 1.6M-hexane solution (25.0 mmol) (produced by Tokyo Chemical Industry Co., Ltd.) at −78° C. After completion of the dripping process, the reaction solution was stirred at −78° C. for one hour. After 2-isopropoxy-4,4,4,5-tetramethyl-1,3,2-dioxaborolane (5.58 g) (30.0 mmol) (produced by Tokyo Chemical Industry Co., Ltd.) was added thereto at −78° C., the reaction solution was stirred at room temperature for 8 hours. After completion of the stirring process, to this was added water (500 mL), and aqueous layers were extracted with 50 mL of ether twice. The organic layer was washed with 100 mL of water five times, and then washed with 50 mL of a saturated saline once, and this was dried over anhydrous magnesium sulfate. After the solvent was distilled off under reduced pressure, the resulting solution was purified by silica gel column chromatography (eluent: methylene chloride:hexane=1:1) so that compound (13-b) (4.5 g, yield: 60%) was obtained as a white solid. The result of $^1$H-NMR measurement on compound (13-b) is shown below:

$^1$H-NMR (CDCl$_3$, ppm): 7.81 (d, J=7.8 Hz, 2H), 7.75 (s, 2H), 7.71 (d, J=7.8 Hz, 2H), 2.00 (m, 2H), 1.39 (s, 24H), 1.30-1.01 (m, 36H), 0.86 (t, J=6.8 Hz, 6H), 0.56 (m, 4H).

Compound (1-f) (100 mg) (0.17 mmol) and the above-mentioned compound (13-b) (119 mg) (0.17 mmol) were dissolved in 5 mL of toluene, and to this were added 1 mL of a 1M aqueous potassium carbonate solution, one drop of Aliquat 336 (produced by Aldrich Corporation) and 30 mg of a tetrakis(triphenyl phosphine) palladium catalyst (produced by Tokyo Chemical Industry Co., Ltd.) at room temperature, and this was stirred at 100° C. for 8 hours in a nitrogen atmosphere. Next, to this was added 60 mg of bromobenzene (produced by Tokyo Chemical Industry Co., Ltd.), and stirred at 100° C. for one hour. Next, to this was added 100 mg of phenylboronic acid (produced by Tokyo Chemical Industry Co., Ltd.), and further stirred at 100° C. for one hour. After the stirring process, the reaction mixture was cooled to room temperature, and poured into 200 mL of methanol. The resulting solid was filtered and taken out, and then washed with methanol, water and acetone in this order. The resulting solid was refluxed in acetone (100 mL) for one hour, and filtered so that acetone-soluble fractions were removed. The crude product was dissolved in 100 mL of chloroform, and to this was added 30 mg of a catalyst removing polymer QuadraSil MP (produced by Aldrich Corporation), and refluxed for one hour. After the chloroform solution was filtered through celite (produced by Nacalai Tesque Inc.), the solvent was distilled off under reduced pressure. The resulting solid was again dissolved in chloroform, and after being allowed to pass through a silica gel column (eluent: chloroform), the resulting solution was condensed, and re-precipitated with methanol so that compound A-10 (45 mg) was obtained (yield: 28%). This compound had the weight-average molecular weight of 16600, the number-average molecular weight of 10200, and the degree of polymerization n of 17.6. Moreover, the light absorption edge wavelength thereof was 636 nm, the bandgap (Eg) was 1.95 eV, and the highest occupied molecular orbital (HOMO) level was −5.39 eV.

Synthesis Example 14

Compound A-11 was synthesized by using a method indicated by Scheme 14.

ate (2.08 g), tetrakis(triphenyl phosphine) palladium (0) (43 mg) (produced by Tokyo Chemical Industry Co., Ltd.) and one drop of Aliquat 336 (produced by Aldrich Corporation), and stirred at 100° C. for 7 hours in a nitrogen atmosphere. Next, to this was added 200 mL of bromobenzene (produced by Tokyo Chemical Industry Co., Ltd.), and stirred at 100° C. for one hour. Next, to this was added 200 mg of phenylboronic acid (produced by Tokyo Chemical Industry Co., Ltd.), and stirred at 100° C. for one hour. To the resulting solution was added 200 mL of methanol, and the generated solid was filtered and taken out, and then washed with methanol, acetone, water and acetone in this order. The resulting solid was added to 300 mL of acetone, and heated and refluxed for 30 minutes. The solid, obtained through filtration while being heated, was dissolved in 200 mL of chloroform, and after being filtered through a silica gel short column (eluent: chloroform), the resulting solution was condensed, and re-precipitated with methanol so that compound A-11 (529 mg) was obtained (yield: 84%). This compound had the weight-average molecular weight of 23400, the number-average molecu-

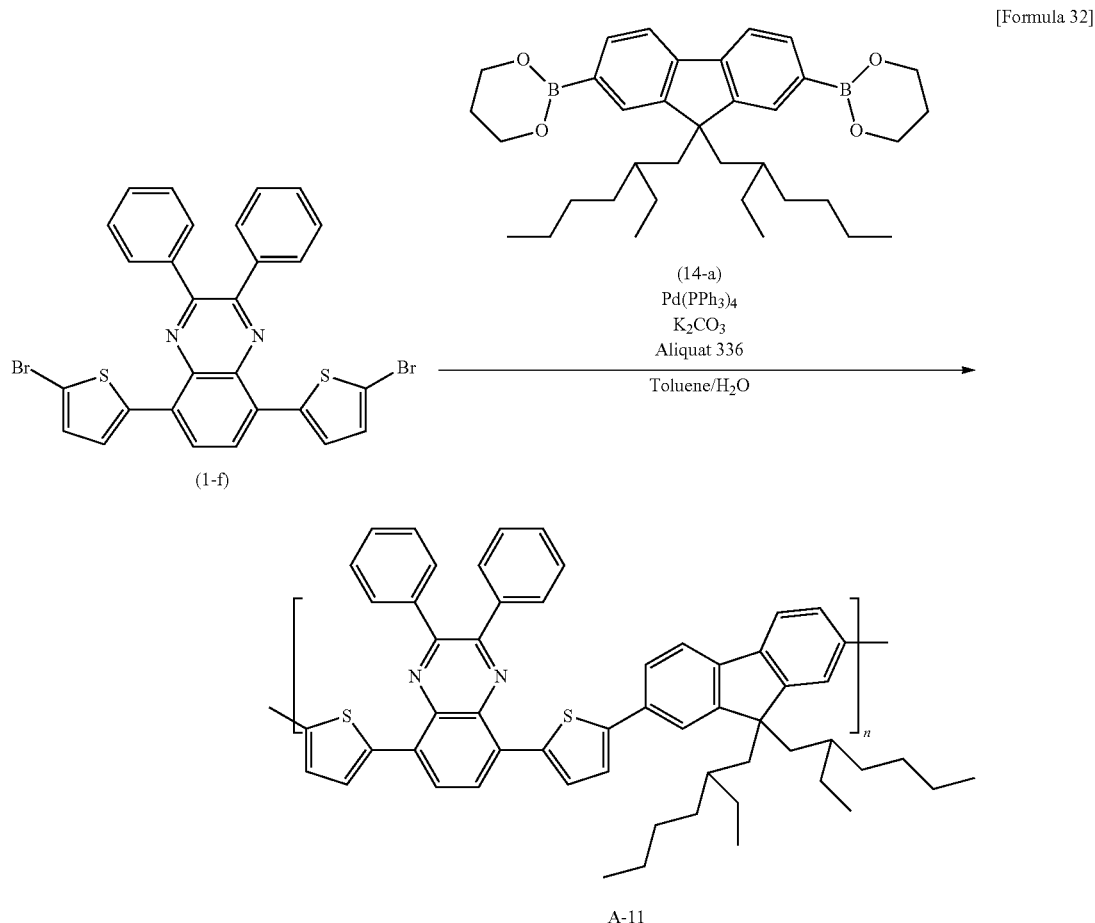

Compound (1-f) (454 mg) of Synthesis Example 1 and compound (14-a) (441 mg) described in Formula 14 (produced by Aldrich Corporation) were dissolved in 40 mL of toluene. To this were added water (8 mL), potassium carbonlar weight of 9950, and the degree of polymerization n of 28.0. Moreover, the light absorption edge wavelength thereof was 630 nm, the bandgap (Eg) was 1.97 eV, and the highest occupied molecular orbital (HOMO) level was −5.43 eV.

Synthesis Example 15
Compound B-4 was synthesized by using a method indicated by Scheme 15.
Compound (15-a) described in Formula 15 (3.49 g) (produced by Tokyo Chemical Industry Co., Ltd.) was added to 40 mL of dimethylsulfoxide (produced by Wako Pure Chemical Industries, Ltd.), and to this was further added 3.02 g of
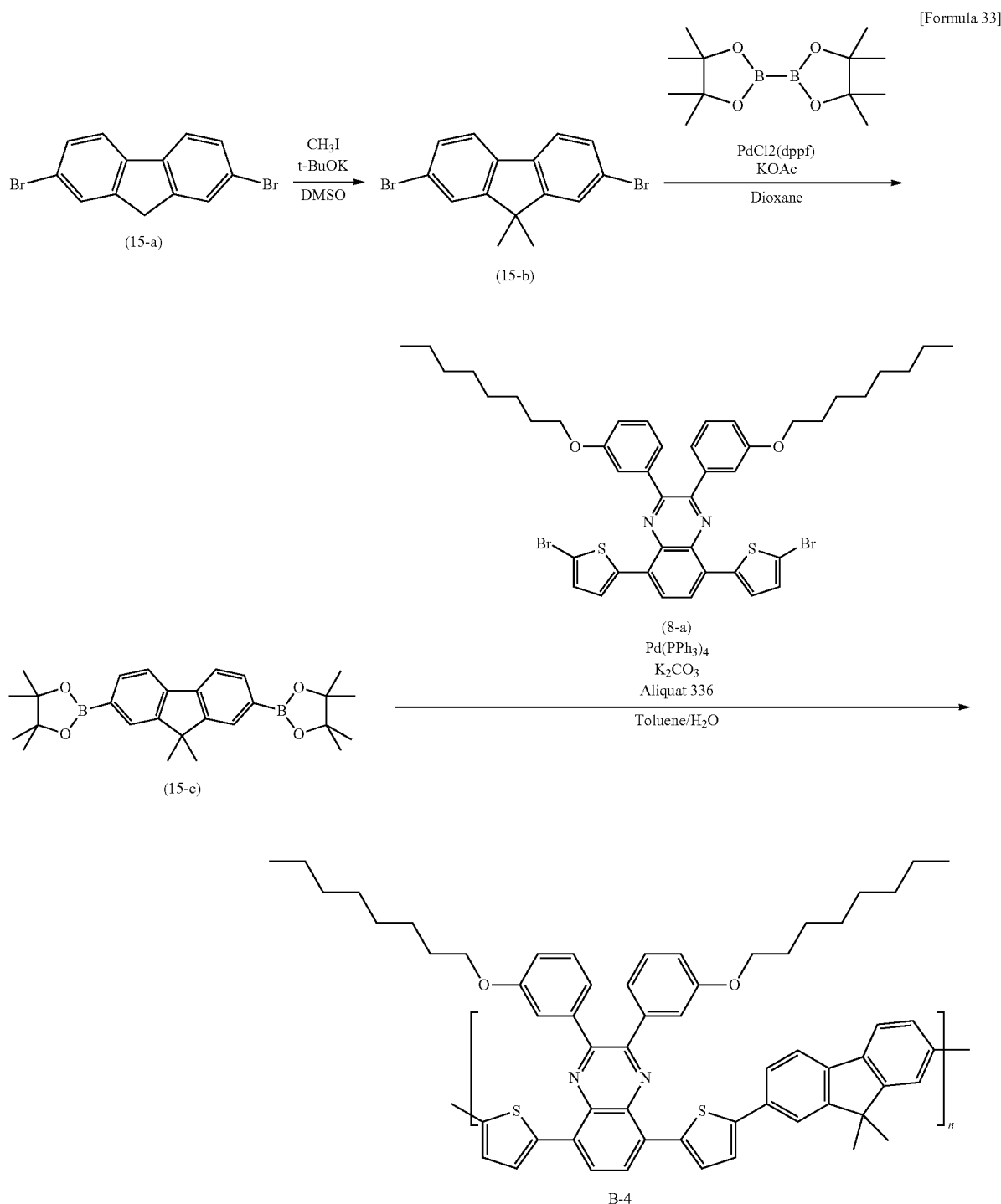

t-butoxy potassium (produced by Tokyo Chemical Industry Co., Ltd.) in a nitrogen atmosphere, and stirred at 0° C. for 30 minutes. Next, to this was added 4.59 g of iodomethane (produced by Tokyo Chemical Industry Co., Ltd.), and stirred at 0° C. for 4 hours, and then stirred at room temperature for 12 hours. To the resulting solution were added water (100 mL) and dichloromethane (100 mL) so that an organic layer was separated and taken out, and the organic layer was washed with water (100 mL), and then dried over magnesium sulfate. After the solvent was distilled off from the resulting solution under reduced pressure, this was re-crystallized with methanol so that compound (15-b) (2.74 g) was obtained.

To 10 mL of 1,4-dioxane (produced by Wako Pure Chemical Industries, Ltd.) were added the above-mentioned compound (15-b) (0.79 g), bis(pinacolato) diboron (1.42 g) (produced by BASF Corp.) and potassium acetate (1.32 g) (produced by Wako Pure Chemical Industries, Ltd.), and to this was further added 0.33 g of [bis(diphenylphosphino)ferrocene]dichloropalladium (produced by Aldrich Corporation), and stirred at 80° C. for 5 hours. Water (100 mL) and dichloromethane (100 mL) were added to the resulting solution, and an organic layer was separated and taken out, and this was washed with 100 mL of water, and then dried over magnesium sulfate. The resulting solution was purified by column chromatography (filler: silica gel, eluent: dichloromethane/hexane) so that compound (15-c) (0.55 g) was obtained. The result of $^1$H-NMR measurement on compound (15-c) is shown below:

$^1$H-NMR (CDCl$_3$, ppm): 7.89 (s, 2H), 7.84-7.74 (m, 4H), 1.56 (s, 6H), 1.38 (s, 24H).

Compound (8-a) (138 mg) of Synthesis Example 8 and the above-mentioned compound (15-c) (72 mg) were dissolved in 30 mL of toluene. To this were added water (5 mL), potassium carbonate (440 mg), tetrakis(triphenyl phosphine) palladium (0) (18 mg) (produced by Tokyo Chemical Industry Co., Ltd.) and one drop of Aliquat 336 (produced by Aldrich Corporation), and this was stirred at 100° C. for 7 hours in a nitrogen atmosphere. Next, to this was added 100 mg of bromobenzene (produced by Tokyo Chemical Industry Co., Ltd.), and stirred at 100° C. for one hour. Next, to this was added 100 mg of phenylboronic acid (produced by Tokyo Chemical Industry Co., Ltd.), and stirred at 100° C. for one hour. To the resulting solution was added 200 mL of methanol, and the generated solid was filtered and taken out, and then washed with methanol, acetone, water and acetone in this order. The resulting solid was added to 300 mL of acetone, and this was heated and refluxed for 30 minutes. The solid obtained through filtration while being heated, was added to 200 mL of chloroform, and after being allowed a chloroform-soluble fraction to pass through a silica gel short column (eluent: chloroform), the resulting solution was condensed, and re-precipitated with methanol so that compound B-4 (10 mg) was obtained (yield: 7%). This compound had the weight-average molecular weight of 3540, the number-average molecular weight of 3060, and the degree of polymerization n of 4.0. Moreover, the light absorption edge wavelength thereof was 640 nm, the bandgap (Eg) was 1.94 eV, and the highest occupied molecular orbital (HOMO) level was −5.25 eV.

Synthesis Example 16

Compound B-5 was synthesized by using a method indicated by Scheme 16.

Scheme 16

[Formula 34]

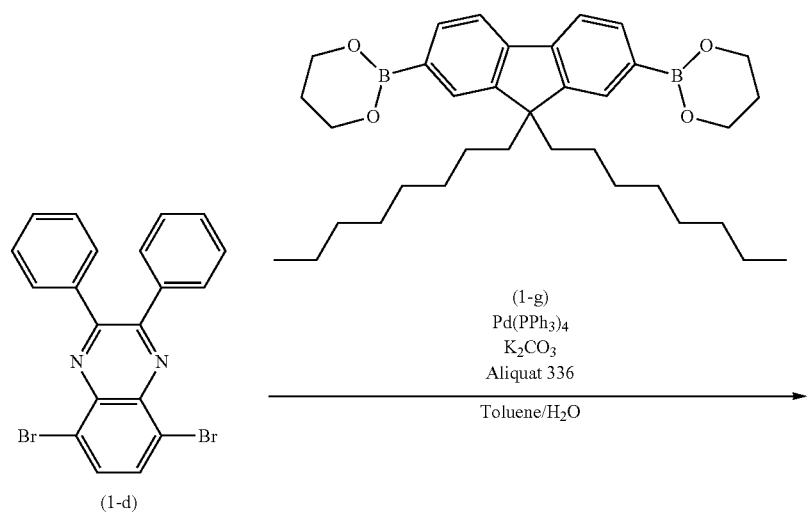

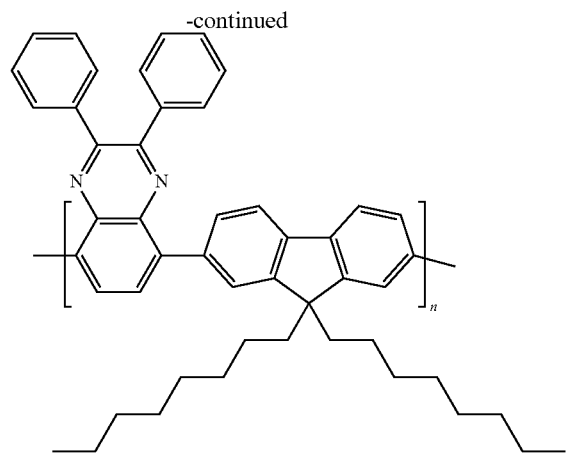

B-5

Compound (1-d) (93 mg) of Synthesis Example 1 and compound (1-g) of Synthesis Example 1 (118 mg) were dissolved in 30 mL of toluene. To this were added water (3 mL), potassium carbonate (580 mg), tetrakis(triphenyl phosphine) palladium (0) (24 mg) (produced by Tokyo Chemical Industry Co., Ltd.) and one drop of Aliquat 336 (produced by Aldrich Corporation), and this was stirred at 100° C. for 5 hours in a nitrogen atmosphere. Next, to this was added 100 mg of bromobenzene (produced by Tokyo Chemical Industry Co., Ltd.), and stirred at 100° C. for one hour. Next, to this further added 100 mg of phenyl boronic acid (produced by Tokyo Chemical Industry Co., Ltd.), and stirred at 100° C. for 4 hours. To the resulting solution was added 100 mL of methanol, and the generated solid was filtered and taken out, and then washed with methanol, acetone, water and acetone in this order. The resulting solid was dissolved in 100 mL of chloroform, and after being filtered through a silica gel short column (eluent: chloroform), the resulting solution was condensed, and re-precipitated with methanol so that compound B-5 (110 mg) was obtained (yield: 78%). This compound had the weight-average molecular weight of 84800, the number-average molecular weight of 32900, and the degree of polymerization n of 127. Moreover, the light absorption edge wavelength thereof was 487 nm, the bandgap (Eg) was 2.55 eV, and the highest occupied molecular orbital (HOMO) level was −5.79 eV.

Synthesis Example 17

Compound B-6 was synthesized by using a method indicated by Scheme 17.

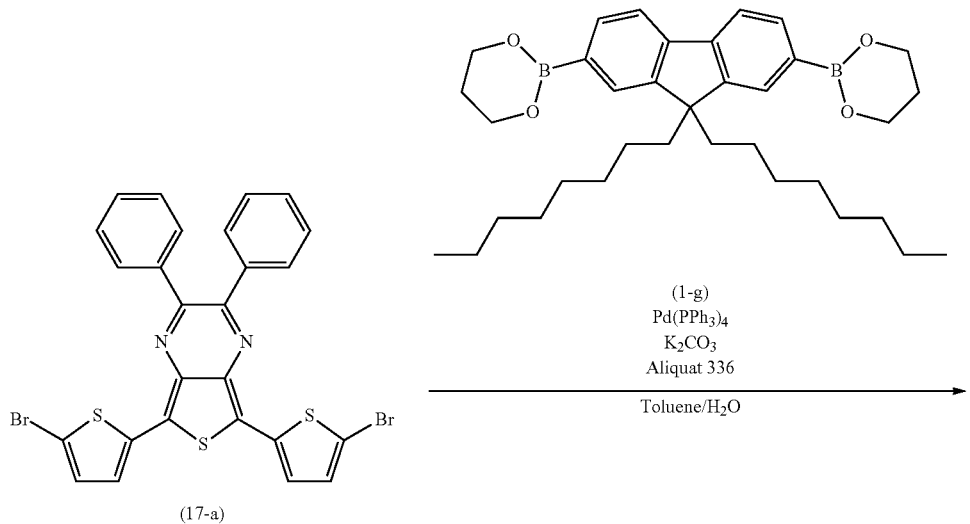

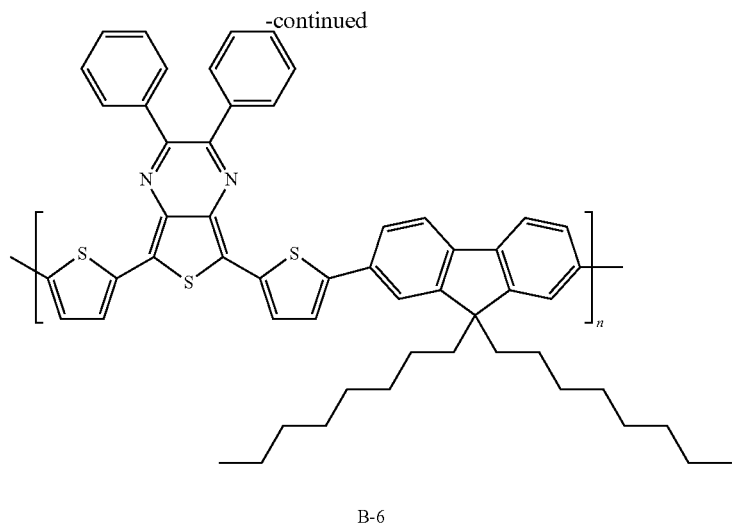

B-6

Compound (17-a) was synthesized by using a method described in "Advanced Functional Materials", pp. 745-750, Volume 15, 2005. The result of $^1$H-NMR measurement on compound (17-a) is shown below:

$^1$H-NMR (CDCl$_3$, ppm): 7.59-7.54 (m, 4H), 7.43-7.30 (m, 8H), 7.05 (m, 2H).

The above-mentioned compound (17-a) (219 mg) and the aforementioned compound (1-g) of Synthesis Example 1 (200 mg) (produced by Aldrich Corporation) were dissolved in 50 mL of toluene. To this were added water (4 mL), potassium carbonate (1.0 g), tetrakis(triphenyl phosphine) palladium (0) (42 mg) (produced by Tokyo Chemical Industry Co., Ltd.) and one drop of Aliquat 336 (produced by Aldrich Corporation), and this was stirred at 100° C. for 2.5 hours in a nitrogen atmosphere. Next, to this was added 100 mg of bromobenzene (produced by Tokyo Chemical Industry Co., Ltd.), and stirred at 100° C. for one hour. Next, to this was added 100 mg of phenylboronic acid (produced by Tokyo Chemical Industry Co., Ltd.), and stirred at 100° C. for 1 hour. To the resulting solution was added 300 mL of methanol, and the generated solid was filtered and taken out, and then washed with methanol, acetone, water and acetone in this order. The resulting solid was dissolved in 200 mL of chloroform, and after being filtered through a silica gel short column (eluent: chloroform), the resulting solution was condensed, and re-precipitated with methanol so that compound B-6 (80 mg) was obtained (yield: 26%). This compound had the weight-average molecular weight of 9260, the number-average molecular weight of 5070, and the degree of polymerization n of 11.0. Moreover, the light absorption edge wavelength thereof was 803 nm, the bandgap (Eg) was 1.54 eV, and the highest occupied molecular orbital (HOMO) level was −5.07 eV.

Figure 3:
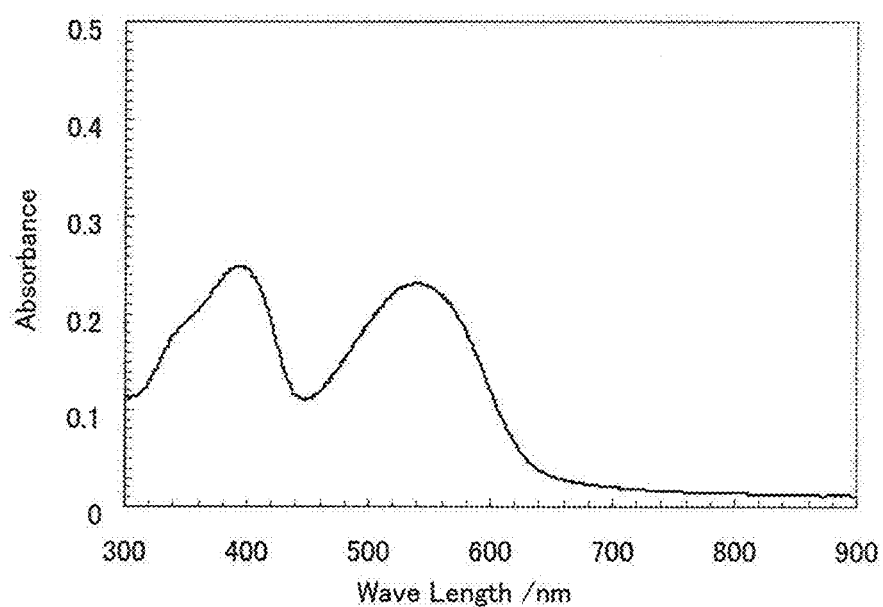
FIG. 3 illustrates an ultraviolet-ray visible absorption spectrum of a thin film (film thickness: about 60 nm) of compound A-1.
Figure 4:
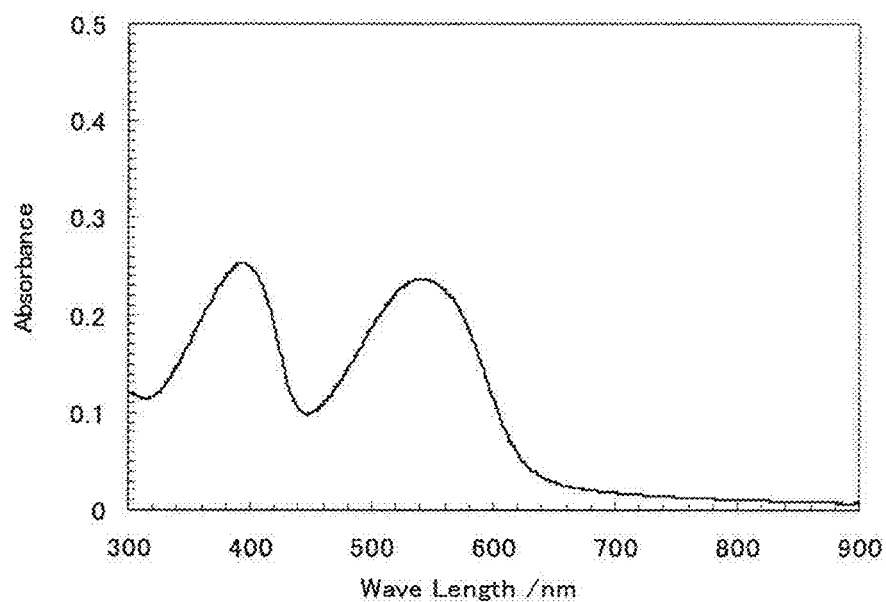
FIG. 4 illustrates an ultraviolet-ray visible absorption spectrum of a thin film (film thickness: about 60 nm) of compound B-1.
Figure 5:
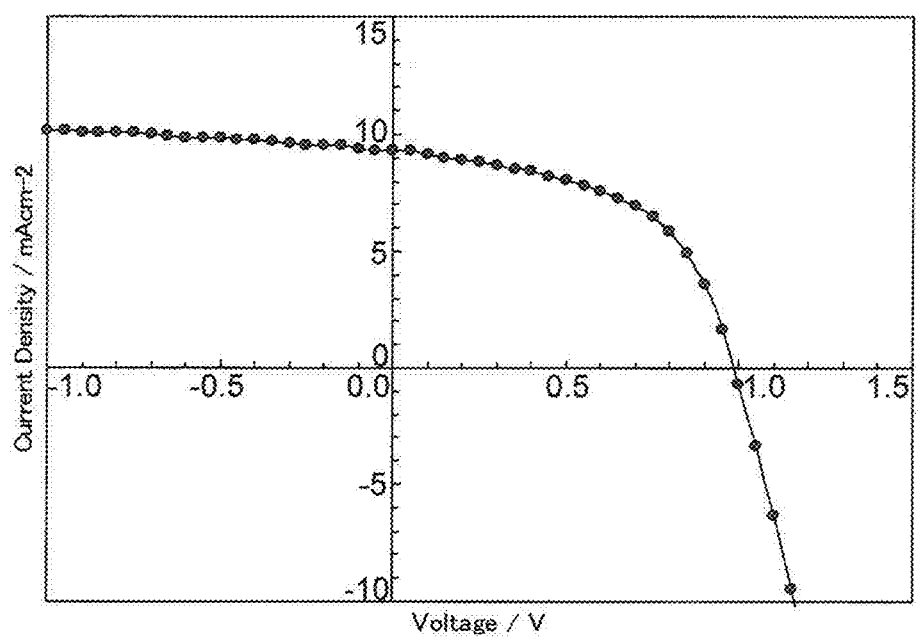
FIG. 5 illustrates current-voltage characteristics of Example 1.
Figure 6:
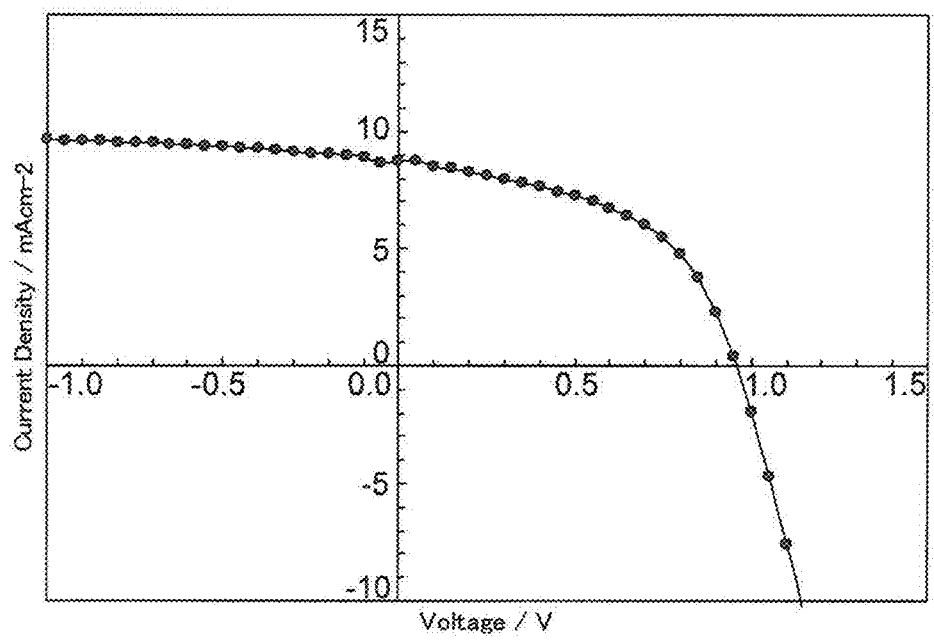
FIG. 6 illustrates current-voltage characteristics of Example 2.
Figure 7:
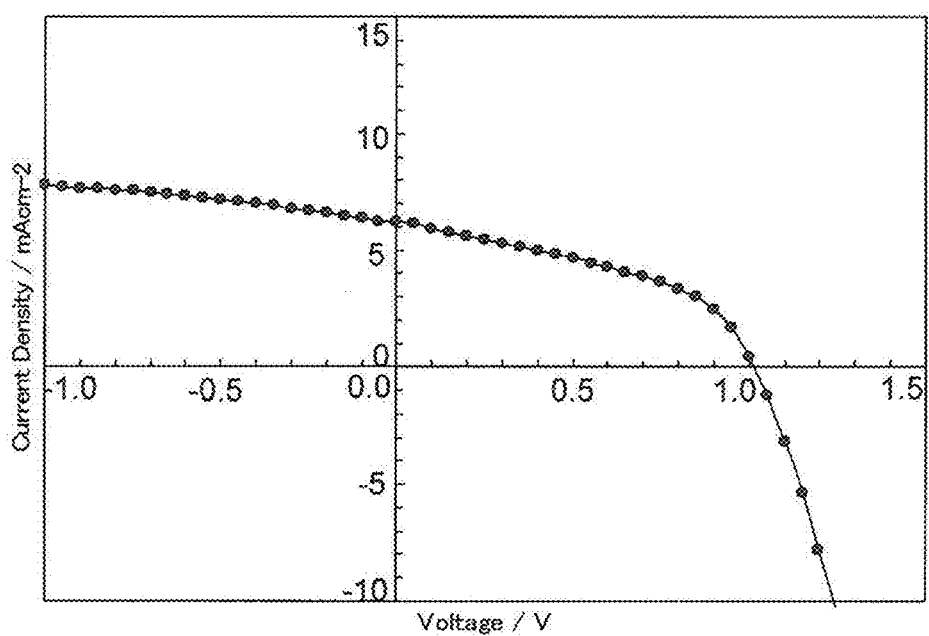
FIG. 7 illustrates current-voltage characteristics of Example 3.
Figure 8:
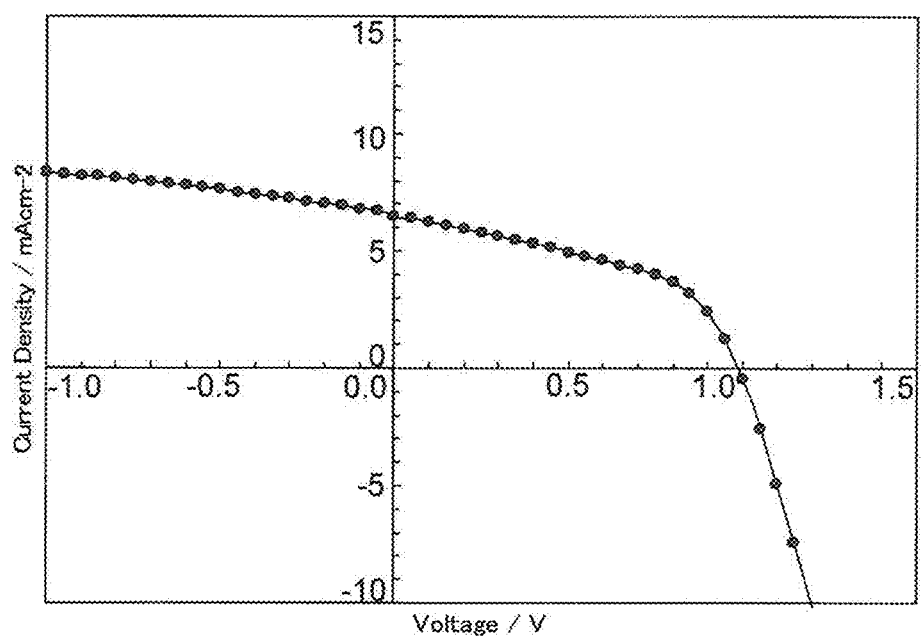
FIG. 8 illustrates current-voltage characteristics of Example 4.
Figure 9:
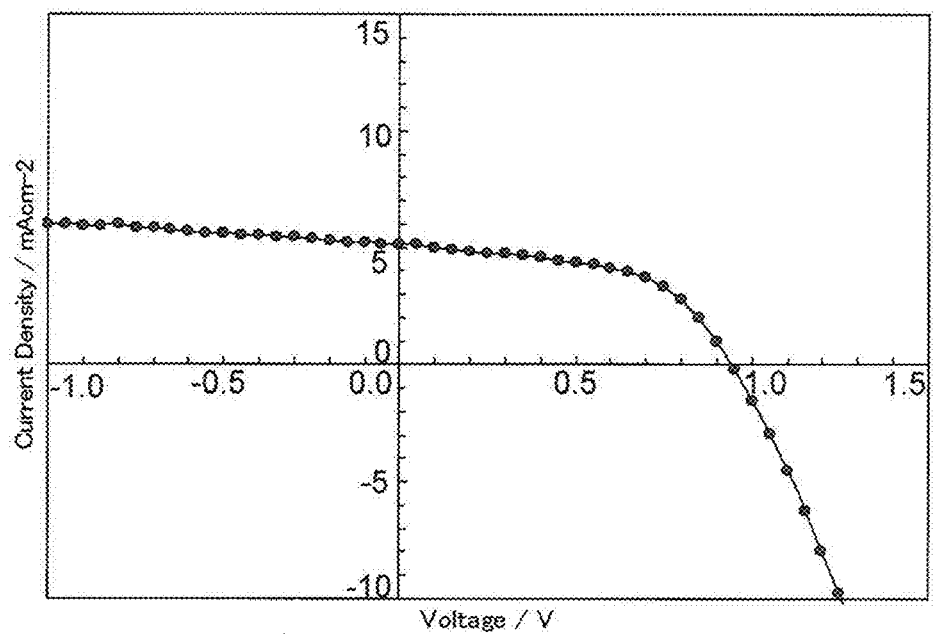
FIG. 9 illustrates current-voltage characteristics of Example 5.
Figure 10:
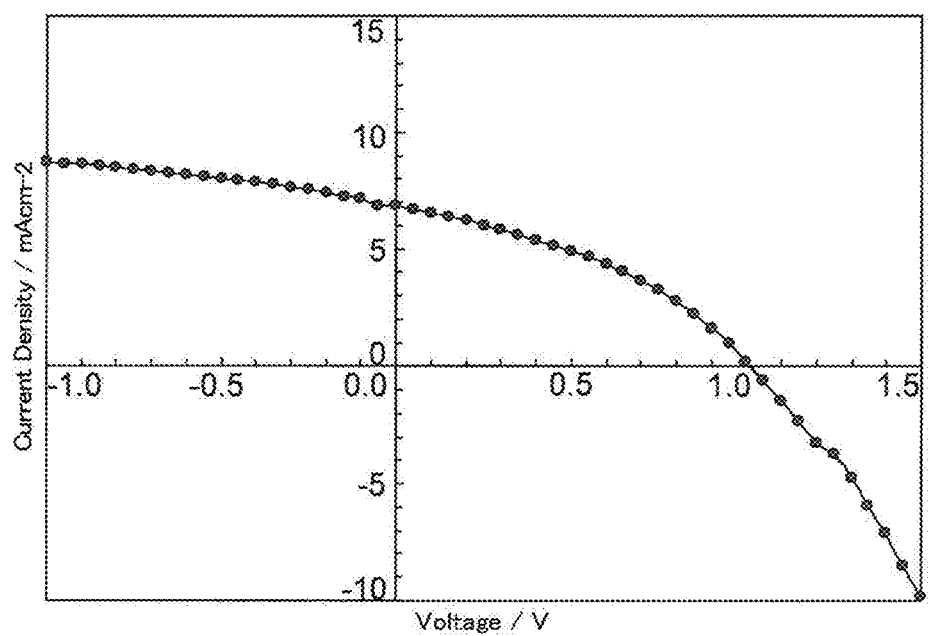
FIG. 10 illustrates current-voltage characteristics of Example 6.
Figure 11:
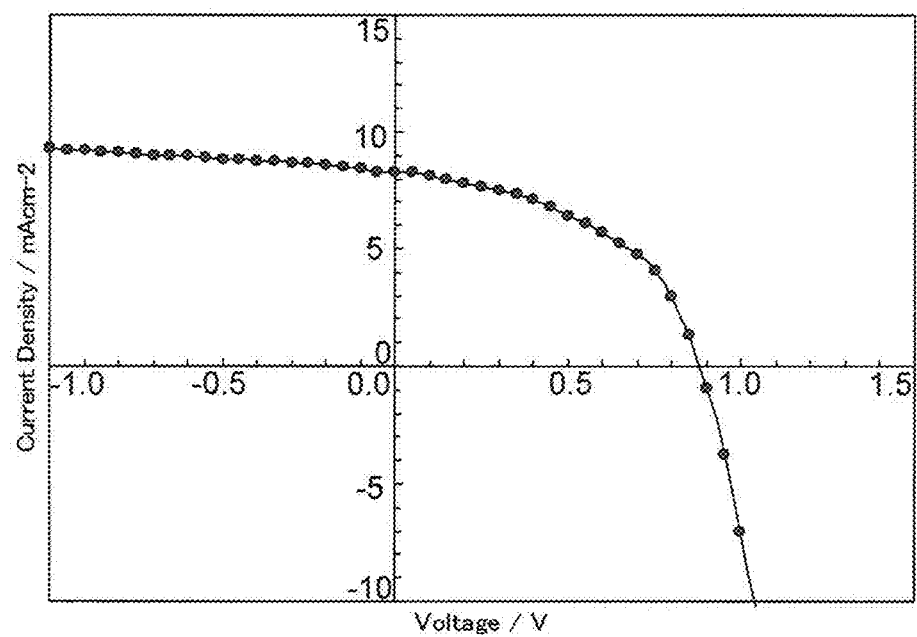
FIG. 11 illustrates current-voltage characteristics of Example 7.
Figure 12:
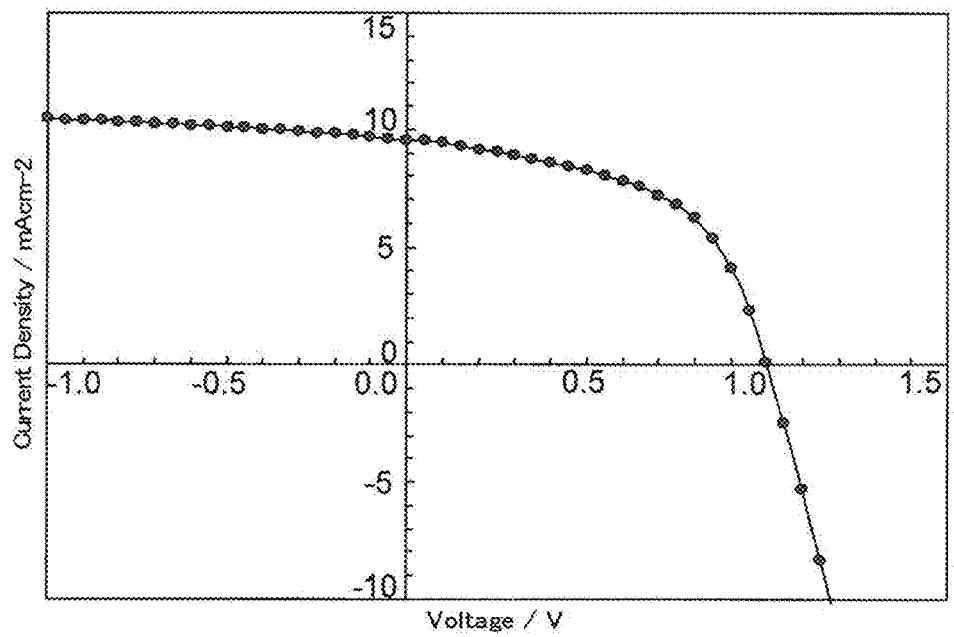
FIG. 12 illustrates current-voltage characteristics of Example 8.
Figure 13:
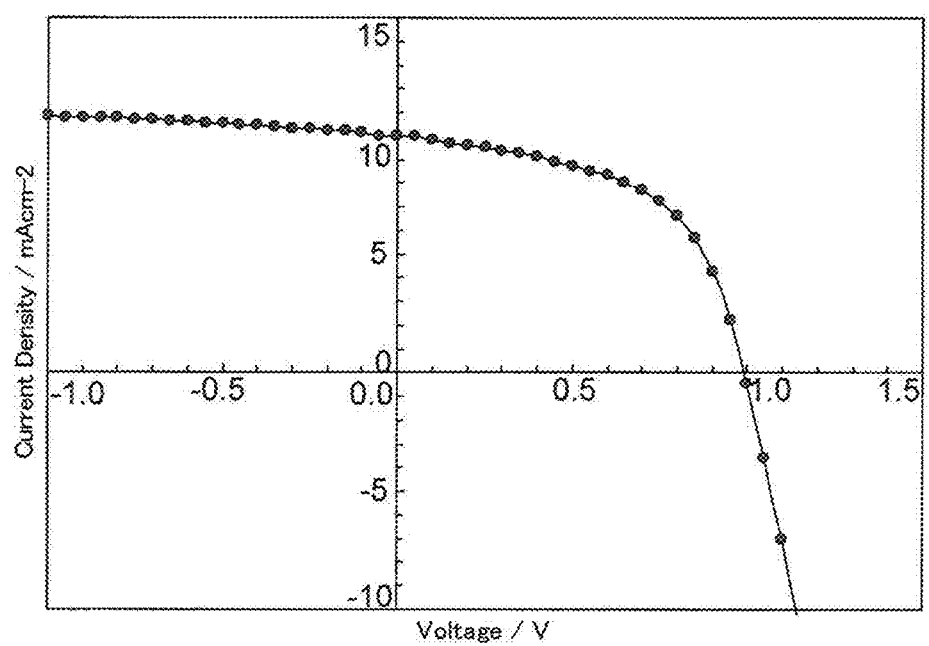
FIG. 13 illustrates current-voltage characteristics of Example 9.
Figure 14:
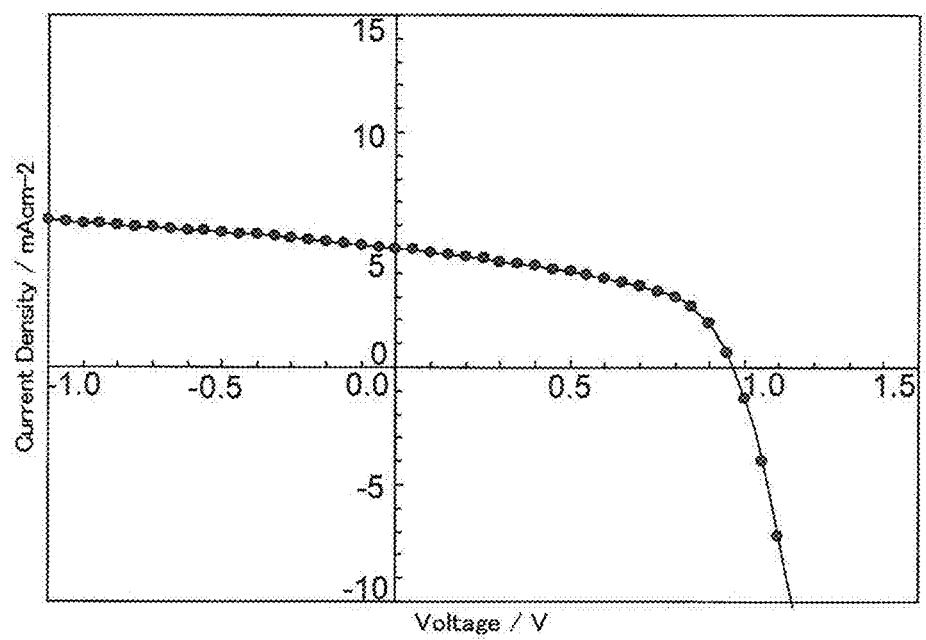
FIG. 14 illustrates current-voltage characteristics of Comparative Example 1.
Figure 15:
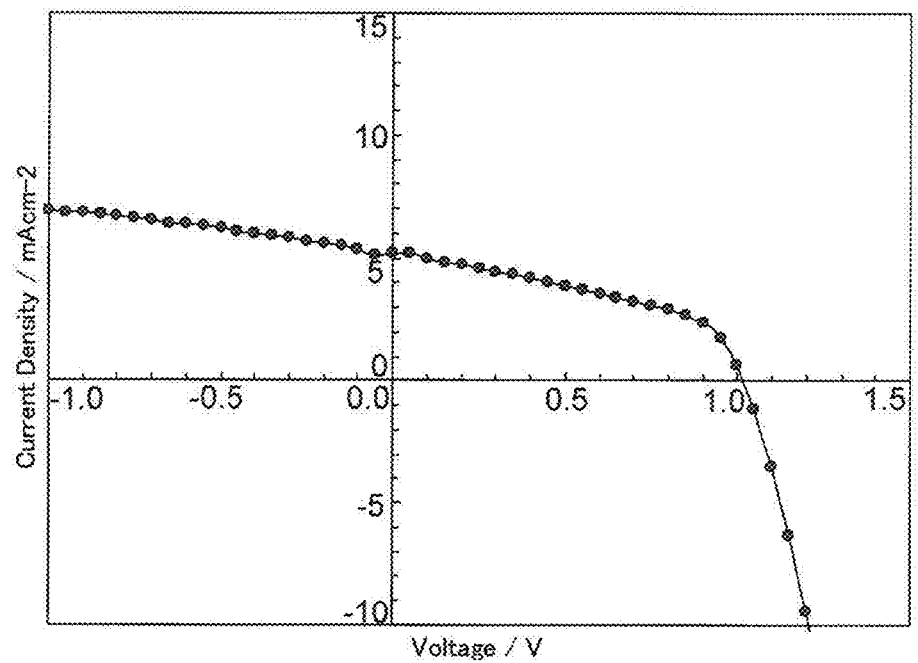
FIG. 15 illustrates current-voltage characteristics of Comparative Example 2.
Figure 16:
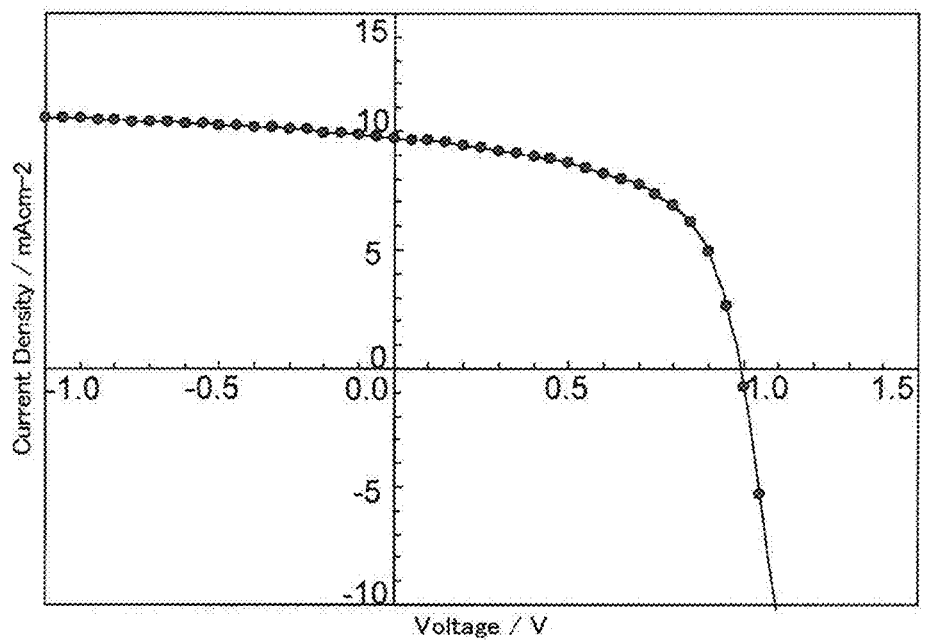
FIG. 16 illustrates current-voltage characteristics of Example 10.
Figure 17:
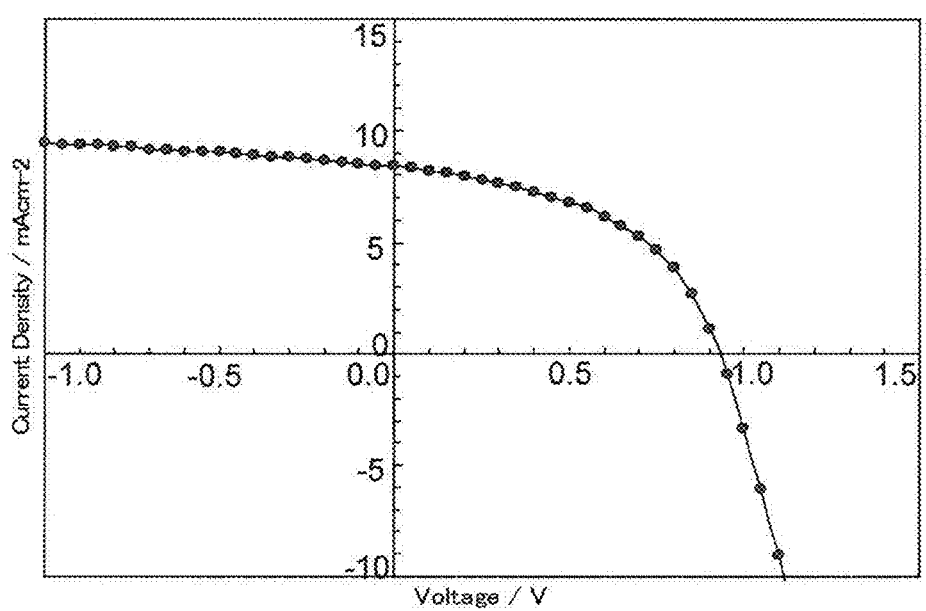
FIG. 17 illustrates current-voltage characteristics of Example 11.
Figure 18:
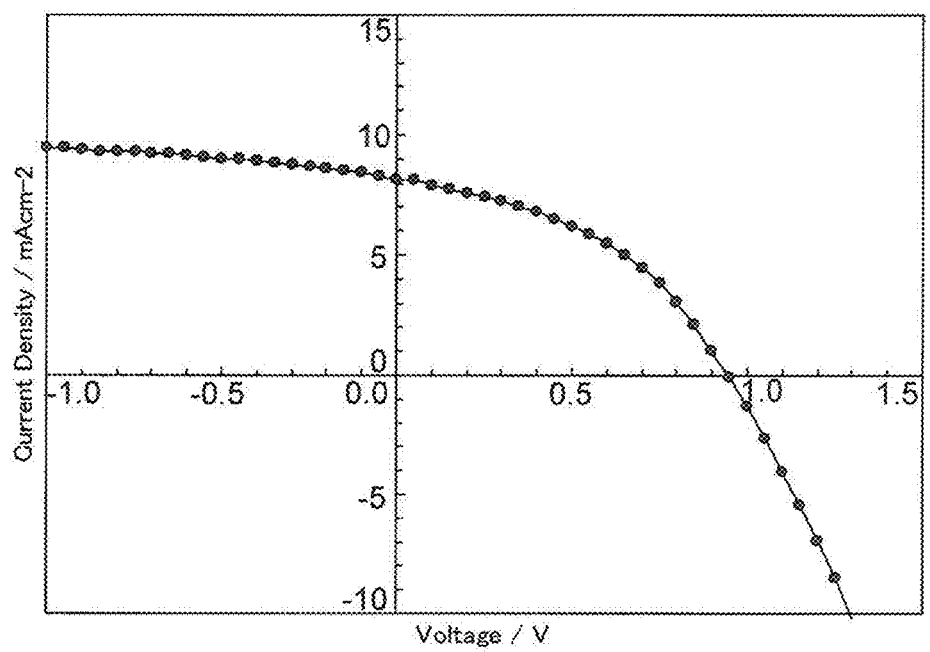
FIG. 18 illustrates current-voltage characteristics of Example 12.
Figure 19:
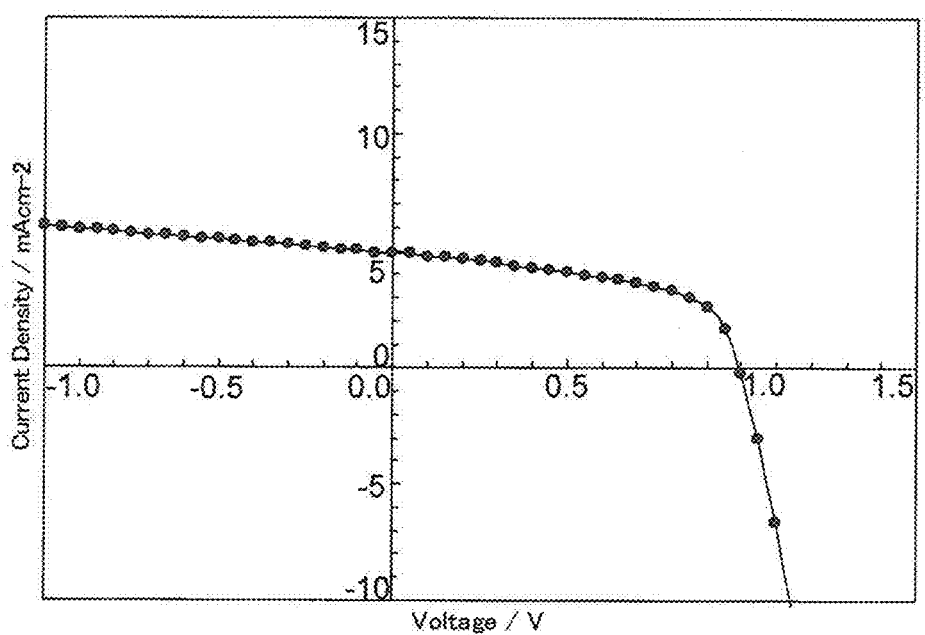
FIG. 19 illustrates current-voltage characteristics of Example 13.
Figure 20:
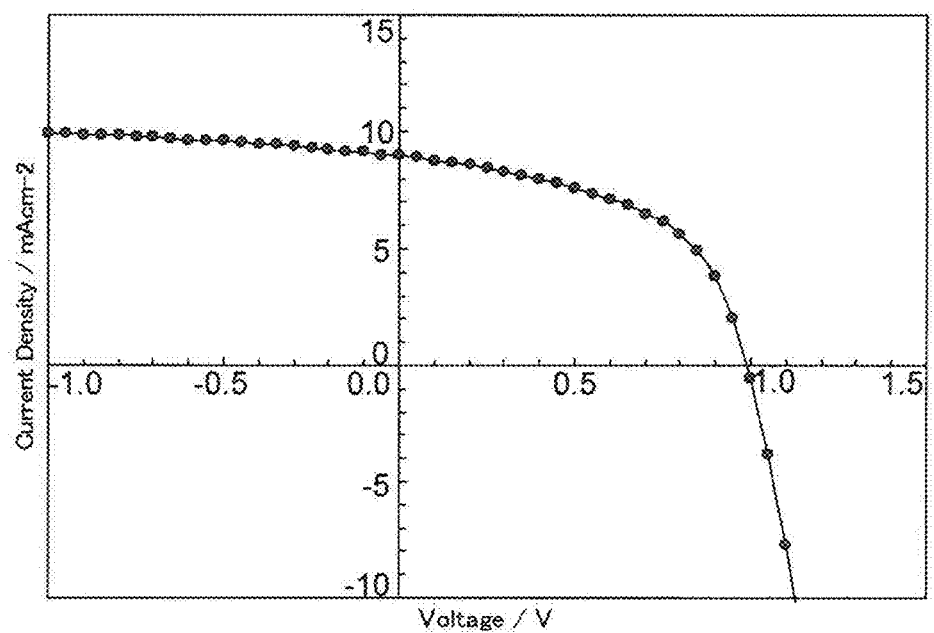
FIG. 20 illustrates current-voltage characteristics of Example 14.
Figure 21:
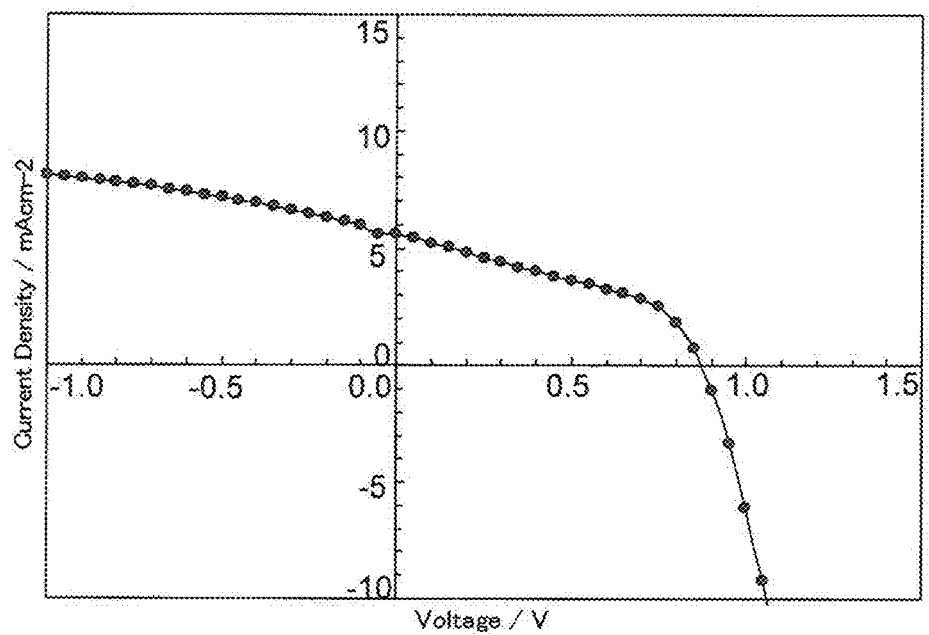
FIG. 21 illustrates current-voltage characteristics of Comparative Example 3.
Figure 22:
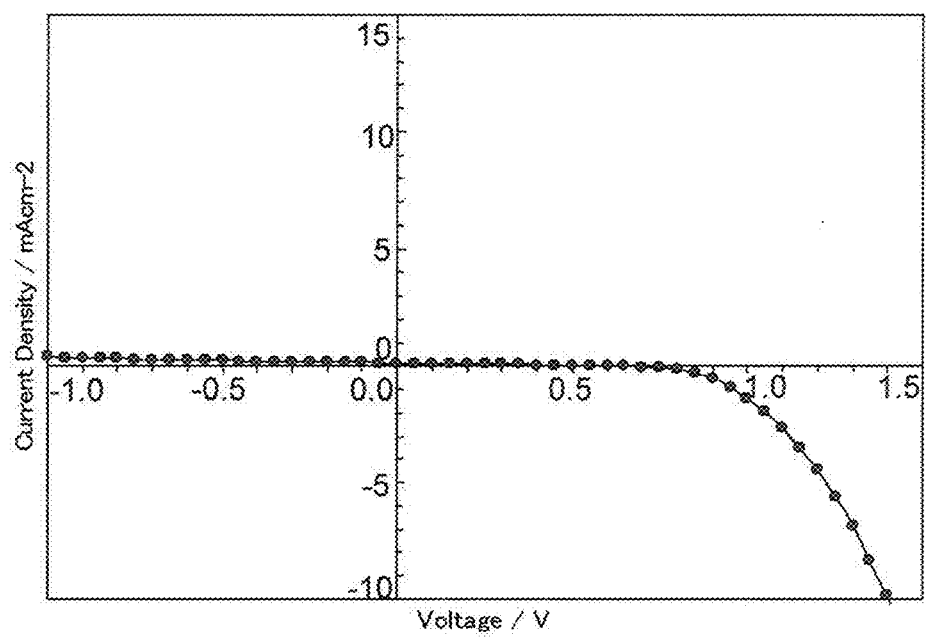
FIG. 22 illustrates current-voltage characteristics of Comparative Example 4.
Figure 23:
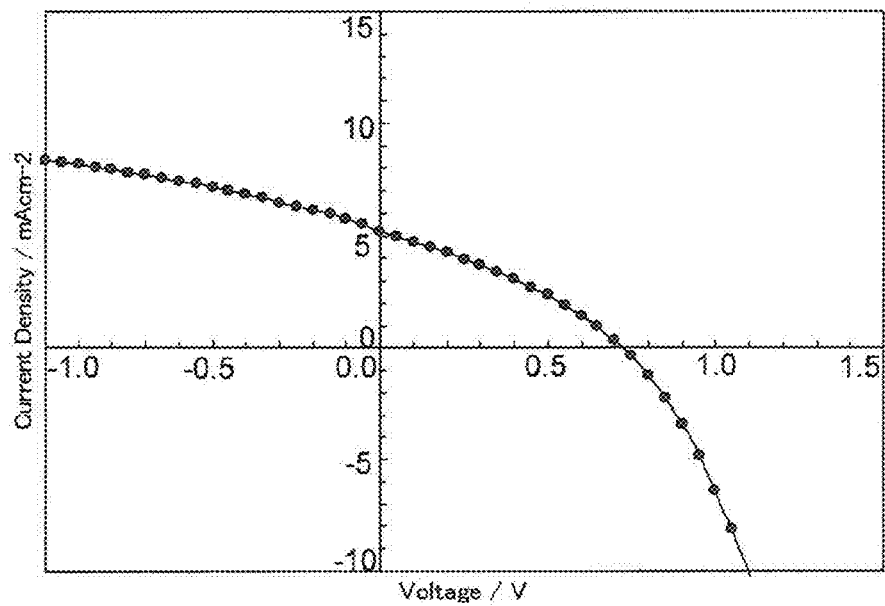
FIG. 23 illustrates current-voltage characteristics of Comparative Example 5.

The yields and various physical properties (the weight-average molecular weight, number-average molecular weight, light absorption edge wavelength, bandgap (Eg), and highest occupied molecular orbital (HOMO) level) of compounds A-1 to A-11 and compounds B-1 to B-6 are collectively shown in Table 1. Moreover, the ultraviolet-ray visible absorption spectrum of each of thin films (film thickness: about 60 nm) is shown in FIGS. 3 and 4.

TABLE 1

| Compound | Yield % | Weight-average molecular weight | Number-average molecular weight | Degree of polymerization | Light absorption edge wavelength nm | Eg eV | HOMO eV |
|---|---|---|---|---|---|---|---|
| A-1 | 78 | 39500 | 16600 | 47.4 | 636 | 1.95 | −5.37 |
| A-2 | 67 | 35800 | 14200 | 40.1 | 628 | 1.97 | −5.32 |
| A-3 | 40 | 38700 | 8860 | 44.5 | 649 | 1.91 | −5.51 |
| A-4 | 21 | 8500 | 5300 | 12.0 | 591 | 2.10 | −5.30 |
| A-5 | 86 | 54700 | 11100 | 64.5 | 640 | 1.94 | −5.29 |
| A-6 | 89 | 18200 | 9900 | 18.2 | 606 | 2.05 | −5.42 |
| A-7 | 28 | 12000 | 7500 | 14.0 | 648 | 1.91 | −5.16 |
| B-1 | 91 | 33000 | 15300 | 30.3 | 632 | 1.96 | −5.36 |
| B-2 | 2.9 | 5040 | 320 | 5.1 | 680 | 1.82 | −5.20 |
| B-3 | 56 | 40200 | 5500 | 59.0 | 618 | 2.01 | −5.40 |
| A-8 | 41 | 19000 | 12000 | 19.3 | 637 | 1.95 | −5.37 |
| A-9 | 33 | 10500 | 7300 | 13.5 | 637 | 1.95 | −5.37 |
| A-10 | 28 | 16600 | 10200 | 17.6 | 636 | 1.95 | −5.39 |
| A-11 | 84 | 23400 | 9950 | 28.0 | 630 | 1.97 | −5.43 |
| B-4 | 7 | 3540 | 3060 | 4.0 | 640 | 1.94 | −5.25 |
| B-5 | 78 | 84800 | 32900 | 127 | 487 | 2.55 | −5.79 |
| B-6 | 26 | 9260 | 5070 | 11.0 | 803 | 1.54 | −5.07 |

Example 1

The above-mentioned compound A-1 (1 mg) and PC$_{70}$BM (4 mg) (produced by Solenn Co., Ltd.) were put into a sample bottle containing 0.25 mL of chlorobenzene, and this was irradiated with ultrasonic waves for 30 minutes in a ultrasonic cleaning machine (US-2 (trade name), output: 120 W, produced by AS ONE Corporation) so that a solution A was obtained.

Figure 27:
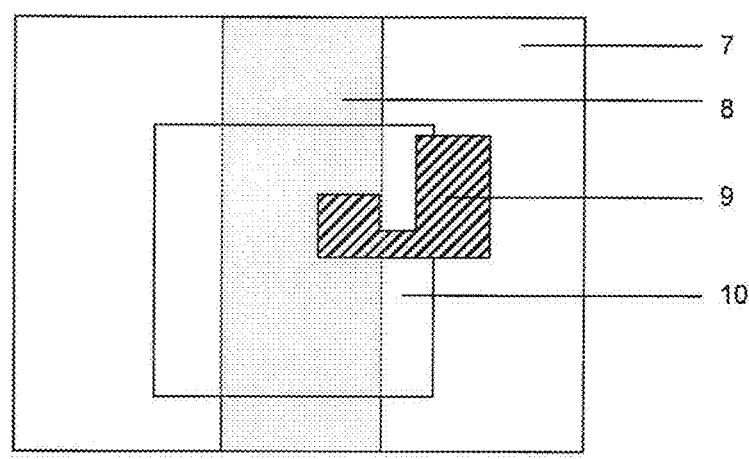
FIG. 27 is a schematic drawing of the photovoltaic device of Example 1.

A glass substrate on which an ITO transparent conductive layer serving as a positive electrode was deposited by a sputtering method with a thickness of 120 nm was cut into a size of 38 mm×46 mm, and the ITO layer was then patterned into a rectangular shape of 38 mm×13 mm by a photolithography method. The resulting substrate was cleaned with ultrasonic waves for 10 minutes in an alkali cleaning solution ("Semicoclean" EL56 (trade name), produced by Furuuchi Chemical Corporation), and then washed with ultrapure water. After this substrate was subjected to a UV/ozone treatment for 30 minutes, an aqueous PEDOT:PSS solution (PEDOT 0.8% by weight, PPS 0.5% by weight) to be used for forming a hole transporting layer was applied to the substrate with a thickness of 60 nm by a spin coating method so as to form a film thereon. After being heated and dried at 200° C. for 5 minutes by using a hot plate, the above-mentioned solution A was dripped onto the PEDOT:PPS layer so that an organic semiconductor layer having a film thickness of 100 nm was formed by a spin coating method. Thereafter, the substrate with the organic semiconductor layer formed thereon and a mask for a negative electrode were placed in a vacuum vapor deposition apparatus, and the apparatus was again evacuated until the degree of vacuum inside the apparatus reached 1×10$^{-3}$ Pa or less so that an aluminum layer serving as a negative electrode was vapor-deposited with a thickness of 80 nm by a resistance heating method. Thus, a photovoltaic device was fabricated. FIG. 27 is a schematic drawing that illustrates the photovoltaic device thus produced. A portion at which the ITO layer having the stripe pattern and the aluminum layer intersect with each other had an area of 5 mm×5 mm.

The positive and negative electrodes of the photovoltaic device thus produced were connected to a picoampere meter/voltage source 4140B manufactured by Hewlett-Packard Development Company, L.P., and the device was irradiated with pseudo-solar light (simple solar simulator YSS-E40, spectral-shape: AM 1.5, Intensity: 100 mW/cm$^2$, manufactured by Yamashita Denso Corporation) from the ITO layer side in the atmosphere; thus, the electric current value was measured, with the applied voltage being varied from −1 V to +2 V. At this time, the short-circuit current density (value of the current density when the applied voltage is 0 V) was 9.28 mA/cm$^2$, the open circuit voltage (value of applied voltage when the electric current density is 0) was 0.99 V and the fill factor (FF) was 0.530, and the photoelectric conversion efficiency calculated based upon these values was 4.86%. In this case, the fill factor and the photoelectric conversion efficiency were calculated from the following expression:

$$\text{Fill factor} = IV_{max}/(\text{Short-circuit current density} \times \text{Open circuit voltage})$$

wherein, IVmax corresponds to a value of product of the electric current density and the applied voltage at a point where the product of the electric current density and the applied voltage becomes the largest between 0V of the applied voltage and the open circuit voltage value.

$$\text{Photoelectric conversion efficiency} = [(\text{Short-circuit current density} \times \text{Open circuit voltage} \times \text{Fill factor})/\text{Intensity of pseudo-solar light } (100 \text{ mW/cm}^2)] \times 100(\%)$$

In the following Examples and Comparative Examples, all the fill factor and photoelectric conversion efficiency were calculated from the above-mentioned expression.

Example 2

The same processes as those of Example 1 were carried out except that in place of compound A-1, the aforementioned compound A-2 was used, so that a photovoltaic device was fabricated, and the electric current-voltage characteristics were measured. At this time, the short-circuit current density was 8.76 A/cm$^2$, the open circuit voltage was 0.96 V, and the fill factor (FF) was 0.500, and the photoelectric conversion efficiency calculated based upon these values was 4.20%.

Example 3

The same processes as those of Example 1 were carried out except that in place of compound A-1, the aforementioned compound A-3 was used, so that a photovoltaic device was fabricated, and the electric current-voltage characteristics were measured. At this time, the short-circuit current density was 6.20 A/cm$^2$, the open circuit voltage was 1.01 V, and the fill factor (FF) was 0.430, and the photoelectric conversion efficiency calculated based upon these values was 2.70%.

Example 4

The same processes as those of Example 1 were carried out except that in place of compound A-1, the aforementioned compound A-4 was used, so that a photovoltaic device was fabricated, and the electric current-voltage characteristics were measured. At this time, the short-circuit current density was 6.50 A/cm$^2$, the open circuit voltage was 0.99 V, and the fill factor (FF) was 0.460, and the photoelectric conversion efficiency calculated based upon these values was 2.97%.

Example 5

The same processes as those of Example 1 were carried out except that in place of compound A-1, the aforementioned compound A-5 was used, so that a photovoltaic device was fabricated, and the electric current-voltage characteristics were measured. At this time, the short-circuit current density was 5.12 A/cm$^2$, the open circuit voltage was 0.94 V, and the fill factor (FF) was 0.540, and the photoelectric conversion efficiency calculated based upon these values was 2.60%.

Example 6

The same processes as those of Example 1 were carried out except that in place of compound A-1, the aforementioned compound A-6 was used, so that a photovoltaic device was fabricated, and the electric current-voltage characteristics were measured. At this time, the short-circuit current density was 6.84 A/cm$^2$, the open circuit voltage was 1.01 V, and the fill factor (FF) was 0.380, and the photoelectric conversion efficiency calculated based upon these values was 2.62%.

Example 7

The same processes as those of Example 1 were carried out except that in place of compound A-1, the aforementioned compound A-7 was used, so that a photovoltaic device was fabricated, and the electric current-voltage characteristics were measured. At this time, the short-circuit current density was 8.28 A/cm$^2$, the open circuit voltage was 0.88 V, and the fill factor (FF) was 0.470, and the photoelectric conversion efficiency calculated based upon these values was 3.44%.

Comparative Example 1

The same processes as those of Example 1 were carried out except that in place of compound A-1, the aforementioned compound B-1 was used, so that a photovoltaic device was fabricated, and the electric current-voltage characteristics were measured. At this time, the short-circuit current density was 5.01 A/cm$^2$, the open circuit voltage was 0.97 V, and the fill factor (FF) was 0.500, and the photoelectric conversion efficiency calculated based upon these values was 2.41%.

Comparative Example 2

The same processes as those of Example 1 were carried out except that in place of compound A-1, the aforementioned compound B-3 was used, so that a photovoltaic device was fabricated, and the electric current-voltage characteristics were measured. At this time, the short-circuit current density was 5.20 A/cm$^2$, the open circuit voltage was 1.02 V, and the fill factor (FF) was 0.440, and the photoelectric conversion efficiency calculated based upon these values was 2.33%.

Example 8

The same processes as those of Example 1 were carried out except that in place of chlorobenzene (0.25 mL), a mixed solvent of chlorobenzene/chloroform (volume ratio: 0.188 mL/0.125 mL, weight ratio: 0.209 g/0.185 g) was used, and that prior to the vapor deposition of the aluminum layer, lithium fluoride was vapor-deposited with a thickness of 0.1 nm, so that a photovoltaic device was fabricated, and the electric current-voltage characteristics were measured. At this time, the short-circuit current density was 9.52 A/cm$^2$, the open circuit voltage was 1.00 V, and the fill factor (FF) was 0.533, and the photoelectric conversion efficiency calculated based upon these values was 5.07%.

Example 9

The same processes as those of Example 8 were carried out except that in place of the mixed solvent of chlorobenzene/chloroform (volume ratio: 0.188 mL/0.125 mL), a mixed solution of chlorobenzene/chloroform/benzotrifluoride (trifluoromethylbenzene) (volume ratio: 0.186 mL/0.124 mL/0.003 mL, weight ratio: 0.206 g/0.184 g/0.0036 g) was used, so that a photovoltaic device was fabricated, and the electric current-voltage characteristics were measured. At this time, the short-circuit current density was 9.96 A/cm$^2$, the open circuit voltage was 0.99 V, and the fill factor (FF) was 0.551, and the photoelectric conversion efficiency calculated based upon these values was 5.43%.

Example 10

The same processes as those of Example 8 were carried out except that prior to the formation of the organic semiconductor layer, the PEDOT:PSS layer was preliminarily treated with 1H,1H,2H,2H-heptadecafluoro-1-decanol (F-decanol), so that a photovoltaic device was fabricated, and the electric current-voltage characteristics were measured. At this time, the short-circuit current density was 9.72 A/cm$^2$, the open circuit voltage was 0.99 V, and the fill factor (FF) was 0.574, and the photoelectric conversion efficiency calculated based upon these values was 5.52%.

Example 11

The same processes as those of Example 1 were carried out except that in place of compound A-1, the aforementioned compound A-8 was used, so that a photovoltaic device was fabricated, and the electric current-voltage characteristics were measured. At this time, the short-circuit current density was 8.40 A/cm$^2$, the open circuit voltage was 0.93 V, and the fill factor (FF) was 0.480, and the photoelectric conversion efficiency calculated based upon these values was 3.74%.

Example 12

The same processes as those of Example 1 were carried out except that in place of compound A-1, the aforementioned compound A-9 was used, so that a photovoltaic device was fabricated, and the electric current-voltage characteristics were measured. At this time, the short-circuit current density was 8.40 A/cm$^2$, the open circuit voltage was 0.95 V, and the fill factor (FF) was 0.426, and the photoelectric conversion efficiency calculated based upon these values was 3.39%.

Example 13

The same processes as those of Example 1 were carried out except that in place of compound A-1, the aforementioned compound A-10 was used, so that a photovoltaic device was fabricated, and the electric current-voltage characteristics were measured. At this time, the short-circuit current density was 4.90 A/cm$^2$, the open circuit voltage was 0.99 V, and the fill factor (FF) was 0.542, and the photoelectric conversion efficiency calculated based upon these values was 2.63%.

Example 14

The same processes as those of Example 1 were carried out except that in place of compound A-1, the aforementioned compound A-11 was used, so that a photovoltaic device was fabricated, and the electric current-voltage characteristics were measured. At this time, the short-circuit current density was 8.96 A/cm$^2$, the open circuit voltage was 0.99 V, and the fill factor (FF) was 0.521, and the photoelectric conversion efficiency calculated based upon these values was 4.62%.

Comparative Example 3

The same processes as those of Example 1 were carried out except that in place of compound A-1, the aforementioned compound B-4 was used, so that a photovoltaic device was fabricated, and the electric current-voltage characteristics were measured. At this time, the short-circuit current density was 5.58 A/cm$^2$, the open circuit voltage was 0.87 V, and the fill factor (FF) was 0.414, and the photoelectric conversion efficiency calculated based upon these values was 2.01%.

Comparative Example 4

The same processes as those of Example 1 were carried out except that in place of compound A-1, the aforementioned compound B-5 was used, so that a photovoltaic device was fabricated, and the electric current-voltage characteristics were measured. At this time, the short-circuit current density was 0.13 A/cm$^2$, the open circuit voltage was 0.68 V, and the fill factor (FF) was 0.281, and the photoelectric conversion efficiency calculated based upon these values was 0.03%.

Comparative Example 5

The same processes as those of Example 1 were carried out except that in place of compound A-1, the aforementioned compound B-6 was used, so that a photovoltaic device was fabricated, and the electric current-voltage characteristics were measured. At this time, the short-circuit current density was 5.22 A/cm$^2$, the open circuit voltage was 0.72 V, and the fill factor (FF) was 0.325, and the photoelectric conversion efficiency calculated based upon these values was 1.22%.

The results of Examples 1 to 14 and Comparative Examples 1 to 5 are collectively shown in Table 2. Moreover, the electric current-voltage characteristics are shown in FIGS. 5 to 23.

electron accepting organic material) of the organic semiconductor layers.

Figure 26:
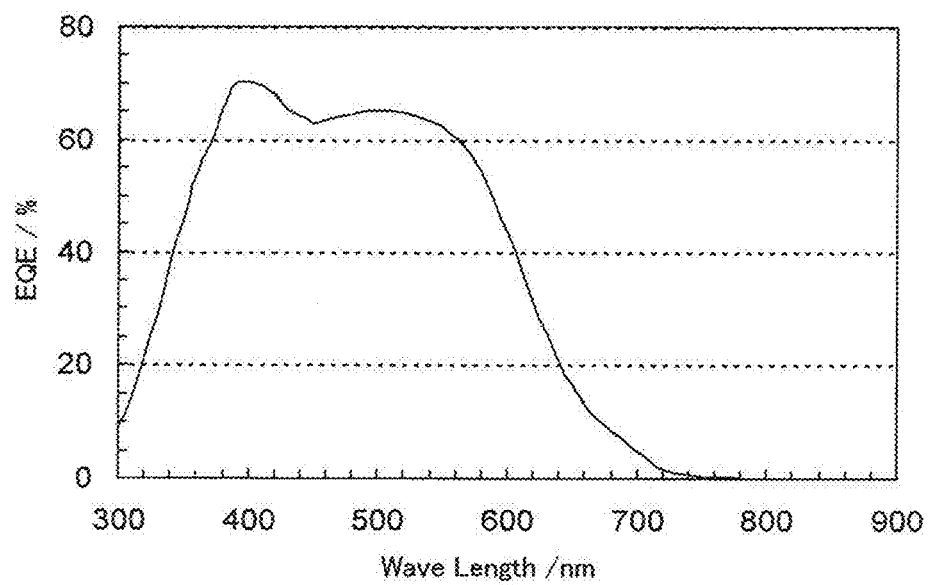
FIG. 26 illustrates an external quantum efficiency (EQE) spectrum of a photovoltaic device of Example 10.

FIG. 26 shows a spectrum of EQE (External Quantum Efficiency) of the photovoltaic device of Example 10 (compound A-1). FIG. 26 clearly indicates that a very high EQE value of about 70% is obtained at a peak top (near 400 nm). This means that upon irradiation with 100 photons, about 70 photons are allowed to flow through an external circuit, thereby indicating that the charge separation efficiency and charge mobility efficiency are very high. It is considered that such a high EQE is hardly obtained when the electron donating organic material and the electron accepting organic material are compatible with each other in a molecular level to form no phase separation structure. Therefore, this strongly implies that in the case of the photovoltaic device using compound A-1, an ideal nano-level phase separation structure is formed.

TABLE 2

| | Compound | Solvent | PEDOT:PSS Layer Pretreatment | LiF | Isc mA/cm2 | Voc V | FF | η % |
|---|---|---|---|---|---|---|---|---|
| Example 1 | A-1 | Chlorobenzene | None | None | 9.28 | 0.99 | 0.530 | 4.86 |
| Example 2 | A-2 | Chlorobenzene | None | None | 8.76 | 0.96 | 0.500 | 4.20 |
| Example 3 | A-3 | Chlorobenzene | None | None | 6.20 | 1.01 | 0.430 | 2.70 |
| Example 4 | A-4 | Chlorobenzene | None | None | 6.50 | 0.99 | 0.460 | 2.97 |
| Example 5 | A-5 | Chlorobenzene | None | None | 5.12 | 0.94 | 0.540 | 2.60 |
| Example 6 | A-6 | Chlorobenzene | None | None | 6.84 | 1.01 | 0.380 | 2.62 |
| Example 7 | A-7 | Chlorobenzene | None | None | 8.28 | 0.88 | 0.470 | 3.44 |
| Example 8 | A-1 | Chlorobenzene/Chloroform | None | 0.1 nm | 9.52 | 1.00 | 0.533 | 5.07 |
| Example 9 | A-1 | Chlorobenzene/Chloroform/ Benzotrifluoride | None | 0.1 nm | 9.96 | 0.99 | 0.551 | 5.43 |
| Comparative Example 1 | B-1 | Chlorobenzene | None | None | 5.01 | 0.97 | 0.500 | 2.41 |
| Comparative Example 2 | B-3 | Chlorobenzene | None | None | 5.20 | 1.02 | 0.440 | 2.33 |
| Example 10 | A-1 | Chlorobenzene/Chloroform | F-decanol | 0.1 nm | 9.72 | 0.99 | 0.574 | 5.52 |
| Example 11 | A-8 | Chlorobenzene | None | None | 8.40 | 0.93 | 0.480 | 3.74 |
| Example 12 | A-9 | Chlorobenzene | None | None | 8.40 | 0.95 | 0.426 | 3.39 |
| Example 13 | A-10 | Chlorobenzene | None | None | 4.90 | 0.99 | 0.542 | 2.63 |
| Example 14 | A-11 | Chlorobenzene | None | None | 8.96 | 0.99 | 0.521 | 4.62 |
| Comparative Example 3 | B-4 | Chlorobenzene | None | None | SSR | 0.87 | 0.414 | 2.01 |
| Comparative Example 4 | B-5 | Chlorobenzene | None | None | 0.13 | 0.68 | 0.281 | 0.03 |
| Comparative Example 5 | B-6 | Chlorobenzene | None | None | 5.22 | 0.72 | 0.325 | 1.22 |

As described above, there is a clear difference in photoelectric conversion efficiency between compounds A-1 to A-11 and compounds B-1 and B-3 to B-6. In particular, upon comparison of compounds A-1 and A-2 with compound B-1, although the molecular weight, bandgap (Eg), absorbance, and the like are in the substantially same level, there is a great difference in the short-circuit current (Jsc), with the result that a great difference appears in the photoelectric conversion efficiency.

Figure 24:
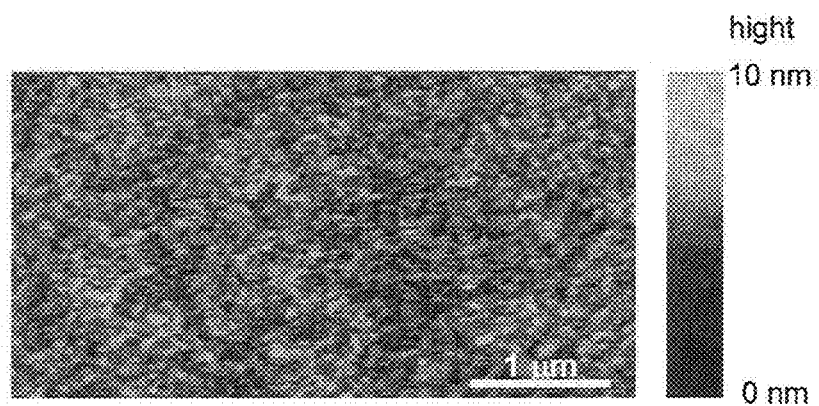
FIG. 24 illustrates an image of the surface status of an organic semiconductor layer of Example 1 analyzed by an atomic force microscope (AFM).
Figure 25:
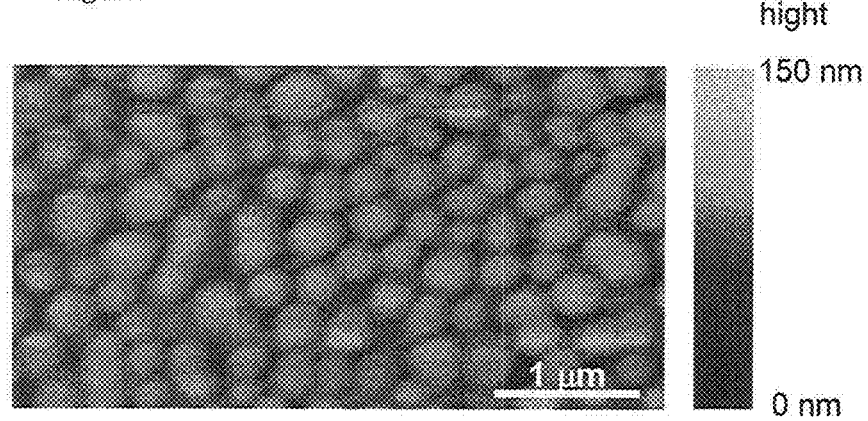
FIG. 25 illustrates an image of the surface status of an organic semiconductor layer of Comparative Example 1 analyzed by an atomic force microscope (AFM).

Images of Atomic Force Microscope: AFM of the surfaces of organic semiconductor layers of Example 1 (compound A-1) and Comparative Example 1 (compound B-1) are shown in FIGS. 24 and 25. Although no clear phase-separation structure is seen on the surface of the organic semiconductor layer of Example 1 (FIG. 24), a phase-separation structure having a size of several hundreds nm is seen on the surface of the organic semiconductor layer of Comparative Example 1 (FIG. 25). That is, the difference in photoelectric conversion efficiency between Example 1 and Comparative Example 1 is highly probably caused by a great difference in morphology (mixed state of an electron donating organic material and an

INDUSTRIAL APPLICABILITY

In accordance with the material for our photovoltaic device, it is possible to provide a photovoltaic device having a high photoelectric conversion efficiency.

The photovoltaic device may be applicable to various photoelectric conversion devices in which its photoelectric conversion function, photo-rectifying function, or the like is utilized. For example, it is useful for photoelectric cells (solar cells, or the like), electron devices (such as a photosensor, photoswitch, phototransistor, photoconductor, or the like) and photorecording materials (photomemory or the like).

EXPLANATIONS OF REFERENCE NUMERALS

1 Substrate
2 Positive electrode
3 Organic semiconductor layer
4 Negative electrode -continued 5 Layer having an electron donating organic material having a structure represented by Formula (1)
6 Layer having an electron accepting organic material
7 Glass substrate
8 ITO layer
9 Aluminum layer
10 PEDOT:PSS layer/organic semiconductor layer

The invention claimed is:

1. A material for a photovoltaic device comprising: an electron donating organic material having a structure represented by (1):

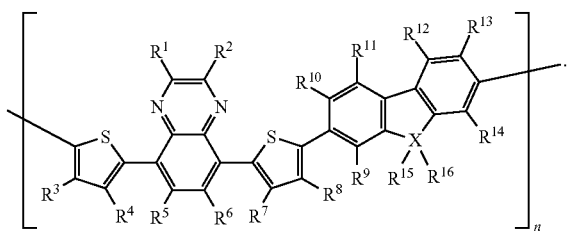

(1)

wherein each of $R^1$ and $R^2$, that may be the same or different, represents an optionally substituted aryl group provided that when a substituent is present, the substituent is an alkoxy group having 1 to 5 carbon atoms; each of $R^3$ through $R^{14}$, that may be the same or different, represents hydrogen, an alkyl group, an alkoxy group, an aryl group, an heteroaryl group, or halogen; each of $R^{15}$ and $R^{16}$, that may be the same or different, represents an alkyl group having 6 to 10 carbon atoms; X represents carbon or nitrogen; where X is nitrogen, no $R^{16}$ exists; and n represents 10 or more to 1000 or less.

2. The material according to claim 1, further comprising an electron accepting organic material.

3. The material according to claim 2, wherein the electron accepting organic material is a fullerene compound.

4. The material according to claim 3, wherein the fullerene compound is a $C_{70}$ derivative.

5. A photovoltaic device comprising at least a positive electrode and a negative electrode, and
a material provided between the negative electrode and the positive electrode,
wherein the material comprises electron donating organic material having a structure represented by (1):

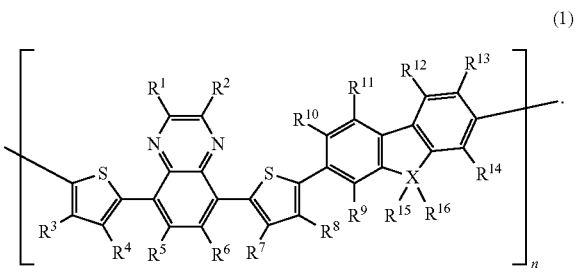

(1)

wherein each of $R^1$ and $R^2$, that may be the same or different, represents an optionally substituted alkyl group having 1 to 5 carbon atoms, an optionally substituted alkoxy group having 1 to 5 carbon atoms, an optionally substituted aryl group, or an optionally substituted heteroaryl group; provided that when a substituent is present, the substituent is an alkyl group having 1 to 5 carbon atoms, an alkoxy group having 1 to 5 carbon atoms, an aryl group, a heteroaryl group, or halogen; each of $R^3$ through $R^{14}$, that may be the same or different, represents hydrogen, an alkyl group, an alkoxy group, an aryl group, an heteroaryl group, or halogen; each of $R^{15}$ and $R^{16}$, that may be the same or different, represents an alkyl group having 6 or more carbon atoms; X represents carbon, or nitrogen or silicon; where X is nitrogen, no $R^{16}$ exists; and n represents 10 or more to 1000 or less.

6. The photovoltaic device according to claim 5, wherein the material further comprises an electron accepting organic material.

7. The photovoltaic device according to claim 6, wherein the electron accepting organic material is a fullerene compound.

8. The photovoltaic device according to claim 7, wherein the fullerene compound is a $C_{70}$ derivative.

* * * * *

UNITED STATES PATENT AND TRADEMARK OFFICE
CERTIFICATE OF CORRECTION

PATENT NO. : 8,501,901 B2
APPLICATION NO. : 13/144532
DATED : August 6, 2013
INVENTOR(S) : Kitazawa et al.

It is certified that error appears in the above-identified patent and that said Letters Patent is hereby corrected as shown below:

In the Specification

In Column 118

At line 29, please change "(m, 6H)" to -- (n, 6H) --.

In Column 125

At (6-a), please insert -- THF -- after "2) iPrOBPin".

In Column 132

At line 37, please change "4-4-4'" to -- 4-4' --.

In Column 143

At line 47, please change "4-4-4'" to -- 4-4' --.

Signed and Sealed this
Thirteenth Day of May, 2014

Michelle K. Lee
*Deputy Director of the United States Patent and Trademark Office*